US011159178B2

(12) United States Patent
Li et al.

(10) Patent No.: US 11,159,178 B2
(45) Date of Patent: Oct. 26, 2021

(54) METHOD AND APPARATUS FOR QUASI-CYCLIC LOW-DENSITY PARITY-CHECK

(71) Applicant: ZTE Corporation, Guangdong (CN)

(72) Inventors: Liguang Li, Guangdong (CN); Jun Xu, Guangdong (CN); Jin Xu, Guangdong (CN)

(73) Assignee: ZTE Corporation, Shenzhen (CN)

( * ) Notice: Subject to any disclaimer, the term of this patent is extended or adjusted under 35 U.S.C. 154(b) by 0 days.

(21) Appl. No.: 16/727,714

(22) Filed: Dec. 26, 2019

(65) Prior Publication Data

US 2020/0145026 A1 May 7, 2020

Related U.S. Application Data

(63) Continuation of application No. PCT/CN2018/090773, filed on Jun. 12, 2018.

(30) Foreign Application Priority Data

Jun. 26, 2017 (CN) ........................ 201710496533.7

(51) Int. Cl.
*H03M 13/11* (2006.01)
*H04L 1/00* (2006.01)

(52) U.S. Cl.
CPC ....... *H03M 13/1168* (2013.01); *H04L 1/0057* (2013.01)

(58) Field of Classification Search
CPC ..... H04L 1/0057; H04L 1/1819; H04L 1/007; H04L 1/0068; H03M 13/11;
(Continued)

(56) References Cited

U.S. PATENT DOCUMENTS 8,286,065 B2 10/2012 Myung et al.
2008/0178065 A1 7/2008 Khandekar et al.
(Continued)

FOREIGN PATENT DOCUMENTS

CN 1953335 A 4/2007
CN 101217337 A 7/2008
(Continued)

OTHER PUBLICATIONS

Huang et al., Cyclic and Quasi-Cyclic LDPC Codes on Constrained Parity-Check Matrices and Their Trapping Sets, IEEE, Trans. on Info. Theory, vol. 58, No. 5, pp. 2648 to 2671 (Year: 2012).*
(Continued)

*Primary Examiner* — Shelly A Chase
(74) *Attorney, Agent, or Firm* — Perkins Coie LLP

(57) ABSTRACT

Provided is a design method and apparatus for quasi-cyclic low-density parity-check (LDPC) encoding. The method includes: performing LDPC encoding on a K-bit information sequence to be encoded according to a parity check matrix of a quasi-cyclic LDPC code to obtain an N-bit LDPC encoded sequence, where the parity check matrix is determined according to a basic matrix and a lifting size Z, and the basic matrix is determined according to the lifting size Z and a coefficient matrix, where K is a positive integer, N is an integer greater than K, and Z is a positive integer.

20 Claims, 2 Drawing Sheets

(58) Field of Classification Search
CPC ........... H03M 13/616; H03M 13/1148; H03M 13/1168; H03M 13/116; H03M 13/6516; H03M 13/6303
See application file for complete search history.

(56) References Cited

U.S. PATENT DOCUMENTS

| | | | |
|---|---|---|---|
| 2016/0094246 | A1 | 3/2016 | Srinivasan Ranganathan et al. |
| 2017/0012648 | A1 | 1/2017 | Park et al. |
| 2017/0134050 | A1 | 5/2017 | Abu-Surra et al. |
| 2017/0250712 | A1* | 8/2017 | Chiu ..................... H04L 1/1819 |
| 2018/0323801 | A1* | 11/2018 | Hsu ....................... H04L 1/0071 |

FOREIGN PATENT DOCUMENTS

| | | | |
|---|---|---|---|
| EP | 2525497 | A1 | 11/2012 |
| RU | 2439793 | C1 | 1/2012 |
| WO | 2012/037749 | A1 | 3/2012 |

OTHER PUBLICATIONS

International Search Report and Written Opinion dated Sep. 3, 2018 for International Application No. PCT/CN2018/090773, filed on Jun. 12, 2018 (11 pages).
Ericsson, "LDPC Code Design for NR," 3GPP TSG-RAN WG1 Meeting #86bis, R1-1608875, Oct. 2016, 13 pages.
European Patent Office, Extended Search Report dated Jun. 9, 2020 for European Patent Application No. 18825447.8, 10 pages.
Mediatek Inc., "On NR LDPC design and performance," 3GPP TSG-RAN WG1 Meeting NR#2, R1-1710829, Jun. 2017, 6 pages.
Russian Patent Office, Office Action dated Mar. 5, 2020 for Russian Patent Application No. 2020102664, 5 pages.
Russian Search Report for Russian Patent Application No. 2020102664, dated Aug. 28, 2020, 2 pages.

* cited by examiner

METHOD AND APPARATUS FOR QUASI-CYCLIC LOW-DENSITY PARITY-CHECK

CROSS-REFERENCES TO RELATED APPLICATIONS

This patent document is a continuation of and claims the benefit of priority to International Patent Application No. PCT/CN2018/090773, filed on Jun. 12, 2018, which claims the benefit of priority of Chinese Patent Application No. 201710496533.7, filed on Jun. 26, 2017. The entire contents of the before-mentioned patent applications are incorporated by reference as part of the disclosure of this application.

TECHNICAL FIELD

The present invention relates to the field of communications and, in particular, to a design method and apparatus for quasi-cyclic low-density parity-check encoding, and a computer storage medium.

BACKGROUND

A digital communication system in the related art generally includes three parts: a transmitting end, a channel, and a receiving end. The transmitting end can perform channel coding on an information sequence to obtain an encoded codeword, interleave the encoded codeword, and map the interleaved bits into modulation symbols, and then process and transmit the modulation symbols according to communication channel information. In the channel, a specific channel response due to factors such as multipath and movement results in distorted data transmission, and noise and interference can further deteriorate the data transmission. The receiving end receives the distorted modulation symbol data transmitted through the channel and needs to perform specific processing to restore the original information sequence.

According to an encoding method used by the transmitting end for encoding the information sequence, the receiving end can perform corresponding processing on the received data to reliably restore the original information sequence. The encoding method must be visible to both the transmitting end and the receiving end. Generally, the encoding method is based on forward error correction (FEC) encoding. The FEC encoding adds some redundant information to the information sequence. The receiving end can reliably restore the original information sequence with the redundant information.

Some common FEC codes include: a convolutional code, a Turbo code, and a low density parity check (LDPC) code. In the FEC encoding process, the EEC encoding is performed on an information sequence with the number k of bits to obtain an FEC encoded codeword with the number n of bits (including n-k redundant bits), and an FEC encoding rate is k/n. The LDPC code is a linear block code defined with a very sparse parity check matrix or a bipartite graph. The sparsity of the check matrix helps achieve low-complexity LDPC encoding and decoding, thus making the LDPC code more practical. Various practices and theories prove that the LDPC code has the best channel encoding performance which is very close to the Shannon limit under additive white Gaussian noise (AWGN). In the parity check matrix of the LDPC code, each row is a parity check code. If an element at a certain index position has a value of 1 in each row, it indicates that the bit at this position participates in the parity check code. If the element is equal to 0, it indicates that the bit at this position does not participate in the parity check code.

Due to a structured characteristic, a quasi-cyclic LDPC code has become a mainstream application, for example, the quasi-cyclic LDPC code has wide applications in fields such as IEEE802.11ac, IEEE802.11ad, IEEE802.11aj, IEEE802.16e, IEEE802.11n, DVB, microwave communications, and fiber-optic communications. The parity check matrix H of the quasi-cyclic LDPC code is a matrix of M×Z rows and N×Z columns, which is composed of M×N sub-matrices. Each sub-matrix is a different power of a Z×Z basic permutation matrix. That is, each sub-matrix is obtained through a cyclic shift of a Z×Z identity matrix. To more easily describe the cyclic shift of the identity matrix from a mathematical perspective, the parity check matrix of the quasi-cyclic LDPC code can be written as the following mathematical formula form:

$$H = \begin{bmatrix} P^{hb_{11}} & P^{hb_{12}} & P^{hb_{13}} & \dots & P^{hb_{1N}} \\ P^{hb_{21}} & P^{hb_{22}} & P^{hb_{23}} & \dots & P^{hb_{2N}} \\ \dots & \dots & \dots & & \dots \\ P^{hb_{M1}} & P^{hb_{M2}} & P^{hb_{M3}} & \dots & P^{hb_{MN}} \end{bmatrix} = P^{Hb}$$

If $hb_{ij}=-1$, $P^{hb_{ij}}$ is an all-zero matrix of size Z×Z; otherwise, $P^{hb_{ij}}$ is a non-negative integer power of the standard permutation matrix P. The standard permutation matrix P is written as:

$$P = \begin{bmatrix} 0 & 1 & 0 & \dots & 0 \\ 0 & 0 & 1 & \dots & 0 \\ \dots & \dots & \dots & \dots & \dots \\ 0 & 0 & 0 & \dots & 1 \\ 1 & 0 & 0 & \dots & 0 \end{bmatrix}$$

With this definition, Z and the power $hb_{ij}$ can uniquely identify each block matrix. If a certain block matrix is an all-zero matrix, the block matrix can be represented by −1 or a null value or in other forms. If the block matrix is obtained through a cyclic shift of value s of the identity matrix, the block matrix is equal to s. All $hb_{ij}$ can constitute the basic matrix Hb of the quasi-cyclic LDPC code, which can be written as:

$$Hb = \begin{bmatrix} hb_{11} & hb_{12} & hb_{13} & \dots & hb_{1N} \\ hb_{21} & hb_{22} & hb_{23} & \dots & hb_{2N} \\ \dots & \dots & \dots & & \dots \\ hb_{M1} & hb_{M2} & hb_{M3} & \dots & hb_{MN} \end{bmatrix}$$

The basic matrix Hb includes two types of elements: an element indicating an all-zero square matrix, and an element indicating a value of the cyclic shift of the identity matrix and generally represented by an integer within a range of 0 to (Z−1). The basic matrix Hb can be referred to as a basic check matrix or a shift value matrix or a permutation value matrix. In the basic matrix Hb, if the element indicating the all-zero matrix is replaced with "0", and other elements are replaced with "1", a template matrix of the quasi-cyclic LDPC code can be obtained. Therefore, the basis matrix of the quasi-cyclic LDPC code can be determined according to the template matrix of the quasi-cyclic LDPC code and a group of shift values (or coefficients). The number Z of dimensions of the basic permutation matrix or the all-zero square matrix can be defined as a lifting size/lifting size or an expansion factor.

In the practical quasi-cyclic LDPC encoding process, since multiple lifting sizes are required to support a flexible design of code lengths, and each lifting size corresponds to one basic matrix, a large number of basic matrices need to be stored. Therefore, in the quasi-cyclic LDPC encoding process, a basic matrix coefficient is required to support the basic matrices corresponding to the multiple lifting sizes. For example, one basic matrix coefficient is HbO and supports lifting sizes of Z0, Z1, Z2, and Z3. All element values of non-"−1" are divided by Zi to obtain remainders and rounded down proportionally to obtain the basic matrix of the quasi-cyclic LDPC code corresponding to the i-th lifting size Zi so that all the element values of non-"−1" are less than the lifting size. When the basic matrix corresponding to Zi is obtained, quasi-cyclic LDPC encoding can be performed on the information bit sequence to be encoded.

Therefore, a structured LDPC code can be uniquely determined by the basic check matrix Hb and the lifting size Z. For example, the basic matrix Hb (2 rows and 4 columns) corresponds to the lifting size z of 4 and is written as:

$$Hb = \begin{bmatrix} 0 & 1 & 0 & -1 \\ 2 & 1 & 2 & 1 \end{bmatrix}$$

The template matrix corresponding to the basic matrix Hb is written as:

$$BG = \begin{bmatrix} 1 & 1 & 1 & 0 \\ 1 & 1 & 1 & 1 \end{bmatrix}$$

The parity check matrix H obtained according to the basic matrix Hb and the lifting size Z is written as:

$$H = \left[\begin{array}{cccc|cccc|cccc|cccc} 1 & 0 & 0 & 0 & 0 & 1 & 0 & 0 & 1 & 0 & 0 & 0 & 0 & 0 & 0 & 0 \\ 0 & 1 & 0 & 0 & 0 & 0 & 1 & 0 & 0 & 1 & 0 & 0 & 0 & 0 & 0 & 0 \\ 0 & 0 & 1 & 0 & 0 & 0 & 0 & 1 & 0 & 0 & 1 & 0 & 0 & 0 & 0 & 0 \\ 0 & 0 & 0 & 1 & 1 & 0 & 0 & 0 & 0 & 0 & 0 & 1 & 0 & 0 & 0 & 0 \\ \hline 0 & 0 & 1 & 0 & 0 & 1 & 0 & 0 & 0 & 0 & 1 & 0 & 0 & 1 & 0 & 0 \\ 0 & 0 & 0 & 1 & 0 & 0 & 1 & 0 & 0 & 0 & 0 & 1 & 0 & 0 & 1 & 0 \\ 1 & 0 & 0 & 0 & 0 & 0 & 0 & 1 & 1 & 0 & 0 & 0 & 0 & 0 & 0 & 1 \\ 0 & 1 & 0 & 0 & 1 & 0 & 0 & 0 & 0 & 1 & 0 & 0 & 1 & 0 & 0 & 0 \end{array}\right]$$

To gain good decoding performance of the quasi-cyclic LDPC code, concepts of a girth and a short circle are to be introduced. A circle length of 4 is defined as follows: if 4 positive integer values {a0, a1, b0, b1} correspond to the elements Hb(a0, b0), Hb(a0, b1), Hb(a1, b0), and Hb(a1, b1) in the basic matrix and these elements are all elements of non-"−1", the basic matrix has a short circle of length 4. Similarly, if 6 positive integer values {a0, a1, a2, b0, b1, b2} correspond to the elements Hb(a0, b0), Hb(a0, b1), Hb(a1, b1), Hb(a1, b2), Hb(a2, b2), and Hb(a2, b0) in the basic matrix and these elements are all the elements of non-"−1", the basic matrix has a short circle of length 6. Similarly, if 8 positive integer values {a0, a1, a2, a3, b0, b1, b2, b3} correspond to the elements Hb(a0, b0), Hb(a0, b1), Hb(a1, b1), Hb(a1, b2), Hb(a2, b2), Hb(a2, b3), Hb(a3, b2), and Hb(a3, b0) in the basic matrix and these elements are all the elements of non-"−1", the basic matrix has a short circle of length 8. In the same manner, short circles of lengths 10, 12 and the like of the basic matrix can be defined. The girth is defined as follows: if at least one of all the short circles of length 4 in the basic matrix satisfies mod(Hb(a0, b0)−Hb(a0, b1)+Hb(a1, b1)−Hb(a1, b0), Z)=0, it is considered that the parity check matrix determined according to the basic matrix and the lifting size Z has a girth of 4. If all the short circles of length 4 satisfy mod (Hb(a0, b0)−Hb(a0, b1)+Hb(a1, b1)−Hb(a1, b0), Z)≠0, and at least one short circle of length 6 satisfies mod(Hb(a0, b0)−Hb(a0, b1)+Hb(a1, b1)−Hb(a1, b2)+Hb(a2, b2)−Hb(a2, b0), Z)=0, it is defined that the parity check matrix determined according to the basic matrix and the lifting size Z has a girth of 6. Similarity, if short circles with the girth of 4 and the girth of 6 do not exist, and at least one short circle of length 8 satisfies mod(Hb(a0, b0)−Hb(a0, b1)+Hb(a1, b1)−Hb(a1, b2)+Hb(a2, b2)−Hb(a2, b3)+Hb(a3, b3)−Hb(a3, b0), Z)=0, it is defined that the parity check matrix determined according to the basic matrix and the lifting size Z has a girth of 8. The calculation formula mod(x1, x2) means a modulo operation of x1 by x2, for example, mod(10, 3)=1. Taking the basic matrix in the above example as an example, it can be seen that the parity matrix determined according to the basic matrix and the lifting size has the girth of 4 because a short circle with the girth of 4 exists for the four elements determined according to {a0, a1, b0, b1}={1, 2, 1, 3} satisfy mod(Hb(a0, b0)−Hb(a0, b1)+Hb(a1, b1)−Hb(a1, b0), Z)=0. For the quasi-cyclic LDPC encoding, if the parity check matrix determined according to the basic matrix and the lifting size has a larger girth, the LDPC codeword has a more random characteristic, better performance, and a larger minimum code distance so that an error floor is more unlikely to occur. Therefore, in the design process of the LDPC code, much importance is attached to the girth characteristic of the basic matrix of the quasi-cyclic LDPC code, and the performance of the quasi-cyclic LDPC encoding can be basically determined according to the girth characteristic of the basic matrix. However, it is more difficult to design the basic matric of the quasi-cyclic LDPC code with a larger girth.

From the above-mentioned parity check matrix of the LDPC code, it can be known that indexes of elements equal to 1 in the first row of the parity check matrix are [1 6 9], indicating that in the structured LDPC code, the first bit, the sixth bit, and the ninth bit constitute one parity check code. Similarly, indexes of elements equal to 1 in the second row are [2 7 10], indicating that the second bit, the seventh bit, and the tenth bit constitute one parity check code. In the same manner, it can be known that the LDPC code is practically a codeword with a large number of parity check codes piled up. According to the above-mentioned definition of the quasi-cyclic LDPC encoding, since each row of the parity check matrix corresponds to one parity check code, the number of rows of the parity check matrix must be equal to the number of check columns of the parity check matrix so that effective encoding can be performed. In the parity check matrix described above, the first 8 (2×Z=2×4) columns are system columns of the parity check matrix, and the last 8 (2×Z=2×4) columns are the check columns of the parity check matrix. Similarly, in the basic matrix, the number of rows of the basic matrix is equal to the number of check columns of the basic matrix. In the basic matrix of the quasi-cyclic LDPC code in the above-mentioned example, the first 2 columns are system columns, and the last two columns are check columns. The number of rows of the basic matrix is exactly equal to the number of check columns of the basic matrix. The quasi-cyclic LDPC encoding can be directly performed according to the parity check matrix determined according to the basic matrix Hb and the lifting size Z. According to the definition of the LDPC code, H×C=0; the parity check matrix H includes [Hs Hp], where Hs is a partial matrix of system columns of the parity check matrix and Hp is a partial matrix of check columns of the parity check matrix; the LDPC codeword C can include [Cs Cp], where Cs is a system bit sequence (information bits, known bits) of the LDPC code and Cp is a check bit sequence (unknown bits) of the LDPC code. The LDPC encoding process is a process for calculating the check bit sequence. According to H×C=0, Hs×Cs=Hp×Cp can be obtained and then the check bit sequence can be calculated as Cp=Hp−1×Hs×Cs. Therefore, the partial matrix of check columns of the parity check matrix must be a square matrix and binary reversible so that a quasi-cyclic LDPC encoded sequence is [Cs Cp], Of course, the quasi-cyclic LDPC encoded sequence can also be obtained through the cyclic shift of all the Z-bit blocks.

Layered decoding, that is, a row parallel decoding method, is generally used for LDPC decoding. The row parallel decoding method can greatly reduce the number of iterations and requires about half the number of iterations of flooding decoding. The parity check matrix described above of the structured LDPC code has 8 rows (the expansion factor Z=4 and the basic matrix has 2 rows and 4 columns), indicating the existence of 8 parity check codes or 8 check equations. In the decoding process, each parity check code needs to be decoded, and it requires an iteration to update data for all the 8 parity check codes. When all or part of the rows in the layered decoding process are decoded in parallel, if the parallelism is p in each iteration (p parity check codes are simultaneously updated), the current p parity check codes and the next p parity check codes in the iteration process are updated by the same update module (parity check code update module). In this way, the decoder has much lower complexity, and the currently updated data can be used for updating data at the next layer in the layered decoding process. Therefore, a smaller number of iterations are required and higher decoding throughput is gained. For H shown above, if the parallelism is 2, two parity check codes in every 4 rows of the parity check matrix (corresponding to one row of the basic check matrix) are simultaneously updated.

Therefore, in the quasi-cyclic LDPC encoding design, the design of the basic matrix is very important. A bad design can result in very poor quasi-cyclic LDPC encoding performance and the error floor. No effective solution has been provided for difficulties in designing the basic matrix such as poor performance of the quasi-cyclic LDPC code.

SUMMARY

Embodiments of the present invention provide a design method and apparatus for quasi-cyclic low-density parity-check encoding, and a computer storage medium to solve at least the problem in the related art of poor performance of a quasi-cyclic LDPC code.

An embodiment of the present invention provides a design method for quasi-cyclic low-density parity-check (LDPC) encoding. The method includes: performing LDPC encoding on a K-bit information sequence to be encoded according to a parity check matrix of a quasi-cyclic LDPC code to obtain an N-bit LDPC encoded sequence, where the parity check matrix is determined according to a basic matrix and a lifting size Z, and the basic matrix is determined according to the lifting size Z and a coefficient matrix, where K is a positive integer, N is an integer greater than K, and Z is a positive integer.

Another embodiment of the present invention provides a design apparatus for quasi-cyclic LDPC encoding. The apparatus includes a quasi-cyclic LDPC encoding module. The quasi-cyclic LDPC encoding module is configured to perform LDPC encoding on a K-bit information sequence to be encoded according to a parity check matrix of a quasi-cyclic LDPC code to obtain an N-bit LDPC encoded sequence, where the parity check matrix is determined according to a basic matrix and a lifting size Z, and the basic matrix is determined according to the lifting size Z and a coefficient matrix, where K is a positive integer, N is an integer greater than K, and Z is a positive integer.

Another embodiment of the present invention further provides a storage medium which is configured to store program codes for executing a step described below.

LDPC encoding is performed on a K-bit information sequence to be encoded according to a parity check matrix of a quasi-cyclic LDPC code to obtain an N-bit LDPC encoded sequence.

The parity check matrix is determined according to a basic matrix and a lifting size Z, and the basic matrix is determined according to the lifting size Z and a coefficient matrix, where K is a positive integer, N is an integer greater than K, and Z is a positive integer.

In the embodiments of the present invention, the LDPC encoding is performed on the K-bit information sequence to be encoded according to the parity check matrix of the quasi-cyclic LDPC code, where the parity check matrix is determined according to the basic matrix and the lifting size Z, and the basic matrix is determined according to the lifting size Z and the coefficient matrix. The present invention solves the problem in the related art of poor performance of the quasi-cyclic LDPC code and effectively improves quasi-cyclic LDPC encoding performance.

BRIEF DESCRIPTION OF DRAWINGS

The drawings described herein are used to provide a further understanding of the present invention and form a part of the present application. The exemplary embodiments and descriptions thereof in the present invention are used to explain the present invention and not to limit the present invention in any improper way. In the drawings.

DETAILED DESCRIPTION

The present invention will be described hereinafter in detail with reference to the drawings in conjunction with the embodiments. It is to be noted that if not in collision, the embodiments and features therein in the present application may be combined with each other.

It is to be noted that the terms "first", "second" and the like in the description, claims and drawings of the present invention are used to distinguish between similar objects and are not necessarily used to describe a particular order or sequence.

Embodiment 1

Figure 1:
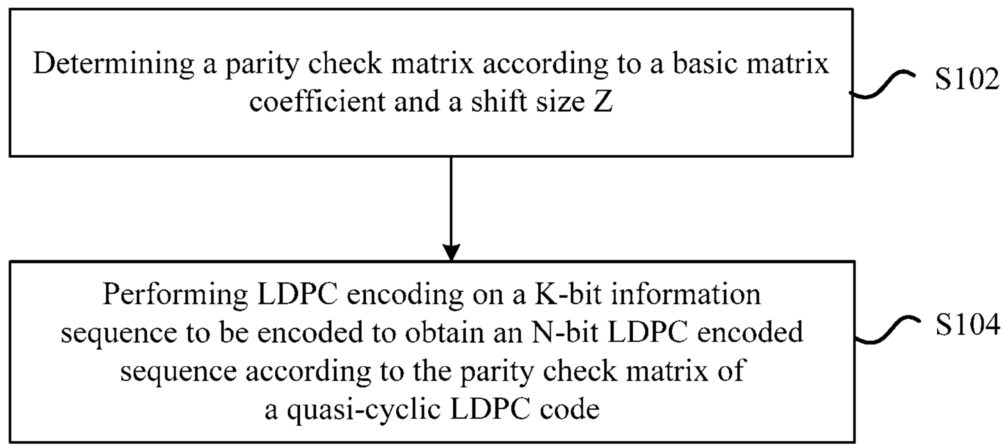
FIG. 1 is a flowchart of a design method for quasi-cyclic low-density parity-check encoding according to an embodiment of the present invention.

This embodiment provides a design method for quasi-cyclic low-density parity-check encoding. FIG. 1 is a flowchart of a design method for quasi-cyclic low-density parity-check encoding according to an embodiment of the present invention. As shown in FIG. 1, the process of the method includes steps described below.

In step S102, a parity check matrix is determined according to a basic matrix coefficient and a lifting size Z.

In step S104, according to the parity check matrix of a quasi-cyclic low-density parity-check (LDPC) code, LDPC encoding is performed on a K-bit information sequence to be encoded to obtain an N-bit LDPC encoded sequence.

K is a positive integer, N is an integer greater than K, and Z is a positive integer.

In the above steps, the LDPC encoding is performed on the K-bit information sequence to be encoded according to the parity check matrix of the quasi-cyclic LDPC code, where the parity check matrix is determined according to a basic matrix and the lifting size Z, and the basic matrix is determined according to the lifting size Z and a coefficient matrix. The method solves the problem in the related art of poor performance of the quasi-cyclic LDPC code and effectively improves quasi-cyclic LDPC encoding performance.

Optionally, a lifting size set Zset exists in this embodiment. The lifting size Z is an element in the lifting size set Zset, an i-th lifting size subset among A lifting size subsets is denoted as Zseti (i=1, 2, 3, . . . , A), all elements in the A lifting size subsets constitute the lifting size set Zset, and the A lifting size subsets have no common elements. A coefficient matrix set exists. The coefficient matrix is a coefficient matrix in the coefficient matrix set, and all lifting sizes supported by an i-th coefficient matrix in the coefficient matrix set constitute the i-th lifting size subset Zseti. The coefficient matrix set includes A coefficient matrices, where A is an integer greater than 1. The A coefficient matrices have a same number of rows, a same number of columns, and same positions at which elements of non-"−1" are disposed. All elements in the lifting size set Zset are positive integers.

Optionally, all lifting sizes corresponding to parity check matrices with a girth greater than or equal to 6 of all basic matrices determined by each lifting size in the lifting size set Zset and the i-th coefficient matrix in the coefficient matrix set constitute a set Z0seti. The set Z0seti includes a number L0i of elements which belong to the i-th lifting size subset Zseti and a number L1i of elements which do not belong to the i-th lifting size subset Zseti, where L0i is a positive integer less than or equal to Li, Li is a number of elements in the i-th lifting size subset Zseti, and L1i≥2, L1i≥3, L1i≥4, L1i≥5, L1i≥6, L1i≥7, L1i≥8, L1i≥9, L1i≥10, or L1i≥11.

Optionally, a first coefficient matrix set (e.g., including the template matrix) exists. All coefficient matrices in the first coefficient matrix set have the same number of rows. All the coefficient matrices have the same number of columns as well. Any coefficient matrix in the first coefficient matrix set has the same number of rows and the same number of columns as the A coefficient matrices in the coefficient matrix set.

Optionally, the coefficient matrix set at least includes one coefficient matrix in the first coefficient matrix set. That is, the coefficient matrix set and the first coefficient matrix set share at least one coefficient matrix.

Optionally, the coefficient matrix set at least includes one adjusted coefficient matrix obtained by adjusting one coefficient matrix in the first coefficient matrix set.

Optionally, all elements of non-"−1" among a first element to an (kb+M)-th element in an s-th row of the adjusted coefficient matrix are equal to all integers obtained from a modulo calculation of all respective elements of non-"−1" among a first element to an (kb+M)-th element in an s-th row of an original coefficient matrix plus Rs by Zmax, where s=1, 2, 3, . . . , row, Rs is an integer to be added corresponding to the s-th row, and at least one of R0, R1, . . . , R(row) is a non-zero integer. Alternatively, all elements of non-"−1" among a first element to a row-th element in a t-th column of the adjusted coefficient matrix are equal to all integers obtained from a modulo calculation of all respective elements of non-"−1" among a first element to a row-th element in a t-th column of the original coefficient matrix plus Ct by Zmax; where t=1, 2, 3, . . . , col, Ct is an integer to be added corresponding to the t-th column, and at least one of C0, C1, . . . , C(col) is a non-zero integer, row is a number of rows of the coefficient matrix, col is a number of columns of the coefficient matrix, kb is equal to a difference between col and row, M is a non-negative integer less than 10, Zmax a maximum lifting size supported by the adjusted coefficient matrix, and Zmax is a positive integer.

Optionally, an element in an s-th row and a t-th column of the adjusted coefficient matrix is equal to an integer obtained from a modulo calculation result of an element in an s-th row and a t-th column of the original coefficient matrix plus (Xs+Yt) by Zmax. The element in the s-th row and the t-th column of the original coefficient matrix is an element of non-"−1", s=1, 2, 3, . . . , row, t=1, 2, 3, . . . , kb+M, kb is the difference between col and row, row is the number of rows of the coefficient matrix, col is the number of columns of the coefficient matrix, M is a non-negative integer less than 10, both Xs and Yt are integers, and at least one of X0, X1, . . . , X(row) and Y0, Y1, . . . , Y(kb+M) is a non-zero integer. Adding a same integer to all elements of non-"−1" in a same row and/or a same column of the coefficient matrix is equivalent to interleaving the quasi-cyclic LDPC code, which does not affect a girth characteristic and a code distance characteristic of the quasi-cyclic LDPC code and thus has no influence on performance of the quasi-cyclic LDPC code. The beneficial effects obtained by adding the same integer to all the elements of non-"−1" in the row or column are described as follows: the basic matrix of the quasi-cyclic LDPC code has certain characteristics, for example, many zero elements are equivalent to preforming no cyclic shift on the basic matrix, which may reduce encoding and decoding complexity and has no influence on decoding performance; and in certain cases, the performance of the quasi-cyclic LDPC code may be improved, for example, when an LDPC encoded sequence which is an integer multiple of the lifting size Z is not completely selected in a bit selection process, the same integer with better performance may be selected to adjust the LDPC encoded sequence according to different interleaving cases.

Optionally, A is equal to 8, and the 8 lifting size subsets are respectively Zset1={2, 4, 8, 16, 32, 64, 128, 256}, Zset2={3, 6, 12, 24, 48, 96, 192}, Zset3={5, 10, 20, 40, 80, 160}, Zset4={7, 14, 28, 56, 112, 224}, Zset5={9, 18, 36, 72, 144}, Zset6={11, 22, 44, 88, 176}, Zset7={13, 26, 52, 104, 208}, and Zset8={15, 30, 60, 120, 240}.

Optionally, the set Z0seti are respectively Z0set1={56, 80, 104, 112, 120, 128, 160, 176, 192, 208, 224, 240, 256}, Z0set2={44, 48, 72, 88, 96, 144, 160, 176, 192, 208, 224, 240, 256}, Z0set3={60, 80, 120, 128, 160, 208, 224, 240, 256}, Z0set4={56, 60, 104, 112, 120, 128, 192, 208, 224, 240, 256}, Z0set5={72, 128, 144, 160, 176, 192, 224, 240, 256}, Z0set6={88, 96, 104, 128, 176, 192, 208, 224, 240, 256}, Z0set7={26, 52, 80, 104, 144, 160, 176, 192, 208, 224, 240}, and Z0set8={30, 60, 112, 120, 144, 160, 208, 224, 240, 256}.

Optionally, all lifting sizes corresponding to all basic matrices with the girth greater than or equal to 6 and corresponding to a quasi-cyclic LDPC encoding rate of Rate0 determined by the each lifting size in the lifting size set Zset and the i-th coefficient matrix in the coefficient matrix set constitute the set Z0seti, and all lifting sizes corresponding to all basic matrices with the girth greater than or equal to 6 and corresponding to a quasi-cyclic LDPC encoding rate of Rate1 determined by the each lifting size in the lifting size set Zset and the i-th coefficient matrix in the coefficient matrix set constitute a set Z0set1i, where Rate0 is less than Rate1, a number of elements in the set Z0set0i is less than or equal to a number of elements in the set Z0set1i, Rate0 and Rate1 are both real numbers greater than 0 and less than 1, and both the set Z0set0i and the set Z0set1i are non-empty sets.

Optionally, in one implementation mode, the first coefficient matrix set at least includes one of coefficient matrices of 42 rows and 52 columns described below.

A coefficient matrix 1 is written as:

159,104,59,79,–1,–1,53,–1,–1,121,0,0,–1,–1,–1,–1,–1,–1,–1,–1,–1,–1,–1,–1,–1,–1,–1,–1, –1,–1,–1,–1,–1,–1,–1,–1,–1,–1,–1,–1,–1,–1,–1,–1,–1,–1,–1,–1,–1,–1;

125,–1,–1,27,5,177,26,75,174,168,–1,0,0,–1,–1,–1,–1,–1,–1,–1,–1,–1,–1,–1,–1,–1,–1,–1, –1,–1,–1,–1,–1,–1,–1,–1,–1,–1,–1,–1,–1,–1,–1,–1,–1,–1,–1,–1,–1,–1;

198,165,–1,129,220,–1,–1,–1,15,–1,1,–1,0,0,–1,–1,–1,–1,–1,–1,–1,–1,–1,–1,–1,–1,–1,–1, –1,–1,–1,–1,–1,–1,–1,–1,–1,–1,–1,–1,–1,–1,–1,–1,–1,–1,–1,–1,–1,–1;

–1,235,185,–1,54,28,40,79,231,140,0,–1,–1,0,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1;

71,193,–1,–1,–1,–1,–1,–1,–1,–1,–1,127,–1,–1,0,–1,–1,–1,–1,–1,–1,–1,–1,–1,–1,–1,–1,–1, –1,–1,–1,–1,–1,–1,–1,–1,–1,–1,–1,–1,–1,–1,–1,–1,–1,–1,–1,–1,–1,–1;

251,211,–1,–1,–1,3,–1,52,–1,–1,–1,221,–1,–1,–1,0,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1;

159,–1,–1,–1,–1,100,–1,180,–1,177,–1,228,–1,–1,–1,–1,0,–1,–1,–1,–1,–1,–1,–1,–1,–1,–1,–1,–1, –1,–1,–1,–1,–1,–1,–1,–1,–1,–1,–1,–1,–1,–1,–1,–1,–1,–1,–1,–1,–1,–1;

–1,79,–1,–1,–1,225,–1,2,–1,–1,–1,180,–1,200,–1,–1,–1,0,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1;

89,47,–1,–1,–1,–1,–1,–1,–1,–1,–1,–1,247,–1,–1,–1,–1,–1,0,–1,–1,–1,–1,–1,–1,–1,–1,–1,–1,–1, –1,–1,–1,–1,–1,–1,–1,–1,–1,–1,–1,–1,–1,–1,–1,–1,–1,–1,–1,–1,–1,–1;

–1,43,–1,–1,–1,–1,–1,–1,10,–1,10,223,–1,–1,–1,–1,–1,–1,–1,0,–1,–1,–1,–1,–1,–1,–1,–1,–1,–1, –1,–1,–1,–1,–1,–1,–1,–1,–1,–1,–1,–1,–1,–1,–1,–1,–1,–1,–1,–1,–1,–1;

180,81,–1,–1,–1,–1,9,202,–1,–1,–1,–1,–1,–1,–1,–1,–1,–1,–1,–1,0,–1,–1,–1,–1,–1,–1,–1,–1,–1,–1, –1,–1,–1,–1,–1,–1,–1,–1,–1,–1,–1,–1,–1,–1,–1,–1,–1,–1,–1,–1,–1;

220,–1,–1,–1,–1,–1,–1,112,–1,30,–1,–1,–1,25,–1,–1,–1,–1,–1,–1,–1,0,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1;

–1,101,–1,39,–1,–1,–1,–1,–1,–1,–1,118,–1,–1,–1,–1,–1,–1,–1,–1,–1,–1,0,–1,–1,–1,–1,–1,–1,–1,–1, –1,–1,–1,–1,–1,–1,–1,–1,–1,–1,–1,–1,–1,–1,–1,–1,–1,–1,–1,–1,–1;

126,41,–1,–1,–1,–1,–1,–1,99,–1,–1,–1,–1,247,–1,–1,–1,–1,–1,–1,–1,–1,–1,0,–1,–1,–1,–1,–1,–1,–1,–1,–1,–1,–1,–1,–1,–1,–1,–1,–1,–1,–1,–1,–1,–1,–1,–1,–1,–1,–1,–1;

–1,41,–1,–1,–1,–1,0,–1,–1,–1,–1,0,–1,243,–1,–1,–1,–1,–1,–1,–1,–1,–1,–1,0,–1,–1,–1,–1,–1,–1,–1, –1,–1,–1,–1,–1,–1,–1,–1,–1,–1,–1,–1,–1,–1,–1,–1,–1,–1,–1,–1,–1;

96,–1,–1,–1,–1,–1,–1,–1,–1,–1,143,70,–1,–1,–1,–1,–1,–1,–1,–1,–1,–1,–1,–1,–1,0,–1,–1,–1,–1,–1, –1,–1,–1,–1,–1,–1,–1,–1,–1,–1,–1,–1,–1,–1,–1,–1,–1,–1,–1,–1,–1;

–1,255,–1,–1,–1,–1,–1,–1,–1,209,–1,162,129,–1,–1,–1,–1,–1,–1,–1,–1,–1,–1,–1,–1,–1,0,–1,–1,–1,–1,–1,–1,–1,–1,–1,–1,–1,–1,–1,–1,–1,–1,–1,–1,–1,–1,–1,–1,–1,–1,–1,–1;

–1,77,–1,–1,–1,41,–1,–1,–1,–1,–1,42,28,–1,–1,–1,–1,–1,–1,–1,–1,–1,–1,–1,–1,–1,–1,0,–1,–1,–1,–1,–1,–1,–1,–1,–1,–1,–1,–1,–1,–1,–1,–1,–1,–1,–1,–1,–1,–1,–1,–1;

37,–1,–1,–1,–1,–1,158,100,–1,–1,–1,–1,–1,–1,–1,–1,–1,–1,–1,–1,–1,–1,–1,–1,–1,–1,–1,0,–1,–1, –1,–1,–1,–1,–1,–1,–1,–1,–1,–1,–1,–1,–1,–1,–1,–1,–1,–1,–1,–1,–1,–1;

201,213,–1,–1,–1,–1,–1,–1,–1,–1,198,–1,–1,–1,–1,–1,–1,–1,–1,–1,–1,–1,–1,–1,–1,–1,–1,–1,0,–1,–1,–1,–1,–1,–1,–1,–1,–1,–1,–1,–1,–1,–1,–1,–1,–1,–1,–1,–1,–1,–1,–1;

–1,233,–1,–1,242,–1,–1,–1,–1,–1,–1,98,–1,–1,–1,–1,–1,–1,–1,–1,–1,–1,–1,–1,–1,–1,–1,–1,–1,0, –1,–1,–1,–1,–1,–1,–1,–1,–1,–1,–1,–1,–1,–1,–1,–1,–1,–1,–1,–1,–1,–1;

250,–1,–1,–1,–1,–1,–1,–1,44,–1,–1,–1,–1,202,–1,–1,–1,–1,–1,–1,–1,–1,–1,–1,–1,–1,–1,–1,–1,–1,0,–1,–1,–1,–1,–1,–1,–1,–1,–1,–1,–1,–1,–1,–1,–1,–1,–1,–1,–1,–1,–1;

–1,144,61,–1,–1,–1,–1,–1,–1,–1,–1,–1,–1,–1,–1,–1,–1,–1,–1,–1,–1,–1,–1,–1,–1,–1,–1,–1,–1,–1, –1,0,–1,–1,–1,–1,–1,–1,–1,–1,–1,–1,–1,–1,–1,–1,–1,–1,–1,–1,–1,–1;

153,–1,–1,224,–1,243,–1,–1,–1,–1,–1,–1,–1,–1,–1,–1,–1,–1,–1,–1,–1,–1,–1,–1,–1,–1,–1,–1,–1, –1,–1,–1,0,–1,–1,–1,–1,–1,–1,–1,–1,–1,–1,–1,–1,–1,–1,–1,–1,–1,–1,–1;

–1,221,230,–1,–1,–1,–1,–1,–1,250,–1,–1,–1,–1,–1,–1,–1,–1,–1,–1,–1,–1,–1,–1,–1,–1,–1,–1,–1, –1,–1,–1,–1,0,–1,–1,–1,–1,–1,–1,–1,–1,–1,–1,–1,–1,–1,–1,–1,–1,–1,–1;

171,–1,–1,–1,–1,106,–1,–1,–1,–1,–1,–1,–1,–1,–1,–1,–1,–1,–1,–1,–1,–1,–1,–1,–1,–1,–1,–1,–1,–1,–1,–1,–1,–1,–1,0,–1,–1,–1,–1,–1,–1,–1,–1,–1,–1,–1,–1,–1,–1,–1,–1;

–1,–1,218,–1,–1,–1,–1,7,–1,–1,–1,–1,253,26,–1,–1,–1,–1,–1,–1,–1,–1,–1,–1,–1,–1,–1,–1,–1,–1, –1,–1,–1,–1,–1,0,–1,–1,–1,–1,–1,–1,–1,–1,–1,–1,–1,–1,–1,–1,–1,–1;

61,–1,–1,–1,–1,–1,251,–1,–1,–1,–1,–1,–1,–1,–1,–1,–1,–1,–1,–1,–1,–1,–1,–1,–1,–1,–1,–1,–1,–1,–1,–1,–1,–1,–1,–1,0,–1,–1,–1,–1,–1,–1,–1,–1,–1,–1,–1,–1,–1,–1,–1;

–1,20,16,–1,–1,26,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,0,–1,–1,–1,–1,–1,–1,–1,–1,–1,–1,–1,–1,–1,–1;

23,–1,–1,–1,163,–1,–1,–1,–1,–1,–1,–1,–1,–1,–1,–1,–1,–1,–1,–1,–1,–1,–1,–1,–1,–1,–1,–1,–1,–1, –1,–1,–1,–1,–1,–1,–1,0,–1,–1,–1,–1,–1,–1,–1,–1,–1,–1,–1,–1,–1,–1;

–1,–1,137,–1,–1,160,–1,18,–1,130,–1,–1,–1,–1,–1,–1,–1,–1,–1,–1,–1,–1,–1,–1,–1,–1,–1,–1,–1, –1,–1,–1,–1,–1,–1,–1,–1,–1,–1,0,–1,–1,–1,–1,–1,–1,–1,–1,–1,–1,–1,–1;

–1,94,–1,–1,–1,–1,–1,–1,–1,–1,–1,–1,–1,165,–1,–1,–1,–1,–1,–1,–1,–1,–1,–1,–1,–1,–1,–1,–1,–1, –1,–1,–1,–1,–1,–1,–1,–1,–1,–1,0,–1,–1,–1,–1,–1,–1,–1,–1,–1,–1,–1;

109,–1,–1,–1,–1,46,–1,–1,–1,–1,–1,–1,134,–1,–1,–1,–1,–1,–1,–1,–1,–1,–1,–1,–1,–1,–1,–1,–1,–1,–1,–1,–1,–1,–1,–1,–1,–1,–1,–1,–1,0,–1,–1,–1,–1,–1,–1,–1,–1,–1,–1;

–1,–1,25,–1,–1,–1,–1,152,–1,–1,195,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,0,–1,–1,–1,–1,–1,–1,–1,–1,–1;

25,−1,−1,−1,−1,−1,−1,−1,−1,−1,−1,40,164,−1,−1,−1,−1,−1,−1,−1,−1,−1,−1,−1,−1,−1,−1,−1,−1, −1,−1,−1,−1,−1,−1,−1,−1,−1,−1,−1,−1,−1,0,−1,−1,−1,−1,−1,−1,−1;

−1,155,−1,−1,−1,182,−1,−1,−1,−1,−1,91,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1,0,−1,−1,−1,−1,−1,−1;

89,−1,214,−1,−1,−1,−1,186,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1,0,−1,−1,−1,−1,−1;

−1,−1,−1,−1,−1,−1,−1,−1,−1,−1,12,−1,−1,192,−1,−1,−1,−1,−1,−1,−1,−1,−1,−1,−1,−1,−1,−1,−1, −1,−1,−1,−1,−1,−1,−1,−1,−1,−1,−1,−1,−1,−1,−1,−1,0,−1,−1,−1,−1;

−1,87,−1,−1,−1,132,−1,−1,−1,−1,−1,210,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1,0,−1,−1,−1;

204,−1,−1,−1,−1,−1,−1,198,−1,−1,−1,−1,57,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1,0,−1,−1;

−1,−1,54,−1,−1,−1,−1,−1,−1,175,−1,−1,64,−1,−1,−1,−1,−1,−1,−1,−1,−1,−1,−1,−1,−1,−1,−1,−1, −1,−1,−1,−1,−1,−1,−1,−1,−1,−1,−1,−1,−1,−1,−1,−1,−1,−1,−1,0,−1;

−1,168,−1,−1,−1,135,−1,−1,−1,−1,−1,84,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1,0.

A coefficient matrix 2 is written as:

32,166,160,29,−1,−1,73,−1,−1,127,0,0,−1,−1,−1,−1,−1,−1,−1,−1,−1,−1,−1,−1,−1,−1,−1,−1,−1, −1,−1,−1,−1,−1,−1,−1,−1,−1,−1,−1,−1,−1,−1,−1,−1,−1,−1,−1,−1,−1,−1;

173,−1,−1,191,49,40,33,19,136,54,−1,0,0,−1,−1,−1,−1,−1,−1,−1,−1,−1,−1,−1,−1,−1,−1,−1,−1,−1, −1,−1,−1,−1,−1,−1,−1,−1,−1,−1,−1,−1,−1,−1,−1,−1,−1,−1,−1,−1,−1,−1;

171,183,−1,176,15,−1,−1,−1,65,−1, 1,−1,0,0,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1;

−1,13,73,−1,18,20,125,142,75,141,0,−1,−1,0,−1,−1,−1,−1,−1,−1,−1,−1,−1,−1,−1,−1,−1,−1,−1,−1, −1,−1,−1,−1,−1,−1,−1,−1,−1,−1,−1,−1,−1,−1,−1,−1,−1,−1,−1,−1,−1,−1;

74,191,−1,−1,−1,−1,−1,−1,−1,−1,−1,173,−1,−1,0,−1,−1,−1,−1,−1,−1,−1,−1,−1,−1,−1,−1,−1,−1,−1, −1,−1,−1,−1,−1,−1,−1,−1,−1,−1,−1,−1,−1,−1,−1,−1,−1,−1,−1,−1,−1,−1;

12,65,−1,−1,−1,21,−1,152,−1,−1,−1,96,−1,−1,−1,0,−1,−1,−1,−1,−1,−1,−1,−1,−1,−1,−1,−1,−1,−1, −1,−1,−1,−1,−1,−1,−1,−1,−1,−1,−1,−1,−1,−1,−1,−1,−1,−1,−1,−1,−1,−1;

3 5,−1,−1,−1,−1,88,−1,28,−1,67,−1,40,−1,−1,−1,−1,0,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1;

−1,5,−1,−1,−1,86,−1,88,−1,−1,−1,54,−1,95,−1,−1,−1,0,−1,−1,−1,−1,−1,−1,−1,−1,−1,−1,−1,−1,−1, −1,−1,−1,−1,−1,−1,−1,−1,−1,−1,−1,−1,−1,−1,−1,−1,−1,−1,−1,−1,−1,−1;

72,43,−1,−1,−1,−1,−1,−1,−1,−1,−1,−1,−1,56,−1,−1,−1,−1,0,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1;

−1,1,−1,−1,−1,−1,−1,−1,124,−1,185,82,−1,−1,−1,−1,−1,−1,−1,0,−1,−1,−1,−1,−1,−1,−1,−1,−1,−1,−1, −1,−1,−1,−1,−1,−1,−1,−1,−1,−1,−1,−1,−1,−1,−1,−1,−1,−1,−1,−1,−1;

109,173,−1,−1,−1,−1,168,76,−1,−1,−1,−1,−1,−1,−1,−1,−1,−1,−1,−1,0,−1,−1,−1,−1,−1,−1,−1,−1,−1, −1,−1,−1,−1,−1,−1,−1,−1,−1,−1,−1,−1,−1,−1,−1,−1,−1,−1,−1,−1,−1,−1;

34,−1,−1,−1,−1,−1,−1,164,−1,24,−1,−1,−1,106,−1,−1,−1,−1,−1,−1,−1,0,−1,−1,−1,−1,−1,−1,−1,−1,−1,−1,−1,−1,−1,−1,−1,−1,−1,−1,−1,−1,−1,−1,−1,−1,−1,−1,−1,−1,−1;

−1,60,−1,56,−1,−1,−1,−1,−1,−1,−1,107,−1,−1,−1,−1,−1,−1,−1,−1,−1,−1,0,−1,−1,−1,−1,−1,−1,−1,−1, −1,−1,−1,−1,−1,−1,−1,−1,−1,−1,−1,−1,−1,−1,−1,−1,−1,−1,−1,−1,−1,−1;

3,2,−1,−1,−1,−1,−1,−1,28,−1,−1,−1,−1,166,−1,−1,−1,−1,−1,−1,−1,−1,−1,0,−1,−1,−1,−1,−1,−1,−1,−1, −1,−1,−1,−1,−1,−1,−1,−1,−1,−1,−1,−1,−1,−1,−1,−1,−1,−1,−1,−1,−1,−1;

−1,136,−1,−1,−1,−1,168,−1,−1,−1,−1,165,−1,19,−1,−1,−1,−1, −1,−1,−1,−1,−1,−1,−1,−1,−1,−1,−1,−1,−1,−1,−1,−1,−1,−1,−1,−1,−1,−1,−1;

166,−1,−1,−1,−1,−1,−1,−1,−1,−1,159,129,−1,−1,−1,−1,−1,−1,−1,−1,−1,−1,−1,−1,−1,0,−1,−1,−1,−1,−1,−1,−1,−1,−1,−1,−1,−1,−1,−1,−1,−1,−1,−1,−1,−1,−1,−1,−1,−1,−1,−1;

−1,60,−1,−1,−1,−1,−1,−1,−1,23,−1,135,160,−1,−1,−1,−1,−1,−1,−1,−1,−1,−1,−1,−1,−1,0,−1,−1,−1,−1,−1,−1,−1,−1,−1,−1,−1,−1,−1,−1,−1,−1,−1,−1,−1,−1,−1,−1,−1,−1,−1;

−1,35,−1,−1,−1,115,−1,−1,−1,−1,−1,9,102,−1,−1,−1,−1,−1,−1,−1,−1,−1,−1,−1,−1,−1,−1,0,−1,−1,−1, −1,−1,−1,−1,−1,−1,−1,−1,−1,−1,−1,−1,−1,−1,−1,−1,−1,−1,−1,−1;

140,−1,−1,−1,−1,−1,104,166,−1,−1,−1,−1,−1,−1,−1,−1,−1,−1,−1,−1,−1,−1,−1,−1,−1,−1,−1,0,−1,−1,−1,−1,−1,−1,−1,−1,−1,−1,−1,−1,−1,−1,−1,−1,−1,−1,−1,−1,−1,−1,−1,−1;

108,159,−1,−1,−1,−1,−1,−1,−1,−1,12,−1,−1,−1,−1,−1,−1,−1,−1,−1,−1,−1,−1,−1,−1,−1,−1,−1,0,−1, −1,−1,−1,−1,−1,−1,−1,−1,−1,−1,−1,−1,−1,−1,−1,−1,−1,−1,−1,−1,−1;

−1,145,−1,−1,62,−1,−1,−1,−1,−1,−1,153,−1,−1,−1,−1,−1,−1,−1,−1,−1,−1,−1,−1,−1,−1,−1,−1,−1,0, −1,−1,−1,−1,−1,−1,−1,−1,−1,−1,−1,−1,−1,−1,−1,−1,−1,−1,−1,−1,−1;

159,−1,−1,−1,−1,−1,−1,−1,100,−1,−1,−1,−1,19,−1,−1,−1,−1,−1,−1,−1,−1,−1,−1,−1,−1,−1,−1,−1,−1,0,−1,−1,−1,−1,−1,−1,−1,−1,−1,−1,−1,−1,−1,−1,−1,−1,−1,−1,−1,−1;

−1,89,46,−1,−1,−1,−1,−1,−1,−1,−1,−1,−1,−1,−1,−1,−1,−1,−1,−1,−1,−1,−1,−1,−1,−1,−1,−1,−1,−1,−1,0,−1,−1,−1,−1,−1,−1,−1,−1,−1,−1,−1,−1,−1,−1,−1,−1,−1,−1;

12,−1,−1,145,−1,187,−1,−1,−1,−1,−1,−1,−1,−1,−1,−1,−1,−1,−1,−1,−1,−1,−1,−1,−1,−1,−1,−1,−1,−1,−1,−1,0,−1,−1,−1,−1,−1,−1,−1,−1,−1,−1,−1,−1,−1,−1,−1,−1,−1,−1;

−1,11,99,−1,−1,−1,−1,−1,−1,58,−1,−1,−1,−1,−1,−1,−1,−1,−1,−1,−1,−1,−1,−1,−1,−1,−1,−1,−1,−1,−1,−1,0,−1,−1,−1,−1,−1,−1,−1,−1,−1,−1,−1,−1,−1,−1,−1,−1;

47,−1,−1,−1,−1,113,−1,−1,−1,−1,−1,−1,−1,−1,−1,−1,−1,−1,−1,−1,−1,−1,−1,−1,−1,−1,−1,−1,−1,−1, −1,−1,−1,−1,0,−1,−1,−1,−1,−1,−1,−1,−1,−1,−1,−1,−1,−1,−1,−1;

−11,109,−1,−1,−1,−1,161,−1,−1,−1,−1,55,37,−1,−1,−1,−1,−1,−1,−1,−1,−1,−1,−1,−1,−1,−1,−1,−1,−1,−1,−1,−1,−1,0,−1,−1,−1,−1,−1,−1,−1,−1,−1,−1,−1,−1,−1,−1;

105,−1,−1,−1,−1,−1,148,−1,−1,−1,−1,−1,−1,−1,−1,−1,−1,−1,−1,−1,−1,−1,−1,−1,−1,−1,−1,−1,−1,−1,−1,−1,−1,−1,−1,0,−1,−1,−1,−1,−1,−1,−1,−1,−1,−1,−1,−1,−1;

−1,91,57,−1,−1,68,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1,0,−1,−1,−1,−1,−1,−1,−1,−1,−1,−1,−1,−1;

112,−1,−1,−1,66,−1,−1,−1,−1,−1,−1,−1,−1,−1,−1,−1,−1,−1,−1,−1,−1,−1,−1,−1,−1,−1,−1,−1,−1,−1, −1,−1,−1,−1,−1,−1,−1,−1,0,−1,−1,−1,−1,−1,−1,−1,−1,−1,−1,−1;

−1,−1,162,−1,−1,6,−1,28,−1,87,−1,−1,−1,−1,−1,−1,−1,−1,−1,−1,−1,−1,−1,−1,−1,−1,−1,−1,−1,−1, −1,−1,−1,−1,−1,−1,−1,−1,−1,0,−1,−1,−1,−1,−1,−1,−1,−1,−1,−1;

−1,72,−1,−1,−1,−1,−1,−1,−1,−1,−1,−1,−1,74,−1,−1,−1,−1,−1,−1,−1,−1,−1,−1,−1,−1,−1,−1,−1,−1,−1,−1,−1,−1,−1,−1,−1,−1,−1,−1,0,−1,−1,−1,−1,−1,−1,−1,−1,−1;

38,−1,−1,−1,−1,100,−1,−1,−1,−1,−1,−1,17,−1,−1,−1,−1,−1,−1,−1,−1,−1,−1,−1,−1,−1,−1,−1,−1,−1, −1,−1,−1,−1,−1,−1,−1,−1,−1,−1,−1,0,−1,−1,−1,−1,−1,−1,−1,−1;

−1,−1,63,−1,−1,−1,−1,11,−1,−1,124,−1,−1,−1,−1,−1,−1,−1,−1,−1,−1,−1,−1,−1,−1,−1,−1,−1,−1,−1, −1,−1,−1,−1,−1,−1,−1,−1,−1,−1,−1,0,−1,−1,−1,−1,−1,−1,−1;

175,−1,−1,−1,−1,−1,−1,−1,−1,−1,−1,−1,129,60,−1,−1,−1,−1,−1,−1,−1,−1,−1,−1,−1,−1,−1,−1,−1,−1,−1,−1,−1,−1,−1,−1,−1,−1,−1,−1,−1,−1,−1,0,−1,−1,−1,−1,−1,−1;

−1,2,−1,−1,−1,132,−1,−1,−1,−1,−1,18,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1,0,−1,−1,−1,−1,−1;

75,–1,97,–1,–1,–1,–1,98,–1,–1,–1,–1,–1,–1,–1,–1,–1,–
1,–1,–1,–1,–1,–1,–1,–1,–1,–1,–1,–1,–1,–1,–1,–1,–1,–
1,–1,–1,–1,–1,–1,–1,–1,–1,–1,–1,0,–1,–1,–1,–1,–1;

–1,–1,–1,–1,–1,–1,–1,–1,–1,–1,85,–1,–1,127,–1,–1,–
1,–1,–1,–1,–1,–1,–1,–1,–1,–1,–1,–1,–1,–1,–1, –1,–1,–1,–
1,–1,–1,–1,–1,–1,–1,–1,–1,–1,–1,–1,–1,0,–1,–1,–1,–1;

–1,9,–1,–1,–1,99,–1,–1,–1,–1,–1,46,–1,–1,–1,–1,–1,–
1,–1,–1,–1,–1,–1,–1,–1,–1,–1,–1,–1,–1,–1,–1, –1,–1,–1,–
1,–1,–1,–1,–1,–1,–1,–1,–1,–1,–1,–1,–1,–1,0,–1,–1,–1;

95,–1,–1,–1,–1,–1,–1,12,–1,–1,–1,–1,57,–1,–1,–1,–1,–
1,–1,–1,–1,–1,–1,–1,–1,–1,–1,–1,–1,–1,–1,–1,–1,–1,–1,–
1,–1,–1,–1,–1,–1,–1,–1,–1,–1,–1,–1,–1,–1,0,–1,–1;

–1,–1,1,–1,–1,–1,–1,–1,–1,–1,107,–1,–1,67,–1,–1,–1,–
1,–1,–1,–1,–1,–1,–1,–1,–1,–1,–1,–1,–1,–1,–1,–1,–1,–1,–
1,–1,–1,–1,–1,–1,–1,–1,–1,–1,–1,–1,–1,–1,–1,0,–1;

–1,72,–1,–1,–1,147,–1,–1,–1,–1,–1,12,–1,–1,–1,–1,–1,–
1,–1,–1,–1,–1,–1,–1,–1,–1,–1,–1,–1,–1,–1,–1, –1,–1,–1,–1,–
1,–1,–1,–1,–1,–1,–1,–1,–1,–1,–1,–1,–1,–1,–1,–1,0.

A coefficient matrix 3 is written as:

148,75,108,47,–1,–1,27,–1,–1,33,0,0,–1,–1,–1,–1,–1,–
1,–1,–1,–1,–1,–1,–1,–1,–1,–1,–1,–1,–1,–1,–1,–1,–1,–1,–
1,–1,–1,–1,–1,–1,–1,–1,–1,–1,–1,–1,–1,–1,–1,–1,–1;

36,–1,–1,22,157,31,47,50,156,137,–1,0,0,–1,–1,–1,–1,–
1,–1,–1,–1,–1,–1,–1,–1,–1,–1,–1,–1,–1, –1,–1,–1,–1,–1,–
1,–1,–1,–1,–1,–1,–1,–1,–1,–1,–1,–1,–1,–1,–1,–1,–1,–1;

113,142,–1,120,61,–1,–1,–1,114,–1,1,–1,0,0,–1,–1,–1,–
1,–1,–1,–1,–1,–1,–1,–1,–1,–1,–1,–1,–1, –1,–1,–1,–1,–1,–
1,–1,–1,–1,–1,–1,–1,–1,–1,–1,–1,–1,–1,–1,–1,–1,–1;

–1,128,96,–1,99,132,36,65,104,63,0,–1,–1,0,–1,–1,–1,–
1,–1,–1,–1,–1,–1,–1,–1,–1,–1,–1,–1,–1,–1, –1,–1,–1,–1,–1,–
1,–1,–1,–1,–1,–1,–1,–1,–1,–1,–1,–1,–1,–1,–1,–1,–1,–1;

106,24,–1,–1,–1,–1,–1,–1,–1,–1,–1,92,–1,–1,0,–1,–1,–
1,–1,–1,–1,–1,–1,–1,–1,–1,–1,–1,–1,–1, –1,–1,–1,–1,–
1,–1,–1,–1,–1,–1,–1,–1,–1,–1,–1,–1,–1,–1,–1,–1;

48,92,–1,–1,–1,55,–1,119,–1,–1,–1,78,–1,–1,–1,0,–1,–
1,–1,–1,–1,–1,–1,–1,–1,–1,–1,–1,–1,–1, –1,–1,–1,–1,–
1,–1,–1,–1,–1,–1,–1,–1,–1,–1,–1,–1,–1,–1,–1,–1;

61,–1,–1,–1,–1,87,–1,73,–1,39,–1,102,–1,–1,–1,–1,0,–
1,–1,–1,–1,–1,–1,–1,–1,–1,–1,–1,–1,–1, –1,–1,–1,–1,–
1,–1,–1,–1,–1,–1,–1,–1,–1,–1,–1,–1,–1,–1,–1,–1;

–1,151,–1,–1,–1,137,–1,9,–1,–1,–1,135,–1,150,–1,–1,–
1,0,–1,–1,–1,–1,–1,–1,–1,–1,–1,–1,–1,–1, –1,–1,–1,–1,–
1,–1,–1,–1,–1,–1,–1,–1,–1,–1,–1,–1,–1,–1,–1,–1,–1;

146,31,–1,–1,–1,–1,–1,–1,–1,–1,–1,–1,104,–1,–1,–1,–
1,–1,0,–1,–1,–1,–1,–1,–1,–1,–1,–1,–1,–1,–1, –1,–1,–1,–
1,–1,–1,–1,–1,–1,–1,–1,–1,–1,–1,–1,–1,–1,–1,–1,–1;

–1,65,–1,–1,–1,–1,–1,–1,113,–1,1,75,–1,–1,–1,–1,–1,–
1,–1,0,–1,–1,–1,–1,–1,–1,–1,–1,–1,–1,–1,–1,–1,–1,–1,–
1,–1,–1,–1,–1,–1,–1,–1,–1,–1,–1,–1,–1,–1,–1,–1;

106,19,–1,–1,–1,–1,48,29,–1,–1,–1,–1,–1,–1,–1,–1,–1,–
1,–1,–1,0,–1,–1,–1,–1,–1,–1,–1,–1,–1,–1, –1,–1,–1,–1,–
1,–1,–1,–1,–1,–1,–1,–1,–1,–1,–1,–1,–1,–1,–1,–1;

132,–1,–1,–1,–1,–1,–1,82,–1,158,–1,–1,–1,22,–1,–1,–
1,–1,–1,–1,–1,0,–1,–1,–1,–1,–1,–1,–1,–1,–1,–1,–1,–1,–
1,–1,–1,–1,–1,–1,–1,–1,–1,–1,–1,–1,–1,–1,–1,–1,–1,–1;

–1,137,–1,108,–1,–1,–1,–1,–1,–1,–1,48,–1,–1,–1,–1,–
1,–1,–1,–1,–1,–1,0,–1,–1,–1,–1,–1,–1,–1,–1, –1,–1,–1,–
1,–1,–1,–1,–1,–1,–1,–1,–1,–1,–1,–1,–1,–1,–1,–1,–1,–1;

70,141,–1,–1,–1,–1,–1,–1,63,–1,–1,–1,–1,48,–1,–1,–1,–
1,–1,–1,–1,–1,–1,0,–1,–1,–1,–1,–1,–1,–1, –1,–1,–1,–1,–
1,–1,–1,–1,–1,–1,–1,–1,–1,–1,–1,–1,–1,–1,–1,–1,–1;

–1,61,–1,–1,–1,–1,51,–1,–1,–1,–1,48,–1,125,–1,–1,–1,–
1,–1,–1,–1,–1,–1,–1,0,–1,–1,–1,–1,–1,–1, –1,–1,–1,–1,–
1,–1,–1,–1,–1,–1,–1,–1,–1,–1,–1,–1,–1,–1,–1,–1,–1;

66,–1,–1,–1,–1,–1,–1,–1,–1,–1,1,94,–1,–1,–1,–1,–1,–
1,–1,–1,–1,–1,–1,–1,–1,0,–1,–1,–1,–1,–1,–1, –1,–1,–1,–
1,–1,–1,–1,–1,–1,–1,–1,–1,–1,–1,–1,–1,–1,–1,–1,–1;

–1,1,–1,–1,–1,–1,–1,–1,–1,59,–1,84,73,–1,–1,–1,–1,–
1,–1,–1,–1,–1,–1,–1,–1,–1,0,–1,–1,–1,–1,–1, –1,–1,–1,–
1,–1,–1,–1,–1,–1,–1,–1,–1,–1,–1,–1,–1,–1,–1,–1,–1;

–1,146,–1,–1,–1,41,–1,–1,–1,–1,–1,8,141,–1,–1,–1,–1,–
1,–1,–1,–1,–1,–1,–1,–1,–1,–1,0,–1,–1,–1, –1,–1,–1,–1,–
1,–1,–1,–1,–1,–1,–1,–1,–1,–1,–1,–1,–1,–1,–1,–1,–1;

52,–1,–1,–1,–1,–1,10,136,–1,–1,–1,–1,–1,–1,–1,–1,–1,–
1,–1,–1,–1,–1,–1,–1,–1,–1,–1,–1,0,–1,–1, –1,–1,–1,–1,–
1,–1,–1,–1,–1,–1,–1,–1,–1,–1,–1,–1,–1,–1,–1,–1,–1;

136,6,–1,–1,–1,–1,–1,–1,–1,–1,87,–1,–1,–1,–1,–1,–1,–
1,–1,–1,–1,–1,–1,–1,–1,–1,–1,–1,–1,0,–1,–1,–1,–1,–1,–
1,–1,–1,–1,–1,–1,–1,–1,–1,–1,–1,–1,–1,–1,–1,–1,–1;

–1,70,–1,–1,97,–1,–1,–1,–1,–1,–1,159,–1,–1,–1,–1,–1,–
1,–1,–1,–1,–1,–1,–1,–1,–1,–1,–1,–1,–1,0, –1,–1,–1,–1,–
1,–1,–1,–1,–1,–1,–1,–1,–1,–1,–1,–1,–1,–1,–1,–1,–1;

32,–1,–1,–1,–1,–1,–1,–1,115,–1,–1,–1,–1,78,–1,–1,–1,–
1,–1,–1,–1,–1,–1,–1,–1,–1,–1,–1,–1,–1,–1, 0,–1,–1,–1,–
1,–1,–1,–1,–1,–1,–1,–1,–1,–1,–1,–1,–1,–1,–1,–1,–1;

–1,55,136,–1,–1,–1,–1,–1,–1,–1,–1,–1,–1,–1,–1,–1,–
1,–1,–1,–1,–1,–1,–1,–1,–1,–1,–1,–1,–1,–1, –1,0,–1,–
1,–1,–1,–1,–1,–1,–1,–1,–1,–1,–1,–1,–1,–1,–1,–1,–1,–1;

88,–1,–1,92,–1,128,–1,–1,–1,–1,–1,–1,–1,–1,–1,–1,–1,–
1,–1,–1,–1,–1,–1,–1,–1,–1,–1,–1,–1,–1,–1, –1,–1,0,–1,–
1,–1,–1,–1,–1,–1,–1,–1,–1,–1,–1,–1,–1,–1,–1,–1,–1;

–1,42,88,–1,–1,–1,–1,–1,–1,32,–1,–1,–1,–1,–1,–1,–1,–
1,–1,–1,–1,–1,–1,–1,–1,–1,–1,–1,–1,–1,–1,–1,–1,0,–
1,–1,–1,–1,–1,–1,–1,–1,–1,–1,–1,–1,–1,–1,–1,–1,–1;

130,–1,–1,–1,–1,41,–1,–1,–1,–1,–1,–1,–1,–1,–1,–1,–
1,–1,–1,–1,–1,–1,–1,–1,–1,–1,–1,–1,–1,–1,–1, –1,–1,–1,–
1,0,–1,–1,–1,–1,–1,–1,–1,–1,–1,–1,–1,–1,–1,–1,–1,–1;

–1,–1,18,–1,–1,–1,–1,53,–1,–1,–1,–1,51,158,–1,–1,–1,–
1,–1,–1,–1,–1,–1,–1,–1,–1,–1,–1,–1,–1,–1, –1,–1,–1,–1,–
1,0,–1,–1,–1,–1,–1,–1,–1,–1,–1,–1,–1,–1,–1,–1,–1;

111,–1,–1,–1,–1,–1,151,–1,–1,–1,–1,–1,–1,–1,–1,–1,–
1,–1,–1,–1,–1,–1,–1,–1,–1,–1,–1,–1,–1,–1,–1,–1,–1,–1,–
1,–1,–1,0,–1,–1,–1,–1,–1,–1,–1,–1,–1,–1,–1,–1,–1,–1;

–1,59,49,–1,–1,88,–1,–1,–1,–1,–1,–1,–1,–1,–1,–1,–1,–
1,–1,–1,–1,–1,–1,–1,–1,–1,–1,–1,–1,–1,–1,–1,–1,–1,–1,–
1,–1,–1,0,–1,–1,–1,–1,–1,–1,–1,–1,–1,–1,–1,–1,–1;

106,–1,–1,–1,119,–1,–1,–1,–1,–1,–1,–1,–1,–1,–1,–1,–
1,–1,–1,–1,–1,–1,–1,–1,–1,–1,–1,–1,–1,–1,–1,–1,–1,–1,–
1,–1,–1,–1,–1,0,–1,–1,–1,–1,–1,–1,–1,–1,–1,–1,–1,–1;

–1,–1,38,–1,–1,28,–1,110,–1,10,–1,–1,–1,–1,–1,–1,–1,–
1,–1,–1,–1,–1,–1,–1,–1,–1,–1,–1,–1,–1,–1, –1,–1,–1,–1,–
1,–1,–1,–1,–1,0,–1,–1,–1,–1,–1,–1,–1,–1,–1,–1,–1;

–1,129,–1,–1,–1,–1,–1,–1,–1,–1,–1,–1,–1,5,–1,–1,–1,–
1,–1,–1,–1,–1,–1,–1,–1,–1,–1,–1,–1,–1,–1,–1,–1,–1,–1,–
1,–1,–1,–1,–1,–1,0,–1,–1,–1,–1,–1,–1,–1,–1,–1,–1;

22,–1,–1,–1,–1,134,–1,–1,–1,–1,–1,–1,115,–1,–1,–1,–
1,–1,–1,–1,–1,–1,–1,–1,–1,–1,–1,–1,–1,–1,–1,–1,–1,–1,–
1,–1,–1,–1,–1,–1,–1,–1,0,–1,–1,–1,–1,–1,–1,–1,–1,–1;

–1,–1,40,–1,–1,–1,–1,6,–1,–1,137,–1,–1,–1,–1,–1,–1,–
1,–1,–1,–1,–1,–1,–1,–1,–1,–1,–1,–1,–1,–1,–1,–1,–1,–1,–
1,–1,–1,–1,–1,–1,–1,–1,0,–1,–1,–1,–1,–1,–1,–1,–1;

97,–1,–1,–1,–1,–1,–1,–1,–1,–1,–1,–1,132,10,–1,–1,–1,–
1,–1,–1,–1,–1,–1,–1,–1,–1,–1,–1,–1,–1,–1, –1,–1,–1,–1,–
1,–1,–1,–1,–1,–1,–1,–1,–1,0,–1,–1,–1,–1,–1,–1,–1;

–1,10,–1,–1,–1,140,–1,–1,–1,–1,–1,70,–1,–1,–1,–1,–1,–
1,–1,–1,–1,–1,–1,–1,–1,–1,–1,–1,–1,–1,–1, –1,–1,–1,–1,–
1,–1,–1,–1,–1,–1,–1,–1,–1,–1,0,–1,–1,–1,–1,–1,–1;

132,–1,14,–1,–1,–1,–1,48,–1,–1,–1,–1,–1,–1,–1,–1,–1,–
1,–1,–1,–1,–1,–1,–1,–1,–1,–1,–1,–1,–1,–1, –1,–1,–1,–1,–
1,–1,–1,–1,–1,–1,–1,–1,–1,–1,–1,0,–1,–1,–1,–1,–1;

–1,–1,–1,–1,–1,–1,–1,–1,–1,–1,18,–1,–1,122,–1,–1,–
1,–1,–1,–1,–1,–1,–1,–1,–1,–1,–1,–1,–1,–1,–1, –1,–1,–1,–
1,–1,–1,–1,–1,–1,–1,–1,–1,–1,–1,–1,–1,0,–1,–1,–1,–1;

−1,48,−1,−1,−1,46,−1,−1,−1,−1,−1,42,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1,0,−1,−1,−1;

80,−1,−1,−1,−1,−1,−1,98,−1,−1,−1,−1,109,−1,−1,−1,−1,−1,−1,−1,−1,−1,−1,−1,−1,−1,−1,−1,−1,−1,−1, −1,−1,−1,−1,−1,−1,−1,−1,−1,−1,−1,−1,−1,−1,−1,−1,−1,−1,−1,0,−1,−1;

−1,−1,121,−1,−1,−1,−1,−1,−1,−1,97,−1,−1,103,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1,0,−1;

−1,145,−1,−1,−1,37,−1,−1,−1,−1,−1,1,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1,0.

A coefficient matrix 4 is written as:

119,156,180,25,−1,−1,116,−1,−1,142,0,0,−1,−1,−1,−1,−1,−1,−1,−1,−1,−1,−1,−1,−1,−1,−1,−1,−1, −1,−1,−1,−1,−1,−1,−1,−1,−1,−1,−1,−1,−1,−1,−1,−1,−1,−1,−1,−1,−1;

47,−1,−1,140,119,105,55,105,29,104,−1,0,0,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1;

171,81,−1,120,31,−1,−1,−1,59,−1,1,−1,0,0,−1,−1,−1,−1,−1,−1,−1,−1,−1,−1,−1,−1,−1,−1,−1,−1, −1,−1,−1,−1,−1,−1,−1,−1,−1,−1,−1,−1,−1,−1,−1,−1,−1,−1,−1;

−1,159,221,−1,40,52,118,69,33,98,0,−1,−1,0,−1,−1,−1,−1,−1,−1,−1,−1,−1,−1,−1,−1,−1,−1,−1, −1,−1,−1,−1,−1,−1,−1,−1,−1,−1,−1,−1,−1,−1,−1,−1,−1,−1,−1,−1;

40,31,−1,−1,−1,−1,−1,−1,−1,−1,181,−1,−1,0,−1,−1,−1,−1,−1,−1,−1,−1,−1,−1,−1,−1,−1,−1,−1, −1,−1,−1,−1,−1,−1,−1,−1,−1,−1,−1,−1,−1,−1,−1,−1,−1,−1,−1;

210,139,−1,−1,−1,90,−1,185,−1,−1,−1,145,−1,−1,−1,0,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1;

115,−1,−1,−1,−1,148,−1,59,−1,34,−1,55,−1,−1,−1,−1,0,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1;

−1,0,−1,−1,−1,218,−1,196,−1,−1,−1,221,−1,202,−1,−1,−1,0,−1,−1,−1,−1,−1,−1,−1,−1,−1,−1,−1, −1,−1,−1,−1,−1,−1,−1,−1,−1,−1,−1,−1,−1,−1,−1,−1,−1,−1,−1,−1;

22,152,−1,−1,−1,−1,−1,−1,−1,−1,−1,−1,154,−1,−1,−1,−1,−1,0,−1,−1,−1,−1,−1,−1,−1,−1,−1,−1,−1, −1,−1,−1,−1,−1,−1,−1,−1,−1,−1,−1,−1,−1,−1,−1,−1,−1,−1,−1;

−1,206,−1,−1,−1,−1,−1,−1,146,−1,30,206,−1,−1,−1,−1,−1,−1,−1,0,−1,−1,−1,−1,−1,−1,−1,−1,−1,−1, −1,−1,−1,−1,−1,−1,−1,−1,−1,−1,−1,−1,−1,−1,−1,−1,−1,−1,−1,−1;

220,68,−1,−1,−1,−1,143,0,−1,−1,−1,−1,−1,−1,−1,−1,−1,−1,−1,0,−1,−1,−1,−1,−1,−1,−1,−1,−1,−1, −1,−1,−1,−1,−1,−1,−1,−1,−1,−1,−1,−1,−1,−1,−1,−1,−1,−1,−1;

130,−1,−1,−1,−1,−1,−1,61,−1,86,−1,−1,−1,3,−1,−1,−1,−1,−1,−1,−1,0,−1,−1,−1,−1,−1,−1,−1,−1,−1,−1,−1,−1,−1,−1,−1,−1,−1,−1,−1,−1,−1,−1,−1,−1,−1,−1,−1;

−1,97,−1,222,−1,−1,−1,−1,−1,−1,−1,63,−1,−1,−1,−1,−1,−1,−1,−1,−1,−1,0,−1,−1,−1,−1,−1,−1,−1,−1, −1,−1,−1,−1,−1,−1,−1,−1,−1,−1,−1,−1,−1,−1,−1,−1,−1,−1,−1;

143,199,−1,−1,−1,−1,−1,−1, 106,−1,−1,−1,−1,183,−1,−1,−1,−1,−1,−1,−1,−1,0,−1,−1,−1,−1,−1,−1,−1,−1,−1,−1,−1,−1,−1,−1,−1,−1,−1,−1,−1,−1,−1,−1,−1,−1,−1,−1;

−1,7,−1,−1,−1,−1,101,−1,−1,−1,−1,205,−1,21,−1,−1,−1,−1,−1,−1,−1,−1,−1,0,−1,−1,−1,−1,−1,−1, −1,−1,−1,−1,−1,−1,−1,−1,−1,−1,−1,−1,−1,−1,−1,−1,−1,−1,−1;

182,−1,−1,−1,−1,−1,−1,−1,−1,−1,34,165,−1,−1,−1,−1,−1,−1,−1,−1,−1,−1,−1,−1,−1,0,−1,−1,−1,−1,−1, −1,−1,−1,−1,−1,−1,−1,−1,−1,−1,−1,−1,−1,−1,−1,−1,−1,−1,−1,−1;

−1,210,−1,−1,−1,−1,−1,−1,−1,221,−1,97,148,−1,−1,−1,−1,−1,−1,−1,−1,−1,−1,−1,−1,−1,0,−1,−1,−1, −1,−1,−1,−1,−1,−1,−1,−1,−1,−1,−1,−1,−1,−1,−1,−1,−1,−1,−1,−1,−1;

−1,92,−1,−1,−1,133,−1,−1,−1,−1,−1,23,190,−1,−1,−1,−1,−1,−1,−1,−1,−1,−1,−1,−1,−1,−1,0,−1,−1,−1,−1,−1,−1,−1,−1,−1,−1,−1,−1,−1,−1,−1,−1,−1,−1,−1,−1,−1,−1;

129,−1,−1,−1,−1,−1,156,154,−1,−1,−1,−1,−1,−1,−1,−1,−1,−1,−1,−1,−1,−1,−1,−1,−1,−1,−1,0,−1,−1,−1,−1,−1,−1,−1,−1,−1,−1,−1,−1,−1,−1,−1,−1,−1,−1,−1,−1,−1;

201,127,−1,−1,−1,−1,−1,−1,−1,−1,71,−1,−1,−1,−1,−1,−1,−1,−1,−1,−1,−1,−1,−1,−1,−1,−1,−1,−1,0,−1, −1,−1,−1,−1,−1,−1,−1,−1,−1,−1,−1,−1,−1,−1,−1,−1,−1,−1,−1,−1;

−1,157,−1,−1,160,−1,−1,−1,−1,−1,−1,66,−1,−1,−1,−1,−1,−1,−1,−1,−1,−1,−1,−1,−1,−1,−1,−1,−1,−1,0, −1,−1,−1,−1,−1,−1,−1,−1,−1,−1,−1,−1,−1,−1,−1,−1,−1,−1,−1,−1;

67,−1,−1,−1,−1,−1,−1,−1,22,−1,−1,−1,−1,186,−1,−1,−1,−1,−1,−1,−1,−1,−1,−1,−1,−1,−1,−1,−1,−1,−1, 0,−1,−1,−1,−1,−1,−1,−1,−1,−1,−1,−1,−1,−1,−1,−1,−1,−1,−1;

−1,114,121,−1,−1,−1,−1,−1,−1,−1,−1,−1,−1,−1,−1,−1,−1,−1,−1,−1,−1,−1,−1,−1,−1,−1,−1,−1,−1,−1,0,−1,−1,−1,−1,−1,−1,−1,−1,−1,−1,−1,−1,−1,−1,−1,−1,−1,−1;

159,−1,−1,139,−1,162,−1,−1,−1,−1,−1,−1,−1,−1,−1,−1,−1,−1,−1,−1,−1,−1,−1,−1,−1,−1,−1,−1,−1,−1, −1,−1,−1,0,−1,−1,−1,−1,−1,−1,−1,−1,−1,−1,−1,−1,−1,−1,−1,−1,−1;

−1,124,171,−1,−1,−1,−1,−1,−1,123,−1,−1,−1,−1,−1,−1,−1,−1,−1,−1,−1,−1,−1,−1,−1,−1,−1,−1,−1,−1, −1,−1,−1,−1,0,−1,−1,−1,−1,−1,−1,−1,−1,−1,−1,−1,−1,−1,−1,−1,−1;

211,−1,−1,−1,−1,54,−1,−1,−1,−1,−1,−1,−1,−1,−1,−1,−1,−1,−1,−1,−1,−1,−1,−1,−1,−1,−1,−1,−1,−1, −1,−1,−1,−1,0,−1,−1,−1,−1,−1,−1,−1,−1,−1,−1,−1,−1,−1,−1,−1;

−1,−1,53,−1,−1,−1,−1,189,−1,−1,−1,−1,34,219,−1,−1,−1,−1,−1,−1,−1,−1,−1,−1,−1,−1,−1,−1,−1,−1,−1,−1,−1,−1,−1,0,−1,−1,−1,−1,−1,−1,−1,−1,−1,−1,−1,−1,−1,−1,−1;

215,−1,−1,−1,−1,−1,52,−1,−1,−1,−1,−1,−1,−1,−1,−1,−1,−1,−1,−1,−1,−1,−1,−1,−1,−1,−1,−1,−1,−1,−1, −1,−1,−1,−1,−1,−1,0,−1,−1,−1,−1,−1,−1,−1,−1,−1,−1,−1,−1,−1,−1;

−1,3,5,−1,−1,37,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1,0,−1,−1,−1,−1,−1,−1,−1,−1,−1,−1,−1,−1,−1;

121,−1,−1,−1,35,−1,−1,−1,−1,−1,−1,−1,−1,−1,−1,−1,−1,−1,−1,−1,−1,−1,−1,−1,−1,−1,−1,−1,−1,−1,−1, −1,−1,−1,−1,−1,−1,−1,−1,0,−1,−1,−1,−1,−1,−1,−1,−1,−1,−1,−1,−1;

−1,−1,160,−1,−1,127,−1,111,−1,58,−1,−1,−1,−1,−1,−1,−1,−1,−1,−1,−1,−1,−1,−1,−1,−1,−1,−1,−1,−1,−1,−1,−1,−1,−1,−1,−1,−1,0,−1,−1,−1,−1,−1,−1,−1,−1,−1,−1,−1,−1;

−1,127,−1,−1,−1,−1,−1,−1,−1,−1,−1,−1,−1,128,−1,−1,−1,−1,−1,−1,−1,−1,−1,−1,−1,−1,−1,−1,−1,−1,−1,−1,−1,−1,−1,−1,−1,−1,−1,−1,−1,0,−1,−1,−1,−1,−1,−1,−1,−1,−1,−1;

21,−1,−1,−1,−1,169,−1,−1,−1,−1,−1,−1,73,−1,−1,−1,−1,−1,−1,−1,−1,−1,−1,−1,−1,−1,−1,−1,−1,−1,−1, −1,−1,−1,−1,−1,−1,−1,−1,−1,−1,−1,0,−1,−1,−1,−1,−1,−1,−1,−1,−1;

−1,−1,29,−1,−1,−1,−1,223,−1,−1,40,−1,−1,−1,−1,−1,−1,−1,−1,−1,−1,−1,−1,−1,−1,−1,−1,−1,−1,−1,−1, −1,−1,−1,−1,−1,−1,−1,−1,−1,−1,−1,−1,0,−1,−1,−1,−1,−1,−1,−1,−1;

50,−1,−1,−1,−1,−1,−1,−1,−1,−1,−1,−1,128,130,−1,−1,−1,−1,−1,−1,−1,−1,−1,−1,−1,−1,−1,−1,−1,−1,−1,−1,−1,−1,−1,−1,−1,−1,−1,−1,−1,−1,−1,0,−1,−1,−1,−1,−1,−1,−1;

−1,30,−1,−1,−1,125,−1,−1,−1,−1,−1,91,−1,−1,−1,−1,−1,−1,−1,−1,−1,−1,−1,−1,−1,−1,−1,−1,−1,−1,−1, −1,−1,−1,−1,−1,−1,−1,−1,−1,−1,−1,−1,−1,−1,0,−1,−1,−1,−1,−1,−1;

168,−1,179,−1,−1,−1,−1,108,−1,−1,−1,−1,−1,−1,−1,−1,−1,−1,−1,−1,−1,−1,−1,−1,−1,−1,−1,−1,−1,−1, −1,−1,−1,−1,−1,−1,−1,−1,−1,−1,−1,−1,−1,−1,−1,−1,0,−1,−1,−1,−1,−1;

−1,−1,−1,−1,−1,−1,−1,−1,−1,−1,57,−1,−1,89,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1,0,−1,−1,−1,−1;

−1,13,−1,−1,−1,179,−1,−1,−1,−1,−1,120,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1,0,−1,−1,−1;

102,–1,–1,–1,–1,–1,–1,148,–1,–1,–1,–1,123,–1,–1,–1,–1,–1,–1,–1,–1,–1,–1,–1,–1,–1,–1,–1,–1,–1, –1,–1,–1,–1,–1,–1,–1,–1,–1,–1,–1,–1,–1,–1,–1,–1,–1,–1,–1,0,–1,–1;

–1,–1,196,–1,–1,–1,–1,–1,–1,–1,203,–1,–1,29,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,0,–1;

–1,64,–1,–1,–1,180,–1,–1,–1,–1,–1,152,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,0.

A coefficient matrix 5 is written as:

3,26,53,35,–1,–1,115,–1,–1,127,0,0,–1,–1,–1,–1,–1,–1,–1,–1,–1,–1,–1,–1,–1,–1,–1,–1,–1,–1, –1,–1,–1,–1,–1,–1,–1,–1,–1,–1,–1,–1,–1,–1,–1,–1,–1,–1,–1,–1;

19,–1,–1,94,104,66,84,98,69,50,–1,0,0,–1,–1,–1,–1,–1,–1,–1,–1,–1,–1,–1,–1,–1,–1,–1,–1,–1, –1,–1,–1,–1,–1,–1,–1,–1,–1,–1,–1,–1,–1,–1,–1,–1,–1,–1,–1,–1;

95,106,–1,92,110,–1,–1,–1,111,–1,1,–1,0,0,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1;

–1,120,121,–1,22,4,73,49,128,79,0,–1,–1,0,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1;

42,24,–1,–1,–1,–1,–1,–1,–1,–1,–1,51,–1,–1,0,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1;

40,140,–1,–1,–1,84,–1,137,–1,–1,–1,71,–1,–1,–1,0,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1;

109,–1,–1,–1,–1,87,–1,107,–1,133,–1,139,–1,–1,–1,–1,0,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1;

–1,97,–1,–1,–1,135,–1,35,–1,–1,–1,108,–1,65,–1,–1,–1,0,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1;

70,69,–1,–1,–1,–1,–1,–1,–1,–1,–1,–1,88,–1,–1,–1,–1,–1,0,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1;

–1,97,–1,–1,–1,–1,–1,–1,40,–1,24,49,–1,–1,–1,–1,–1,–1,–1,0,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1;

46,41,–1,–1,–1,–1,101,96,–1,–1,–1,–1,–1,–1,–1,–1,–1,–1,–1,–1,0,–1,–1,–1,–1,–1,–1,–1,–1,–1,–1, –1,–1,–1,–1,–1,–1,–1,–1,–1,–1,–1,–1,–1,–1,–1,–1,–1,–1,–1,–1;

28,–1,–1,–1,–1,–1,–1,30,–1,116,–1,–1,–1,64,–1,–1,–1,–1,–1,–1,–1,0,–1,–1,–1,–1,–1,–1,–1,–1,–1, –1,–1,–1,–1,–1,–1,–1,–1,–1,–1,–1,–1,–1,–1,–1,–1,–1,–1,–1,–1;

–1,33,–1,122,–1,–1,–1,–1,–1,–1,–1,131,–1,–1,–1,–1,–1,–1,–1,–1,–1,–1,0,–1,–1,–1,–1,–1,–1,–1, –1,–1,–1,–1,–1,–1,–1,–1,–1,–1,–1,–1,–1,–1,–1,–1,–1,–1,–1,–1,–1;

76,37,–1,–1,–1,–1,–1,–1,62,–1,–1,–1,–1,47,–1,–1,–1,–1,–1,–1,–1,–1,–1,0,–1,–1,–1,–1,–1,–1,–1,–1,–1,–1,–1,–1,–1,–1,–1,–1,–1,–1,–1,–1,–1,–1,–1,–1,–1,–1,–1,–1;

–1,143,–1,–1,–1,–1,51,–1,–1,–1,–1,130,–1,97,–1,–1,–1,–1,–1,–1,–1,–1,–1,–1,0,–1,–1,–1,–1,–1,–1,–1,–1,–1,–1,–1,–1,–1,–1,–1,–1,–1,–1,–1,–1,–1,–1,–1,–1,–1,–1,–1;

139,–1,–1,–1,–1,–1,–1,–1,–1,–1,96,128,–1,–1,–1,–1,–1,–1,–1,–1,–1,–1,–1,–1,–1,0,–1,–1,–1,–1,–1, –1,–1,–1,–1,–1,–1,–1,–1,–1,–1,–1,–1,–1,–1,–1,–1,–1,–1,–1,–1,–1;

–1,48,–1,–1,–1,–1,–1,–1,–1,9,–1,28,8,–1,–1,–1,–1,–1,–1,–1,–1,–1,–1,–1,–1,–1,0,–1,–1,–1,–1,–1,–1,–1,–1,–1,–1,–1,–1,–1,–1,–1,–1,–1,–1,–1,–1,–1,–1,–1,–1;

–1,120,–1,–1,–1,43,–1,–1,–1,–1,–1,65,42,–1,–1, –1,–1,–1,–1,–1,–1,–1,–1,–1,–1,–1,–1,–1,–1,–1,–1,–1,–1,–1,–1;

17,–1,–1,–1,–1,–1,106,142,–1,–1,–1,–1,–1,–1,–1,–1,–1,–1,–1,–1,–1,–1,–1,–1,–1,–1,–1,0,–1,–1, –1,–1,–1,–1,–1,–1,–1,–1,–1,–1,–1,–1,–1,–1,–1,–1,–1,–1,–1,–1,–1;

79,28,–1,–1,–1,–1,–1,–1,–1,–1,41,–1,–1,–1,–1,–1,–1,–1,–1,–1,–1,–1,–1,–1,–1,–1,–1,–1,–1,0,–1,–1,–1,–1,–1,–1,–1,–1,–1,–1,–1,–1,–1,–1,–1,–1,–1,–1,–1,–1,–1,–1;

–1,2,–1,–1,103,–1,–1,–1,–1,–1,–1,78,–1,–1,–1,–1,–1,–1,–1,–1,–1,–1,–1,–1,–1,–1,–1,–1,–1,–1,0,–1,–1,–1,–1,–1,–1,–1,–1,–1,–1,–1,–1,–1,–1,–1,–1,–1,–1,–1,–1,–1;

91,–1,–1,–1,–1,–1,–1,–1,75,–1,–1,–1,–1,81,–1,–1,–1,–1,–1,–1,–1,–1,–1,–1,–1,–1,–1,–1,–1,–1, 0,–1,–1,–1,–1,–1,–1,–1,–1,–1,–1,–1,–1,–1,–1,–1,–1,–1,–1,–1,–1;

–1,54,132,–1,–1,–1,–1,–1,–1,–1,–1,–1,–1,–1,–1,–1,–1,–1,–1,–1,–1,–1,–1,–1,–1,–1,–1,–1,–1,–1, –1,0,–1,–1,–1,–1,–1,–1,–1,–1,–1,–1,–1,–1,–1,–1,–1,–1,–1,–1,–1;

68,–1,–1,115,–1,56,–1,–1,–1,–1,–1,–1,–1,–1,–1,–1,–1,–1,–1,–1,–1,–1,–1,–1,–1,–1,–1,–1,–1,–1, –1,–1,0,–1,–1,–1,–1,–1,–1,–1,–1,–1,–1,–1,–1,–1,–1,–1,–1,–1,–1;

–1,30,42,–1,–1,–1,–1,–1,–1,101,–1,–1,–1,–1,–1,–1,–1,–1,–1,–1,–1,–1,–1,–1,–1,–1,–1,–1,–1,–1, –1,–1,–1,0,–1,–1,–1,–1,–1,–1,–1,–1,–1,–1,–1,–1,–1,–1,–1,–1,–1;

128,–1,–1,–1,–1,63,–1,–1,–1,–1,–1,–1,–1,–1,–1,–1,–1,–1,–1,–1,–1,–1,–1,–1,–1,–1,–1,–1,–1,–1, –1,–1,–1,–1,0,–1,–1,–1,–1,–1,–1,–1,–1,–1,–1,–1,–1,–1,–1,–1,–1;

–1,–1,142,–1,–1,–1,–1,28,–1,–1,–1,–1,100,133,–1,–1,–1,–1,–1,–1,–1,–1,–1,–1,–1,–1,–1,–1,–1,–1, –1,–1,–1,–1,–1,–1,0,–1,–1,–1,–1,–1,–1,–1,–1,–1,–1,–1,–1,–1,–1,–1;

13,–1,–1,–1,–1,–1,10,–1,–1,–1,–1,–1,–1,–1,–1,–1,–1,–1,–1,–1,–1,–1,–1,–1,–1,–1,–1,–1,–1,–1,–1,–1,–1,–1,–1,–1,0,–1,–1,–1,–1,–1,–1,–1,–1,–1,–1,–1,–1,–1,–1,–1;

–1,106,77,–1,–1,43,–1,–1,–1,–1,–1,–1,–1,–1,–1,–1,–1,–1,–1,–1,–1,–1,–1,–1,–1,–1,–1,–1,–1,–1, –1,–1,–1,–1,–1,–1,–1,0,–1,–1,–1,–1,–1,–1,–1,–1,–1,–1,–1,–1,–1;

133,–1,–1,–1,25,–1,–1,–1,–1,–1,–1,–1,–1,–1,–1,–1,–1,–1,–1,–1,–1,–1,–1,–1,–1,–1,–1,–1,–1, –1,–1,–1,–1,–1,–1,–1,–1,0,–1,–1,–1,–1,–1,–1,–1,–1,–1,–1,–1,–1,–1;

–1,–1,87,–1,–1,56,–1,104,–1,70,–1,–1,–1,–1,–1,–1,–1,–1,–1,–1,–1,–1,–1,–1,–1,–1,–1,–1,–1,–1, –1,–1,–1,–1,–1,–1,–1,–1,–1,0,–1,–1,–1,–1,–1,–1,–1,–1,–1,–1,–1;

–1,80,–1,–1,–1,–1,–1,–1,–1,–1,–1,–1,–1,139,–1,–1,–1,–1,–1,–1,–1,–1,–1,–1,–1,–1,–1,–1,–1,–1,–1,–1,–1,–1,–1,–1,–1,–1,–1,–1,–1,0,–1,–1,–1,–1,–1,–1,–1,–1,–1,–1;

32,–1,–1,–1,–1,89,–1,–1,–1,–1,–1,–1,71,–1,–1,–1,–1,–1,–1,–1,–1,–1,–1,–1,–1,–1,–1,–1,–1,–1,–1,–1,–1,–1,–1,–1,–1,–1,–1,–1,–1,–1,0,–1,–1,–1,–1,–1,–1,–1,–1,–1;

–1,–1,135,–1,–1,–1,–1,6,–1,–1,2,–1,–1,–1,–1,–1,–1,–1,–1,–1,–1,–1,–1,–1,–1,–1,–1,–1,–1,–1, –1,–1,–1,–1,–1,–1,–1,–1,–1,–1,–1,–1,0,–1,–1,–1,–1,–1,–1,–1,–1;

37,–1,–1,–1,–1,–1,–1,–1,–1,–1,–1,–1,25,114,–1,–1,–1,–1,–1,–1,–1,–1,–1,–1,–1,–1,–1,–1,–1,–1, –1,–1,–1,–1,–1,–1,–1,–1,–1,–1,–1,–1,–1,–1,0,–1,–1,–1,–1,–1,–1,–1;

–1,60,–1,–1,–1,137,–1,–1,–1,–1,–1,93,–1,–1,–1,–1,–1,–1,–1,–1,–1,–1,–1,–1,–1,–1,–1,–1,–1,–1, –1,–1,–1,–1,–1,–1,–1,–1,–1,–1,–1,–1,–1,–1,–1,0,–1,–1,–1,–1,–1,–1;

121,–1,129,–1,–1,–1,–1,26,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,0,–1,–1,–1,–1,–1;

–1,–1,–1,–1,–1,–1,–1,–1,–1,–1,97,–1,–1,56,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,0,–1,–1,–1,–1;

–1,1,–1,–1,–1,70,–1,–1,–1,–1,–1,1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,0,–1,–1,–1;

119,–1,–1,–1,–1,–1,–1,32,–1,–1,–1,–1, 142,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,0,–1,–1;

–1,–1,6,–1,–1,–1,–1,–1,–1,–1,73,–1,–1,102,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,0,–1;

−1,48,−1,−1,−1,47,−1,−1,−1,−1,−1,19,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1,0.

A coefficient matrix 6 is written as:

97,152,104,149,−1,−1,8,−1,−1,101,0,0,−1,−1,−1,−1,−1,−1,−1,−1,−1,−1,−1,−1,−1,−1,−1,−1,−1,−1, −1,−1,−1,−1,−1,−1,−1,−1,−1,−1,−1,−1,−1,−1,−1,−1,−1,−1,−1,−1,−1,−1;

133,−1,−1,133,160,73,154,143,151,163,−1,0,0,−1,−1,−1,−1,−1,−1,−1,−1,−1,−1,−1,−1,−1,−1,−1,−1, −1,−1,−1,−1,−1,−1,−1,−1,−1,−1,−1,−1,−1,−1,−1,−1,−1,−1,−1,−1,−1,−1,−1,−1;

39,62,−1,170,173,−1,−1,−1,52,−1,1,−1,0,0,−1,−1,−1,−1,−1,−1,−1,−1,−1,−1,−1,−1,−1,−1,−1,−1,−1, −1,−1,−1,−1,−1,−1,−1,−1,−1,−1,−1,−1,−1,−1,−1,−1,−1,−1,−1,−1,−1;

−1,26,18,−1,113,148,41,146,125,21,0,−1,−1,0,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1;

154,40,−1,−1,−1,−1,−1,−1,−1,−1,−1,85,−1,−1,0,−1,−1,−1,−1,−1,−1,−1,−1,−1,−1,−1,−1,−1,−1,−1,−1, −1,−1,−1,−1,−1,−1,−1,−1,−1,−1,−1,−1,−1,−1,−1,−1,−1,−1,−1,−1,−1;

93,10,−1,−1,−1,38,−1,88,−1,−1,−1,21,−1,−1,−1,0,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1;

56,−1,−1,−1,−1,0,−1,79,−1,26,−1,89,−1,−1,−1,−1,0,−1,−1,−1,−1,−1,−1,−1,−1,−1,−1,−1,−1,−1,−1,−1, −1,−1,−1,−1,−1,−1,−1,−1,−1,−1,−1,−1,−1,−1,−1,−1,−1,−1,−1,−1,−1;

−1,76,−1,−1,−1,133,−1,173,−1,−1,−1,63,−1,119,−1,−1,−1,0,−1,−1,−1,−1,−1,−1,−1,−1,−1,−1,−1, −1,−1,−1,−1,−1,−1,−1,−1,−1,−1,−1,−1,−1,−1,−1,−1,−1,−1,−1,−1,−1,−1,−1,−1;

8,154,−1,−1,−1,−1,−1,−1,−1,−1,−1,−1,80,−1,−1,−1,−1,−1,0,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1;

−1,58,−1,−1,−1,−1,−1,−1,173,−1,64,90,−1,−1,−1,−1,−1,−1,−1,0,−1,−1,−1,−1,−1,−1,−1,−1,−1,−1,−1,−1, −1,−1,−1,−1,−1,−1,−1,−1,−1,−1,−1,−1,−1,−1,−1,−1,−1,−1,−1,−1,−1;

158,12,−1,−1,−1,−1,42,62,−1,−1,−1,−1,−1,−1,−1,−1,−1,−1,−1,−1,−1,0,−1,−1,−1,−1,−1,−1,−1,−1,−1,−1, −1,−1,−1,−1,−1,−1,−1,−1,−1,−1,−1,−1,−1,−1,−1,−1,−1,−1,−1,−1;

94,−1,−1,−1,−1,−1,−1,57,−1,146,−1,−1,−1,92,−1,−1,−1,−1,−1,−1,−1,−1,0,−1,−1,−1,−1,−1,−1,−1,−1,−1, −1,−1,−1,−1,−1,−1,−1,−1,−1,−1,−1,−1,−1,−1,−1,−1,−1,−1,−1,−1,−1;

−1,112,−1,26,−1,−1,−1,−1,−1,−1,−1,65,−1,−1,−1,−1,−1,−1,−1,−1,−1,−1,0,−1,−1,−1,−1,−1,−1,−1,−1,−1, −1,−1,−1,−1,−1,−1,−1,−1,−1,−1,−1,−1,−1,−1,−1,−1,−1,−1,−1,−1,−1;

15,52,−1,−1,−1,−1,−1,−1,170,−1,−1,−1,63,−1,−1,−1,−1,−1,−1,−1,−1,−1,−1,0,−1,−1,−1,−1,−1,−1,−1,−1, −1,−1,−1,−1,−1,−1,−1,−1,−1,−1,−1,−1,−1,−1,−1,−1,−1,−1,−1,−1,−1;

−1,6,−1,−1,−1,−1,169,−1,−1,−1,−1,0,−1,151,−1,−1,−1,−1,−1,−1,−1,−1,−1,−1,−1,0,−1,−1,−1,−1,−1,−1,−1,−1,−1,−1,−1,−1,−1,−1,−1,−1,−1,−1,−1,−1,−1,−1,−1,−1,−1,−1;

84,−1,−1,−1,−1,−1,−1,−1,−1,−1,−1,21,110,−1,−1,−1,−1,−1,−1,−1,−1,−1,−1,−1,−1,0,−1,−1,−1,−1,−1,−1, −1,−1,−1,−1,−1,−1,−1,−1,−1,−1,−1,−1,−1,−1,−1,−1,−1,−1,−1,−1,−1;

−1,104,−1,−1,−1,−1,−1,−1,−1,108,−1,64,38,−1,−1,−1,−1,−1,−1,−1,−1,−1,−1,−1,−1,−1,0,−1,−1,−1,−1,−1,−1,−1,−1,−1,−1,−1,−1,−1,−1,−1,−1,−1,−1,−1,−1,−1,−1,−1,−1,−1;

−1,152,−1,−1,−1,128,−1,−1,−1,−1,−1,37,82,−1,−1,−1,−1,−1,−1,−1,−1,−1,−1,−1,−1,−1,−1,0,−1,−1,−1,−1,−1,−1,−1,−1,−1,−1,−1,−1,−1,−1,−1,−1,−1,−1,−1,−1,−1,−1,−1,−1;

15,−1,−1,−1,−1,−1,2,55,−1,−1, −1,−1,−1,−1,−1,−1,−1,−1,−1,−1,−1,−1,−1,−1,−1,−1,−1,−1,−1,−1,−1,−1;

125,14,−1,−1,−1,−1,−1,−1,−1,−1,67,−1,−1,−1,−1,−1,−1,−1,−1,−1,−1,−1,−1,−1,−1,−1,−1,−1,0,−1, −1,−1,−1,−1,−1,−1,−1,−1,−1,−1,−1,−1,−1,−1,−1,−1,−1,−1,−1,−1,−1,−1;

−1,56,−1,−1,161,−1,−1,−1,−1,−1,−1,107,−1,−1,−1,−1,−1,−1,−1,−1,−1,−1,−1,−1,−1,−1,−1,−1,−1,0, −1,−1,−1,−1,−1,−1,−1,−1,−1,−1,−1,−1,−1,−1,−1,−1,−1,−1,−1,−1,−1,−1;

40,−1,−1,−1,−1,−1,−1,−1,69,−1,−1,−1,−1,73,−1,−1,−1,−1,−1,−1,−1,−1,−1,−1,−1,−1,−1,−1,−1,−1,−1, 0,−1,−1,−1,−1,−1,−1,−1,−1,−1,−1,−1,−1,−1,−1,−1,−1,−1,−1,−1,−1;

−1,155,117,−1,−1,−1,−1,−1,−1,−1,−1,−1,−1,−1,−1,−1,−1,−1,−1,−1,−1,−1,−1,−1,−1,−1,−1,−1,−1,−1,−1,0,−1,−1,−1,−1,−1,−1,−1,−1,−1,−1,−1,−1,−1,−1,−1,−1,−1,−1,−1,−1;

45,−1,−1,101,−1,27,−1,−1,−1,−1,−1,−1,−1,−1,−1,−1,−1,−1,−1,−1,−1,−1,−1,−1,−1,−1,−1,−1,−1,−1, −1,−1,0,−1,−1,−1,−1,−1,−1,−1,−1,−1,−1,−1,−1,−1,−1,−1,−1,−1,−1,−1;

−1,60,164,−1,−1,−1,−1,−1,−1,44,−1,−1,−1,−1,−1,−1,−1,−1,−1,−1,−1,−1,−1,−1,−1,−1,−1,−1,−1,−1, −1,−1,−1,0,−1,−1,−1,−1,−1,−1,−1,−1,−1,−1,−1,−1,−1,−1,−1,−1,−1,−1;

57,−1,−1,−1,−1,120,−1,−1,−1,−1,−1,−1,−1,−1,−1,−1,−1,−1,−1,−1,−1,−1,−1,−1,−1,−1,−1,−1,−1,−1, −1,−1,−1,−1,0,−1,−1,−1,−1,−1,−1,−1,−1,−1,−1,−1,−1,−1,−1,−1,−1,−1;

−1,−1,140,−1,−1,−1,−1,1,−1,−1,−1,−1,134,107,−1,−1,−1,−1,−1,−1,−1,−1,−1,−1,−1,−1,−1,−1,−1,−1,−1,−1,−1,−1,−1,0,−1,−1,−1,−1,−1,−1,−1,−1,−1,−1,−1,−1,−1,−1,−1,−1;

85,−1,−1,−1,−1,−1,56,−1,−1,−1,−1,−1,−1,−1,−1,−1,−1,−1,−1,−1,−1,−1,−1,−1,−1,−1,−1,−1,−1,−1,−1,−1,−1,−1,−1,−1,0,−1,−1,−1,−1,−1,−1,−1,−1,−1,−1,−1,−1,−1,−1,−1;

−1,55,162,−1,−1,87,−1,−1,−1,−1,−1,−1,−1,−1,−1,−1,−1,−1,−1,−1,−1,−1,−1,−1,−1,−1,−1,−1,−1,−1, −1,−1,−1,−1,−1,−1,−1,0,−1,−1,−1,−1,−1,−1,−1,−1,−1,−1,−1,−1,−1,−1;

71,−1,−1,−1,3 5,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1,0,−1,−1,−1,−1,−1,−1,−1,−1,−1,−1,−1,−1,−1;

−1,−1,167,−1,−1,112,−1,102,−1,21,−1,−1,−1,−1,−1,−1,−1,−1,−1,−1,−1,−1,−1,−1,−1,−1,−1,−1,−1,−1, −1,−1,−1,−1,−1,−1,−1,−1,−1,0,−1,−1,−1,−1,−1,−1,−1,−1,−1,−1,−1,−1;

−1,17,−1,−1,−1,−1,−1,−1,−1,−1,−1,−1,174,−1,−1,−1,−1,−1,−1,−1,−1,−1,−1,−1,−1,−1,−1,−1,−1,−1, −1,−1,−1,−1,−1,−1,−1,−1,−1,−1,0,−1,−1,−1,−1,−1,−1,−1,−1,−1,−1,−1;

101,−1,−1,−1,−1,4,−1,−1,−1,−1,−1,−1,26,−1,−1,−1,−1,−1,−1,−1,−1,−1,−1,−1,−1,−1,−1,−1,−1,−1,−1,−1,−1,−1,−1,−1,−1,−1,−1,−1,−1,0,−1,−1,−1,−1,−1,−1,−1,−1,−1,−1;

−1,−1,41,−1,−1,−1,−1,115,−1,−1,165,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1,0,−1,−1,−1,−1,−1,−1,−1,−1,−1;

91,−1,−1,−1,−1,−1,−1,−1,−1,−1,−1,−1,23,93,−1,−1,−1,−1,−1,−1,−1,−1,−1,−1,−1,−1,−1,−1,−1,−1,−1,−1,−1,−1,−1,−1,−1,−1,−1,−1,−1,−1,−1,0,−1,−1,−1,−1,−1,−1,−1,−1;

−1,120,−1,−1,−1,157,−1,−1,−1,−1,−1,24,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1,0,−1,−1,−1,−1,−1,−1,−1;

164,−1,145,−1,−1,−1,−1,35,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1,0,−1,−1,−1,−1,−1,−1;

−1,−1,−1,−1,−1,−1,−1,−1,−1,−1,154,−1,−1,136,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1,0,−1,−1,−1,−1;

−1,79,−1,−1,−1,101,−1,−1,−1,−1,−1,104,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1,0,−1,−1,−1;

79,−1,−1,−1,−1,−1,−1,144,−1,−1,−1,−1,5,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1,0,−1,−1;

−1,−1,15,−1,−1,−1,−1,−1,−1,−1, 145,−1,−1,104,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1,0,−1;

−1,164,−1,−1,−1,161,−1,−1,−1,−1,−1,106,−1,−1,−1,−1,−1,−1,−1,−1,−1,−1,−1,−1,−1,−1,−1,−1,−1,−1, −1,−1,−1,−1,−1,−1,−1,−1,−1,−1,−1,−1,−1,−1,−1,−1,−1,−1,−1,−1,−1,0.

A coefficient matrix 7 is written as:

105,99,186,201,−1,−1,59,−1,−1,174,0,0,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1;

10,–1,–1,115,81,172,82,74,101,103,–1,0,0,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1;

0,32,–1,86,93,–1,–1,–1,47,–1,1,–1,0,0,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1;

–1,118,141,–1,120,122,24,109,184,169,0,–1,–1,0,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1;

61,114,–1,–1,–1,–1,–1,–1,–1,–1,–1,156,–1,–1,0,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1;

142,118,–1,–1,–1,136,–1,126,–1,–1,–1,148,–1,–1,–1,0,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1;

29,–1,–1,–1,–1,188,–1,164,–1,201,–1,128,–1,–1,–1,–1,0,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1;

–1,113,–1,–1,–1,110,–1,66,–1,–1,–1,35,–1,10,–1,–1,–1,0,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1;

135,81,–1,–1,–1,–1,–1,–1,–1,–1,–1,–1,65,–1,–1,–1,–1,–1,0,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1;

–1,71,–1,–1,–1,–1,–1,–1,32,–1,106,70,–1,–1,–1,–1,–1,–1,–1,0,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1;

152,79,–1,–1,–1,–1,86,3,–1,–1,–1,–1,–1,–1,–1,–1,–1,–1,–1,–1,0,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1;

63,–1,–1,–1,–1,–1,–1,165,–1,63,–1,–1,–1,139,–1,–1,–1,–1,–1,–1,–1,0,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1;

–1,172,–1,50,–1,–1,–1,–1,–1,–1,–1,206,–1,–1,–1,–1,–1,–1,–1,–1,–1,–1,0,–1,–1,–1,–1,–1,–1,–1,–1,–1,–1,–1,–1,–1,–1,–1,–1,–1,–1,–1,–1,–1,–1,–1,–1,–1,–1,–1,–1,–1;

203,198,–1,–1,–1,–1,–1,–1,85,–1,–1,–1,–1,48,–1,–1,–1,–1,–1,–1,–1,–1,–1,0,–1,–1,–1,–1,–1,–1,–1,–1,–1,–1,–1,–1,–1,–1,–1,–1,–1,–1,–1,–1,–1,–1,–1,–1,–1,–1,–1,–1;

–1,44,–1,–1,–1,–1,124,–1,–1,–1,–1,132,–1,138,–1,–1,–1,–1,–1,–1,–1,–1,–1,–1,0,–1,–1,–1,–1,–1,–1,–1,–1,–1,–1,–1,–1,–1,–1,–1,–1,–1,–1,–1,–1,–1,–1,–1,–1,–1,–1,–1;

186,–1,–1,–1,–1,–1,–1,–1,–1,–1,24,0,–1,–1,–1,–1,–1,–1,–1,–1,–1,–1,–1,–1,–1,0,–1,–1,–1,–1,–1,–1,–1,–1,–1,–1,–1,–1,–1,–1,–1,–1,–1,–1,–1,–1,–1,–1,–1,–1,–1,–1;

–1,28,–1,–1,–1,–1,–1,–1,–1,6,–1,190,89,–1,–1,–1,–1,–1,–1,–1,–1,–1,–1,–1,–1,–1,0,–1,–1,–1,–1,–1,–1,–1,–1,–1,–1,–1,–1,–1,–1,–1,–1,–1,–1,–1,–1,–1,–1,–1,–1,–1;

–1,10,–1,–1,–1,94,–1,–1,–1,–1,–1,102,35,–1,–1,–1,–1,–1,–1,–1,–1,–1,–1,–1,–1,–1,–1,0,–1,–1,–1,–1,–1,–1,–1,–1,–1,–1,–1,–1,–1,–1,–1,–1,–1,–1,–1,–1,–1,–1,–1,–1;

15,–1,–1,–1,–1,–1,137,120,–1,–1,–1,–1,–1,–1,–1,–1,–1,–1,–1,–1,–1,–1,–1,–1,–1,–1,–1,–1,0,–1,–1,–1,–1,–1,–1,–1,–1,–1,–1,–1,–1,–1,–1,–1,–1,–1,–1,–1,–1,–1,–1,–1;

69,52,–1,–1,–1,–1,–1,–1,–1,–1,85,–1,–1,–1,–1,–1,–1,–1,–1,–1,–1,–1,–1,–1,–1,–1,–1,–1,–1,0,–1,–1,–1,–1,–1,–1,–1,–1,–1,–1,–1,–1,–1,–1,–1,–1,–1,–1,–1,–1,–1,–1;

–1,64,–1,–1,160,–1,–1,–1,–1,–1,–1,138,–1,–1,–1,–1,–1,–1,–1,–1,–1,–1,–1,–1,–1,–1,–1,–1,–1,–1,0,–1,–1,–1,–1,–1,–1,–1,–1,–1,–1,–1,–1,–1,–1,–1,–1,–1,–1,–1,–1,–1;

73,–1,–1,–1,–1,–1,–1,–1,194,–1,–1,–1,–1,142,–1,–1,–1,–1,–1,–1,–1,–1,–1,–1,–1,–1,–1,–1,–1,–1,–1,0,–1,–1,–1,–1,–1,–1,–1,–1,–1,–1,–1,–1,–1,–1,–1,–1,–1,–1,–1,–1;

–1,119,22,–1,–1,–1,–1,–1,–1,–1,–1,–1,–1,–1,–1,–1,–1,–1,–1,–1,–1,–1,–1,–1,–1,–1,–1,–1,–1,–1,–1,–1,0,–1,–1,–1,–1,–1,–1,–1,–1,–1,–1,–1,–1,–1,–1,–1,–1,–1,–1,–1;

70,–1,–1,164,–1,9,–1,–1,–1,–1,–1,–1,–1,–1,–1,–1,–1,–1,–1,–1,–1,–1,–1,–1,–1,–1,–1,–1,–1,–1,–1,–1,–1,0,–1,–1,–1,–1,–1,–1,–1,–1,–1,–1,–1,–1,–1,–1,–1,–1,–1,–1;

–1,190,25,–1,–1,–1,–1,–1,–1,34,–1,–1,–1,–1,–1,–1,–1,–1,–1,–1,–1,–1,–1,–1,–1,–1,–1,–1,–1,–1,–1,–1,–1,–1,0,–1,–1,–1,–1,–1,–1,–1,–1,–1,–1,–1,–1,–1,–1,–1,–1,–1;

103,–1,–1,–1,–1,4,–1,–1,–1,–1,–1,–1,–1,–1,–1,–1,–1,–1,–1,–1,–1,–1,–1,–1,–1,–1,–1,–1,–1,–1,–1,–1,–1,–1,–1,0,–1,–1,–1,–1,–1,–1,–1,–1,–1,–1,–1,–1,–1,–1,–1,–1;

–1,–1,197,–1,–1,–1,–1,88,–1,–1,–1,–1,86,154,–1,–1,–1,–1,–1,–1,–1,–1,–1,–1,–1,–1,–1,–1,–1,–1,–1,–1,–1,–1,–1,–1,0,–1,–1,–1,–1,–1,–1,–1,–1,–1,–1,–1,–1,–1,–1,–1;

8,–1,–1,–1,–1,–1,59,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,0,–1,–1,–1,–1,–1,–1,–1,–1,–1,–1,–1,–1,–1,–1;

–1,164,205,–1,–1,80,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,0,–1,–1,–1,–1,–1,–1,–1,–1,–1,–1,–1,–1,–1;

128,–1,–1,–1,206,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,0,–1,–1,–1,–1,–1,–1,–1,–1,–1,–1,–1,–1;

–1,–1,97,–1,–1,150,–1,8,–1,162,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,0,–1,–1,–1,–1,–1,–1,–1,–1,–1,–1,–1;

–1,87,–1,–1,–1,–1,–1,–1,–1,–1,–1,–1,–1,78,–1,–1,–1,–1,–1,–1,–1,–1,–1,–1,–1,–1,–1,–1,–1,–1,–1,–1,–1,–1,–1,–1,–1,–1,–1,–1,–1,0,–1,–1,–1,–1,–1,–1,–1,–1,–1,–1;

32,–1,–1,–1,–1,176,–1,–1,–1,–1,–1,–1,45,–1,–1,–1,–1,–1,–1,–1,–1,–1,–1,–1,–1,–1,–1,–1,–1,–1,–1,–1,–1,–1,–1,–1,–1,–1,–1,–1,–1,–1,0,–1,–1,–1,–1,–1,–1,–1,–1,–1;

–1,–1,206,–1,–1,–1,–1,92,–1,–1,38,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,0,–1,–1,–1,–1,–1,–1,–1,–1;

140,–1,–1,–1,–1,–1,–1,–1,–1,–1,–1,–1,126,26,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,0,–1,–1,–1,–1,–1,–1,–1;

–1,96,–1,–1,–1,160,–1,–1,–1,–1,–1,187,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,0,–1,–1,–1,–1,–1,–1;

183,–1,104,–1,–1,–1,–1,108,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,0,–1,–1,–1,–1,–1;

–1,–1,–1,–1,–1,–1,–1,–1,–1,–1,46,–1,–1,8,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,0,–1,–1,–1,–1;

–1,16,–1,–1,–1,207,–1,–1,–1,–1,–1,96,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,0,–1,–1,–1;

94,–1,–1,–1,–1,–1,–1,166,–1,–1,–1,–1,10,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,0,–1,–1;

–1,–1,147,–1,–1,–1,–1,–1,–1,–1,180,–1,–1,16,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,0,–1;

–1,129,–1,–1,–1,2,–1,–1,–1,–1,–1,121,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,0.

A coefficient matrix 8 is written as:

134,163,13,2,–1,–1,3,–1,–1,114,0,0,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1;

197,−1,−1,128,221,180,232,176,87,212,−1,0,0,−1,−1,−1,−1,−1,−1,−1,−1,−1,−1,−1,−1,−1,−1,−1, −1,−1,−1,−1,−1,−1,−1,−1,−1,−1,−1,−1,−1,−1,−1,−1,−1,−1,−1,−1,−1,−1,−1;

234,60,−1,44,190,−1,−1,−1,137,−1,1,−1,0,0,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1;

−1,170,96,−1,224,73,210,162,119,27,0,−1,−1,0,−1,−1,−1,−1,−1,−1,−1,−1,−1,−1,−1,−1,−1,−1,−1, −1,−1,−1,−1,−1,−1,−1,−1,−1,−1,−1,−1,−1,−1,−1,−1,−1,−1,−1,−1,−1,−1,−1;

190,154,−1,−1,−1,−1,−1,−1,−1,−1,−1,109,−1,−1,0,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1;

160,20,−1,−1,−1,105,−1,230,−1,−1,−1,164,−1,−1,−1,0,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1;

65,−1,−1,−1,−1,16,−1,214,−1,224,−1,116,−1,−1,−1,−1, 0,−1,−1,−1,−1,−1,−1,−1,−1,−1,−1,−1,−1,−1, −1,−1,−1,−1,−1,−1,−1,−1,−1,−1,−1,−1,−1,−1,−1,−1,−1,−1,−1,−1,−1,−1,−1;

−1,100,−1,−1,−1,148,−1,178,−1,−1,−1,221,−1,217,−1,−1,−1,0,−1,−1,−1,−1,−1,−1,−1,−1,−1,−1,−1,−1, −1,−1,−1,−1,−1,−1,−1,−1,−1,−1,−1,−1,−1,−1,−1,−1,−1,−1,−1,−1,−1,−1,−1,−1;

235,216,−1,−1,−1,−1,−1,−1,−1,−1,−1,−1,87,−1,−1,−1,−1,−1,0,−1,−1,−1,−1,−1,−1,−1,−1,−1,−1,−1,−1, −1,−1,−1,−1,−1,−1,−1,−1,−1,−1,−1,−1,−1,−1,−1,−1,−1,−1,−1,−1;

−1,214,−1,−1,−1,−1,−1,−1,70,−1,143,205,−1,−1,−1,−1,−1,−1,−1,0,−1,−1,−1,−1,−1,−1,−1,−1,−1,−1,−1, −1,−1,−1,−1,−1,−1,−1,−1,−1,−1,−1,−1,−1,−1,−1,−1,−1,−1,−1,−1,−1,−1;

199,2,−1,−1,−1,−1, 184,236,−1,−1,−1,−1,−1,−1,−1,−1,−1,−1,−1,−1,0,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1;

59,−1,−1,−1,−1,−1,−1,3 5,−1,55,−1,−1,−1,56,−1,−1,−1,−1,−1,−1,−1,0,−1,−1,−1,−1,−1,−1,−1,−1,−1,−1,−1,−1,−1,−1,−1,−1,−1,−1,−1,−1,−1,−1,−1,−1,−1,−1,−1,−1,−1;

−1,217,−1,143,−1,−1,−1,−1,−1,−1,−1,123,−1,−1,−1,−1,−1,−1,−1,−1,−1,−1,0,−1,−1,−1,−1,−1,−1,−1,−1,−1,−1,−1,−1,−1,−1,−1,−1,−1,−1,−1,−1,−1,−1,−1,−1,−1,−1,−1,−1,−1;

19,185,−1,−1,−1,−1,−1,−1,123,−1,−1,−1,−1,88,−1,−1,−1,−1,−1,−1,−1,−1,−1,0,−1,−1,−1,−1,−1,−1,−1,−1,−1,−1,−1,−1,−1,−1,−1,−1,−1,−1,−1,−1,−1,−1,−1,−1,−1,−1,−1,−1;

−1,17,−1,−1,−1,−1,178,−1,−1,−1,−1,46,−1,84,−1,−1,−1,−1,−1,−1,−1,−1,−1,−1,0,−1,−1,−1,−1,−1,−1,−1, −1,−1,−1,−1,−1,−1,−1,−1,−1,−1,−1,−1,−1,−1,−1,−1,−1,−1,−1,−1;

58,−1,−1,−1,−1,−1,−1,−1,−1,−1,138,162,−1,−1,−1,−1,−1,−1,−1,−1,−1,−1,−1,−1,−1,0,−1,−1,−1,−1,−1, −1,−1,−1,−1,−1,−1,−1,−1,−1,−1,−1,−1,−1,−1,−1,−1,−1,−1,−1,−1,−1,−1;

−1,55,−1,−1,−1,−1,−1,−1,−1,43,−1,22,174,−1,−1,−1,−1,−1,−1,−1,−1,−1,−1,−1,−1,−1,0,−1,−1,−1,−1, −1,−1,−1,−1,−1,−1,−1,−1,−1,−1,−1,−1,−1,−1,−1,−1,−1,−1,−1,−1,−1;

−1,63,−1,−1,−1,239,−1,−1,−1,−1,−1,236,187,−1,−1,−1,−1,−1,−1,−1,−1,−1,−1,−1,−1,−1,−1,−1,0,−1,−1, −1,−1,−1,−1,−1,−1,−1,−1,−1,−1,−1,−1,−1,−1,−1,−1,−1,−1,−1,−1,−1,−1;

27,−1,−1,−1,−1,−1,188,53,−1,−1,−1,−1,−1,−1,−1,−1,−1,−1,−1,−1,−1,−1,−1,−1,−1,−1,−1,−1,0,−1,−1, −1,−1,−1,−1,−1,−1,−1,−1,−1,−1,−1,−1,−1,−1,−1,−1,−1,−1,−1,−1,−1;

91,54,−1,−1,−1,−1,−1,−1,−1,−1,82,−1,−1,−1,−1,−1,−1,−1,−1,−1,−1,−1,−1,−1,−1,−1,−1,−1,−1,0,−1,−1,−1,−1,−1,−1,−1,−1,−1,−1,−1,−1,−1,−1,−1,−1,−1,−1,−1,−1,−1,−1;

−1,196,−1,−1,89,−1,−1,−1,−1,−1,−1,215,−1,−1,−1,−1,−1,−1,−1,−1,−1,−1,−1,−1,−1,−1,−1,−1,−1,−1,−1,0, −1,−1,−1,−1,−1,−1,−1,−1,−1,−1,−1,−1,−1,−1,−1,−1,−1,−1,−1,−1,−1;

80,−1,−1,−1,−1,−1,−1,−1,213,−1,−1,−1,−1,168,−1,−1,−1,−1,−1,−1,−1,−1,−1,−1,−1,−1,−1,−1,−1,−1,−1,−1,0,−1,−1,−1,−1,−1,−1,−1,−1,−1,−1,−1,−1,−1,−1,−1,−1,−1,−1,−1,−1;

−1,160,187,−1,−1,−1,−1,−1,−1,−1,−1,−1,−1,−1,−1,−1,−1,−1,−1,−1,−1,−1,−1,−1,−1,−1,−1,−1,−1,−1,−1,−1,0,−1,−1,−1,−1,−1,−1,−1,−1,−1,−1,−1,−1,−1,−1,−1,−1,−1,−1,−1;

28,−1,−1,239,−1,175,−1,−1,−1,−1,−1,−1,−1,−1,−1,−1,−1,−1,−1,−1,−1,−1,−1,−1,−1,−1,−1,−1,−1,−1,−1,−1,−1,0,−1,−1,−1,−1,−1,−1,−1,−1,−1,−1,−1,−1,−1,−1,−1,−1,−1,−1;

−1,56,220,−1,−1,−1,−1,−1,−1,133,−1,−1,−1,−1,−1,−1,−1,−1,−1,−1,−1,−1,−1,−1,−1,−1,−1,−1,−1,−1,−1,−1,−1,−1, 0,−1,−1,−1,−1,−1,−1,−1,−1,−1,−1,−1,−1,−1,−1,−1,−1,−1;

26,−1,−1,−1,−1,201,−1,−1,−1,−1,−1,−1,−1,−1,−1,−1,−1,−1,−1,−1,−1,−1,−1,−1,−1,−1,−1,−1,−1,−1,−1, −1,−1,−1,−1,0,−1,−1,−1,−1,−1,−1,−1,−1,−1,−1,−1,−1,−1,−1,−1,−1;

−1,−1,192,−1,−1,−1,−1,178,−1,−1,−1,−1,67,163,−1,−1,−1,−1,−1,−1,−1,−1,−1,−1,−1,−1,−1,−1,−1,−1, −1,−1,−1,−1,−1,−1,0,−1,−1,−1,−1,−1,−1,−1,−1,−1,−1,−1,−1,−1,−1,−1;

76,−1,−1,−1,−1,−1,75,−1,−1,−1,−1,−1,−1,−1,−1,−1,−1,−1,−1,−1,−1,−1,−1,−1,−1,−1,−1,−1,−1,−1,−1,−1,−1,−1,−1,0,−1,−1,−1,−1,−1,−1,−1,−1,−1,−1,−1,−1,−1,−1,−1;

−1,136,187,−1,−1,173,−1,−1,−1,−1,−1,−1,−1,−1,−1,−1,−1,−1,−1,−1,−1,−1,−1,−1,−1,−1,−1,−1,−1,−1, −1,−1,−1,−1,−1,−1,−1,−1,0,−1,−1,−1,−1,−1,−1,−1,−1,−1,−1,−1,−1,−1,−1;

224,−1,−1,−1,49,−1,−1,−1,−1,−1,−1,−1,−1,−1,−1,−1,−1,−1,−1,−1,−1,−1,−1,−1,−1,−1,−1,−1,−1,−1, −1,−1,−1,−1,−1,−1,−1,−1,0,−1,−1,−1,−1,−1,−1,−1,−1,−1,−1,−1,−1,−1;

−1,−1,32,−1,−1,15,−1,91,−1,211,−1,−1,−1,−1,−1,−1,−1,−1,−1,−1,−1,−1,−1,−1,−1,−1,−1,−1,−1,−1, −1,−1,−1,−1,−1,−1,−1,−1,−1,0,−1,−1,−1,−1,−1,−1,−1,−1,−1,−1,−1,−1;

−1,195,−1,−1,−1,−1,−1,−1,−1,−1,−1,−1,−1,81,−1,−1,−1,−1,−1,−1,−1,−1,−1,−1,−1,−1,−1,−1,−1,−1,−1,−1, −1,−1,−1,−1,−1,−1,−1,−1,−1,−1,0,−1,−1,−1,−1,−1,−1,−1,−1,−1,−1;

156,−1,−1,−1,−1,45,−1,−1,−1,−1,−1,−1,122,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1,0,−1,−1,−1,−1,−1,−1,−1,−1,−1;

−1,−1,226,−1,−1,−1,−1,59,−1,−1,214,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1,0,−1,−1,−1,−1,−1,−1,−1,−1;

152,−1,−1,−1,−1,−1,−1,−1,−1,−1,−1,−1,141,213,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1,0,−1,−1,−1,−1,−1,−1,−1;

−1,64,−1,−1,−1,124,−1,−1,−1,−1,−1,202,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1,0,−1,−1,−1,−1,−1,−1;

168,−1,90,−1,−1,−1,−1,116,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1,0,−1,−1,−1,−1,−1;

−1,−1,−1,−1,−1,−1,−1,−1,−1,−1,135,−1,−1,66,−1,−1,−1,−1,−1,−1,−1,−1,−1,−1,−1,−1,−1,−1,−1,−1,−1,−1, −1,−1,−1,−1,−1,−1,−1,−1,−1,−1,−1,−1,−1,−1,−1,0,−1,−1,−1,−1;

−1,50,−1,−1,−1,145,−1,−1,−1,−1,−1,132,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1,0,−1,−1,−1;

223,−1,−1,−1,−1,−1,−1,48,−1,−1,−1,−1,−1,140,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1,0,−1,−1;

−1,−1,221,−1,−1,−1,−1,−1,−1,−1,16,−1,−1,197,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1,0,−1;

−1,82,−1,−1,−1,221,−1,−1,−1,−1,−1,80,−1,−1,−1,−1,−1,−1,−1,−1,−1,−1,−1,−1,−1,−1,−1,−1,−1,−1,−1,−1, −1,−1,−1,−1,−1,−1,−1,−1,−1,−1,−1,−1,−1,−1,−1,−1,−1,−1,−1,−1,0.

All lifting sizes supported by a coefficient matrix i correspond to the lifting size subset Zseti, where i=1, 2, 3, . . . , 8; and an i-th set Z0seti corresponds to the coefficient matrix i, where i=1, 2, 3, . . . , 8. The coefficient matrices in the present application may be described in tables. For example, positions (including row indexes and column indexes in the coefficient matrix) and values of all the elements of non-"−1" need to be recorded in the tables.

In another optional implementation mode, the first coefficient matrix set at least includes one of coefficient matrices of 42 rows and 52 columns described below.

The coefficient matrix 1 is written as:

109,223,171,209,−1,−1,4,−1,−1,0,0,0,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1;

36,−1,−1,236,40,226,226,157,11,204,−1,0,0,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1;

15,131,−1,70,84,−1,−1,−1,170,−1,1,−1,0,0,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1;

−1,135,193,−1,97,158,177,11,96,223,0,−1,−1,0,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1;

117,19,−1,−1,−1,−1,−1,−1,−1,−1,−1,78,−1,−1,0,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1;

40,119,−1,−1,−1,116,−1,133,−1,−1,−1,102,−1,−1,−1,0,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1;

6,−1,−1,−1,−1,37,−1,77,−1,213,−1,138,−1,−1,−1,−1,0,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1;

−1,156,−1,−1,−1,215,−1,29,−1,−1,−1,120,−1,243,−1,−1,−1,0,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1;

76,167,−1,−1,−1,−1,−1,−1,−1,−1,−1,−1,210,−1,−1,−1,−1,−1,0,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1;

−1,241,−1,−1,−1,−1,−1,−1,44,−1,22,51,−1,−1,−1,−1,−1,−1,−1,0,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1;

244,221,−1,−1,−1,−1,206,250,−1,−1,−1,−1,−1,−1,−1,−1,−1,−1,−1,−1,0,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1;

194,−1,−1,−1,−1,−1,−1,174,−1,95,−1,−1,−1,199,−1,−1,−1,−1,−1,−1,−1,0,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1;

−1,66,−1,134,−1,−1,−1,−1,−1,−1,−1,255,−1,−1,−1,−1,−1,−1,−1,−1,−1,−1,0,−1,−1,−1,−1,−1,−1,−1,−1,−1,−1,−1,−1,−1,−1,−1,−1,−1,−1,−1,−1,−1,−1,−1,−1,−1,−1,−1,−1,−1;

98,159,−1,−1,−1,−1,−1,−1,68,−1,−1,−1,−1,17,−1,−1,−1,−1,−1,−1,−1,−1,−1,0,−1,−1,−1,−1,−1,−1,−1,−1,−1,−1,−1,−1,−1,−1,−1,−1,−1,−1,−1,−1,−1,−1,−1,−1,−1,−1,−1,−1;

−1,245,−1,−1,−1,−1,185,−1,−1,−1,−1,91,−1,249,−1,−1,−1,−1,−1,−1,−1,−1,−1,−1,0,−1,−1,−1,−1,−1,−1,−1,−1,−1,−1,−1,−1,−1,−1,−1,−1,−1,−1,−1,−1,−1,−1,−1,−1,−1,−1,−1;

53,−1,−1,−1,−1,−1,−1,−1,−1,−1,237,103,−1,−1,−1,−1,−1,−1,−1,−1,−1,−1,−1,−1,−1,0,−1,−1,−1,−1,−1,−1,−1,−1,−1,−1,−1,−1,−1,−1,−1,−1,−1,−1,−1,−1,−1,−1,−1,−1,−1,−1;

−1,19,−1,−1,−1,−1,−1,−1,−1,214,−1,151,241,−1,−1,−1,−1,−1,−1,−1,−1,−1,−1,−1,−1,−1,0,−1,−1,−1,−1,−1,−1,−1,−1,−1,−1,−1,−1,−1,−1,−1,−1,−1,−1,−1,−1,−1,−1,−1,−1,−1;

−1,185,−1,−1,−1,237,−1,−1,−1,−1,−1,41,122,−1,−1,−1,−1,−1,−1,−1,−1,−1,−1,−1,−1,−1,−1,0,−1,−1,−1,−1,−1,−1,−1,−1,−1,−1,−1,−1,−1,−1,−1,−1,−1,−1,−1,−1,−1,−1,−1,−1;

111,−1,−1,−1,−1,−1,211,225,−1,−1,−1,−1,−1,−1,−1,−1,−1,−1,−1,−1,−1,−1,−1,−1,−1,−1,−1,−1,0,−1,−1,−1,−1,−1,−1,−1,−1,−1,−1,−1,−1,−1,−1,−1,−1,−1,−1,−1,−1,−1,−1,−1;

150,38,−1,−1,−1,−1,−1,−1,−1,−1,66,−1,−1,−1,−1,−1,−1,−1,−1,−1,−1,−1,−1,−1,−1,−1,−1,−1,−1,0,−1,−1,−1,−1,−1,−1,−1,−1,−1,−1,−1,−1,−1,−1,−1,−1,−1,−1,−1,−1,−1,−1;

−1,191,−1,−1,250,−1,−1,−1,−1,−1,−1,214,−1,−1,−1,−1,−1,−1,−1,−1,−1,−1,−1,−1,−1,−1,−1,−1,−1,−1,0,−1,−1,−1,−1,−1,−1,−1,−1,−1,−1,−1,−1,−1,−1,−1,−1,−1,−1,−1,−1,−1;

2,−1,−1,−1,−1,−1,−1,−1,232,−1,−1,−1,−1,76,−1,−1,−1,−1,−1,−1,−1,−1,−1,−1,−1,−1,−1,−1,−1,−1,−1,0,−1,−1,−1,−1,−1,−1,−1,−1,−1,−1,−1,−1,−1,−1,−1,−1,−1,−1,−1,−1;

−1,147,134,−1,−1,−1,−1,−1,−1,−1,−1,−1,−1,−1,−1,−1,−1,−1,−1,−1,−1,−1,−1,−1,−1,−1,−1,−1,−1,−1,−1,−1,0,−1,−1,−1,−1,−1,−1,−1,−1,−1,−1,−1,−1,−1,−1,−1,−1,−1,−1,−1;

25,−1,−1,235,−1,194,−1,−1,−1,−1,−1,−1,−1,−1,−1,−1,−1,−1,−1,−1,−1,−1,−1,−1,−1,−1,−1,−1,−1,−1,−1,−1,−1,0,−1,−1,−1,−1,−1,−1,−1,−1,−1,−1,−1,−1,−1,−1,−1,−1,−1,−1;

−1,6,11,−1,−1,−1,−1,−1,−1,173,−1,−1,−1,−1,−1,−1,−1,−1,−1,−1,−1,−1,−1,−1,−1,−1,−1,−1,−1,−1,−1,−1,−1,−1,0,−1,−1,−1,−1,−1,−1,−1,−1,−1,−1,−1,−1,−1,−1,−1,−1,−1;

11,−1,−1,−1,−1,0,−1,−1,−1,−1,−1,−1,−1,−1,−1,−1,−1,−1,−1,−1,−1,−1,−1,−1,−1,−1,−1,−1,−1,−1,−1,−1,−1,−1,−1,0,−1,−1,−1,−1,−1,−1,−1,−1,−1,−1,−1,−1,−1,−1,−1,−1;

−1,−1,6,−1,−1,−1,−1,232,−1,−1,−1,−1,226,202,−1,−1,−1,−1,−1,−1,−1,−1,−1,−1,−1,−1,−1,−1,−1,−1,−1,−1,−1,−1,−1,−1,0,−1,−1,−1,−1,−1,−1,−1,−1,−1,−1,−1,−1,−1,−1,−1;

232,−1,−1,−1,−1,−1,19,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1,0,−1,−1,−1,−1,−1,−1,−1,−1,−1,−1,−1,−1,−1,−1;

−1,193,23,−1,−1,142,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1,0,−1,−1,−1,−1,−1,−1,−1,−1,−1,−1,−1,−1,−1;

0,−1,−1,−1,112,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1,0,−1,−1,−1,−1,−1,−1,−1,−1,−1,−1,−1,−1;

−1,−1,31,−1,−1,245,−1,12,−1,2,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1,0,−1,−1,−1,−1,−1,−1,−1,−1,−1,−1,−1;

−1,0,−1,−1,−1,−1,−1,−1,−1,−1,−1,−1,−1,152,−1,−1,−1,−1,−1,−1,−1,−1,−1,−1,−1,−1,−1,−1,−1,−1,−1,−1,−1,−1,−1,−1,−1,−1,−1,−1,−1,0,−1,−1,−1,−1,−1,−1,−1,−1,−1,−1;

5,−1,−1,−1,−1,24,−1,−1,−1,−1,−1,132,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1,0,−1,−1,−1,−1,−1,−1,−1,−1,−1;

−1,−1,80,−1,−1,−1,−1,145,−1,−1,26,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1,0,−1,−1,−1,−1,−1,−1,−1,−1;

27,−1,−1,−1,−1,−1,−1,−1,−1,−1,−1,−1,192,73,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1,0,−1,−1,−1,−1,−1,−1,−1;

−1,84,−1,−1,−1,218,−1,−1,−1,−1,−1,201,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1,0,−1,−1,−1,−1,−1,−1;

164,−1,115,−1,−1,−1,−1,183,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1,0,−1,−1,−1,−1,−1;

−1,−1,−1,−1,−1,−1,−1,−1,−1,−1,19,−1,−1,20,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1,0,−1,−1,−1,−1;

−1,109,−1,−1,−1,143,−1,−1,−1,−1,−1,119,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1,0,−1,−1,−1;

180,−1,−1,−1,−1,−1,143,−1,−1,−1,−1,135,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1,0,−1,−1;

−1,−1,164,−1,−1,−1,−1,−1,−1,31,−1,−1,13,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1,0,−1;

−1,230,−1,−1,−1,167,−1,−1,−1,−1,−1,122,−1,−1,−1,−1,−1,−1,−1,−1,−1,−1,−1,−1,−1,−1,−1,−1,−1,−1, −1,−1,−1,−1,−1,−1,−1,−1,−1,−1,−1,−1,−1,−1,−1,−1,−1,−1,−1,−1,−1,0.

The coefficient matrix 2 is written as:

121,9,19,93,−1,−1,168,−1,−1,51,0,0,−1,−1,−1,−1,−1,−1,−1,−1,−1,−1,−1,−1,−1,−1,−1,−1,−1,−1, −1,−1,−1,−1,−1,−1,−1,−1,−1,−1,−1,−1,−1,−1,−1,−1,−1,−1,−1,−1,−1;

116,−1,−1,149,111,2,21,184,140,69,−1,0,0,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1;

108,180,−1,147,77,−1,−1,−1,64,−1,1,−1,0,0,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1;

−1,115,81,−1,163,187,56,73,14,22,0,−1,−1,0,−1,−1,−1,−1,−1,−1,−1,−1,−1,−1,−1,−1,−1,−1,−1,−1, −1,−1,−1,−1,−1,−1,−1,−1,−1,−1,−1,−1,−1,−1,−1,−1,−1,−1,−1,−1,−1;

145,122,−1,−1,−1,−1,−1,−1,−1,−1,−1,67,−1,−1,−1,−1,−1,−1,−1,−1,−1,−1,−1,−1,−1,−1, −1,−1,−1,−1,−1,−1,−1,−1,−1,−1,−1,−1,−1,−1,−1,−1,−1,−1,−1,−1;

124,121,−1,−1,−1,4,−1,37,−1,−1,−1,145,−1,−1,−1,0,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1;

141,−1,−1,−1,−1,185,−1,124,−1,171,−1,151,−1,−1,−1,−1,0,−1,−1,−1,−1,−1,−1,−1,−1,−1,−1,−1,−1, −1,−1,−1,−1,−1,−1,−1,−1,−1,−1,−1,−1,−1,−1,−1,−1,−1,−1,−1,−1,−1,−1;

−1,185,−1,−1,−1,150,−1,190,−1,−1,−1,165,−1,134,−1,−1,−1,0,−1,−1,−1,−1,−1,−1,−1,−1,−1,−1,−1, −1,−1,−1,−1,−1,−1,−1,−1,−1,−1,−1,−1,−1,−1,−1,−1,−1,−1,−1,−1,−1,−1;

83,178,−1,−1,−1,−1,−1,−1,−1,−1,−1,−1,186,−1,−1,−1,−1,−1,0,−1,−1,−1,−1,−1,−1,−1,−1,−1,−1,−1, −1,−1,−1,−1,−1,−1,−1,−1,−1,−1,−1,−1,−1,−1,−1,−1,−1,−1,−1,−1;

−1,73,−1,−1,−1,−1,−1,−1,87,−1,175,123,−1,−1,−1,−1,−1,−1,−1,0,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1;

16,158,−1,−1,−1,−1,179,173,−1,−1,−1,−1,−1,−1,−1,−1,−1,−1,−1,−1,0,−1,−1,−1,−1,−1,−1,−1,−1, −1,−1,−1,−1,−1,−1,−1,−1,−1,−1,−1,−1,−1,−1,−1,−1,−1,−1,−1,−1,−1;

130,−1,−1,−1,−1,−1,−1,104,−1,174,−1,−1,−1,52,−1,−1,−1,−1,−1,−1,−1,0,−1,−1,−1,−1,−1,−1,−1,−1, −1,−1,−1,−1,−1,−1,−1,−1,−1,−1,−1,−1,−1,−1,−1,−1,−1,−1,−1,−1;

−1,179,−1,39,−1,−1,−1,−1,−1,−1,−1,139,−1,−1,−1,−1,−1,−1,−1,−1,−1,−1,0,−1,−1,−1,−1,−1,−1,−1, −1,−1,−1,−1,−1,−1,−1,−1,−1,−1,−1,−1,−1,−1,−1,−1,−1,−1,−1;

128,23,−1,−1,−1,−1,−1,−1,105,−1,−1,−1,−1,111,−1,−1,−1,−1,−1,−1,−1,−1,−1,0,−1,−1,−1,−1,−1,−1, −1,−1,−1,−1,−1,−1,−1,−1,−1,−1,−1,−1,−1,−1,−1,−1,−1,−1,−1,−1;

−1,88,−1,−1,−1,−1,95,−1,−1,−1,−1,85,−1,187,−1,−1,−1,−1,−1,−1,−1,−1,−1,−1,0,−1,−1,−1,−1,−1,−1, −1,−1,−1,−1,−1,−1,−1,−1,−1,−1,−1,−1,−1,−1,−1,−1,−1,−1;

108,−1,−1,−1,−1,−1,−1,−1,−1,60,98,−1,−1,−1,−1,−1,−1,−1,−1,−1,−1,−1,−1,−1,0,−1,−1,−1,−1,−1, −1,−1,−1,−1,−1,−1,−1,−1,−1,−1,−1,−1,−1,−1,−1,−1,−1,−1,−1;

−1,130,−1,−1,−1,−1,−1,−1,−1,12,−1,35,176,−1,−1,−1,−1,−1,−1,−1,−1,−1,−1,−1,−1,−1,0,−1,−1,−1,−1,−1,−1,−1,−1,−1,−1,−1,−1,−1,−1,−1,−1,−1,−1,−1,−1,−1,−1,−1,−1;

−1,134,−1,−1,−1,19,−1,−1,−1,−1,−1,0,127,−1,−1,−1,−1,−1,−1,−1,−1,−1,−1,−1,−1,−1,−1,0,−1,−1,−1, −1,−1,−1,−1,−1,−1,−1,−1,−1,−1,−1,−1,−1,−1,−1,−1,−1,−1,−1;

1,−1,−1,−1,−1,−1,78,163,−1,−1,−1,−1,−1,−1,−1,−1,−1,−1,−1,−1,−1,−1,−1,−1,−1,−1,−1,−1,0,−1,−1,−1,−1,−1,−1,−1,−1,−1,−1,−1,−1,−1,−1,−1,−1,−1,−1,−1,−1,−1,−1;

97,54,−1,−1,−1,−1,−1,−1,−1,−1,27,−1,−1,−1,−1,−1,−1,−1,−1,−1,−1,−1,−1,−1,−1,−1,−1,−1,−1,0,−1,−1,−1,−1,−1,−1,−1,−1,−1,−1,−1,−1,−1,−1,−1,−1,−1,−1,−1,−1,−1;

−1,94,−1,−1,28,−1,−1,−1,−1,−1,−1,185,−1,−1,−1,−1,−1,−1,−1,−1,−1,−1,−1,−1,−1,−1,−1,−1,−1,0, −1,−1,−1,−1,−1,−1,−1,−1,−1,−1,−1,−1,−1,−1,−1,−1,−1,−1,−1,−1;

83,−1,−1,−1,−1,−1,−1,−1,79,−1,−1,−1,−1,116,−1,−1,−1,−1,−1,−1,−1,−1,−1,−1,−1,−1,−1,−1,−1,−1, 0,−1,−1,−1,−1,−1,−1,−1,−1,−1,−1,−1,−1,−1,−1,−1,−1,−1,−1,−1,−1;

−1,22,67,−1,−1,−1,−1,−1,−1,−1,−1,−1,−1,−1,−1,−1,−1,−1,−1,−1,−1,−1,−1,−1,−1,−1,−1,−1,−1,−1,−1,0,−1,−1,−1,−1,−1,−1,−1,−1,−1,−1,−1,−1,−1,−1,−1,−1,−1,−1,−1;

97,−1,−1,43,−1,106,−1,−1,−1,−1,−1,−1,−1,−1,−1,−1,−1,−1,−1,−1,−1,−1,−1,−1,−1,−1,−1,−1,−1,−1, −1,−1,0,−1,−1,−1,−1,−1,−1,−1,−1,−1,−1,−1,−1,−1,−1,−1,−1,−1,−1;

−1,102,104,−1,−1,−1,−1,−1,−1,169,−1,−1,−1,−1,−1,−1,−1,−1,−1,−1,−1,−1,−1,−1,−1,−1,−1,−1,−1, −1,−1,−1,−1, 0,−1,−1,−1,−1,−1,−1,−1,−1,−1,−1,−1,−1,−1,−1,−1,−1;

171,−1,−1,−1,−1,121,−1,−1,−1,−1,−1,−1,−1,−1,−1,−1,−1,−1,−1,−1,−1,−1,−1,−1,−1,−1,−1,−1,−1,−1,−1,−1,0,−1,−1,−1,−1,−1,−1,−1,−1,−1,−1,−1,−1,−1,−1,−1,−1,−1,−1;

−1,−1,183,−1,−1,−1,−1,148,−1,−1,−1,−1,43,160,−1,−1,−1,−1,−1,−1,−1,−1,−1,−1,−1,−1,−1,−1,−1,−1, −1,−1,−1,−1,−1,−1,0,−1,−1,−1,−1,−1,−1,−1,−1,−1,−1,−1,−1,−1,−1;

108,−1,−1,−1,−1,−1,176,−1,−1,−1,−1,−1,−1,−1,−1,−1,−1,−1,−1,−1,−1,−1,−1,−1,−1,−1,−1,−1,−1,−1,−1,−1,−1,−1,−1,0,−1,−1,−1,−1,−1,−1,−1,−1,−1,−1,−1,−1,−1,−1,−1;

−1,118,161,−1,−1,191,−1,−1,−1,−1,−1,−1,−1,−1,−1,−1,−1,−1,−1,−1,−1,−1,−1,−1,−1,−1,−1,−1,−1, −1,−1,−1,−1,−1,−1,−1,0,−1,−1,−1,−1,−1,−1,−1,−1,−1,−1,−1,−1,−1;

22,−1,−1,−1,22,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1,0,−1,−1,−1,−1,−1,−1,−1,−1,−1,−1,−1,−1;

−1,−1,135,−1,−1,74,−1,154,−1,6,−1,−1,−1,−1,−1,−1,−1,−1,−1,−1,−1,−1,−1,−1,−1,−1,−1,−1,−1,−1, −1,−1,−1,−1,−1,−1,−1,−1,0,−1,−1,−1,−1,−1,−1,−1,−1,−1,−1,−1;

−1,137,−1,−1,−1,−1,−1,−1,−1,−1,−1,−1,−1,35,−1,−1,−1,−1,−1,−1,−1,−1,−1,−1,−1,−1,−1,−1,−1,−1, −1,−1,−1,−1,−1,−1,−1,−1,−1,0,−1,−1,−1,−1,−1,−1,−1,−1,−1,−1;

105,−1,−1,−1,−1,116,−1,−1,−1,−1,−1,−1,132,−1,−1,−1,−1,−1,−1,−1,−1,−1,−1,−1,−1,−1,−1,−1,−1,−1, −1,−1,−1,−1,−1,−1,−1,−1,−1,−1,0,−1,−1,−1,−1,−1,−1,−1,−1,−1;

−1,−1,146,−1,−1,−1,−1,158,−1,−1,59,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1,0,−1,−1,−1,−1,−1,−1,−1,−1;

37,−1,−1,−1,−1,−1,−1,−1,−1,−1,−1,−1,138,125,−1,−1,−1,−1,−1,−1,−1,−1,−1,−1,−1,−1,−1,−1,−1,−1,−1,−1,−1,−1,−1,−1,−1,−1,−1,−1,−1,−1,0,−1,−1,−1,−1,−1,−1,−1;

−1,73,−1,−1,−1,95,−1,−1,−1,−1,−1,128,−1,−1,−1,−1,−1,−1,−1,−1,−1,−1,−1,−1,−1,−1,−1,−1,−1,−1, −1,−1,−1,−1,−1,−1,−1,−1,−1,−1,−1,−1,−1,0,−1,−1,−1,−1,−1,−1;

47,−1,131,−1,−1,−1,−1,154,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1,0,−1,−1,−1,−1,−1;

−1,−1,−1,−1,−1,−1,−1,−1,−1,−1,58,−1,−1,137,−1,−1,−1,−1,−1,−1,−1,−1,−1,−1,−1,−1,−1,−1,−1,−1, −1,−1,−1,−1,−1,−1,−1,−1,−1,−1,−1,−1,−1,−1,−1,0,−1,−1,−1,−1;

−1,29,−1,−1,−1,124,−1,−1,−1,−1,−1,123,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1,0,−1,−1,−1;

175,−1,−1,−1,−1,−1,−1,74,−1,−1,−1,−1,147,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1,0,−1,−1;

−1,−1,51,−1,−1,−1,−1,−1,−1,−1,87,−1,−1,167,−1,−1,−1,−1,−1,−1,−1,−1,−1,−1,−1,−1,−1,−1,−1,−1, −1,−1,−1,−1,−1,−1,−1,−1,−1,−1,−1,−1,−1,−1,−1,−1,−1,−1,0,−1;

−1,27,−1,−1,−1,17,−1,−1,−1,−1,−1,1,−1,−1,−1,−1,−1,−1,−1,−1,−1,−1,−1,−1,−1,−1,−1,−1,−1,−1, −1,−1,−1,−1,−1,−1,−1,−1,−1,−1,−1,−1,−1,−1,−1,−1,−1,−1,−1,0.

The coefficient matrix 3 is written as:

94,136,3,2,−1,−1,15,−1,−1,71,0,0,−1,−1,−1,−1,−1,−1,−1,−1,−1,−1,−1,−1,−1,−1,−1,−1,−1,−1,−1,−1,−1, −1,−1,−1,−1,−1,−1,−1,−1,−1,−1,−1,−1,−1,−1,−1,−1,−1,−1,−1,−1;

71,−1,−1,126,0,119,103,34,75,126,−1,0,0,−1,−1,−1,−1,−1,−1,−1,−1,−1,−1,−1,−1,−1,−1,−1,−1,−1,−1,−1, −1,−1,−1,−1,−1,−1,−1,−1,−1,−1,−1,−1,−1,−1,−1,−1,−1,−1,−1,−1,−1;

114,70,−1,101,9,−1,−1,−1,23,−1,1,−1,0,0,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1;

−1,14,18,−1,102,105,27,91,128,117,0,−1,−1,0,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1;

33,51,−1,−1,−1,−1,−1,−1,−1,−1,−1,96,−1,−1,0,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1;

40,53,−1,−1,−1,47,−1,121,−1,−1,−1,10,−1,−1,−1,0,−1,−1,−1,−1,−1,−1,−1,−1,−1,−1,−1,−1,−1,−1,−1,−1, −1,−1,−1,−1,−1,−1,−1,−1,−1,−1,−1,−1,−1,−1,−1,−1,−1,−1,−1,−1,−1;

110,−1,−1,−1,−1,99,−1,149,−1,132,−1,4,−1,−1,−1,−1,0,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1;

−1,83,−1,−1,−1,111,−1,129,−1,−1,−1,43,−1,25,−1,−1,−1,0,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1;

94,41,−1,−1,−1,−1,−1,−1,−1,−1,−1,−1,87,−1,−1,−1,−1,0,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1;

−1,135,−1,−1,−1,−1,−1,−1,11,−1,50,84,−1,−1,−1,−1,−1,−1,0,−1,−1,−1,−1,−1,−1,−1,−1,−1,−1,−1,−1, −1,−1,−1,−1,−1,−1,−1,−1,−1,−1,−1,−1,−1,−1,−1,−1,−1,−1,−1,−1,−1;

154,34,−1,−1,−1,−1,141,86,−1,−1,−1,−1,−1,−1,−1,−1,−1,−1,−1,−1,0,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1;

54,−1,−1,−1,−1,−1,−1,40,−1,84,−1,−1,−1,43,−1,−1,−1,−1,−1,−1,−1,0,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1;

−1,31,−1,90,−1,−1,−1,−1,−1,−1,−1,113,−1,−1,−1,−1,−1,−1,−1,−1,−1,−1,0,−1,−1,−1,−1,−1,−1,−1,−1, −1,−1,−1,−1,−1,−1,−1,−1,−1,−1,−1,−1,−1,−1,−1,−1,−1,−1,−1,−1,−1;

41,86,−1,−1,−1,−1,−1,−1,16,−1,−1,−1,−1,79,−1,−1,−1,−1,−1,−1,−1,−1,−1,0,−1,−1,−1,−1,−1,−1,−1,−1,−1,−1,−1,−1,−1,−1,−1,−1,−1,−1,−1,−1,−1,−1,−1,−1,−1,−1,−1,−1;

−1,10,−1,−1,−1,−1,28,−1,−1,−1,−1,128,−1,104,−1,−1,−1,−1,−1,−1,−1,−1,−1,−1,0,−1,−1,−1,−1,−1,−1,−1,−1,−1,−1,−1,−1,−1,−1,−1,−1,−1,−1,−1,−1,−1,−1,−1,−1,−1,−1,−1;

65,−1,−1,−1,−1,−1,−1,−1,−1,−1,110,93,−1,−1,−1,−1,−1,−1,−1,−1,−1,−1,−1,−1,−1,0,−1,−1,−1,−1,−1, −1,−1,−1,−1,−1,−1,−1,−1,−1,−1,−1,−1,−1,−1,−1,−1,−1,−1,−1,−1,−1;

−1,24,−1,−1,−1,−1,−1,−1,−1,63,−1,0,33,−1,−1,−1,−1,−1,−1,−1,−1,−1,−1,−1,−1,−1,0,−1,−1,−1,−1,−1, −1,−1,−1,−1,−1,−1,−1,−1,−1,−1,−1,−1,−1,−1,−1,−1,−1,−1,−1,−1,−1;

−1,35,−1,−1,−1,100,−1,−1,−1,−1,−1,86,0,−1,−1,−1,−1,−1,−1,−1,−1,−1,−1,−1,−1,−1,−1,0,−1,−1,−1,−1,−1,−1,−1,−1,−1,−1,−1,−1,−1,−1,−1,−1,−1,−1,−1,−1,−1,−1,−1,−1;

129,−1,−1,−1,−1,−1,37,149,−1,−1,−1,−1,−1,−1,−1,−1,−1,−1,−1,−1,−1,−1,−1,−1,−1,−1,−1,−1,0,−1,−1, −1,−1,−1,−1,−1,−1,−1,−1,−1,−1,−1,−1,−1,−1,−1,−1,−1,−1,−1,−1,−1;

117,48,−1,−1,−1,−1,−1,−1,−1,−1,136,−1,−1,−1,−1,−1,−1,−1,−1,−1,−1,−1,−1,−1,−1,−1,−1,−1,−1,0,−1,−1,−1,−1,−1,−1,−1,−1,−1,−1,−1,−1,−1,−1,−1,−1,−1,−1,−1,−1,−1,−1;

−1,47,−1,−1,28,−1,−1,−1,−1,−1,−1,150,−1,−1,−1,−1,−1,−1,−1,−1,−1,−1,−1,−1,−1,−1,−1,−1,−1,−1,0, −1,−1,−1,−1,−1,−1,−1,−1,−1,−1,−1,−1,−1,−1,−1,−1,−1,−1,−1,−1,−1;

56,−1,−1,−1,−1,−1,−1,−1,118,−1,−1,−1,−1,126,−1,−1,−1,−1,−1,−1,−1,−1,−1,−1,−1,−1,−1,−1,−1,−1,−1,0,−1,−1,−1,−1,−1,−1,−1,−1,−1,−1,−1,−1,−1,−1,−1,−1,−1,−1,−1,−1;

−1,40,125,−1,−1,−1,−1,−1,−1,−1,−1,−1,−1,−1,−1,−1,−1,−1,−1,−1,−1,−1,−1,−1,−1,−1,−1,−1,−1,−1,−1, −1,0,−1,−1,−1,−1,−1,−1,−1,−1,−1,−1,−1,−1,−1,−1,−1,−1,−1,−1,−1;

7,−1,−1,113,−1,65,−1,−1,−1,−1,−1,−1,−1,−1,−1,−1,−1,−1,−1,−1,−1,−1,−1,−1,−1,−1,−1,−1,−1,−1,−1,−1,−1,0,−1,−1,−1,−1,−1,−1,−1,−1,−1,−1,−1,−1,−1,−1,−1,−1,−1,−1;

−1,135,16,−1,−1,−1,−1,−1,−1,93,−1,−1,−1,−1,−1,−1,−1,−1,−1,−1,−1,−1,−1,−1,−1,−1,−1,−1,−1,−1,−1, −1,−1,−1,0,−1,−1,−1,−1,−1,−1,−1,−1,−1,−1,−1,−1,−1,−1,−1,−1,−1;

80,−1,−1,−1,−1,143,−1,−1,−1,−1,−1,−1,−1,−1,−1,−1,−1,−1,−1,−1,−1,−1,−1,−1,−1,−1,−1,−1,−1,−1,−1, −1,−1,−1,−1,0,−1,−1,−1,−1,−1,−1,−1,−1,−1,−1,−1,−1,−1,−1,−1,−1;

−1,−1,42,−1,−1,−1,−1,144,−1,−1,−1,−1,125,19,−1,−1,−1,−1,−1,−1,−1,−1,−1,−1,−1,−1,−1,−1,−1,−1,−1,−1,−1,−1,−1,−1,0,−1,−1,−1,−1,−1,−1,−1,−1,−1,−1,−1,−1,−1,−1,−1;

144,−1,−1,−1,−1,−1,100,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1,0,−1,−1,−1,−1,−1,−1,−1,−1,−1,−1,−1,−1,−1,−1;

−1,124,52,−1,−1,116,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1,0,−1,−1,−1,−1,−1,−1,−1,−1,−1,−1,−1,−1,−1;

141,−1,−1,−1,120,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1,0,−1,−1,−1,−1,−1,−1,−1,−1,−1,−1,−1,−1;

−1,−1,68,−1,−1,33,−1,62,−1,32,−1,−1,−1,−1,−1,−1,−1,−1,−1,−1,−1,−1,−1,−1,−1,−1,−1,−1,−1,−1,−1, −1,−1,−1,−1,−1,−1,−1,−1,−1,0,−1,−1,−1,−1,−1,−1,−1,−1,−1,−1,−1;

−1,94,−1,−1,−1,−1,−1,−1,−1,−1,−1,−1,−1,121,−1,−1,−1,−1,−1,−1,−1,−1,−1,−1,−1,−1,−1,−1,−1,−1,−1, −1,−1,−1,−1,−1,−1,−1,−1,−1,−1,0,−1,−1,−1,−1,−1,−1,−1,−1,−1,−1;

0,−1,−1,−1,−1,133,−1,−1,−1,−1,−1,−1,92,−1,−1,−1,−1,−1,−1,−1,−1,−1,−1,−1,−1,−1,−1,−1,−1,−1,−1,−1,−1,−1,−1,−1,−1,−1,−1,−1,−1,−1,0,−1,−1,−1,−1,−1,−1,−1,−1,−1;

−1,−1,6,−1,−1,−1,−1,103,−1,−1,89,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1,0,−1,−1,−1,−1,−1,−1,−1,−1;

70,−1,−1,−1,−1,−1,−1,−1,−1,−1,−1,−1,78,127,−1,−1,−1,−1,−1,−1,−1,−1,−1,−1,−1,−1,−1,−1,−1,−1,−1, −1,−1,−1,−1,−1,−1,−1,−1,−1,−1,−1,−1,−1,0,−1,−1,−1,−1,−1,−1,−1;

−1,63,−1,−1,−1,132,−1,−1,−1,−1,−1,36,−1,−1,−1,−1,−1,−1,−1,−1,−1,−1,−1,−1,−1,−1,−1,−1,−1,−1,−1, −1,−1,−1,−1,−1,−1,−1,−1,−1,−1,−1,−1,−1,−1,0,−1,−1,−1,−1,−1,−1;

99,−1,83,−1,−1,−1,−1,108,−1,−1,−1,−1,−1,−1,−1,−1,−1,−1,−1,−1,−1,−1,−1,−1,−1,−1,−1,−1,−1,−1,−1, −1,−1,−1,−1,−1,−1,−1,−1,−1,−1,−1,−1,−1,−1,−1,0,−1,−1,−1,−1,−1;

−1,−1,−1,−1,−1,−1,−1,−1,−1,−1,50,−1,−1,97,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1,0,−1,−1,−1,−1;

−1,151,−1,−1,−1,64,−1,−1,−1,−1,−1,32,−1,−1,−1,−1,−1,−1,−1,−1,−1,−1,−1,−1,−1,−1,−1,−1,−1,−1,−1, −1,−1,−1,−1,−1,−1,−1,−1,−1,−1,−1,−1,−1,−1,−1,−1,−1,0,−1,−1,−1;

27,−1,−1,−1,−1,−1,−1,61,−1,−1,−1,−1,51,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1,0,−1,−1;

−1,−1,78,−1,−1,−1,−1,−1,−1,−1,76,−1,−1,111,−1,−1,−1,−1,−1,−1,−1,−1,−1,−1,−1,−1,−1,−1,−1,−1,−1, −1,−1,−1,−1,−1,−1,−1,−1,−1,−1,−1,−1,−1,−1,−1,−1,−1,−1,−1,0,−1;

−1,30,−1,−1,−1,156,−1,−1,−1,−1,−1,103,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1,0.

The coefficient matrix 4 is written as:

191,100,49,135,−1,−1,36,−1,−1,80,0,0,−1,−1,−1,−1,−1,−1,−1,−1,−1,−1,−1,−1,−1,−1,−1,−1,−1,−1,−1, −1,−1,−1,−1,−1,−1,−1,−1,−1,−1,−1,−1,−1,−1,−1,−1,−1,−1,−1,−1,−1;

119,−1,−1,26,219,57,199,89,25,42,−1,0,0,−1,−1,−1,−1,−1,−1,−1,−1,−1,−1,−1,−1,−1,−1,−1,−1,−1,−1, −1,−1,−1,−1,−1,−1,−1,−1,−1,−1,−1,−1,−1,−1,−1,−1,−1,−1,−1,−1,−1;

19,25,−1,6,131,−1,−1,−1,55,−1,1,−1,0,0,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1;

−1,103,90,−1,140,4,38,53,29,36,0,−1,−1,0,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1;

172,35,−1,−1,−1,−1,−1,−1,−1,−1,−1,17,−1,−1,0,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1;

96,121,−1,−1,−1,80,−1,207,−1,−1,−1,183,−1,−1,−1,0,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1;

6,−1,−1,−1,−1,143,−1,86,−1,15,−1,98,−1,−1,−1,−1,0,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1;

−1,16,−1,−1,−1,18,−1,28,−1,−1,−1,69,−1,50,−1,−1,−1,0,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1;

17,19,−1,−1,−1,−1,−1,−1,−1,−1,−1,−1,77,−1,−1,−1,−1,−1,0,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1;

−1,207,−1,−1,−1,−1,−1,−1,199,−1,87,39,−1,−1,−1,−1,−1,−1,−1,0,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1;

34,202,−1,−1,−1,−1,29,174,−1,−1,−1,−1,−1,−1,−1,−1,−1,−1,−1,−1,0,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1;

176,−1,−1,−1,−1,−1,−1,19,−1,222,−1,−1,−1,201,−1,−1,−1,−1,−1,−1,−1,0,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1;

−1,33,−1,100,−1,−1,−1,−1,−1,−1,−1,55,−1,−1,−1,−1,−1,−1,−1,−1,−1,−1,0,−1,−1,−1,−1,−1,−1,−1,−1,−1,−1,−1,−1,−1,−1,−1,−1,−1,−1,−1,−1,−1,−1,−1,−1,−1,−1,−1,−1,−1;

3,155,−1,−1,−1,−1,−1,−1,114,−1,−1,−1,−1,195,−1,−1,−1,−1,−1,−1,−1,−1,−1,0,−1,−1,−1,−1,−1,−1,−1,−1,−1,−1,−1,−1,−1,−1,−1,−1,−1,−1,−1,−1,−1,−1,−1,−1,−1,−1,−1,−1;

−1,168,−1,−1,−1,−1,14,−1,−1,−1,−1,198,−1,14,−1,−1,−1,−1,−1,−1,−1,−1,−1,−1,0,−1,−1,−1,−1,−1,−1,−1,−1,−1,−1,−1,−1,−1,−1,−1,−1,−1,−1,−1,−1,−1,−1,−1,−1,−1,−1,−1;

77,−1,−1,−1,−1,−1,−1,−1,−1,−1,81,212,−1,−1,−1,−1,−1,−1,−1,−1,−1,−1,−1,−1,−1,0,−1,−1,−1,−1,−1,−1,−1,−1,−1,−1,−1,−1,−1,−1,−1,−1,−1,−1,−1,−1,−1,−1,−1,−1,−1,−1;

−1,26,−1,−1,−1,−1,−1,−1,−1,31,−1,193,20,−1,−1,−1,−1,−1,−1,−1,−1,−1,−1,−1,−1,−1,0,−1,−1,−1,−1,−1,−1,−1,−1,−1,−1,−1,−1,−1,−1,−1,−1,−1,−1,−1,−1,−1,−1,−1,−1,−1;

−1,40,−1,−1,−1,89,−1,−1,−1,−1,−1,27,194,−1,−1,−1,−1,−1,−1,−1,−1,−1,−1,−1,−1,−1,−1,0,−1,−1,−1,−1,−1,−1,−1,−1,−1,−1,−1,−1,−1,−1,−1,−1,−1,−1,−1,−1,−1,−1,−1,−1;

33,−1,−1,−1,−1,−1,132,194,−1,−1,−1,−1,−1,−1,−1,−1,−1,−1,−1,−1,−1,−1,−1,−1,−1,−1,−1,−1,0,−1,−1,−1,−1,−1,−1,−1,−1,−1,−1,−1,−1,−1,−1,−1,−1,−1,−1,−1,−1,−1,−1,−1;

148,170,−1,−1,−1,−1,−1,−1,−1,−1,170,−1,−1,−1,−1,−1,−1,−1,−1,−1,−1,−1,−1,−1,−1,−1,−1,−1,−1,0,−1,−1,−1,−1,−1,−1,−1,−1,−1,−1,−1,−1,−1,−1,−1,−1,−1,−1,−1,−1,−1,−1;

−1,23,−1,−1,182,−1,−1,−1,−1,−1,−1,212,−1,−1,−1,−1,−1,−1,−1,−1,−1,−1,−1,−1,−1,−1,−1,−1,−1,−1,0,−1,−1,−1,−1,−1,−1,−1,−1,−1,−1,−1,−1,−1,−1,−1,−1,−1,−1,−1,−1,−1;

19,−1,−1,−1,−1,−1,−1,−1,122,−1,−1,−1,−1,66,−1,−1,−1,−1,−1,−1,−1,−1,−1,−1,−1,−1,−1,−1,−1,−1,−1,0,−1,−1,−1,−1,−1,−1,−1,−1,−1,−1,−1,−1,−1,−1,−1,−1,−1,−1,−1,−1;

−1,0,31,−1,−1,−1,−1,−1,−1,−1,−1,−1,−1,−1,−1,−1,−1,−1,−1,−1,−1,−1,−1,−1,−1,−1,−1,−1,−1,−1,−1,−1,0,−1,−1,−1,−1,−1,−1,−1,−1,−1,−1,−1,−1,−1,−1,−1,−1,−1,−1,−1;

49,−1,−1,134,−1,16,−1,−1,−1,−1,−1,−1,−1,−1,−1,−1,−1,−1,−1,−1,−1,−1,−1,−1,−1,−1,−1,−1,−1,−1,−1,−1,−1,0,−1,−1,−1,−1,−1,−1,−1,−1,−1,−1,−1,−1,−1,−1,−1,−1,−1,−1;

−1,64,72,−1,−1,−1,−1,−1,−1,180,−1,−1,−1,−1,−1,−1,−1,−1,−1,−1,−1,−1,−1,−1,−1,−1,−1,−1,−1,−1,−1,−1,−1,−1,0,−1,−1,−1,−1,−1,−1,−1,−1,−1,−1,−1,−1,−1,−1,−1,−1,−1;

221,−1,−1,−1,−1,33,−1,−1,−1,−1,−1,−1,−1,−1,−1,−1,−1,−1,−1,−1,−1,−1,−1,−1,−1,−1,−1,−1,−1,−1,−1,−1,−1,−1,−1,0,−1,−1,−1,−1,−1,−1,−1,−1,−1,−1,−1,−1,−1,−1,−1,−1;

−1,−1,27,−1,−1,−1,−1,87,−1,−1,−1,−1,157,187,−1,−1,−1,−1,−1,−1,−1,−1,−1,−1,−1,−1,−1,−1,−1,−1,−1,−1,−1,−1,−1,−1,0,−1,−1,−1,−1,−1,−1,−1,−1,−1,−1,−1,−1,−1,−1,−1;

201,−1,−1,−1,−1,−1,72,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1,0,−1,−1,−1,−1,−1,−1,−1,−1,−1,−1,−1,−1,−1,−1;

−1,219,202,−1,−1,68,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1,0,−1,−1,−1,−1,−1,−1,−1,−1,−1,−1,−1,−1,−1;

153,−1,−1,−1,196,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1,0,−1,−1,−1,−1,−1,−1,−1,−1,−1,−1,−1,−1;

−1,−1,68,−1,−1,217,−1,131,−1,93,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1,0,−1,−1,−1,−1,−1,−1,−1,−1,−1,−1,−1;

−1,193,−1,−1,−1,−1,−1,−1,−1,−1,−1,−1,−1,141,−1,−1,−1,−1,−1,−1,−1,−1,−1,−1,−1,−1,−1,−1,−1,−1,−1,−1,−1,−1,−1,−1,−1,−1,−1,−1,−1,0,−1,−1,−1,−1,−1,−1,−1,−1,−1,−1;

82,−1,−1,−1,−1,138,−1,−1,−1,−1,−1,−1,204,−1,−1,−1,−1,−1,−1,−1,−1,−1,−1,−1,−1,−1,−1,−1,−1,−1,−1,−1,−1,−1,−1,−1,−1,−1,−1,−1,−1,−1,0,−1,−1,−1,−1,−1,−1,−1,−1,−1;

−1,−1,142,−1,−1,−1,−1,53,−1,−1,144,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1,0,−1,−1,−1,−1,−1,−1,−1,−1;

79,−1,−1,−1,−1,−1,−1,−1,−1,−1,−1,−1,93,54,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1,0,−1,−1,−1,−1,−1,−1,−1;

−1,188,−1,−1,−1,135,−1,−1,−1,−1,−1,205,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1,0,−1,−1,−1,−1,−1,−1;

177,−1,124,−1,−1,−1,−1,66,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1,0,−1,−1,−1,−1,−1;

−1,−1,−1,−1,−1,−1,−1,−1,−1,−1,57,−1,−1,62,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1,0,−1,−1,−1,−1;

−1,45,−1,−1,−1,97,−1,−1,−1,−1,−1,150,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1,0,−1,−1,−1;

105,−1,−1,−1,−1,−1,10,−1,−1,−1,−1,223,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1,0,−1,−1;

−1,−1,200,−1,−1,−1,−1,−1,−1,−1,129,−1,−1,216,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1,0,−1;

−1,208,−1,−1,−1,32,−1,−1,−1,−1,−1,53,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1,0.

The coefficient matrix 5 is written as:

6,11,117,94,−1,−1,36,−1,−1,2,0,0,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1;

63,−1,−1,100,10,4,52,13,26,97,−1,0,0,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1;

3,36,−1,3,142,−1,−1,−1,34,−1,1,−1,0,0,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1;

−1,88,125,−1,127,7,11,68,112,23,0,−1,−1,0,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1;

106,37,−1,−1,−1,−1,−1,−1,−1,−1,−1,27,−1,−1,0,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1;

15,133,−1,−1,−1,21,−1,101,−1,−1,−1,46,−1,−1,−1,0,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1;

26,−1,−1,−1,−1,34,−1,37,−1,99,−1,139,−1,−1,−1,−1,0,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1;

−1,136,−1,−1,−1,61,−1,120,−1,−1,−1,133,−1,77,−1,−1,−1,0,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1;

77,4,−1,−1,−1,−1,−1,−1,−1,−1,−1,−1,72,−1,−1,−1,−1,−1,0,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1;

−1,18,−1,−1,−1,−1,−1,−1,13,−1,77,22,−1,−1,−1,−1,−1,−1,−1,0,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1;

37,102,−1,−1,−1,−1,131,103,−1,−1,−1,−1,−1,−1,−1,−1,−1,−1,−1,−1,0,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1;

50,−1,−1,−1,−1,−1,−1,103,−1,95,−1,−1,−1,103,−1,−1,−1,−1,−1,−1,−1,0,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1;

−1,65,−1,105,−1,−1,−1,−1,−1,−1,−1,88,−1,−1,−1,−1,−1,−1,−1,−1,−1,−1,0,−1,−1,−1,−1,−1,−1,−1,−1,−1,−1,−1,−1,−1,−1,−1,−1,−1,−1,−1,−1,−1,−1,−1,−1,−1,−1,−1,−1,−1;

77,95,−1,−1,−1,−1,−1,−1,14,−1,−1,−1,−1,105,−1,−1,−1,−1,−1,−1,−1,−1,−1,0,−1,−1,−1,−1,−1,−1,−1,−1,−1,−1,−1,−1,−1,−1,−1,−1,−1,−1,−1,−1,−1,−1,−1,−1,−1,−1,−1,−1;

−1,49,−1,−1,−1,−1,55,−1,−1,−1,−1,41,−1,124,−1,−1,−1,−1,−1,−1,−1,−1,−1,−1,0,−1,−1,−1,−1,−1,−1,−1,−1,−1,−1,−1,−1,−1,−1,−1,−1,−1,−1,−1,−1,−1,−1,−1,−1,−1,−1,−1;

21,−1,−1,−1,−1,−1,−1,−1,−1,−1,90,22,−1,−1,−1,−1,−1,−1,−1,−1,−1,−1,−1,−1,−1,0,−1,−1,−1,−1,−1,−1,−1,−1,−1,−1,−1,−1,−1,−1,−1,−1,−1,−1,−1,−1,−1,−1,−1,−1,−1,−1;

−1,129,−1,−1,−1,−1,−1,−1,−1,9,−1,68,37,−1,−1,−1,−1,−1,−1,−1,−1,−1,−1,−1,−1,−1,0,−1,−1,−1,−1,−1,−1,−1,−1,−1,−1,−1,−1,−1,−1,−1,−1,−1,−1,−1,−1,−1,−1,−1,−1,−1;

−1,25,−1,−1,−1,143,−1,−1,−1,−1,−1,34,10,−1,−1,−1,−1,−1,−1,−1,−1,−1,−1,−1,−1,−1,−1,0,−1,−1,−1,−1,−1,−1,−1,−1,−1,−1,−1,−1,−1,−1,−1,−1,−1,−1,−1,−1,−1,−1,−1,−1;

98,−1,−1,−1,−1,−1,112,78,−1,−1,−1,−1,−1,−1,−1,−1,−1,−1,−1,−1,−1,−1,−1,−1,−1,−1,−1,−1,0,−1,−1,−1,−1,−1,−1,−1,−1,−1,−1,−1,−1,−1,−1,−1,−1,−1,−1,−1,−1,−1,−1,−1;

51,37,−1,−1,−1,−1,−1,−1,−1,−1,86,−1,−1,−1,−1,−1,−1,−1,−1,−1,−1,−1,−1,−1,−1,−1,−1,−1,−1,0,−1,−1,−1,−1,−1,−1,−1,−1,−1,−1,−1,−1,−1,−1,−1,−1,−1,−1,−1,−1,−1,−1;

−1,67,−1,−1,0,−1,−1,−1,−1,−1,−1,101,−1,−1,−1,−1,−1,−1,−1,−1,−1,−1,−1,−1,−1,−1,−1,−1,−1,−1,0,−1,−1,−1,−1,−1,−1,−1,−1,−1,−1,−1,−1,−1,−1,−1,−1,−1,−1,−1,−1,−1;

135,−1,−1,−1,−1,−1,−1,−1,52,−1,−1,−1,−1,88,−1,−1,−1,−1,−1,−1,−1,−1,−1,−1,−1,−1,−1,−1,−1,−1,−1,0,−1,−1,−1,−1,−1,−1,−1,−1,−1,−1,−1,−1,−1,−1,−1,−1,−1,−1,−1,−1;

−1,136,1,−1,−1,−1,−1,−1,−1,−1,−1,−1,−1,−1,−1,−1,−1,−1,−1,−1,−1,−1,−1,−1,−1,−1,−1,−1,−1,−1,−1,1,0,−1,−1,−1,−1,−1,−1,−1,−1,−1,−1,−1,−1,−1,−1,−1,−1,−1,−1,−1;

9,−1,−1,142,−1,121,−1,−1,−1,−1,−1,−1,−1,−1,−1,−1,−1,−1,−1,−1,−1,−1,−1,−1,−1,−1,−1,−1,−1,−1,−1,−1,−1,0,−1,−1,−1,−1,−1,−1,−1,−1,−1,−1,−1,−1,−1,−1,−1,−1,−1,−1;

−1,122,26,−1,−1,−1,−1,−1,−1,125,−1,−1,−1,−1,−1,−1,−1,−1,−1,−1,−1,−1,−1,−1,−1,−1,−1,−1,−1,−1,−1,−1,−1,−1,0,−1,−1,−1,−1,−1,−1,−1,−1,−1,−1,−1,−1,−1,−1,−1,−1,−1;

10,−1,−1,−1,−1,128,−1,−1,−1,−1,−1,−1,−1,−1,−1,−1,−1,−1,−1,−1,−1,−1,−1,−1,−1,−1,−1,−1,−1,−1,−1,−1,−1,−1,−1,0,−1,−1,−1,−1,−1,−1,−1,−1,−1,−1,−1,−1,−1,−1,−1,−1;

−1,−1,111,−1,−1,−1,−1,106,−1,−1,−1,−1,142,98,−1,−1,−1,−1,−1,−1,−1,−1,−1,−1,−1,−1,−1,−1,−1,−1,−1,−1,−1,−1,−1,−1,0,−1,−1,−1,−1,−1,−1,−1,−1,−1,−1,−1,−1,−1,−1,−1;

19,−1,−1,−1,−1,−1,7,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1,0,−1,−1,−1,−1,−1,−1,−1,−1,−1,−1,−1,−1,−1,−1;

−1,55,68,−1,−1,120,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1,0,−1,−1,−1,−1,−1,−1,−1,−1,−1,−1,−1,−1,−1;

40,−1,−1,−1,19,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1,0,−1,−1,−1,−1,−1,−1,−1,−1,−1,−1,−1,−1;

−1,−1,126,−1,−1,113,−1,112,−1,37,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1,0,−1,−1,−1,−1,−1,−1,−1,−1,−1,−1,−1;

−1,107,−1,−1,−1,−1,−1,−1,−1,−1,−1,−1,−1,130,−1,−1,−1,−1,−1,−1,−1,−1,−1,−1,−1,−1,−1,−1,−1,−1,−1,−1,−1,−1,−1,−1,−1,−1,−1,−1,−1,0,−1,−1,−1,−1,−1,−1,−1,−1,−1,−1;

2,−1,−1,−1,−1,66,−1,−1,−1,−1,−1,−1,68,−1,−1,−1,−1,−1,−1,−1,−1,−1,−1,−1,−1,−1,−1,−1,−1,−1,−1,−1,−1,−1,−1,−1,−1,−1,−1,−1,−1,−1,0,−1,−1,−1,−1,−1,−1,−1,−1,−1;

−1,−1,95,−1,−1,−1,−1,115,−1,−1,37,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1,0,−1,−1,−1,−1,−1,−1,−1,−1;

56,−1,−1,−1,−1,−1,−1,−1,−1,−1,−1,10,16,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1,0,−1,−1,−1,−1,−1,−1,−1;

−1,12,−1,−1,−1,43,−1,−1,−1,−1,−1,15,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1,0,−1,−1,−1,−1,−1,−1;

96,−1,116,−1,−1,−1,−1,70,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1,0,−1,−1,−1,−1,−1;

−1,−1,−1,−1,−1,−1,−1,−1,−1,−1,31,−1,−1,74,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1,0,−1,−1,−1,−1;

−1,124,−1,−1,−1,91,−1,−1,−1,−1,−1,100,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1,0,−1,−1,−1;

11,−1,−1,−1,−1,−1,−1,2,−1,−1,−1,−1,121,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1,0,−1,−1;

−1,−1,101,−1,−1,−1,−1,−1,−1,−1,24,−1,−1,37,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1,0,−1;

−1,88,−1,−1,−1,89,−1,−1,−1,−1,−1,23,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1,0.

The coefficient matrix 6 is written as:

121,74,89,122,−1,−1,141,−1,−1,137,0,0,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1;

118,−1,−1,0,25,171,133,79,173,121,−1,0,0,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1;

42,121,−1,95,8,−1,−1,−1,29,−1,1,−1,0,0,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1;

−1,64,110,−1,143,78,90,9,55,90,0,−1,−1,0,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1;

31,48,−1,−1,−1,−1,−1,−1,−1,−1,−1,162,−1,−1,0,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1;

28,29,−1,−1,−1,99,−1,142,−1,−1,−1,80,−1,−1,−1,0,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1;

17,–1,–1,–1,–1,38,–1,63,–1,26,–1,167,–1,–1,–1,–1,0,–1,–1,–1,–1,–1,–1,–1,–1,–1,–1,–1,–1,–1, –1,–1,–1,–1,–1,–1,–1,–1,–1,–1,–1,–1,–1,–1,–1,–1,–1,–1,–1,–1;

–1,44,–1,–1,–1,68,–1,59,–1,–1,–1,110,–1,86,–1,–1,–1, 0,–1,–1,–1,–1,–1,–1,–1,–1,–1,–1,–1,–1,–1, –1,–1,–1,–1,–1,–1,–1,–1,–1,–1,–1,–1,–1,–1,–1,–1,–1,–1,–1,–1;

104,58,–1,–1,–1,–1,–1,–1,–1,–1,–1,53,–1,–1,–1,–1,–1,0,–1,–1,–1,–1,–1,–1,–1,–1,–1,–1,–1,–1, –1,–1,–1,–1,–1,–1,–1,–1,–1,–1,–1,–1,–1,–1,–1,–1,–1,–1,–1,–1;

–1,136,–1,–1,–1,–1,–1,–1,135,–1,133,142,–1,–1,–1,–1,–1,–1,–1,0,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1;

153,15,–1,–1,–1,–1,109,86,–1,–1,–1,–1,–1,–1,–1,–1,–1,–1,–1,–1,0,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1;

4,–1,–1,–1,–1,–1,–1,34,–1,168,–1,–1,–1,156,–1,–1,–1,–1,–1,–1,–1,0,–1,–1,–1,–1,–1,–1,–1,–1, –1,–1,–1,–1,–1,–1,–1,–1,–1,–1,–1,–1,–1,–1,–1,–1,–1,–1,–1,–1;

–1,98,–1,60,–1,–1,–1,–1,–1,–1,–1,172,–1,–1,–1,–1,–1,–1,–1,–1,–1,–1,0,–1,–1,–1,–1,–1,–1,–1,–1, –1,–1,–1,–1,–1,–1,–1,–1,–1,–1,–1,–1,–1,–1,–1,–1,–1,–1,–1,–1;

98,3,–1,–1,–1,–1,–1,–1,89,–1,–1,–1,–1,108,–1,–1,–1,–1,–1,–1,–1,–1,–1,0,–1,–1,–1,–1,–1,–1,–1,–1,–1,–1,–1,–1,–1,–1,–1,–1,–1,–1,–1,–1,–1,–1,–1,–1,–1,–1,–1;

–1,30,–1,–1,–1,–1,131,–1,–1,–1,–1,127,–1,112,–1,–1,–1,–1,–1,–1,–1,–1,–1,–1,0,–1,–1,–1,–1,–1, –1,–1,–1,–1,–1,–1,–1,–1,–1,–1,–1,–1,–1,–1,–1,–1,–1,–1,–1,–1;

3 8,–1,–1,–1,–1,–1,–1,–1,–1,64,77,–1,–1,–1,–1,–1,–1,–1,–1,–1,–1,–1,–1,–1,0,–1,–1,–1,–1,–1,–1,–1,–1,–1,–1,–1,–1,–1,–1,–1,–1,–1,–1,–1,–1,–1,–1,–1,–1,–1,–1;

–1,110,–1,–1,–1,–1,–1,–1,–1,42,–1,10,82,–1,–1,–1,–1,–1,–1,–1,–1,–1,–1,–1,–1,–1,0,–1,–1,–1,–1, –1,–1,–1,–1,–1,–1,–1,–1,–1,–1,–1,–1,–1,–1,–1,–1,–1,–1,–1,–1;

–1,48,–1,–1,–1,66,–1,–1,–1,–1,–1,61,161,–1,–1,–1,–1,–1,–1,–1,–1,–1,–1,–1,–1,–1,–1,0,–1,–1,–1, –1,–1,–1,–1,–1,–1,–1,–1,–1,–1,–1,–1,–1,–1,–1,–1,–1,–1,–1,–1;

90,–1,–1,–1,–1,–1,47,63,–1,–1,–1,–1,–1,–1,–1,–1,–1,–1,–1,–1,–1,–1,–1,–1,–1,–1,–1,–1,0,–1,–1,–1,–1,–1,–1,–1,–1,–1,–1,–1,–1,–1,–1,–1,–1,–1,–1,–1,–1,–1,–1,–1;

175,87,–1,–1,–1,–1,–1,–1,–1,–1,59,–1,–1,–1,–1,–1,–1,–1,–1,–1,–1,–1,–1,–1,–1,–1,–1,–1,–1,0,–1, –1,–1,–1,–1,–1,–1,–1,–1,–1,–1,–1,–1,–1,–1,–1,–1,–1,–1,–1,–1;

–1,88,–1,–1,150,–1,–1,–1,–1,–1,–1,12,–1,–1,–1,–1,–1,–1,–1,–1,–1,–1,–1,–1,–1,–1,–1,–1,–1,0, –1,–1,–1,–1,–1,–1,–1,–1,–1,–1,–1,–1,–1,–1,–1,–1,–1,–1,–1,–1;

5,–1,–1,–1,–1,–1,–1,–1,79,–1,–1,–1,–1,137,–1,–1,–1,–1,–1,–1,–1,–1,–1,–1,–1,–1,–1,–1,–1,–1,–1, 0,–1,–1,–1,–1,–1,–1,–1,–1,–1,–1,–1,–1,–1,–1,–1,–1,–1,–1,–1;

–1,43,127,–1,–1,–1,–1,–1,–1,–1,–1,–1,–1,–1,–1,–1,–1,–1,–1,–1,–1,–1,–1,–1,–1,–1,–1,–1,–1,–1,–1,0,–1,–1,–1,–1,–1,–1,–1,–1,–1,–1,–1,–1,–1,–1,–1,–1,–1,–1,–1,–1;

78,–1,–1,32,–1,169,–1,–1,–1,–1,–1,–1,–1,–1,–1,–1,–1,–1,–1,–1,–1,–1,–1,–1,–1,–1,–1,–1,–1,–1, –1,–1,0,–1,–1,–1,–1,–1,–1,–1,–1,–1,–1,–1,–1,–1,–1,–1,–1,–1;

–1,1,150,–1,–1,–1,–1,–1,–1,13,–1,–1,–1,–1,–1,–1,–1,–1,–1,–1,–1,–1,–1,–1,–1,–1,–1,–1,–1,–1,–1,–1,0,–1,–1,–1,–1,–1,–1,–1,–1,–1,–1,–1,–1,–1,–1,–1,–1,–1,–1;

39,–1,–1,–1,–1,21,–1,–1,–1,–1,–1,–1,–1,–1,–1,–1,–1,–1,–1,–1,–1,–1,–1,–1,–1,–1,–1,–1,–1,–1,–1,–1,–1, 0,–1,–1,–1,–1,–1,–1,–1,–1,–1,–1,–1,–1,–1,–1,–1,–1;

–1,–1,23,–1,–1,–1,–1,82,–1,–1,–1,–1,121,156,–1,–1,–1,–1,–1,–1,–1,–1,–1,–1,–1,–1,–1,–1,–1,–1,–1,–1,–1,–1,0,–1,–1,–1,–1,–1,–1,–1,–1,–1,–1,–1,–1,–1,–1,–1,–1;

74,–1,–1,–1,–1,–1,166,–1,–1,–1,–1,–1,–1,–1,–1,–1,–1,–1,–1,–1,–1,–1,–1,–1,–1,–1,–1,–1,–1,–1,–1, –1,–1,–1,–1,–1,–1,0,–1,–1,–1,–1,–1,–1,–1,–1,–1,–1,–1,–1,–1,–1;

–1,22,19,–1,–1,42,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,0,–1,–1,–1,–1,–1,–1,–1,–1,–1,–1,–1,–1,–1;

91,–1,–1,–1,133,–1,–1,–1,–1,–1,–1,–1,–1,–1,–1,–1,–1,–1,–1,–1,–1,–1,–1,–1,–1,–1,–1,–1,–1,–1, –1,–1,–1,–1,–1,–1,–1,–1,0,–1,–1,–1,–1,–1,–1,–1,–1,–1,–1,–1;

–1,–1,16,–1,–1,140,–1,56,–1,158,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,0,–1,–1,–1,–1,–1,–1,–1,–1,–1,–1;

–1,165,–1,–1,–1,–1,–1,–1,–1,–1,–1,–1,–1,23,–1,–1,–1,–1,–1,–1,–1,–1,–1,–1,–1,–1,–1,–1,–1,–1, –1,–1,–1,–1,–1,–1,–1,–1,–1,0,–1,–1,–1,–1,–1,–1,–1,–1,–1;

34,–1,–1,–1,–1,4,–1,–1,–1,–1,–1,–1,18,–1,–1,–1,–1,–1,–1,–1,–1,–1,–1,–1,–1,–1,–1,–1,–1,–1,–1, –1,–1,–1,–1,–1,–1,–1,–1,–1,0,–1,–1,–1,–1,–1,–1,–1,–1;

–1,–1,152,–1,–1,–1,–1,131,–1,–1,5,–1,–1,–1,–1,–1,–1,–1,–1,–1,–1,–1,–1,–1,–1,–1,–1,–1,–1,–1, –1,–1,–1,–1,–1,–1,–1,–1,–1,–1,–1,0,–1,–1,–1,–1,–1,–1,–1,–1;

148,–1,–1,–1,–1,–1,–1,–1,–1,–1,–1,–1,82,153,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,0,–1,–1,–1,–1,–1,–1,–1;

–1,124,–1,–1,–1,48,–1,–1,–1,–1,–1,8,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,0,–1,–1,–1,–1,–1,–1;

128,–1,50,–1,–1,–1,–1,6,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,0,–1,–1,–1,–1,–1;

–1,–1,–1,–1,–1,–1,–1,–1,–1,–1,31,–1,–1,120,–1,–1,–1,–1,–1,–1,–1,–1,–1,–1,–1,–1,–1,–1,–1,–1, –1,–1,–1,–1,–1,–1,–1,–1,–1,–1,–1,–1,–1,–1,–1,0,–1,–1,–1,–1;

–1,142,–1,–1,–1,119,–1,–1,–1,–1,–1,69,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,0,–1,–1,–1;

69,–1,–1,–1,–1,–1,–1,124,–1,–1,–1,–1,33,–1,–1,–1,–1,–1,–1,–1,–1,–1,–1,–1,–1,–1,–1,–1,–1,–1, –1,–1,–1,–1,–1,–1,–1,–1,–1,–1,–1,–1,–1,–1,–1,–1,–1,0,–1,–1;

–1,–1,72,–1,–1,–1,–1,–1,–1,–1,141,–1,–1,18,–1,–1,–1,–1,–1,–1,–1,–1,–1,–1,–1,–1,–1,–1,–1,–1,–1, –1,–1,–1,–1,–1,–1,–1,–1,–1,–1,–1,–1,–1,–1,–1,–1,–1,–1,0,–1;

–1,4,–1,–1,–1,92,–1,–1,–1,–1,–1,37,–1,–1,–1,–1,–1,–1,–1,–1,–1,–1,–1,–1,–1,–1,–1,–1,–1,–1,–1, –1,–1,–1,–1,–1,–1,–1,–1,–1,–1,–1,–1,–1,–1,–1,–1,–1,–1,–1,0.

The coefficient matrix 7 is written as:

153,19,47,79,–1,–1,19,–1,–1,90,0,0,–1,–1,–1,–1,–1,–1,–1,–1,–1,–1,–1,–1,–1,–1,–1,–1,–1,–1, –1,–1,–1,–1,–1,–1,–1,–1,–1,–1,–1,–1,–1,–1,–1,–1,–1,–1,–1,–1;

58,–1,–1,201,157,100,42,46,15,19,–1,0,0,–1,–1,–1,–1,–1,–1,–1,–1,–1,–1,–1,–1,–1,–1,–1,–1, –1,–1,–1,–1,–1,–1,–1,–1,–1,–1,–1,–1,–1,–1,–1,–1,–1,–1,–1,–1;

48,160,–1,172,169,–1,–1,–1,169,–1,1,–1,0,0,–1,–1,–1,–1,–1,–1,–1,–1,–1,–1,–1,–1,–1,–1,–1, –1,–1,–1,–1,–1,–1,–1,–1,–1,–1,–1,–1,–1,–1,–1,–1,–1,–1,–1,–1;

–1,38,2,–1,196,50,192,81,98,85,0,–1,–1,0,–1,–1,–1,–1,–1,–1,–1,–1,–1,–1,–1,–1,–1,–1,–1,–1, –1,–1,–1,–1,–1,–1,–1,–1,–1,–1,–1,–1,–1,–1,–1,–1,–1,–1,–1;

169,94,–1,–1,–1,–1,–1,–1,–1,–1,–1,8,–1,–1,0,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1;

20,76,–1,–1,–1,102,–1,136,–1,–1,–1,186,–1,–1,–1,0,–1,–1,–1,–1,–1,–1,–1,–1,–1,–1,–1,–1,–1,–1, –1,–1,–1,–1,–1,–1,–1,–1,–1,–1,–1,–1,–1,–1,–1,–1,–1,–1,–1,–1,–1;

121,–1,–1,–1,–1,160,–1,180,–1,161,–1,172,–1,–1,–1,–1,0,–1,–1,–1,–1,–1,–1,–1,–1,–1,–1,–1,–1, –1,–1,–1,–1,–1,–1,–1,–1,–1,–1,–1,–1,–1,–1,–1,–1,–1,–1,–1,–1,–1,–1,–1;

−1,104,−1,−1,−1,109,−1,109,−1,−1,−1,106,−1,81,−1,−1,−1,0,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1;

107,133,−1,−1,−1,−1,−1,−1,−1,−1,−1,−1,197,−1,−1,−1,−1,−1,0,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1;

−1,49,−1,−1,−1,−1,−1,−1,4,−1,164,128,−1,−1,−1,−1,−1,−1,−1,−1,−1,−1, −1,−1,−1,−1,−1,−1,−1,−1,−1,−1,−1,−1,−1,−1,−1,−1,−1,−1,−1,−1,−1,−1;

165,172,−1,−1,−1,−1,11,148,−1,−1,−1,−1,−1,−1,−1,−1,−1,−1,−1,0,−1,−1,−1,−1,−1,−1,−1,−1,−1, −1,−1,−1,−1,−1,−1,−1,−1,−1,−1,−1,−1,−1,−1,−1,−1,−1,−1,−1,−1,−1;

85,−1,−1,−1,−1,−1,−1,111,−1,161,−1,−1,−1,113,−1,−1,−1,−1,−1,−1,−1,0,−1,−1,−1,−1,−1,−1,−1,−1, −1,−1,−1,−1,−1,−1,−1,−1,−1,−1,−1,−1,−1,−1,−1,−1,−1,−1,−1,−1,−1;

−1,84,−1,128,−1,−1,−1,−1,−1,−1,−1,198,−1,−1,−1,−1,−1,−1,−1,−1,−1,−1,0,−1,−1,−1,−1,−1,−1,−1,−1, −1,−1,−1,−1,−1,−1,−1,−1,−1,−1,−1,−1,−1,−1,−1,−1,−1,−1,−1,−1;

54,129,−1,−1,−1,−1,−1,−1,10,−1,−1,−1,−1,59,−1,−1,−1,−1,−1,−1,−1,−1,−1,0,−1,−1,−1,−1,−1,−1,−1, −1,−1,−1,−1,−1,−1,−1,−1,−1,−1,−1,−1,−1,−1,−1,−1,−1,−1,−1;

−1,165,−1,−1,−1,−1,77,−1,−1,−1,−1,125,−1,131,−1,−1,−1,−1,−1,−1,−1,−1,−1,−1,0,−1,−1,−1,−1,−1, −1,−1,−1,−1,−1,−1,−1,−1,−1,−1,−1,−1,−1,−1,−1,−1,−1,−1,−1,−1,−1;

74,−1,−1,−1,−1,−1,−1,−1,−1,−1,72,48,−1,−1,−1,−1,−1,−1,−1,−1,−1,−1,−1,−1,−1,0,−1,−1,−1,−1,−1,−1,−1,−1,−1,−1,−1,−1,−1,−1,−1,−1,−1,−1,−1,−1,−1,−1,−1,−1,−1,−1;

−1,160,−1,−1,−1,−1,−1,−1,−1,134,−1,194,93,−1,−1,−1,−1,−1,−1,−1,−1,−1,−1,−1,−1,−1,−1,0,−1,−1,−1, −1,−1,−1,−1,−1,−1,−1,−1,−1,−1,−1,−1,−1,−1,−1,−1,−1,−1,−1,−1,−1;

−1,194,−1,−1,−1,78,−1,−1,−1,−1,−1,158,91,−1,−1,−1,−1,−1,−1,−1,−1,−1,−1,−1,−1,−1,−1,−1,0,−1,−1,−1,−1,−1,−1,−1,−1,−1,−1,−1,−1,−1,−1,−1,−1,−1,−1,−1,−1,−1,−1,−1;

193,−1,−1,−1,−1,−1,19,14,−1,−1,−1,−1,−1,−1,−1,−1,−1,−1,−1,−1,−1,−1,−1,−1,−1,−1,−1,0,−1,−1, −1,−1,−1,−1,−1,−1,−1,−1,−1,−1,−1,−1,−1,−1,−1,−1,−1,−1,−1,−1;

71,134,−1,−1,−1,−1,−1,−1,−1,−1,39,−1,−1,−1,−1,−1,−1,−1,−1,−1,−1,−1,−1,−1,−1,−1,−1,−1,−1,0,−1, −1,−1,−1,−1,−1,−1,−1,−1,−1,−1,−1,−1,−1,−1,−1,−1,−1,−1,−1,−1;

−1,5,−1,−1,49,−1,−1,−1,−1,−1,−1,159,−1,−1,−1,−1,−1,−1,−1,−1,−1,−1,−1,−1,−1,−1,−1,−1,−1,−1,0,−1,−1,−1,−1,−1,−1,−1,−1,−1,−1,−1,−1,−1,−1,−1,−1,−1,−1,−1,−1;

61,−1,−1,−1,−1,−1,−1,−1,48,−1,−1,−1,−1,82,−1,−1,−1,−1,−1,−1,−1,−1,−1,−1,−1,−1,−1,−1,−1,−1,−1, 0,−1,−1,−1,−1,−1,−1,−1,−1,−1,−1,−1,−1,−1,−1,−1,−1,−1,−1,−1;

−1,162,39,−1,−1,−1,−1,−1,−1,−1,−1,−1,−1,−1,−1,−1,−1,−1,−1,−1,−1,−1,−1,−1,−1,−1,−1,−1,−1,−1, −1,0,−1,−1,−1,−1,−1,−1,−1,−1,−1,−1,−1,−1,−1,−1,−1,−1,−1,−1;

37,−1,−1,201,−1,174,−1,−1,−1,−1,−1,−1,−1,−1,−1,−1,−1,−1,−1,−1,−1,−1,−1,−1,−1,−1,−1,−1,−1,−1,−1,−1,0,−1,−1,−1,−1,−1,−1,−1,−1,−1,−1,−1,−1,−1,−1,−1,−1,−1;

−1,191,176,−1,−1,−1,−1,−1,−1,178,−1,−1,−1,−1,−1,−1,−1,−1,−1,−1,−1,−1,−1,−1,−1,−1,−1,−1,−1,−1, −1,−1,−1,−1,0,−1,−1,−1,−1,−1,−1,−1,−1,−1,−1,−1,−1,−1,−1,−1,−1;

191,−1,−1,−1,−1,9,−1,−1,−1,−1,−1,−1,−1,−1,−1,−1,−1,−1,−1,−1,−1,−1,−1,−1,−1,−1,−1,−1,−1,−1,−1,−1,−1,−1,0,−1,−1,−1,−1,−1,−1,−1,−1,−1,−1,−1,−1,−1,−1,−1;

−1,−1,94,−1,−1,−1,−1,83,−1,−1,−1,−1,142,198,−1,−1,−1,−1,−1,−1,−1,−1,−1,−1,−1,−1,−1,−1,−1,−1,−1,−1,−1,−1,−1,0,−1,−1,−1,−1,−1,−1,−1,−1,−1,−1,−1,−1,−1,−1;

188,−1,−1,−1,−1,−1,176,−1,−1,−1,−1,−1,−1,−1,−1,−1,−1,−1,−1,−1,−1,−1,−1,−1,−1,−1,−1,−1,−1,−1,−1,−1,−1,−1,−1,−1,0,−1,−1,−1,−1,−1,−1,−1,−1,−1,−1,−1,−1,−1,−1;

−1,44,68,−1,−1,33,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1,0,−1,−1,−1,−1,−1,−1,−1,−1,−1,−1,−1,−1;

10,−1,−1,−1,91,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1,0,−1,−1,−1,−1,−1,−1,−1,−1,−1,−1,−1,−1;

−1,−1,62,−1,−1,17,−1,135,−1,39,−1,−1,−1,−1,−1,−1,−1,−1,−1,−1,−1,−1,−1,−1,−1,−1,−1,−1,−1,−1, −1,−1,−1,−1,−1,−1,−1,−1,−1,0,−1,−1,−1,−1,−1,−1,−1,−1,−1,−1,−1;

−1,187,−1,−1,−1,−1,−1,−1,−1,−1,−1,−1,−1,58,−1,−1,−1,−1,−1,−1,−1,−1,−1,−1,−1,−1,−1,−1,−1,−1,−1, −1,−1,−1,−1,−1,−1,−1,−1,−1,−1,0,−1,−1,−1,−1,−1,−1,−1,−1,−1,−1;

166,−1,−1,−1,−1,166,−1,−1,−1,−1,−1,−1,191,−1,−1,−1,−1,−1,−1,−1,−1,−1,−1,−1,−1,−1,−1,−1,−1,−1, −1,−1,−1,−1,−1,−1,−1,−1,−1,−1,−1,−1,0,−1,−1,−1,−1,−1,−1,−1,−1,−1;

−1,−1,126,−1,−1,−1,−1,73,−1,−1,153,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1,0,−1,−1,−1,−1,−1,−1,−1,−1;

140,−1,−1,−1,−1,−1,−1,−1,−1,−1,−1,−1,97,180,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1,0,−1,−1,−1,−1,−1,−1,−1;

−1,198,−1,−1,−1,69,−1,−1,−1,−1,−1,202,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1,0,−1,−1,−1,−1,−1,−1;

45,−1,30,−1,−1,−1,−1,134,−1,−1,−1,−1,−1,−1,−1,−1,−1,−1,−1,−1,−1,−1,−1,−1,−1,−1,−1,−1,−1, −1,−1,−1,−1,−1,−1,−1,−1,−1,−1,−1,−1,−1,−1,−1,0,−1,−1,−1,−1,−1;

−1,−1,−1,−1,−1,−1,−1,−1,−1,−1,162,−1,−1,170,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1,0,−1,−1,−1,−1;

−1,28,−1,−1,−1,109,−1,−1,−1,−1,−1,198,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1,0,−1,−1,−1;

51,−1,−1,−1,−1,−1,−1,44,−1,−1,−1,−1,82,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1,0,−1,−1;

−1,−1,157,−1,−1,−1,−1,−1,−1,−1,47,−1,−1,96,−1,−1,−1,−1,−1,−1,−1,−1,−1,−1,−1,−1,−1,−1,−1,−1,−1, −1,−1,−1,−1,−1,−1,−1,−1,−1,−1,−1,−1,−1,−1,−1,−1,−1,−1,−1,0,−1;

−1,142,−1,−1,−1,58,−1,−1,−1,−1,−1,73,−1,−1,−1,−1,−1,−1,−1,−1,−1,−1,−1,−1,−1,−1,−1,−1,−1,−1,−1, −1,−1,−1,−1,−1,−1,−1,−1,−1,−1,−1,−1,−1,−1,−1,−1,−1,−1,−1,−1,0.

The coefficient matrix 8 is written as:

56,19,221,119,−1,−1,219,−1,−1,33,0,0,−1,−1,−1,−1,−1,−1,−1,−1,−1,−1,−1,−1,−1,−1,−1,−1,−1, −1,−1,−1,−1,−1,−1,−1,−1,−1,−1,−1,−1,−1,−1,−1,−1,−1,−1,−1,−1,−1;

119,−1,−1,5,115,64,208,120,95,131,−1,0,0,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1;

156,156,−1,161,84,−1,−1,−1,145,−1,1,−1,0,0,−1,−1,−1,−1,−1,−1,−1,−1,−1,−1,−1,−1,−1,−1,−1,−1, −1,−1,−1,−1,−1,−1,−1,−1,−1,−1,−1,−1,−1,−1,−1,−1,−1,−1,−1,−1,−1;

−1,26,64,−1,118,197,186,106,127,186,0,−1,−1,0,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1;

171,69,−1,−1,−1,−1,−1,−1,−1,−1,−1,168,−1,−1,0,−1,−1,−1,−1,−1,−1,−1,−1,−1,−1,−1,−1,−1,−1,−1, −1,−1,−1,−1,−1,−1,−1,−1,−1,−1,−1,−1,−1,−1,−1,−1,−1,−1,−1,−1,−1;

120,154,−1,−1,−1,27,−1,212,−1,−1,−1,202,−1,−1,−1,0,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1;

89,−1,−1,−1,−1,2,−1,20,−1,5,−1,218,−1,−1,−1,−1,0,−1,−1,−1,−1,−1,−1,−1,−1,−1,−1,−1,−1,−1,−1, −1,−1,−1,−1,−1,−1,−1,−1,−1,−1,−1,−1,−1,−1,−1,−1,−1,−1,−1;

−1,239,−1,−1,−1,75,−1,165,−1,−1,−1,24,−1,20,−1,−1,−1,0,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1;

229,144,−1,−1,−1,−1,−1,−1,−1,−1,−1,−1,159,−1,−1,−1,−1,−1,0,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1;

−1,234,−1,−1,−1,−1,−1,−1,2,−1,67,129,−1,−1,−1,−1,−1,−1,−1,0,−1,−1,−1,−1,−1,−1,−1,−1,−1,−1,−1, −1,−1,−1,−1,−1,−1,−1,−1,−1,−1,−1,−1,−1,−1,−1,−1,−1,−1,−1,−1,−1;

178,155,−1,−1,−1,−1,217,237,−1,−1,−1,−1,−1,−1,−1,−1,−1,−1,−1,−1,0,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1;

187,−1,−1,−1,−1,−1,−1,185,−1,180,−1,−1,−1,22,−1,−1,−1,−1,−1,−1,−1,0,−1,−1,−1,−1,−1,−1,−1,−1, −1,−1,−1,−1,−1,−1,−1,−1,−1,−1,−1,−1,−1,−1,−1,−1,−1,−1,−1,−1,−1;

−1,171,−1,118,−1,−1,−1,−1,−1,−1,−1,221,−1,−1,−1,−1,−1,−1,−1,−1,−1,−1,0,−1,−1,−1,−1,−1,−1,−1,−1,−1,−1,−1,−1,−1,−1,−1,−1,−1,−1,−1,−1,−1,−1,−1,−1,−1,−1,−1,−1;

154,14,−1,−1,−1,−1,−1,−1,104,−1,−1,−1,−1,61,−1,−1,−1,−1,−1,−1,−1,−1,−1,0,−1,−1,−1,−1,−1,−1,−1,−1,−1,−1,−1,−1,−1,−1,−1,−1,−1,−1,−1,−1,−1,−1,−1,−1,−1,−1,−1,−1;

−1,105,−1,−1,−1,−1,146,−1,−1,−1,−1,38,−1,76,−1,−1,−1,−1,−1,−1,−1,−1,−1,−1,0,−1,−1,−1,−1,−1,−1,−1,−1,−1,−1,−1,−1,−1,−1,−1,−1,−1,−1,−1,−1,−1,−1,−1,−1,−1,−1;

231,−1,−1,−1,−1,−1,−1,−1,−1,−1,149,173,−1,−1,−1,−1,−1,−1,−1,−1,−1,−1,−1,−1,−1,0,−1,−1,−1,−1,−1,−1,−1,−1,−1,−1,−1,−1,−1,−1,−1,−1,−1,−1,−1,−1,−1,−1,−1,−1,−1,−1;

−1,145,−1,−1,−1,−1,−1,−1,−1,196,−1,16,168,−1,−1,−1,−1,−1,−1,−1,−1,−1,−1,−1,−1,−1,0,−1,−1,−1, −1,−1,−1,−1,−1,−1,−1,−1,−1,−1,−1,−1,−1,−1,−1,−1,−1,−1,−1,−1,−1;

−1,206,−1,−1,−1,170,−1,−1,−1,−1,−1,43,234,−1,−1,−1,−1,−1,−1,−1,−1,−1,−1,−1,−1,−1,−1,0,−1,−1, −1,−1,−1,−1,−1,−1,−1,−1,−1,−1,−1,−1,−1,−1,−1,−1,−1,−1,−1,−1,−1;

61,−1,−1,−1,−1,−1,36,109,−1,−1,−1,−1,−1,−1,−1,−1,−1,−1,−1,−1,−1,−1,−1,−1,−1,−1,−1,0,−1,−1, −1,−1,−1,−1,−1,−1,−1,−1,−1,−1,−1,−1,−1,−1,−1,−1,−1,−1,−1,−1;

16,153,−1,−1,−1,−1,−1,−1,−1,−1,85,−1,−1,−1,−1,−1,−1,−1,−1,−1,−1,−1,−1,−1,−1,−1,−1,−1,0,−1, −1,−1,−1,−1,−1,−1,−1,−1,−1,−1,−1,−1,−1,−1,−1,−1,−1,−1,−1,−1;

−1,108,−1,−1,39,−1,−1,−1,−1,−1,−1,31,−1,−1,−1,−1,−1,−1,−1,−1,−1,−1,−1,−1,−1,−1,−1,−1,−1,0, −1,−1,−1,−1,−1,−1,−1,−1,−1,−1,−1,−1,−1,−1,−1,−1,−1,−1,−1,−1;

18,−1,−1,−1,−1,−1,−1,−1,97,−1,−1,−1,−1,44,−1,−1,−1,−1,−1,−1,−1,−1,−1,−1,−1,−1,−1,−1,−1,−1,−1, 0,−1,−1,−1,−1,−1,−1,−1,−1,−1,−1,−1,−1,−1,−1,−1,−1,−1,−1,−1,−1;

−1,17,188,−1,−1,−1,−1,−1,−1,−1,−1,−1,−1,−1,−1,−1,−1,−1,−1,−1,−1,−1,−1,−1,−1,−1,−1,−1,−1,−1,−1, −1,0,−1,−1,−1,−1,−1,−1,−1,−1,−1,−1,−1,−1,−1,−1,−1,−1,−1,−1,−1;

16,−1,−1,52,−1,101,−1,−1,−1,−1,−1,−1,−1,−1,−1,−1,−1,−1,−1,−1,−1,−1,−1,−1,−1,−1,−1,−1,−1,−1,−1, −1,−1,0,−1,−1,−1,−1,−1,−1,−1,−1,−1,−1,−1,−1,−1,−1,−1,−1,−1;

−1,199,137,−1,−1,−1,−1,−1,−1,194,−1,−1,−1,−1,−1,−1,−1,−1,−1,−1,−1,−1,−1,−1,−1,−1,−1,−1,−1,−1,−1,−1,−1, 0,−1,−1,−1,−1,−1,−1,−1,−1,−1,−1,−1,−1,−1,−1,−1,−1,−1,−1;

17,−1,−1,−1,−1,115,−1,−1,−1,−1,−1,−1,−1,−1,−1,−1,−1,−1,−1,−1,−1,−1,−1,−1,−1,−1,−1,−1,−1,−1, −1,−1,−1,−1, 0,−1,−1,−1,−1,−1,−1,−1,−1,−1,−1,−1,−1,−1,−1,−1;

−1,−1,239,−1,−1,−1,−1,173,−1,−1,−1,−1,193,116,−1,−1,−1,−1,−1,−1,−1,−1,−1,−1,−1,−1,−1,−1,−1,−1,−1,−1,−1,−1,−1,0,−1,−1,−1,−1,−1,−1,−1,−1,−1,−1,−1,−1,−1,−1,−1,−1;

18,−1,−1,−1,−1,−1,171,−1,−1,−1,−1,−1,−1,−1,−1,−1,−1,−1,−1,−1,−1,−1,−1,−1,−1,−1,−1,−1,−1,−1, −1,−1,−1,−1,−1,−1,0,−1,−1,−1,−1,−1,−1,−1,−1,−1,−1,−1,−1,−1,−1;

−1,88,128,−1,−1,66,−1,−1,−1,−1,−1,−1,−1,−1,−1,−1,−1,−1,−1,−1,−1,−1,−1,−1,−1,−1,−1,−1,−1,−1, −1,−1,−1,−1,−1,−1,0,−1,−1,−1,−1,−1,−1,−1,−1,−1,−1,−1,−1;

181,−1,−1,−1,13,−1,−1,−1,−1,−1,−1,−1,−1,−1,−1,−1,−1,−1,−1,−1,−1,−1,−1,−1,−1,−1,−1,−1,−1,−1, −1,−1,−1,−1,−1,−1,−1,−1,0,−1,−1,−1,−1,−1,−1,−1,−1,−1,−1,−1,−1;

−1,−1,231,−1,−1,177,−1,12,−1,17,−1,−1,−1,−1,−1,−1,−1,−1,−1,−1,−1,−1,−1,−1,−1,−1,−1,−1,−1,−1,−1,−1,−1,−1,−1,−1,−1,−1,−1,0,−1,−1,−1,−1,−1,−1,−1,−1,−1,−1,−1;

−1,6,−1,−1,−1,−1,−1,−1,−1,−1,−1,−1,−1,204,−1,−1,−1,−1,−1,−1,−1,−1,−1,−1,−1,−1,−1,−1,−1,−1,−1,−1,−1,−1,−1,−1,−1,−1,−1,−1,−1,0,−1,−1,−1,−1,−1,−1,−1,−1,−1,−1;

130,−1,−1,−1,−1,214,−1,−1,−1,−1,−1,−1,67,−1,−1,−1,−1,−1,−1,−1,−1,−1,−1,−1,−1,−1,−1,−1,−1,−1,−1,−1,−1,−1,−1,−1,−1,−1,−1,−1,−1,−1,0,−1,−1,−1,−1,−1,−1,−1,−1,−1;

−1,−1,23 5,−1,−1,−1,−1,192,−1,−1,65,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1,0,−1,−1,−1,−1,−1,−1,−1,−1;

123,−1,−1,−1,−1,−1,−1,−1,−1,−1,−1,−1,42,2,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1,0,−1,−1,−1,−1,−1,−1,−1;

−1,123,−1,−1,−1,135,−1,−1,−1,−1,−1,5,−1,−1,−1,−1,−1,−1,−1,−1,−1,−1,−1,−1,−1,−1,−1,−1,−1,−1,−1, −1,−1,−1,−1,−1,−1,−1,−1,−1,−1,−1,−1,−1,−1,0,−1,−1,−1,−1,−1,−1;

125,−1,190,−1,−1,−1,−1,90,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1,0,−1,−1,−1,−1,−1;

−1,−1,−1,−1,−1,−1,−1,−1,−1,−1,78,−1,−1,190,−1,−1,−1,−1,−1,−1,−1,−1,−1,−1,−1,−1,−1,−1,−1,−1,−1, −1,−1,−1,−1,−1,−1,−1,−1,−1,−1,−1,−1,−1,−1,−1,−1,0,−1,−1,−1,−1;

−1,90,−1,−1,−1,126,−1,−1,−1,−1,−1,234,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1,0,−1,−1,−1;

164,−1,−1,−1,−1,−1,−1,134,−1,−1,−1,−1,200,−1,−1,−1,−1,−1,−1,−1,−1,−1,−1,−1,−1,−1,−1,−1,−1,−1, −1,−1,−1,−1,−1,−1,−1,−1,−1,−1,−1,−1,−1,−1,−1,−1,−1,−1,−1,0,−1,−1;

−1,−1,239,−1,−1,−1,−1,−1,−1,−1,17,−1,−1,63,−1,−1,−1,−1,−1,−1,−1,−1,−1,−1,−1,−1,−1,−1,−1,−1,−1, −1,−1,−1,−1,−1,−1,−1,−1,−1,−1,−1,−1,−1,−1,−1,−1,−1,−1,−1,0,−1;

−1,99,−1,−1,−1,94,−1,−1,−1,−1,−1,181,−1,−1,−1,−1,−1,−1,−1,−1,−1,−1,−1,−1,−1,−1,−1,−1,−1,−1,−1, −1,−1,−1,−1,−1,−1,−1,−1,−1,−1,−1,−1,−1,−1,−1,−1,−1,−1,−1,−1,0.

All the lifting sizes supported by the coefficient matrix i correspond to the lifting size subset Zseti, where i=1, 2, 3, . . . , 8; and the i-th set Z0seti corresponds to the coefficient matrix i, where i=1, 2, 3, . . . , 8. The 8 lifting size subsets are respectively Zset1={2, 4, 8, 16, 32, 64, 128, 256}, Zset2={3, 6, 12, 24, 48, 96, 192}, Zset3={5, 10, 20, 40, 80, 160}, Zset4={7, 14, 28, 56, 112, 224}, Zset5={9, 18, 36, 72, 144}, Zset6={11, 22, 44, 88, 176}, Zset7={13, 26, 52, 104, 208}, and Zset8={15, 30, 60, 120, 240}.

In another implementation mode, optionally, A is equal to 8, and the 8 lifting size subsets are respectively Zset1={2, 4, 8, 16, 32, 64, 128, 256}, Zset2={3, 6, 12, 24, 48, 96, 192, 384}, Zset3={5, 10, 20, 40, 80, 160, 320}, Zset4={7, 14, 28, 56, 112, 224}, Zset5={9, 18, 36, 72, 144, 288}, Zset6={11, 22, 44, 88, 176, 352}, Zset7={13, 26, 52, 104, 208}, and Zset8={15, 30, 60, 120, 240}.

Optionally, the set Z0seti are respectively Z0set1={16, 32, 48, 64, 80, 96, 112, 128, 144, 160, 176, 192, 208, 224, 240, 256, 288, 320, 352, 384}, Z0set2={12, 24, 36, 48, 60, 72, 96, 120, 144, 192, 240, 256, 288, 352, 384}, Z0set3={20, 40, 60, 80, 120, 160, 240, 320, 352}, Z0set4={56, 112, 224, 288, 352, 384}, Z0set5={18, 36, 72, 144, 176, 192, 288, 352, 384}, Z0set6={22, 44, 88, 176, 256, 320, 352, 384}, Z0set7={13, 26, 52, 104, 176, 208, 224, 240, 256, 288, 320, 352, 384}, and Z0set8={30, 60, 120, 240, 320, 352}.

The first coefficient matrix set at least includes one of coefficient matrices of 46 rows and 68 columns described below.

The coefficient matrix 1 is written as:

202,76,183,29,−1,32,31,−1,−1,153,187,236,92,183,−1, 141,71,−1,77,192,162,248,0,0,−1, −1,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1, −1,−1,−1,−1,−1,−1,−1;

120,–1,79,169,31,187,–1,185,14,150,–1,19,33,–1,0,92, 13,215,–1,243,–1,241,1,0,0,–1,–1, –1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1, –1,–1,–1,–1,–1;

103,116,8,–1,230,108,22,62,235,88,198,–1,–1,100,188, 246,–1,53,176,166,196,–1,–1,–1, 0,0,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1;

54,136,–1,115,98,–1,0,32,224,–1,57,212,14,12,165,–1, 193,35,230,–1,209,28,0,–1,–1,0,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1;

26,100,–1,–1,–1,–1,–1,–1,–1,–1,–1,–1,–1,–1,–1,–1,–1,–1,–1,–1,–1,–1,–1,–1,–1,–1,0,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1;

75,43,–1,251,–1,–1,–1,–1,–1,–1,–1,–1,104,–1,–1,–1, 226,–1,–1,–1,–1,27,89,–1,–1,–1,–1,0,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1;

53,–1,–1,–1,–1,–1,167,–1,–1,–1,126,145,–1,112,–1,–1,–1,206,143,–1,241,–1,–1,–1,–1,–1,–1,–1,0,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1;

26,127,–1,–1,126,–1,–1,223,21,–1,–1,–1,–1,–1,213,–1,–1,–1,–1,–1,–1,–1,–1,–1,–1,–1,–1,–1,–1, 0,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1;

160,220,–1,85,–1,–1,–1,–1,–1,–1,–1,–1,214,–1,–1,–1, 166,–1,–1,100,–1,3,124,–1,6,–1,–1,–1,–1,–1,0,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1, 108,166,–1,–1,–1,–1,–1,–1,–1,–1,153,207,–1,221,–1,–1,–1,50,222,–1,11,–1,–1,–1,–1,–1,–1,–1, –1,–1,–1,0,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1, –1,–1,–1,–1;

–1,244,89,–1,229,–1,–1,114,134,–1,–1,–1,–1,–1,190,–1,–1,–1,–1,–1,–1,–1,–1,–1,–1,–1,–1,–1,–1,–1,–1,–1,0,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1;

32,186,–1,–1,–1,–1,–1,–1,–1,–1,–1,–1,60,–1,–1,–1,50,–1,–1,–1,–1,5,103,137,–1,–1,–1,–1,–1,–1, –1,–1,–1,0,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1, –1,–1;

87,136,–1,–1,–1,–1,–1,–1,–1,–1,225,54,–1,153,–1,–1,–1,–1,28,–1,–1,–1,–1,–1,–1,–1,–1,–1,–1,–1,–1,–1,–1, 0,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1;

6,–1,–1,14,–1,–1,–1,67,–1,–1,–1,–1,–1,–1,–1,–1,–1,–1,–1,–1,154,–1,–1,35,–1,–1,–1,–1,–1,–1,–1, –1,–1,–1,–1, 0,–1,–1,–1,–1,–1,–1,–1,–1,–1,–1,–1,–1,–1,–1,–1,–1,–1,–1,–1,–1,–1,–1,–1,–1,–1,–1,–1,–1,–1;

243,–1,–1,–1,–1,–1,–1,–1,–1,–1,–1,–1,227,–1,–1,13, 219,251,–1,–1,–1,103,–1,–1,–1,–1,–1,–1,–1,–1,–1,–1,–1,–1,–1,–1,0,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1;

6,106,–1,–1,–1,–1,–1,–1,–1,–1,158,–1,–1,148,–1,–1,–1,–1,100,–1,–1,–1,–1,–1,–1,137,–1,–1,–1, –1,–1,–1,–1,–1,–1,–1,–1,0,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1;

–1,196,–1,65,–1,–1,–1,–1,–1,–1,–1,158,–1,–1,–1,–1,–1,–1,–1,–1,83,–1,189,–1,–1,–1,–1,–1,–1,–1,–1,–1,–1,–1,–1,–1,–1,–1,–1,0,–1,–1,–1,–1,–1,–1,–1,–1,–1,–1,–1,–1,–1,–1,–1,–1,–1,–1,–1,–1,–1,–1,–1,–1,–1,–1,–1,–1,–1;

132,–1,–1,–1,–1,–1,–1,–1,–1,–1,–1,–1,–1,–1,69,–1,253, 235,–1,–1,–1,239,–1,–1,–1,–1,–1,–1,–1, –1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1;

–1,162,–1,–1,–1,–1,–1,–1,–1,–1,–1,–1,142,65,–1,–1,–1,–1,5,247,–1,–1,–1,–1,–1,–1,–1,–1,–1,–1, –1,–1,–1,–1,–1,–1,–1,–1,–1,–1,0,–1,–1,–1,–1,–1,–1,–1,–1,–1,–1,–1,–1,–1,–1,–1,–1,–1,–1,–1,–1,–1,–1,–1,–1,–1,–1,–1,–1,–1;

243,102,–1,–1,–1,–1,–1,115,79,–1,225,–1,–1,–1,–1,–1,–1,–1,–1,–1,–1,–1,–1,–1,–1,–1,–1,–1,–1, –1,–1,–1,–1,–1,–1,–1,–1,–1,–1,–1,–1,0,–1,–1,–1,–1,–1,–1,–1,–1,–1,–1,–1,–1,–1,–1,–1,–1,–1,–1,–1,–1,–1,–1,–1,–1,–1,–1;

111,–1,–1,99,–1,–1,–1,–1,–1,246,–1,47,–1,–1,–1,–1,–1,–1,–1,–1,–1,–1,50,–1,–1,–1,–1,–1,–1,–1,–1,–1,–1,–1,–1,–1,–1,–1,–1,–1,–1,0,–1,–1,–1,–1,–1,–1,–1,–1,–1,–1,–1,–1,–1,–1,–1,–1,–1,–1,–1,–1, 1,–1;

–1,141,–1,–1,–1,121,–1,–1,–1,–1,–1,–1,–1,–1,–1,–1, 12,–1,–1,–1,26,227,–1,–1,–1,–1,–1,–1,–1,–1,–1,–1,–1,–1,–1,–1,–1,–1,–1,–1,–1,–1,–1,0,–1,–1,–1,–1,–1,–1,–1,–1,–1,–1,–1,–1,–1,–1,–1,–1,–1,–1,–1,–1,–1,–1,–1,–1;

133,–1,–1,–1,–1,–1,–1,–1,–1,–1,–1,–1,60,220,–1,–1,–1, 24,–1,–1,–1,–1,–1,–1,–1,–1,–1,–1,–1,–1,–1,–1,–1,–1,–1,–1,–1,–1,–1,–1,–1,–1,–1,0,–1,–1,–1,–1,–1,–1,–1,–1,–1,–1,–1,–1,–1,–1,–1,–1,–1,–1,–1,–1,–1,–1;

–1,0,17,4,–1,–1,–1,–1,–1,–1,74,–1,–1,–1,–1,–1,–1,–1, 102,–1,–1,–1,–1,–1,–1,–1,–1,–1,–1,–1,–1, –1,–1,–1,–1,–1,–1,–1,–1,–1,–1,–1,–1,–1,0,–1,–1,–1,–1,–1,–1,–1,–1,–1,–1,–1,–1,–1,–1,–1,–1,–1,–1,–1,–1;

153,–1,–1,20,92,–1,–1,–1,–1,–1,–1,173,–1,–1,–1,–1,–1,–1,–1,–1,–1,–1,132,–1,–1,–1,–1,–1,–1,–1,–1,–1,–1,–1,–1,–1,–1,–1,–1,–1,–1,–1,–1,–1,–1,0,–1,–1,–1,–1,–1,–1,–1,–1,–1,–1,–1,–1,–1,–1,–1,–1,–1,–1,–1,–1,–1;

–1,121,–1,–1,–1,–1,29,148,–1,–1,–1,–1,–1,–1,205,–1,–1,–1,–1,–1,–1,–1,–1,–1,–1,–1,–1,–1,–1,–1, –1,–1,–1,–1,–1,–1,–1,–1,–1,–1,–1,–1,–1,–1,–1,–1,0,–1,–1,–1,–1,–1,–1,–1,–1,–1,–1,–1,–1,–1,–1,–1,–1,–1,–1, –1,–1;

181,–1,222,–1,123,–1,–1,–1,–1,–1,–1,–1,–1,–1,13,–1,–1,–1,–1,–1,–1,–1,–1,–1,–1,–1,–1,–1, –1,–1,–1,–1,–1,–1,–1,–1,–1,–1,–1,–1,–1,–1,–1,–1,–1,0,–1,–1,–1,–1,–1,–1,–1,–1,–1,–1,–1,–1,–1,–1,–1,–1,–1,–1, –1,–1;

–1,128,–1,–1,–1,–1,221,–1,123,–1,–1,–1,–1,–1,–1,–1,–1,–1,–1,–1,–1,–1,–1,–1,–1,–1,–1,–1,–1,–1, –1,–1,–1,–1,–1,–1,–1,–1,–1,–1,–1,–1,–1,–1,–1,–1,–1,0,–1,–1,–1,–1,–1,–1,–1,–1,–1,–1,–1,–1,–1,–1,–1,–1,–1,–1,–1;

47,–1,–1,–1,247,–1,–1,–1,–1,–1,–1,–1,–1,–1,–1,–1,–1,–1,81,–1,174,–1,–1,–1,–1,–1,–1,–1,–1,–1,–1,–1,–1,–1,–1,–1,–1,–1,–1,–1,–1,–1,–1,–1,–1,–1,–1,–1,–1,0,–1,–1,–1,–1,–1,–1,–1,–1,–1,–1,–1,–1,–1,–1,–1,–1,–1,–1;

–1,242,–1,–1,–1,–1,–1,–1,–1,–1,–1,–1,–1,–1,84,–1,–1,–1,23,–1,–1,–1,–1,–1,–1,16,–1,–1,–1,–1,–1, –1,–1,–1,–1,–1,–1,–1,–1,–1,–1,–1,–1,–1,–1,–1,–1,–1,–1,0,–1,–1,–1,–1,–1,–1,–1,–1,–1,–1,–1,–1,–1,–1,–1, –1;

47,–1,–1,–1,–1,–1,–1,–1,–1,–1,95,–1,–1,216,–1,–1,–1,–1,–1,–1,–1,–1,–1,–1,175,–1,–1,–1,–1,–1,–1,–1,–1,–1,–1,–1,–1,–1,–1,–1,–1,–1,–1,–1,–1,–1,–1,–1,–1,–1,–1,–1,0,–1,–1,–1,–1,–1,–1,–1,–1,–1,–1,–1, 1,–1;

–1,36,–1,–1,–1,–1,–1,57,–1,–1,–1,–1,–1,–1,–1,–1,–1,–1,–1,–1,–1,–1,202,–1,–1,37,–1,–1,–1,–1,–1, –1,–1,–1,–1,–1,–1,–1,–1,–1,–1,–1,–1,–1,–1,–1,–1,–1,–1,–1,–1,–1, 0,–1,–1,–1,–1,–1,–1,–1,–1,–1,–1,–1,–1,–1, –1;

193,–1,–1,–1,–1,–1,–1,–1,–1,–1,–1,–1,252,–1,237,–1,–1,–1,–1,–1,–1,–1,–1,–1,70,–1,–1,–1,–1,–1, –1,–1,–1,–1,–1,–1,–1,–1,–1,–1,–1,–1,–1,–1,–1,–1,–1,–1,–1,–1,–1,–1,–1,0,–1,–1,–1,–1,–1,–1,–1,–1,–1,–1,–1, –1,–1;

–1,161,251,–1,–1,–1,–1,–1,–1,–1,–1,162,–1,–1,–1,–1,–1,–1,–1,–1,18,–1,–1,–1,–1,–1,–1,–1, –1,–1,–1,–1,–1,–1,–1,–1,–1,–1,–1,–1,–1,–1,–1,–1,–1,–1,–1,–1,–1,–1,–1,–1,0,–1,–1,–1,–1,–1,–1,–1,–1,–1,–1, –1,–1;

224,−1,−1,−1,−1,−1,−1,108,−1,−1,−1,−1,−1,−1,−1,17,−1,161,−1,−1,−1,−1,−1,−1,−1,−1,−1,−1,−1,−1, −1,−1,−1,−1,−1,−1,−1,−1,−1,−1,−1,−1,−1,−1,−1,−1,−1,−1,−1,−1,−1,−1,−1,−1,0,−1,−1,−1,−1,−1,−1,−1,−1,−1, −1,−1;

−1,153,−1,−1,−1,−1,232,−1,−1,−1,−1,−1,33,−1,−1,−1,−1,−1,−1,−1,−1,−1,160,−1,−1,−1,−1,−1,−1,−1, −1,−1,−1,−1,−1,−1,−1,−1,−1,−1,−1,−1,−1,−1,−1,−1,−1,−1,−1,−1,−1,−1,−1,−1,−1,−1,0,−1,−1,−1,−1,−1,−1,−1,−1, −1,−1;

34,−1,−1,−1,−1,−1,−1,−1,−1,−1,−1,−1,−1,−1,32,11,−1,−1,182,−1,−1,−1,−1,−1,−1,−1,−1,−1,−1,−1, −1,−1,−1,−1,−1,−1,−1,−1,−1,−1,−1,−1,−1,−1,−1,−1,−1,−1,−1,−1,−1,−1,−1,−1,−1,−1,0,−1,−1,−1,−1,−1,−1,−1,−1, −1;

−1,95,−1,−1,−1,−1,−1,−1,−1,−1,−1,−1,−1,98,−1,−1,−1,−1,−1,−1,−1,−1,−1,82,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1,0,−1,−1,−1,−1,−1,−1,−1,−1;

26,−1,−1,−1,−1,−1,−1,−1,−1,100,127,−1,107,−1,−1,−1,−1,−1,−1,−1,−1,−1,−1,−1,−1,−1,−1,−1,−1,−1, −1,−1,−1,−1,−1,−1,−1,−1,−1,−1,−1,−1,−1,−1,−1,−1,−1,−1,−1,−1,−1,−1,−1,−1,−1,−1,−1,−1,0,−1,−1,−1,−1,−1, −1,−1;

−1,250,−1,61,−1,−1,−1,76,−1,−1,−1,−1,−1,−1,−1,−1,−1,−1,−1,11,−1,−1,−1,−1,−1,−1,−1,−1,−1,−1,−1, −1,−1,−1,−1,−1,−1,−1,−1,−1,−1,−1,−1,−1,−1,−1,−1,−1,−1,−1,−1,−1,−1,−1,−1,−1,−1,−1,−1,0,−1,−1,−1,−1,−1,−1;

122,−1,−1,−1,−1,−1,−1,−1,26,−1,−1,−1,−1,−1,−1,−1,−1,190,−1,−1,−1,−1,−1,−1,−1,−1,−1,−1,−1,−1, 1,−1,−1,−1,−1,−1,−1,−1,−1,−1,−1,−1,−1,−1,−1,−1,−1,−1,−1,−1,−1,−1,−1,−1,−1,−1,−1,−1,−1,−1,0,−1, 1,−1;

−1,52,−1,30,−1,−1,−1,−1,−1,114,−1,−1,−1,−1,−1,−1,−1,−1,223,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1,0,−1,−1,−1,−1;

211,−1,−1,−1,104,−1,−1,−1,−1,−1,−1,−1,−1,−1,−1,−1,−1,−1,−1,−1,−1,−1,−1,−1,97,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1,0,−1,−1,−1;

−1,207,−1,−1,−1,−1,−1,−1,−1,−1,−1,−1,−1,−1,−1,−1,129,−1,120,−1,−1,−1,−1,−1,−1,70,−1,−1,−1,−1, −1,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1,0, −1,−1;

93,−1,−1,−1,−1,−1,−1,60,−1,209,−1,−1,−1,−1,−1,−1,−1,−1,−1,−1,−1,242,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1, 0, −1;

−1,211,−1,−1,−1,−1,173,−1,−1,−1,143,−1,−1,−1,−1,−1,−1,−1,−1,−1,−1,−1,−1,−1,−1,−1,−1,−1,−1,−1, −1,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1, −1,0.

The coefficient matrix 2 is written as:

0,0,0,0,−1,0,0,−1,−1,0,0,0,0,0,−1,0,0,−1,0,0,0,0,0,0,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1;

129,−1,127,189,0,4,−1,0,0,10,−1,284,371,−1,0,2,30,0,−1,29,−1,171,193,0,0,−1,−1,−1,−1,−1, −1,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1, −1,−1;

4,263,278,−1,381,6,68,296,358,61,46,−1,−1,36,1,331,−1,376,249,16,15,−1,−1,−1,0,0,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1;

2,43,−1,42,16,−1,10,84,111,−1,289,321,17,275,22,−1,14,314,351,−1,4,56,0,−1,−1,0,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1, −1,−1,−1,−1;

149,124,−1,−1,−1,−1,−1,−1,−1,−1,−1,−1,−1,−1,−1,−1,−1,−1,−1,−1,−1,−1,−1,−1,−1,0,−1,−1,−1,−1, −1,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1, −1;

97,327,−1,213,−1,−1,−1,−1,−1,−1,−1,−1,41,−1,−1,−1,211,−1,−1,−1,−1,36,30,−1,−1,−1,−1,0,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1;

358,−1,−1,−1,−1,−1,20,−1,−1,−1,78,268,−1,121,−1,−1,−1,230,156,−1,329,−1,−1,−1,−1,−1,−1,−1, 0,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1, −1,−1,−1,−1;

347,333,−1,−1,299,−1,−1,164,172,−1,−1,−1,−1,−1,46,−1,−1,−1,−1,−1,−1,−1,−1,−1,−1,−1,−1,−1,−1,0,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1;

113,63,−1,119,−1,−1,−1,−1,−1,−1,−1,−1,110,−1,−1,−1,42,−11,4,−1,82,247,−1,197,−1,−1,−1,−1,−1,0,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1;

2,203,−1,−1,−1,−1,−1,−1,−1,−1,176,38,−1,69,−1,−1,−1,299,315,−1,53,−1,−1,−1,−1,−1,−1,−1,−1, −1,−1,0,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1;

−1,152,73,−1,16,−1,−1,2,336,−1,−1,−1,−1,−1,361,−1,−1,−1,−1,−1,−1,−1,−1,−1,−1,−1,−1,−1,−1,−1, −1,−1,0,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1;

179,111,−1,−1,−1,−1,−1,−1,−1,−1,−1,−1,331,−1,−1,−1,1,−1,−1,−1,−1,8,46,184,−1,−1,−1,−1,−1,−1, −1,−1,−1,0,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1, −1,−1;

47,132,−1,−1,−1,−1,−1,−1,−1,−1,1,212,−1,333,−1,−1,−1,−1,209,−1,−1,−1,−1,−1,−1,−1,−1,−1,−1,−1,−1,−1,−1,−1,0,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1;

347,−1,−1,88,−1,−1,−1,18,−1,−1,−1,−1,−1,−1,−1,−1,−1,−1,−1,−1,12,−1,−1,261,−1,−1,−1,−1,−1,−1, −1,−1,−1,−1,−1,0,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1;

6,−1,−1,−1,−1,−1,−1,−1,−1,−1,−1,−1,324,−1,−1,193,23,2,−1,−1,−1,297,−1,−1,−1,−1,−1,−1,−1,−1,−1,−1,−1,−1,−1,−1,0,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1;

339,155,−1,−1,−1,−1,−1,−1,−1,−1,109,−1,−1,4,−1,−1,−1,−1,6,−1,−1,−1,−1,−1,−1,178,−1,−1,−1,−1, −1,−1,−1,−1,−1,−1,−1,0,−1,−1,−1,−1,−1,−1,−1,−1,−1,−1,−1,−1,−1,−1,−1,−1,−1,−1,−1,−1,−1,−1,−1,−1,−1,−1,−1;

−1,163,−1,70,−1,−1,−1,−1,−1,−1,−1,95,−1,−1,−1,−1,−1,−1,−1,−1,27,−1,145,−1,−1,−1,−1,−1,−1,−1, −1,−1,−1,−1,−1,−1,−1,−1,0,−1,−1,−1,−1,−1,−1,−1,−1,−1,−1,−1,−1,−1,−1,−1,−1,−1,−1,−1,−1,−1,−1,−1,−1,−1,−1;

4,−1,−1,−1,−1,−1,−1,−1,−1,−1,−1,−1,−1,−1,326,−1,57,1,−1,−1,−1,215,−1,−1,−1,−1,−1,−1,−1,−1,−1, −1,−1,−1,−1,−1,−1,−1,−1,0,−1,−1,−1,−1,−1,−1,−1,−1,−1,−1,−1,−1,−1,−1,−1,−1,−1,−1,−1,−1,−1,−1,−1,−1,−1;

−1,86,−1,−1,−1,−1,−1,−1,−1,−1,−1,−1,341,22,−1,−1,−1,−1,349,292,−1,−1,−1,−1,−1,−1,−1,−1,−1,−1,−1,−1,−1,−1,−1,−1,−1,−1,−1,−1,0,−1,−1,−1,−1,−1,−1,−1,−1,−1,−1,−1,−1,−1,−1,−1,−1,−1,−1,−1,−1,−1,−1,−1,−1,−1;

2,269,−1,−1,−1,−1,−1,295,320,−1,46,−1,−1,−1,−1,−1,−1,−1,−1,−1,−1,−1,−1,−1,−1,−1,−1,−1,−1,−1, −1,−1,−1,−1,−1,−1,−1,−1,−1,−1,−1,0,−1,−1,−1,−1,−1,−1,−1,−1,−1,−1,−1,−1,−1,−1,−1,−1,−1,−1,−1,−1,−1,−1,−1;

104,−1,−1,18,−1,−1,−1,−1,−1, 136,−1,1,−1,−1,−1,−1,−1,−1,−1,−1,−1,−1,47,−1,−1,−1,−1,−1,−1,−1,−1,−1,−1,−1,−1,−1,−1,−1,−1,−1,−1,−1,0,−1,−1,−1,−1,−1,−1,−1,−1,−1,−1,−1,−1,−1,−1,−1,−1,−1,−1,−1,−1,−1,−1,−1;

–1,6,–1,–1,–1,250,–1,–1,–1,–1,–1,–1,–1,–1,–1,–1,157,–1,–1,–1,284,2,–1,–1,–1,–1,–1,–1,–1,–1,–1,–1,–1,–1,–1,–1,–1,–1,–1,–1,–1,–1,–1,0,–1,–1,–1,–1,–1,–1,–1,–1,–1,–1,–1,–1,–1,–1,–1,–1,–1,–1,–1,–1,–1,–1,–1,–1;

80,–1,–1,–1,–1,–1,–1,–1,–1,–1,–1,–1,159,22,–1,–1,–1, 45,–1,–1,–1,–1,–1,–1,–1,–1,–1,–1,–1,–1,–1, –1,–1,–1,–1,–1,–1,–1,–1,–1,–1,–1,–1,–1,0,–1,–1,–1,–1,–1,–1,–1,–1,–1,–1,–1,–1,–1,–1,–1,–1,–1,–1,–1,–1,–1,–1;

–1,129,246,–1,–1,–1,–1,–1,–1,–1,1,–1,–1,–1,–1,–1,–1,–1,178,–1,–1,–1,–1,–1,–1,–1,–1,–1,–1,–1,–1,–1,–1,–1,–1,–1,–1,–1,–1,–1,–1,–1,–1,–1,–1,0,–1,–1,–1,–1,–1,–1,–1,–1,–1,–1,–1,–1,–1,–1,–1,–1,–1,–1,–1,–1,–1,–1;

29,–1,–1,36,314,–1,–1,–1,–1,–1,–1,42,–1,–1,–1,–1,–1,–1,–1,–1,–1,–1,97,–1,–1,–1,–1,–1,–1,–1,–1,–1,–1,–1,–1,–1,–1,–1,–1,–1,–1,–1,–1,–1,–1,–1,–1,0,–1,–1,–1,–1,–1,–1,–1,–1,–1,–1,–1,–1,–1,–1,–1,–1,–1,–1,–1,–1,–1;

–1,178,–1,–1,–1,–1,6,58,–1,–1,–1,–1,–1,–1,160,–1,–1,–1,–1,–1,–1,–1,–1,–1,–1,–1,–1,–1,–1,–1,–1,–1, –1,–1,–1,–1,–1,–1,–1,–1,–1,–1,–1,–1,–1,–1,–1,–1,0,–1,–1,–1,–1,–1,–1,–1,–1,–1,–1,–1,–1,–1,–1,–1,–1,–1,–1,–1, –1;

240,–1,283,–1,19,–1,–1,–1,–1,–1,–1,–1,–1,–1,–1,222,–1,–1,–1,–1,–1,–1,–1,–1,–1,–1,–1,–1,–1,–1,–1, –1,–1,–1,–1,–1,–1,–1,–1,–1,–1,–1,–1,–1,–1,–1,–1,–1,–1,0,–1,–1,–1,–1,–1,–1,–1,–1,–1,–1,–1,–1,–1,–1,–1,–1,–1,–1, –1,–1;

–1,31,–1,–1,–1,–1,381,–1,197,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,0,–1,–1,–1,–1,–1,–1,–1,–1,–1,–1,–1,–1,–1,–1,–1,–1,–1,–1;

173,–1,–1,–1,42,–1,–1,–1,–1,–1,–1,–1,–1,–1,–1,–1,–1,–1,–1,–1,8,–1,55,–1,–1,–1,–1,–1,–1,–1,–1,–1,–1, –1,–1,–1,–1,–1,–1,–1,–1,–1,–1,–1,–1,–1,–1,–1,–1,–1,–1,–1,–1,0,–1,–1,–1,–1,–1,–1,–1,–1,–1,–1,–1,–1,–1,–1,–1,–1,–1,–1;

–1,96,–1,–1,–1,–1,–1,–1,–1,–1,–1,–1,–1,–1,264,–1,–1,–1,207,–1,–1,–1,–1,–1,–1,284,–1,–1,–1,–1, –1,–1,–1,–1,–1,–1,–1,–1,–1,–1,–1,–1,–1,–1,–1,–1,–1,–1,–1,–1,–1,–1, 0,–1,–1,–1,–1,–1,–1,–1,–1,–1,–1,–1,–1,–1,–1,–1, –1,–1;

309,–1,–1,–1,–1,–1,–1,–1,–1,–1,70,–1,–1,279,–1,–1,–1,–1,–1,–1,–1,–1,–1,–1,239,–1,–1,–1,–1,–1, –1,–1,–1,–1,–1,–1,–1,–1,–1,–1,–1,–1,–1,–1,–1,–1,–1,–1,–1,–1,–1,0,–1,–1,–1,–1,–1,–1,–1,–1,–1,–1,–1,–1,–1, –1,–1;

–1,359,–1,–1,–1,–1,–1,12,–1,–1,–1,–1,–1,–1,–1,–1,–1,–1,–1,–1,–1,–1,–1,356,–1,–1,261,–1,–1,–1,–1, –1,–1,–1,–1,–1,–1,–1,–1,–1,–1,–1,–1,–1,–1,–1,–1,–1,–1,–1,–1,–1,–1,0,–1,–1,–1,–1,–1,–1,–1,–1,–1,–1,–1,–1, –1,–1;

175,–1,–1,–1,–1,–1,–1,–1,–1,–1,–1,–1,60,–1,2,–1,–1,–1,–1,–1,–1,–1,–1,–1,40,–1,–1,–1,–1,–1,–1,–1,–1,–1,–1,–1,–1,–1,–1,–1, 1;

–1,281,373,–1,–1,–1,–1,–1,–1,–1,–1,258,–1,–1,–1,–1,–1,–1,–1,–1,–1,315,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,0,–1,–1,–1,–1,–1,–1,–1,–1,–1,–1,–1,–1;

328,–1,–1,–1,–1,–1,–1,12,–1,–1,–1,–1,–1,–1,–1,44,–1, 70,–1,–1,–1,–1,–1,–1,–1,–1,–1,–1,–1,–1,–1,–1, –1,–1,–1,–1,–1,–1,–1,–1,–1,–1,–1,–1,–1,–1,–1,–1,–1,–1,–1,–1,–1,–1,–1,0,–1,–1,–1,–1,–1,–1,–1,–1,–1,–1, –1;

–1,4,–1,–1,–1,–1,20,–1,–1,–1,–1,–1,185,–1,–1,–1,–1,–1,–1,–1,–1,–1,40,–1,–1,–1,–1,–1,–1,–1,–1,–1, –1,–1,–1,–1,–1,–1,–1,–1,–1,–1,–1,–1,–1,–1,–1,–1,–1,–1,–1,–1,–1,–1,–1,–1,0,–1,–1,–1,–1,–1,–1,–1,–1,–1,–1;

262,–1,–1,–1,–1,–1,–1,–1,–1,–1,–1,–1,–1,–1,10,249,–1,–1,356,–1,–1,–1,–1,–1,–1,–1,–1,–1,–1,–1,–1, –1,–1,–1,–1,–1,–1,–1,–1,–1,–1,–1,–1,–1,–1,–1,–1,–1,–1,–1,–1,–1,–1,–1,–1,–1,–1,0,–1,–1,–1,–1,–1,–1,–1,–1, –1,–1;

–1,337,–1,–1,–1,–1,–1,–1,–1,–1,–1,–1,–1,56,–1,–1,–1,–1,–1,–1,–1,–1,–1,381,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,0,–1,–1,–1,–1,–1,–1,–1,–1;

369,–1,–1,–1,–1,–1,–1,–1,–1,198,12,–1,22,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,0,–1,–1,–1,–1,–1,–1,–1;

–1,246,–1,10,–1,–1,–1,2,–1,–1,–1,–1,–1,–1,–1,–1,–1,–1,–1,50,–1,–1,–1,–1,–1,–1,–1,–1,–1,–1,–1,–1, –1,–1,–1,–1,–1,–1,–1,–1,–1,–1,–1,–1,–1,–1,–1,–1,–1,–1,–1,–1,–1,–1,–1,–1,–1,–1,–1,–1,0,–1,–1,–1,–1,–1,–1;

175,–1,–1,–1,–1,–1,–1,–1,367,–1,–1,–1,–1,–1,–1,–1,–1, 177,–1,–1,–1,–1,–1,–1,–1,–1,–1,–1,–1,–1,–1, –1,–1,–1,–1,–1,–1,–1,–1,–1,–1,–1,–1,–1,–1,–1,–1,–1,–1,–1,–1,–1,–1,–1,–1,–1,–1,–1,–1,–1,–1,0,–1,–1,–1,–1,–1;

–1,141,–1,28,–1,–1,–1,–1,–1,231,–1,–1,–1,–1,–1,–1,–1,–1,54,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,0,–1,–1,–1,–1;

136,–1,–1,–1,10,–1,–1,–1,–1,–1,–1,–1,–1,–1,–1,–1,–1,–1,–1,–1,–1,–1,–1,–1,335,–1,–1,–1,–1,–1,–1,–1;

–1,4,–1,–1,–1,–1,–1,–1,–1,–1,–1,–1,–1,–1,–1,–1,46,–1, 276,–1,–1,–1,–1,–1,–1,43,–1,–1,–1,–1,–1, –1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,0,–1,–1;

255,–1,–1,–1,–1,–1,–1,160,–1,361,–1,–1,–1,–1,–1,–1,–1,–1,–1,–1,–1,–1,46,–1,–1,–1,–1,–1,–1,–1,–1, –1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1, 0,–1;

–1,274,–1,–1,–1,–1,117,–1,–1,–1,56,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,0.

The coefficient matrix 3 is written as:

278,104,10,232,–1,256,8,–1,–1,281,180,2,238,236,–1, 21,69,–1,161,259,198,134,0,0,–1, –1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1, –1,–1,–1,–1,–1,–1,–1;

197,–1,12,29,224,260,–1,192,312,297,–1,30,150,–1,133, 27,99,214,–1,162,–1,1,161,0,0, –1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1, –1,–1,–1,–1,–1,–1,–1;

114,233,237,–1,95,266,293,251,16,299,73,–1,–1,197, 209,180,–1,75,203,154,135,–1,–1, –1,0,0,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1;

107,255,–1,135,225,–1,24,157,10,–1,252,90,223,294, 241,–1,22,211,231,–1,204,228,0,–1,–1,0,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1;

60,97,–1,–1,–1,–1,–1,–1,–1,–1,–1,–1,–1,–1,–1,–1,–1,–1,–1,–1,–1,–1,–1,–1,–1,–1,0,–1,–1,–1,–1,–1, –1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1;

274,10,–1,154,–1,–1,–1,–1,–1,–1,–1,–1,48,–1,–1,–1, 172,–1,–1,–1,–1,202,29,–1,–1,–1,–1,0,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1, –1,–1,–1;

4,–1,–1,–1,–1,–1,279,–1,–1,–1,177,104,–1,26,–1,–1,–1, 31,221,–1,232,–1,–1,–1,–1,–1,–1,–1,0, –1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1, –1,–1,–1;

34,86,–1,–1,165,–1,–1,132,147,–1,–1,–1,–1,–1,117,–1,–1,–1,–1,–1,–1,–1,–1,–1,–1,–1,–1,–1,–1,–1, 0,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1;

63,196,–1,198,–1,–1,–1,–1,–1,–1,–1,–1,20,–1,–1,–1, 47,–1,–1,233,–1,218,19,–1,313,–1,–1,–1, –1,–1,0,–1,–1,–

1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1;

27,294,–1,–1,–1,–1,–1,–1,–1,–1,284,36,–1,239,–1,–1,–1,62,38,–1,298,–1,–1,–1,–1,–1,–1,–1,–1,   –1,–1,0,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1, –1,–1,–1;

–1,210,127,–1,155,–1,–1,218,290,–1,–1,–1,–1,–1,125,–1,–1,–1,–1,–1,–1,–1,–1,–1,–1,–1,–1,–1,   –1,–1,–1,–1,0,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1;

219,250,–1,–1,–1,–1,–1,–1,–1,–1,–1,–1,257,–1,–1,–1,211,–1,–1,–1,–1,49,7,171,–1,–1,–1,–1,–1, –1,–1,–1,–1,0,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1, –1,–1,–1;

315,76,–1,–1,–1,–1,–1,–1,–1,–1,42,302,–1,314,–1,–1,–1,–1,48,–1,–1,–1,–1,–1,–1,–1,–1,–1,–1,–1,–1,–1,–1,–1,–1,0,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1;

135,–1,–1,233,–1,–1,–1,228,–1,–1,–1,–1,–1,–1,–1,–1,–1,–1,–1,–1,213,–1,–1,309,–1,–1,–1,–1,–1,   –1,–1,–1,–1,–1,–1,0,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1, –1,–1,–1;

317,–1,–1,–1,–1,–1,–1,–1,–1,–1,–1,–1,289,–1,–1,41,174,267,–1,–1,–1,170,–1,–1,–1,–1,–1,–1,–1,–1,–1,–1,–1,–1,–1,–1,0,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1, 103,21,–1,–1,–1,–1,–1,–1,–1,–1,–1,69,–1,–1,77,–1,–1,–1,–1,181,–1,–1,–1,–1,–1,–1,173,–1,–1,–1,–1,–1,–1,–1,–1,–1,–1,–1,0,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1;

–1,259,–1,152,–1,–1,–1,–1,–1,–1,–1,159,–1,–1,–1,–1,–1,–1,–1,–1,120,–1,191,–1,–1,–1,–1,–1,–1,   –1,–1,–1,–1,–1,–1,–1,–1,–1,0,–1,–1,–1,–1,–1,–1,–1,–1,–1,–1,–1,–1,–1,–1,–1,–1,–1,–1,–1,–1,–1,–1,–1,–1,–1,–1,–1, –1,–1,–1;

314,–1,–1,–1,–1,–1,–1,–1,–1,–1,–1,–1,–1,–1,–1,135,–1,107,270,–1,–1,–1,226,–1,–1,–1,–1,–1,–1,–1,   –1,–1,–1,–1,–1,–1,–1,–1,–1,–1,–1,0,–1,–1,–1,–1,–1,–1,–1,–1,–1,–1,–1,–1,–1,–1,–1,–1,–1,–1,–1,–1,–1,–1,–1,–1,–1,–1, –1,–1,–1;

–1,2,–1,–1,–1,–1,–1,–1,–1,–1,–1,–1,133,132,–1,–1,–1,–1,95,228,–1,–1,–1,–1,–1,–1,–1,–1,–1,–1, –1,–1,–1,–1,–1,–1,–1,–1,–1,–1,0,–1,–1,–1,–1,–1,–1,–1,–1,–1,–1,–1,–1,–1,–1,–1,–1,–1,–1,–1,–1,–1,–1,–1,–1,–1,–1,–1,–1,–1;

288,142,–1,–1,–1,–1,–1,212,209,–1,240,–1,–1,–1,–1,–1,–1,–1,–1,–1,–1,–1,–1,–1,–1,–1,–1,–1,–1,   –1,–1,–1,–1,–1,–1,–1,–1,–1,–1,–1,–1,0,–1,–1,–1,–1,–1,–1,–1,–1,–1,–1,–1,–1,–1,–1,–1,–1,–1,–1,–1,–1,–1,–1,–1,–1, –1,–1,–1;

284,–1,–1,290,–1,–1,–1,–1,–1,311,–1,2,–1,–1,–1,–1,–1,–1,–1,–1,–1,–1,241,–1,–1,–1,–1,–1,–1,–1,–1,–1,–1,–1,–1,–1,–1,–1,–1,–1,–1,–1,–1,0,–1,–1,–1,–1,–1,–1,–1,–1,–1,–1,–1,–1,–1,–1,–1,–1,–1,–1,–1,–1,–1,–1,–1,–1,–1,–1;

–1,303,–1,–1,–1,125,–1,–1,–1,–1,–1,–1,–1,–1,–1,–1,–1,97,–1,–1,–1,208,300,–1,–1,–1,–1,–1,–1,–1, –1,–1,–1,–1,–1,–1,–1,–1,–1,–1,–1,–1,–1,–1,–1,0,–1,–1,–1,–1,–1,–1,–1,–1,–1,–1,–1,–1,–1,–1,–1,–1,–1,–1,–1,–1,–1,–1,–1,–1,–1,–1;

69,–1,–1,–1,–1,–1,–1,–1,–1,–1,–1,–1,273,242,–1,–1,–1,98,–1,–1,–1,–1,–1,–1,–1,–1,–1,–1,–1,–1,–1,–1,–1,–1,–1,–1,–1,–1,–1,–1,–1,–1,–1,–1,–1,0,–1,–1,–1,–1,–1,–1,–1,–1,–1,–1,–1,–1,–1,–1,–1,–1,–1,–1,–1,–1,–1,–1,–1;

–1,64,231,–1,–1,–1,–1,–1,–1,–1,38,–1,–1,–1,–1,–1,–1,–1,263,–1,–1,–1,–1,–1,–1,–1,–1,–1,–1,–1,–1,–1,–1,–1,–1,–1,–1,–1,–1,–1,–1,–1,–1,–1,–1,–1,0,–1,–1,–1,–1,–1,–1,–1,–1,–1,–1,–1,–1,–1,–1,–1,–1,–1,–1,–1,–1,–1,–1,–1;

249,–1,–1,68,231,–1,–1,–1,–1,–1,–1,234,–1,–1,–1,–1,–1,–1,–1,–1,–1,–1,134,–1,–1,–1,–1,–1,–1,     –1,–1,–1,–1,–1,–1,–1,–1,–1,–1,–1,–1,–1,–1,–1,–1,–1,–1,0,–1,–1,–1,–1,–1,–1,–1,–1,–1,–1,–1,–1,–1,–1,–1,–1,–1,–1,–1,–1,–1;

–1,64,–1,–1,–1,–1,157,253,–1,–1,–1,–1,–1,–1,47,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,0,–1,–1,–1,–1,–1,–1,–1,–1,–1,–1,–1,–1,–1,–1,–1,–1,–1,–1;

170,–1,51,–1,236,–1,–1,–1,–1,–1,–1,–1,–1,–1,295,–1,–1,–1,–1,–1,–1,–1,–1,–1,–1,–1,–1,–1,  –1,–1,–1,–1,–1,–1,–1,–1,–1,–1,–1,–1,–1,–1,–1,–1,0,–1,–1,–1,–1,–1,–1,–1,–1,–1,–1,–1,–1,–1,–1,–1,–1,–1, –1,–1;

–1,8,–1,–1,–1,–1,249,–1,242,–1,–1,–1,–1,–1,–1,–1,–1,–1,–1,–1,–1,–1,–1,–1,–1,–1,–1,–1,–1,–1,  –1,–1,–1,–1,–1,–1,–1,–1,–1,–1,–1,–1,–1,–1,–1,–1,0,–1,–1,–1,–1,–1,–1,–1,–1,–1,–1,–1,–1,–1,–1,–1,–1,–1, –1;

109,–1,–1,–1,72,–1,–1,–1,–1,–1,–1,–1,–1,–1,–1,–1,–1,–1,–1,158,–1,38,–1,–1,–1,–1,–1,–1,–1,–1,–1,–1,–1,–1,–1,–1,–1,–1,–1,–1,–1,–1,–1,–1,–1,–1,–1,–1,–1,–1,0,–1,–1,–1,–1,–1,–1,–1,–1,–1,–1,–1,–1,–1,–1,–1,–1;

–1,148,–1,–1,–1,–1,–1,–1,–1,–1,–1,–1,–1,89,–1,–1,–1,236,–1,–1,–1,–1,–1,–1,222,–1,–1,–1,–1,   –1,–1,–1,–1,–1,–1,–1,–1,–1,–1,–1,–1,–1,–1,–1,–1,–1,–1,–1,–1,0,–1,–1,–1,–1,–1,–1,–1,–1,–1,–1,–1,–1,–1, –1,–1;

318,–1,–1,–1,–1,–1,–1,–1,–1,27,–1,–1,44,–1,–1,–1,–1,–1,–1,–1,–1,–1,–1,222,–1,–1,–1,–1,–1,–1,–1,–1,–1,–1,–1,–1,–1,–1,–1,–1,–1,–1,–1,–1,–1,–1,–1,–1,–1,–1,0,–1,–1,–1,–1,–1,–1,–1,–1,–1,–1,–1,–1,–1,–1,–1;

–1,51,–1,–1,–1,–1,–1,205,–1,–1,–1,–1,–1,–1,–1,–1,–1,–1,–1,–1,–1,–1,226,–1,–1,89,–1,–1,–1,–1,–1,–1,–1,–1,–1,–1,–1,–1,–1,–1,–1,–1,–1,–1,–1,–1,–1,–1,–1,–1,–1,0,–1,–1,–1,–1,–1,–1,–1,–1,–1,–1,–1,–1,–1;

274,–1,–1,–1,–1,–1,–1,–1,–1,–1,–1,–1,9,–1,239,–1,–1,–1,–1,–1,–1,–1,–1,–1,191,–1,–1,–1,–1,–1,–1,–1,–1,–1,–1,–1,–1,–1,–1,–1,–1,–1,–1,–1,–1,–1,–1,–1,–1,–1,–1,–1,–1,0,–1,–1,–1,–1,–1,–1,–1,–1,–1,–1,–1,–1,–1;

–1,78,28,–1,–1,–1,–1,–1,–1,–1,–1,228,–1,–1,–1,–1,–1,–1,–1,–1,–1,282,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,0,–1,–1,–1,–1,–1,–1,–1,–1,–1,–1,–1;

90,–1,–1,–1,–1,–1,–1,86,–1,–1,–1,–1,–1,–1,–1,52,–1,122,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,0,–1,–1,–1,–1,–1,–1,–1,–1,–1, –1;

–1,249,–1,–1,–1,–1,159,–1,–1,–1,–1,–1,132,–1,–1,–1,–1,–1,–1,–1,–1,–1,76,–1,–1,–1,–1,–1,–1,–1,  –1,–1,–1,–1,–1,–1,–1,–1,–1,–1,–1,–1,–1,–1,–1,–1,–1,–1,–1,–1,–1,–1,–1,–1,0,–1,–1,–1,–1,–1,–1,–1,–1, –1,–1;

263,–1,–1,–1,–1,–1,–1,–1,–1,–1,–1,–1,–1,315,156,–1,–1,135,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,0,–1,–1,–1,–1,–1,–1,–1,–1;

–1,233,–1,–1,–1,–1,–1,–1,–1,–1,–1,–1,–1,144,–1,–1,–1,–1,–1,–1,–1,–1,–1,110,–1,–1,–1,–1,–1,–1, –1,–1,–1,–1,–1,–1,–1,–1,–1,–1,–1,–1,–1,–1,–1,–1,–1,–1,–1,–1,–1,–1,–1,–1,–1,–1,0,–1,–1,–1,–1,–1,–1,–1,–1;

70,–1,–1,–1,–1,–1,–1,–1,–1,29,178,–1,112,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,0,–1,–1,–1,–1,–1,–1,–1;

–1,165,–1,32,–1,–1,–1,256,–1,–1,–1,–1,–1,–1,–1,–1,–1,–1,–1,158,–1,–1,–1,–1,–1,–1,–1,–1,–1,–1,     –1,–1,–1,–1,–1,–1,–1,–1,–1,–1,–1,–1,–1,–1,–1,–1,–1,–1,–1,–1,–1,–1,–1,–1,–1,–1,–1,–1,0,–1,–1,–1,–1, –1,–1;

37,–1,–1,–1,–1,–1,–1,–1,115,–1,–1,–1,–1,–1,–1,–1,–1,183,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,0,–1,–1,–1,–1,–1;

–1,208,–1,80,–1,–1,–1,–1,–1,3     5,–1,–1,–1,–1,–1,–1,–1,–1,303,–1,–1,–1,–1,–1,–1,–1,–1,–1,–1,–1,–1,–1,–1,–1,–

1,–1,–1,–1,–1,–1,–1,–1,–1,–1,–1,–1,–1,–1,–1,–1,–1,–1,–1,–1,–1,–1,–1,–1,–1,–1,–1,0,–1,–1,–1,–1;

69,–1,–1,–1,21,–1,–1,–1,–1,–1,–1,–1,–1,–1,–1,–1,–1,–1,–1,–1,–1,–1,–1,–1,249,–1,–1,–1,–1,–1,–1, –1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,0,–1,–1, –1;

–1,284,–1,–1,–1,–1,–1,–1,–1,–1,–1,–1,–1,–1,–1,–1, 301,–1,145,–1,–1,–1,–1,–1,–1,60,–1,–1,–1,–1, –1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,0, –1,–1;

27,–1,–1,–1,–1,–1,–1,187,–1,171,–1,–1,–1,–1,–1,–1,–1,–1,–1,–1,–1,–1,279,–1,–1,–1,–1,–1,–1,–1, –1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1, 0,–1;

–1,77,–1,–1,–1,–1,132,–1,–1,–1,168,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,0.

The coefficient matrix 4 is written as:

219,105,86,70,–1,92,65,–1,–1,67,70,100,219,168,–1, 167,51,–1,50,20,204,100,0,0,–1,–1, –1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1, –1,–1,–1,–1,–1,–1;

29,–1,12,85,203,172,–1,92,112,3,–1,186,184,–1,200,49, 30,56,–1,130,–1,33,223,0,0,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1;

102,122,70,–1,94,159,187,168,157,1,46,–1,–1,65,106, 214,–1,223,191,51,133,–1,–1,–1,0, 0,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1, –1,–1,–1,–1,–1,–1,–1;

188,119,–1,145,162,–1,95,67,152,–1,17,64,208,218, 188,–1,64,149,104,–1,155,211,0,–1, –1,0,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1;

178,205,–1,–1,–1,–1,–1,–1,–1,–1,–1,–1,–1,–1,–1,–1,–1,–1,–1,–1,–1,–1,–1,–1,–1,–1,0,–1,–1,–1,–1, –1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1, –1;

16,4,–1,188,–1,–1,–1,–1,–1,–1,–1,–1,194,–1,–1,–1,48,–1,–1,–1,–1,42,145,–1,–1,–1,–1,0,–1,–1, –1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1, –1,–1;

24,–1,–1,–1,–1,–1,26,–1,–1,–1,129,217,–1,10,–1,–1,–1, 105,181,–1,10,–1,–1,–1,–1,–1,–1,–1,0, –1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1, –1,–1,–1;

70,155,–1,–1,214,–1,–1,193,156,–1,–1,–1,–1,–1,135,–1,–1,–1,–1,–1,–1,–1,–1,–1,–1,–1,–1,–1,–1,0,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1, 1,–1,–1,–1;

150,185,–1,222,–1,–1,–1,–1,–1,–1,–1,–1,84,–1,–1,–1, 160,–1,–1,154,–1,96,106,–1,36,–1,–1,–1,–1,–1,0,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1;

200,51,–1,–1,–1,–1,–1,–1,–1,–1,28,151,–1,8,–1,–1,–1, 0,183,–1,201,–1,–1,–1,–1,–1,–1,–1,–1,–1,–1,0,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1;

–1,77,1,–1,26,–1,–1,186,48,–1,–1,–1,–1,–1,127,–1,–1,–1,–1,–1,–1,–1,–1,–1,–1,–1,–1,–1,–1,–1,–1,–1,–1,0,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1;

211,15,–1,–1,–1,–1,–1,–1,–1,–1,–1,–1,207,–1,–1,–1, 141,–1,–1,–1,–1,2,150,172,–1,–1,–1,–1,–1, –1,–1,–1,–1, 0,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1, –1,–1,–1;

183,13,–1,–1,–1,–1,–1,–1,–1,–1,29,118,–1,200,–1,–1,–1,–1,97,–1,–1,–1,–1,–1,–1,–1,–1,–1,–1,–1,–1,–1,–1,–1, 0,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1;

175,–1,–1,94,–1,–1,–1,96,–1,–1,–1,–1,–1,–1,–1,–1,–1,–1,–1,–1,54,–1,–1,101,–1,–1,–1,–1,–1,–1, –1,–1,–1,–1,–1, 0,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1;

129,–1,–1,–1,–1,–1,–1,–1,–1,–1,–1,–1,200,–1,–1,180, 26,66,–1,–1,–1,116,–1,–1,–1,–1,–1,–1,–1, –1,–1,–1,–1,–1,–1,–1,0,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1;

57,127,–1,–1,–1,–1,–1,–1,–1,–1,50,–1,–1,70,–1,–1,–1,–1,219,–1,–1,–1,–1,–1,–1,77,–1,–1,–1,–1, –1,–1,–1,–1,–1,–1,–1,0,–1,–1,–1,–1,–1,–1,–1,–1,–1,–1,–1,–1,–1,–1,–1,–1,–1,–1,–1,–1,–1,–1,–1,–1,–1,–1,–1,–1;

–1,55,–1,133,–1,–1,–1,–1,–1,–1,–1,63,–1,–1,–1,–1,–1,–1,–1,–1,5,–1,70,–1,–1,–1,–1,–1,–1,–1,–1, –1,–1,–1,–1,–1,–1,–1,0,–1,–1,–1,–1,–1,–1,–1,–1,–1,–1,–1,–1,–1,–1,–1,–1,–1,–1,–1,–1,–1,–1,–1,–1,–1,–1,–1,–1;

88,–1,–1,–1,–1,–1,–1,–1,–1,–1,–1,–1,–1,–1,126,–1,217, 54,–1,–1,–1,8,–1,–1,–1,–1,–1,–1,–1,–1,–1,–1,–1,–1,–1,–1,–1,–1,0,–1,–1,–1,–1,–1,–1,–1,–1,–1,–1,–1,–1,–1,–1,–1,–1,–1,–1,–1,–1,–1,–1,–1,–1,–1,–1,–1,–1;

–1,88,–1,–1,–1,–1,–1,–1,–1,–1,–1,–1,142,135,–1,–1,–1,–1,67,189,–1,–1,–1,–1,–1,–1,–1,–1,–1,–1,–1,–1,–1,–1,–1,–1,–1,–1,–1,–1,0,–1,–1,–1,–1,–1,–1,–1,–1,–1,–1,–1,–1,–1,–1,–1,–1,–1,–1,–1,–1,–1,–1,–1,–1,–1,–1;

52,166,–1,–1,–1,–1,–1,41,85,–1,4,–1,–1,–1,–1,–1,–1,–1,–1,–1,–1,–1,–1,–1,–1,–1,–1,–1,–1,–1,–1,–1,–1, –1,–1,–1,–1,–1,–1,–1,–1,–1,–1,0,–1,–1,–1,–1,–1,–1,–1,–1,–1,–1,–1,–1,–1,–1,–1,–1,–1,–1,–1,–1,–1,–1,–1,–1,–1;

186,–1,–1,43,–1,–1,–1,–1,–1,60,–1,60,–1,–1,–1,–1,–1,–1,–1,–1,–1,–1,40,–1,–1,–1,–1,–1,–1,–1,–1,–1,–1,–1,–1,–1,–1,–1,–1,–1,–1,–1,0,–1,–1,–1,–1,–1,–1,–1,–1,–1,–1,–1,–1,–1,–1,–1,–1,–1,–1,–1,–1,–1,–1,–1,–1,–1;

–1,53,–1,–1,–1,199,–1,–1,–1,–1,–1,–1,–1,–1,–1,–1, 168,–1,–1,–1,18,192,–1,–1,–1,–1,–1,–1,–1,–1,–1,–1,–1,–1,–1,–1,–1,–1,–1,–1,–1,–1,0,–1,–1,–1,–1,–1,–1,–1,–1,–1,–1,–1,–1,–1,–1,–1,–1,–1,–1,–1,–1,–1,–1,–1,–1,–1,–1;

125,–1,–1,–1,–1,–1,–1,–1,–1,–1,–1,–1,164,156,–1,–1,–1,43,–1,–1,–1,–1,–1,–1,–1,–1,–1,–1,–1,–1, –1,–1,–1,–1,–1,–1,–1,–1,–1,–1,–1,–1,–1,0,–1,–1,–1,–1,–1,–1,–1,–1,–1,–1,–1,–1,–1,–1,–1,–1,–1,–1,–1,–1, –1,–1;

–1,18,70,–1,–1,–1,–1,–1,–1,–1,84,–1,–1,–1,–1,–1,–1,–1,49,–1,–1,–1,–1,–1,–1,–1,–1,–1,–1,–1,–1, –1,–1,–1,–1,–1,–1,–1,–1,–1,–1,–1,–1,–1,0,–1,–1,–1,–1,–1,–1,–1,–1,–1,–1,–1,–1,–1,–1,–1,–1,–1,–1,–1,–1,–1;

165,–1,–1,212,16,–1,–1,–1,–1,–1,–1,99,–1,–1,–1,–1,–1,–1,–1,–1,–1,–1,118,–1,–1,–1,–1,–1,–1,–1,–1,–1,–1,–1,–1,–1,–1,–1,–1,–1,–1,–1,–1,–1,–1,0,–1,–1,–1,–1,–1,–1,–1,–1,–1,–1,–1,–1,–1,–1,–1,–1,–1,–1,–1,–1,–1,–1,–1;

–1,179,–1,–1,–1,–1,178,137,–1,–1,–1,–1,–1,–1,83,–1,–1,–1,–1,–1,–1,–1,–1,–1,–1,–1,–1,–1,–1,–1, –1,–1,–1,–1,–1,–1,–1,–1,–1,–1,–1,–1,–1,–1,–1,–1,0,–1,–1,–1,–1,–1,–1,–1,–1,–1,–1,–1,–1,–1,–1,–1,–1,–1,–1, –1,–1;

57,–1,23,–1,16,–1,–1,–1,–1,–1,–1,–1,–1,–1,–1,215,–1,–1,–1,–1,–1,–1,–1,–1,–1,–1,–1,–1,–1,–1,–1, –1,–1,–1,–1,–1,–1,–1,–1,–1,–1,–1,–1,–1,–1,–1,–1,0,–1,–1,–1,–1,–1,–1,–1,–1,–1,–1,–1,–1,–1,–1,–1,–1,–1,–1,–1;

–1,0,–1,–1,–1,–1,12,–1,160,–1,–1,–1,–1,–1,–1,–1,–1,–1,–1,–1,–1,–1,–1,–1,–1,–1,–1,–1,–1,–1,–1, –1,–1,–1,–1,–1,–1,–1,–1,–1,–1,–1,–1,–1,–1,–1,–1,–1;

54,–1,–1,–1,48,–1,–1,–1,–1,–1,–1,–1,–1,–1,–1,–1,–1,–1,–1,202,–1,122,–1,–1,–1,–1,–1,–1,–1,–1,–1,–1,–1,–1,–

1,−1,−1,−1,−1,−1,−1,−1,−1,−1,−1,−1,−1,−1,−1,−1,0,−1,−1,−1,−1,−1,−1,−1,−1,−1,−1,−1,−1,−1,−1,−1,−1,−1;

−1,216,−1,−1,−1,−1,−1,−1,−1,−1,−1,−1,−1,−1,169,−1,−1,−1,162,−1,−1,−1,−1,−1,−1,163,−1,−1,−1,−1,−1,−1,−1,−1,−1,−1,−1,−1,−1,−1,−1,−1,−1,−1,−1,−1,−1,−1,−1,−1,−1,−1,−1, 0,−1,−1,−1,−1,−1,−1,−1,−1,−1,−1,−1,−1,−1,−1,−1,−1,−1;

146,−1,−1,−1,−1,−1,−1,−1,−1,−1,79,−1,−1,32,−1,−1,−1,−1,−1,−1,−1,−1,−1,−1,218,−1,−1,−1,−1,−1,−1,−1,−1,−1,−1,−1,−1,−1,−1,−1,−1,−1,−1,−1,−1,−1,−1,−1,−1,−1,−1,−1,−1,0,−1,−1,−1,−1,−1,−1,−1,−1,−1,−1,−1,−1,−1,−1,−1,−1,−1;

−1,26,−1,−1,−1,−1,−1,210,−1,−1,−1,−1,−1,−1,−1,−1,−1,−1,−1,−1,−1,−1,−1,208,−1,−1,194,−1,−1,−1,−1, −1,−1,−1,−1,−1,−1,−1,−1,−1,−1,−1,−1,−1,−1,−1,−1,−1,−1,−1,−1,−1,−1,−1,−1,−1,0,−1,−1,−1,−1,−1,−1,−1,−1,−1,−1,−1,−1,−1, −1,−1;

154,−1,−1,−1,−1,−1,−1,−1,−1,−1,−1,−1,−1,125,−1,211,−1,−1,−1,−1,−1,−1,−1,−1,−1,19,−1,−1,−1,−1,−1, −1,−1,−1,−1,−1,−1,−1,−1,−1,−1,−1,−1,−1,−1,−1,−1,−1,−1,−1,−1,−1,−1,−1,−1,−1,0,−1,−1,−1,−1,−1,−1,−1,−1,−1,−1,−1,−1,−1, −1,−1;

−1,92,167,−1,−1,−1,−1,−1,−1,−1,−1,217,−1,−1,−1,−1,−1,−1,−1,−1,−1,32,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1,0,−1,−1,−1,−1,−1,−1,−1,−1,−1,−1,−1,−1,−1;

20,−1,−1,−1,−1,−1,−1,101,−1,−1,−1,−1,−1,−1,−1,−1,157,−1, 32,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1,0,−1,−1,−1,−1,−1,−1,−1,−1,−1,−1,−1,−1,−1;

−1,109,−1,−1,−1,−1,−1,124,−1,−1,−1,−1,−1,−1,140,−1,−1,−1,−1,−1,−1,−1,−1,−1,−1,64,−1,−1,−1,−1,−1,−1,−1,−1, −1,−1,−1,−1,−1,−1,−1,−1,−1,−1,−1,−1,−1,−1,−1,−1,−1,−1,−1,−1,−1,−1,−1,−1,−1,−1,−1,−1,−1,−1,0,−1,−1,−1,−1,−1,−1,−1,−1,−1, −1,−1;

36,−1,−1,−1,−1,−1,−1,−1,−1,−1,−1,−1,−1,−1,−1,112,191,−1,−1,115,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1,0,−1,−1,−1,−1,−1,−1,−1,−1, −1,−1;

−1,84,−1,−1,−1,−1,−1,−1,−1,−1,−1,−1,−1,−1,66,−1,−1,−1,−1,−1,−1,−1,−1,−1,28,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1,0,−1,−1,−1,−1,−1,−1,−1,−1,−1;

86,−1,−1,−1,−1,−1,−1,−1,−1,0,218,−1,44,−1,−1,−1,−1,−1,−1,−1,−1,−1,−1,−1,−1,−1,−1,−1,−1,−1,−1,−1,−1,−1, −1,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1,0,−1,−1,−1,−1,−1,−1,−1,−1;

−1,59,−1,112,−1,−1,−1,14,−1,−1,−1,−1,−1,−1,−1,−1,−1,−1,−1,−1,74,−1,−1,−1,−1,−1,−1,−1,−1,−1,−1,−1,−1,−1, −1,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1,0,−1,−1,−1,−1,−1,−1, −1;

67,−1,−1,−1,−1,−1,−1,−1,138,−1,−1,−1,−1,−1,−1,−1,−1,−1, 90,−1,−1,−1,−1,−1,−1,−1,−1,−1,−1,−1,−1,−1,−1,−1, −1,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1,0,−1,−1,−1,−1,−1, −1;

−1,216,−1,40,−1,−1,−1,−1,−1,212,−1,−1,−1,−1,−1,−1,−1,−1,−1,151,−1,−1,−1,−1,−1,−1,−1,−1,−1,−1,−1,−1,−1, −1,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1,0,−1,−1, −1,−1;

69,−1,−1,−1,14,−1,−1,−1,−1,−1,−1,−1,−1,−1,−1,−1,−1,−1,−1,−1,−1,−1,−1,−1,−1,−1,114,−1,−1,−1,−1,−1,−1,−1, −1,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1,0,−1,−1, −1;

−1,140,−1,−1,−1,−1,−1,−1,−1,−1,−1,−1,−1,−1,−1,−1,−1, 106,−1,111,−1,−1,−1,−1,−1,−1,92,−1,−1,−1,−1,−1, −1,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1,0, −1,−1;

64,−1,−1,−1,−1,−1,−1,152,−1,198,−1,−1,−1,−1,−1,−1,−1,−1,−1,−1,−1,−1,−1,−1,135,−1,−1,−1,−1,−1,−1,−1,−1, −1,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1, 0,−1;

−1,25,−1,−1,−1,−1,49,−1,−1,−1,29,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1, 0.

The coefficient matrix 5 is written as:

6,120,58,248,−1,240,272,−1,−1,40,9,196,50,254,−1,149, 69,−1,177,275,214,150,0,0,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1;

247,−1,70,10,99,244,−1,56,208,56,−1,240,251,−1,252, 155,97,230,−1,187,−1,181,145,0,0, −1,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1, −1,−1,−1,−1,−1,−1,−1;

158,189,10,−1,128,250,3,142,128,42,67,−1,−1,92,201, 144,−1,261,54,184,225,−1,−1,−1,0, 0,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1, −1,−1,−1,−1,−1,−1,−1;

89,21,−1,129,76,−1,0,174,209,−1,138,218,256,26,79,−1, 136,200,79,−1,35,255,0,−1,−1,0, −1,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1, −1,−1,−1,−1,−1,−1;

65,241,−1,−1,−1,−1,−1,−1,−1,−1,−1,−1,−1,−1,−1,−1,−1,−1,−1,−1,−1,−1,−1,−1,−1,−1,0,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1;

216,39,−1,226,−1,−1,−1,−1,−1,−1,−1,−1,0,−1,−1,−1, 220,−1,−1,−1,−1,241,44,−1,−1,−1,−1,0,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1;

266,−1,−1,−1,−1,−1,45,−1,−1,−1,284,178,−1,265,−1,−1,−1,54,158,−1,11,−1,−1,−1,−1,−1,−1,−1,−1, 0,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1;

84,110,−1,−1,23,−1,−1,22,250,−1,−1,−1,−1,−1,232,−1,−1,−1,−1,−1,−1,−1,−1,−1,−1,−1,−1,−1,−1,−1,−1,0, −1,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1, −1,−1;

160,270,−1,35,−1,−1,−1,−1,−1,−1,−1,−1,281,−1,−1,−1, 225,−1,−1,196,−1,1,63,−1,202,−1,−1,−1, −1,−1,0,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1;

252,9,−1,−1,−1,−1,−1,−1,−1,−1,254,223,−1,228,−1,−1,−1,248,142,−1,186,−1,−1,−1,−1,−1,−1,−1,−1,0,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1, −1,−1,−1,−1;

−1,151,284,−1,13 8,−1,−1,12,154,−1,−1,−1,−1,−1,210,−1,−1,−1,−1,−1,−1,−1,−1,−1,−1,−1,−1,−1,−1,−1,−1,−1,−1,0,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1;

78,143,−1,−1,−1,−1,−1,−1,−1,−1,−1,−1,−1,12,−1,−1,−1, 117,−1,−1,−1,−1,5,155,217,−1,−1,−1,−1,−1,−1,−1,−1,−1,−1, 0,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1;

238,259,−1,−1,−1,−1,−1,−1,−1,−1,−1, 146,93,−1,146,−1,−1,−1,−1,211,−1,−1,−1,−1,−1,−1,0,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1;

68,−1,−1,253,−1,−1,−1,104,−1,−1,−1,−1,−1,−1,−1,−1,−1,−1,−1,−1,−1,264,−1,−1,201,−1,−1,−1,−1,−1,−1, −1,−1,−1,−1,−1,−1,0,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1;

152,−1,−1,−1,−1,−1,−1,−1,−1,−1,−1,−1,−1,127,−1,−1,147, 57,90,−1,−1,−1,20,−1,−1,−1,−1,−1,−1,−1,−1,−1,−1,−1,−1,−1,−1,−1,0,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1;

160,21,−1,−1,−1,−1,−1,−1,−1,−1,−1,179,−1,−1,19,−1,−1,−1,−1,8,−1,−1,−1,−1,−1,−1,−1,273,−1,−1,−1,−1,−1, −1,−1,−1,−1,−1,−

1,–1,–1,0,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1;

–1,77,–1,132,–1,–1,–1,–1,–1,–1,–1,198,–1,–1,–1,–1,–1,–1,–1,–1,82,–1,188,–1,–1,–1,–1,–1,–1,–1,–1,–1,–1,–1,–1,–1,–1,–1,0,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1;

20,–1,–1,–1,–1,–1,–1,–1,–1,–1,–1,–1,–1,–1,213,–1,107,79,–1,–1,–1,58,–1,–1,–1,–1,–1,–1,–1,–1, –1,–1,–1,–1,–1,–1,–1,–1,–1,0,–1,–1,–1,–1,–1,–1,–1,–1,–1,–1,–1,–1,–1,–1,–1,–1,–1,–1,–1,–1,–1,–1,–1,–1,–1,–1,–1,–1,–1;

–1,112,–1,–1,–1,–1,–1,–1,–1,–1,–1,–1,97,72,–1,–1,–1,–1,42,43,–1,–1,–1,–1,–1,–1,–1,–1,–1,–1,–1,–1,–1,–1,–1,–1,–1,–1,–1,–1,0,–1,–1,–1,–1,–1,–1,–1,–1,–1,–1,–1,–1,–1,–1,–1,–1,–1,–1,–1,–1,–1,–1,–1,–1,–1,–1,–1;

24,94,–1,–1,–1,–1,–1,4,22,–1,230,–1,–1,–1,–1,–1,–1,–1,–1,–1,–1,–1,–1,–1,–1,–1,–1,–1,–1,–1,–1,–1, –1,–1,–1,–1,–1,–1,–1,–1,–1,–1,0,–1,–1,–1,–1,–1,–1,–1,–1,–1,–1,–1,–1,–1,–1,–1,–1,–1,–1,–1,–1,–1,–1,–1,–1,–1,–1;

248,–1,–1,260,–1,–1,–1,–1,–1,253,–1,73,–1,–1,–1,–1,–1,–1,–1,–1,–1,–1,178,–1,–1,–1,–1,–1,–1, –1,–1,–1,–1,–1,–1,–1,–1,–1,–1,–1,–1,–1,0,–1,–1,–1,–1,–1,–1,–1,–1,–1,–1,–1,–1,–1,–1,–1,–1,–1,–1,–1,–1,–1,–1,–1,–1,–1,–1,–1;

–1,6,–1,–1,–1,241,–1,–1,–1,–1,–1,–1,–1,–1,–1,–1,183,–1,–1,–1,131,184,–1,–1,–1,–1,–1,–1,–1,–1,–1,–1,–1,–1,–1,–1,–1,–1,–1,–1,–1,–1,–1,0,–1,–1,–1,–1,–1,–1,–1,–1,–1,–1,–1,–1,–1,–1,–1,–1,–1,–1,–1,–1,–1,–1,–1,–1,–1;

109,–1,–1,–1,–1,–1,–1,–1,–1,–1,–1,–1,–1,196,106,–1,–1,–1,127,–1,–1,–1,–1,–1,–1,–1,–1,–1,–1,–1,–1,–1,–1,–1,–1,–1,–1,–1,–1,–1,–1,–1,–1,–1,–1,–1,–1,0,–1,–1,–1,–1,–1,–1,–1,–1,–1,–1,–1,–1,–1,–1,–1,–1,–1,–1,–1,–1,–1,–1,–1,–1;

–1,9,42,–1,–1,–1,–1,–1,–1,–1,35,–1,–1,–1,–1,–1,–1,–1,235,–1,–1,–1,–1,–1,–1,–1,–1,–1,–1,–1,–1, –1,–1,–1,–1,–1,–1,–1,–1,–1,–1,–1,–1,–1,–1,0,–1,–1,–1,–1,–1,–1,–1,–1,–1,–1,–1,–1,–1,–1,–1,–1,–1,–1,–1,–1,–1,–1;

15,–1,–1,188,265,–1,–1,–1,–1,–1,–1,165,–1,–1,–1,–1,–1,–1,–1,–1,–1,–1,122,–1,–1,–1,–1,–1,–1, –1,–1,–1,–1,–1,–1,–1,–1,–1,–1,–1,–1,–1,–1,–1,–1,–1,0,–1,–1,–1,–1,–1,–1,–1,–1,–1,–1,–1,–1,–1,–1,–1,–1,–1,–1,–1,–1,–1,–1;

–1,94,–1,–1,–1,–1,31,66,–1,–1,–1,–1,–1,–1,209,–1,–1,–1,–1,–1,–1,–1,–1,–1,–1,–1,–1,–1,–1,–1,–1, –1,–1,–1,–1,–1,–1,–1,–1,–1,–1,–1,–1,–1,–1,–1,–1,0,–1,–1,–1,–1,–1,–1,–1,–1,–1,–1,–1,–1,–1,–1,–1,–1,–1,–1,–1, –1;

104,–1,88,–1,159,–1,–1,–1,–1,–1,–1,–1,–1,–1,–1,202,–1,–1,–1,–1,–1,–1,–1,–1,–1,–1,–1,–1,–1,–1, –1,–1,–1,–1,–1,–1,–1,–1,–1,–1,–1,–1,–1,–1,–1,–1,–1,–1,0,–1,–1,–1,–1,–1,–1,–1,–1,–1,–1,–1,–1,–1,–1,–1,–1,–1, –1,–1;

–1,277,–1,–1,–1,–1,104,–1,150,–1,–1,–1,–1,–1,–1,–1,–1,–1,–1,–1,–1,–1,–1,–1,–1,–1,–1,–1,–1,–1, –1,–1,–1,–1,–1,–1,–1,–1,–1,–1,–1,–1,–1,–1,–1,–1,–1,–1,–1,–1,0,–1,–1,–1,–1,–1,–1,–1,–1,–1,–1,–1,–1,–1,–1,–1,–1,–1,–1,–1,–1;

136,–1,–1,–1,125,–1,–1,–1,–1,–1,–1,–1,–1,–1,–1,–1,–1,–1,–1,266,–1,173,–1,–1,–1,–1,–1,–1,–1,–1,–1,–1,–1,–1,–1,–1,–1,–1,–1,–1,–1,–1,–1,–1,–1,–1,–1,–1,–1,–1,–1,0,–1,–1,–1,–1,–1,–1,–1,–1,–1,–1,–1,–1,–1,–1,–1,–1,–1;

–1,171,–1,–1,–1,–1,–1,–1,–1,–1,–1,–1,–1,–1,42,–1,–1,–1,97,–1,–1,–1,–1,–1,–1,177,–1,–1,–1,–1,–1,–1,–1,–1,–1,–1,–1,–1,–1,–1,–1,–1,–1,–1,–1,–1,–1,–1,–1,–1,–1,0,–1,–1,–1,–1,–1,–1,–1,–1,–1,–1,–1,–1,–1,–1,–1,–1;

209,–1,–1,–1,–1,–1,–1,–1,–1,–1,182,–1,–1,42,–1,–1,–1,–1,–1,–1,–1,–1,–1,–1,270,–1,–1,–1,–1,–1, –1,–1,–1,–1,–1,–1,–1,–1,–1,–1,–1,–1,–1,–1,–1,–1,–1,–1,–1,–1,–1,0,–1,–1,–1,–1,–1,–1,–1,–1,–1,–1,–1,–1,–1, –1,–1;

–1,173,–1,–1,–1,–1,–1,241,–1,–1,–1,–1,–1,–1,–1,–1,–1,–1,–1,–1,–1,–1,90,–1,–1,133,–1,–1,–1,–1, –1,–1,–1,–1,–1,–1,–1,–1,–1,–1,–1,–1,–1,–1,–1,–1,–1,–1,–1,–1,–1,–1,–1,0,–1,–1,–1,–1,–1,–1,–1,–1,–1,–1,–1,–1,–1, –1,–1;

135,–1,–1,–1,–1,–1,–1,–1,–1,–1,–1,–1,57,–1,191,–1,–1,–1,–1,–1,–1,–1,–1,–1,277,–1,–1,–1,–1,–1, –1,–1,–1,–1,–1,–1,–1,–1,–1,–1,–1,–1,–1,–1,–1,–1,–1,–1,–1,–1,–1,–1,–1,0,–1,–1,–1,–1,–1,–1,–1,–1,–1,–1,–1, –1,–1;

–1,30,161,–1,–1,–1,–1,–1,–1,–1,–1,114,–1,–1,–1,–1,–1,–1,–1,–1,–1,89,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,0,–1,–1,–1,–1,–1,–1,–1,–1,–1,–1,–1,–1;

53,–1,–1,–1,–1,–1,–1,160,–1,–1,–1,–1,–1,–1,–1,56,–1,214,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,0,–1,–1,–1,–1,–1,–1,–1,–1,–1,–1,–1;

–1,206,–1,–1,–1,–1,28,–1,–1,–1,–1,–1,87,–1,–1,–1,–1,–1,–1,–1,–1,–1,48,–1,–1,–1,–1,–1,–1,–1, –1,–1,–1,–1,–1,–1,–1,–1,–1,–1,–1,–1,–1,–1,–1,–1,–1,–1,–1,–1,–1,–1,–1,–1,0,–1,–1,–1,–1,–1,–1,–1,–1,–1, –1;

236,–1,–1,–1,–1,–1,–1,–1,–1,–1,–1,–1,–1,212,201,–1,–1,133,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,0,–1,–1,–1,–1,–1,–1,–1,–1,–1;

–1,197,–1,–1,–1,–1,–1,–1,–1,–1,–1,–1,–1,155,–1,–1,–1,–1,–1,–1,–1,–1,–1,120,–1,–1,–1,–1,–1,–1, –1,–1,–1,–1,–1,–1,–1,–1,–1,–1,–1,–1,–1,–1,–1,–1,–1,–1,–1,–1,–1,–1,–1,–1,–1,–1,–1,0,–1,–1,–1,–1,–1,–1,–1,–1;

246,–1,–1,–1,–1,–1,–1,–1,–1,206,261,–1,280,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,0,–1,–1, 1,–1,–1;

–1,279,–1,264,–1,–1,–1,120,–1,–1,–1,–1,–1,–1,–1,–1,–1,–1,–1,68,–1,–1,–1,–1,–1,–1,–1,–1,–1,–1, –1,–1,–1,–1,–1,–1,–1,–1,–1,–1,–1,–1,–1,–1,–1,–1,–1,–1,–1,–1,–1,–1,–1,–1,–1,–1,0,–1,–1,–1,–1, –1,–1;

146,–1,–1,–1,–1,–1,–1,–1,57,–1,–1,–1,–1,–1,–1,–1,–1,260,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,0,–1,–1,–1,–1,–1;

–1,15,–1,75,–1,–1,–1,–1,–1,144,–1,–1,–1,–1,–1,–1,–1,–1,44,–1,–1,–1,–1,–1,–1,–1,–1,–1,–1,–1,–1, –1,–1,–1,–1,–1,–1,–1,–1,–1,–1,–1,–1,–1,–1,–1,–1,–1,–1,–1,–1,–1,–1,–1,–1,–1,–1,–1,–1,–1,–1,0,–1,–1,–1, –1;

169,–1,–1,–1,261,–1,–1,–1,–1,–1,–1,–1,–1,–1,–1,–1,–1,–1,–1,–1,–1,–1,–1,–1,70,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,0,–1,–1,–1;

–1,59,–1,–1,–1,–1,–1,–1,–1,–1,–1,–1,–1,–1,–1,–1,273,–1,35,–1,–1,–1,–1,–1,–1,165,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,0,–1,–1;

81,–1,–1,–1,–1,–1,–1,131,–1,234,–1,–1,–1,–1,–1,–1,–1,–1,–1,–1,–1,–1,180,–1,–1,–1,–1,–1,–1,–1, –1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1, 0,–1;

–1,202,–1,–1,–1,–1,143,–1,–1,–1,82,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,0.

The coefficient matrix 6 is written as:

0,0,0,0,–1,0,0,–1,–1,0,0,0,0,0,–1,0,0,–1,0,0,0,0,0,0,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1;

131,–1,18,42,0,16,–1,0,0,10,–1,341,9,–1,0,6,59,0,–1,215,–1,69,177,0,0,–1,–1,–1,–1,–1,–1, –1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1, –1;

259,291,345,–1,293,4,277,240,181,12,222,–1,–1,36,102,330,–1,70,54,216,175,–1,–1,–1, 0,0,–1,–1,–1,–1,–1,–1,–

1,–1,–1,–1,–1,–1,–1,–1,–1,–1,–1,–1,–1,–1,–1,–1,–1,–1,–
1,–1,–1,–1,–1,–1,–1,–1,–1,–1,–1,–1,–1,–1,–1,–1,–1,–1;

18,29,–1,10,156,–1,16,36,18,–1,232,158,299,319,227,–
1,1,22,239,–1,71,72,0,–1,–1,0,–1, –1,–1,–1,–1,–1,–1,–1,–
1,–1,–1,–1,–1,–1,–1,–1,–1,–1,–1,–1,–1,–1,–1,–1,–1,–1,–
1,–1,–1,–1,–1,–1,–1,–1,–1,–1,–1, –1,–1,–1,–1,–1;

160,322,–1,–1,–1,–1,–1,–1,–1,–1,–1,–1,–1,–1,–1,–1,–
1,–1,–1,–1,–1,–1,–1,–1,–1,–1,0,–1,–1,–1,–1, –1,–1,–1,–
1,–1,–1,–1,–1,–1,–1,–1,–1,–1,–1,–1,–1,–1,–1,–1,–1,–1,–
1,–1,–1,–1,–1,–1,–1,–1,–1,–1,–1,–1,–1,–1,–1, –1;

154,58,–1,10,–1,–1,–1,–1,–1,–1,–1,–1,317,–1,–1,–1,
193,–1,–1,–1,–1,42,6,–1,–1,–1,–1,0,–1,–1, –1,–1,–1,–1,–
1,–1,–1,–1,–1,–1,–1,–1,–1,–1,–1,–1,–1,–1,–1,–1,–1,–1,–
1,–1,–1,–1,–1,–1,–1,–1,–1,–1,–1,–1,–1,–1, –1,–1,–1,–1;

287,–1,–1,–1,–1,–1,266,–1,–1,–1,214,33,–1,189,–1,–
1,–1,325,73,–1,124,–1,–1,–1,–1,–1,–1,–1, 0,–1,–1,–1,–1,–
1,–1,–1,–1,–1,–1,–1,–1,–1,–1,–1,–1,–1,–1,–1,–1,–1,–1,–
1,–1,–1,–1,–1,–1,–1,–1,–1,–1,–1,–1,–1, –1,–1,–1,–1;

21,146,–1,–1,166,–1,–1,262,35,–1,–1,–1,–1,–1,319,–
1,–1,–1,–1,–1,–1,–1,–1,–1,–1,–1,–1,–1, 0,–1,–1,–1,–
1,–1,–1,–1,–1,–1,–1,–1,–1,–1,–1,–1,–1,–1,–1,–1,–1,–1,–
1,–1,–1,–1,–1,–1,–1,–1,–1,–1,–1,–1,–1,–1,–1,–1,–1,–1;

256,99,–1,105,–1,–1,–1,–1,–1,–1,–1,–1,136,–1,–1,–1,
20,–1,–1,247,–1,16,279,–1,316,–1,–1,–1,–1,–1,0,–1,–1,–
1,–1,–1,–1,–1,–1,–1,–1,–1,–1,–1,–1,–1,–1,–1,–1,–1,–1,–
1,–1,–1,–1,–1,–1,–1,–1,–1,–1,–1,–1,–1,–1,–1,–1,–1,–1;

49,51,–1,–1,–1,–1,–1,–1,–1,–1,177,119,–1,224,–1,–1,–
1,4,128,–1,6,–1,–1,–1,–1,–1,–1,–1,–1,–1,–1,0,–1,–1,–1,–
1,–1,–1,–1,–1,–1,–1,–1,–1,–1,–1,–1,–1,–1,–1,–1,–1,–1,–
1,–1,–1,–1,–1,–1,–1,–1,–1,–1,–1,–1,–1,–1,–1;

–1,282,139,–1,4,–1,–1,45,3,–1,–1,–1,–1,–1,108,–1,–1,–
1,–1,–1,–1,–1,–1,–1,–1,–1,–1,–1,–1,–1,–1,–1,0,–1,–1,–
1,–1,–1,–1,–1,–1,–1,–1,–1,–1,–1,–1,–1,–1,–1,–1,–1,–1,–
1,–1,–1,–1,–1,–1,–1,–1,–1,–1,–1,–1,–1,–1,–1;

311,141,–1,–1,–1,–1,–1,–1,–1,–1,–1,–1,318,–1,–1,–1,
49,–1,–1,–1,–1,332,80,283,–1,–1,–1,–1,–1,–1,–1,–1,–1,
0,–1,–1,–1,–1,–1,–1,–1,–1,–1,–1,–1,–1,–1,–1,–1,–1,–1,–
1,–1,–1,–1,–1,–1,–1,–1,–1,–1,–1,–1,–1,–1,–1,–1,–1,–1;

62,118,–1,–1,–1,–1,–1,–1,–1,–1,6,117,–1,10,–1,–1,–1,–
1,78,–1,–1,–1,–1,–1,–1,–1,–1,–1,–1,–1,–1,–1,–1,–1,0,–
1,–1,–1,–1,–1,–1,–1,–1,–1,–1,–1,–1,–1,–1,–1,–1,–1,–1,–
1,–1,–1,–1,–1,–1,–1,–1,–1,–1,–1,–1,–1,–1,–1;

87,–1,–1,82,–1,–1,–1,6,–1,–1,–1,–1,–1,–1,–1,–1,–1,–
1,–1,–1,115,–1,–1,20,–1,–1,–1,–1,–1,–1,–1, –1,–1,–1,–1,
0,–1,–1,–1,–1,–1,–1,–1,–1,–1,–1,–1,–1,–1,–1,–1,–1,–1,–
1,–1,–1,–1,–1,–1,–1,–1,–1,–1,–1,–1,–1,–1,–1;

1,–1,–1,–1,–1,–1,–1,–1,–1,–1,–1,–1,218,–1,–1,103,22,
30,–1,–1,–1,68,–1,–1,–1,–1,–1,–1,–1,–1,–1,–1,–1,–1,–1,–
1,0,–1,–1,–1,–1,–1,–1,–1,–1,–1,–1,–1,–1,–1,–1,–1,–1,–
1,–1,–1,–1,–1,–1,–1,–1,–1,–1,–1,–1,–1,–1,–1;

16,147,–1,–1,–1,–1,–1,–1,–1,–1,2,–1,–1,268,–1,–1,–1,–
1,211,–1,–1,–1,–1,–1,–1,278,–1,–1,–1,–1,–1,–1,–1,–1,–
1,–1,–1,0,–1,–1,–1,–1,–1,–1,–1,–1,–1,–1,–1,–1,–1,–1,–
1,–1,–1,–1,–1,–1,–1,–1,–1,–1,–1,–1,–1,–1,–1,–1;

–1,10,–1,36,–1,–1,–1,–1,–1,–1,–1,72,–1,–1,–1,–1,–1,–
1,–1,–1,287,–1,79,–1,–1,–1,–1,–1,–1,–1,–1,–1,–1,–1,–1,–
1,–1,–1,0,–1,–1,–1,–1,–1,–1,–1,–1,–1,–1,–1,–1,–1,–1,–
1,–1,–1,–1,–1,–1,–1,–1,–1,–1,–1,–1,–1,–1,–1;

183,–1,–1,–1,–1,–1,–1,–1,–1,–1,–1,–1,–1,–1,208,–1,
149,180,–1,–1,–1,47,–1,–1,–1,–1,–1,–1,–1, –1,–1,–1,–1,–
1,–1,–1,–1,–1,–1,0,–1,–1,–1,–1,–1,–1,–1,–1,–1,–1,–1,–
1,–1,–1,–1,–1,–1,–1,–1,–1,–1,–1,–1,–1,–1,–1,–1,–1,–1;

–1,323,–1,–1,–1,–1,–1,–1,–1,–1,–1,–1,22,1,–1,–1,–1,–
1,188,38,–1,–1,–1,–1,–1,–1,–1,–1,–1,–1,–1,–1,–1,–1,–1,–
1,–1,–1,–1,–1,0,–1,–1,–1,–1,–1,–1,–1,–1,–1,–1,–1,–1,–
1,–1,–1,–1,–1,–1,–1,–1,–1,–1,–1,–1,–1,–1,–1;

1,106,–1,–1,–1,–1,–1, 10,247,–1,42,–1,–1,–1,–1,–1,–
1,–1,–1,–1,–1,–1,–1,–1,–1,–1,–1,–1,–1,–1,–1,–1,–1,–1,–
1,–1,–1,–1,–1,–1,–1,0,–1,–1,–1,–1,–1,–1,–1,–1,–1,–1,–
1,–1,–1,–1,–1,–1,–1,–1,–1,–1,–1,–1,–1,–1,–1,–1;

284,–1,–1,97,–1,–1,–1,–1,–1,58,–1,33,–1,–1,–1,–1,–1,–
1,–1,–1,–1,–1,261,–1,–1,–1,–1,–1,–1,–1, –1,–1,–1,–1,–
1,–1,–1,–1,–1,–1,–1,–1,0,–1,–1,–1,–1,–1,–1,–1,–1,–1,–
1,–1,–1,–1,–1,–1,–1,–1,–1,–1,–1,–1,–1,–1,–1,–1;

–1,343,–1,–1,–1,215,–1,–1,–1,–1,–1,–1,–1,–1,–1,–1,1,–
1,–1,–1,36,140,–1,–1,–1,–1,–1,–1,–1,–1,–1,–1,–1,–1,–
1,–1,–1,–1,–1,–1,–1,–1,–1,–1,–1,–1,–1, 1,–1;

20,–1,–1,–1,–1,–1,–1,–1,–1,–1,–1,–1,155,126,–1,–1,–1,
48,–1,–1,–1,–1,–1,–1,–1,–1,–1,–1,–1,–1,–1,–1,–1,–1,–1,–
1,–1,–1,–1,–1,–1,–1,–1,–1,0,–1,–1,–1,–1,–1,–1,–1,–1,–
1,–1,–1,–1,–1,–1,–1,–1,–1,–1,–1,–1,–1,–1,–1;

–1,316,103,–1,–1,–1,–1,–1,–1,–1,63,–1,–1,–1,–1,–1,–
1,–1,0,–1,–1,–1,–1,–1,–1,–1,–1,–1,–1,–1,–1, –1,–1,–1,–
1,–1,–1,–1,–1,–1,–1,–1,–1,–1,–1,0,–1,–1,–1,–1,–1,–1,–
1,–1,–1,–1,–1,–1,–1,–1,–1,–1,–1,–1,–1,–1,–1, –1;

168,–1,–1,52,128,–1,–1,–1,–1,–1,–1,215,–1,–1,–1,–1,–
1,–1,–1,–1,–1,–1,210,–1,–1,–1,–1,–1,–1, –1,–1,–1,–1,–
1,–1,–1,–1,–1,–1,–1,–1,–1,–1,–1,–1,–1,0,–1,–1,–1,–1,–
1,–1,–1,–1,–1,–1,–1,–1,–1,–1,–1,–1,–1,–1,–1,–1,–1,–1;

–1,212,–1,–1,–1,–1,317,313,–1,–1,–1,–1,–1,–1,4,–1,–
1,–1,–1,–1,–1,–1,–1,–1,–1,–1,–1,–1,–1,–1,–1,–1,–1,–1,–
1,–1,–1,–1,–1,–1,–1,–1,–1,–1,–1,–1,–1,0,–1,–1,–1,–1,–
1,–1,–1,–1,–1,–1,–1,–1,–1,–1,–1,–1,–1,–1,–1,–1;

112,–1,208,–1,277,–1,–1,–1,–1,–1,–1,–1,–1,–1,–1,
290,–1,–1,–1,–1,–1,–1,–1,–1,–1,–1,–1,–1,–1,–1,–1,–1,–
1,–1,–1,–1,–1,–1,–1,–1,–1,–1,–1,–1,–1,–1,–1,–1,0,–1,–
1,–1,–1,–1,–1,–1,–1,–1,–1,–1,–1,–1,–1,–1,–1,–1,–1,–1;

–1,349,–1,–1,–1,–1,26,–1,155,–1,–1,–1,–1,–1,–1,–1,–
1,–1,–1,–1,–1,–1,–1,–1,–1,–1,–1,–1,–1,–1,–1,–1,–1,–1,–
1,–1,–1,–1,–1,–1,–1,–1,–1,–1,–1,–1,–1,–1,–1,0,–1,–1,–
1,–1,–1,–1,–1,–1,–1,–1,–1,–1,–1,–1,–1,–1,–1,–1;

27,–1,–1,–1,73,–1,–1,–1,–1,–1,–1,–1,–1,–1,–1,–1,–1,–
1,–1,272,–1,36,–1,–1,–1,–1,–1,–1,–1,–1,–1, –1,–1,–1,–1,–
1,–1,–1,–1,–1,–1,–1,–1,–1,–1,–1,–1,–1,–1,–1,0,–1,–1,–
1,–1,–1,–1,–1,–1,–1,–1,–1,–1,–1,–1,–1,–1, –1;

–1,128,–1,–1,–1,–1,–1,–1,–1,–1,–1,–1,–1,–1,4,–1,–1,–
1,152,–1,–1,–1,–1,–1,–1,58,–1,–1,–1,–1,–1, –1,–1,–1,–1,–
1,–1,–1,–1,–1,–1,–1,–1,–1,–1,–1,–1,–1,–1,–1,–1,0,–1,–
1,–1,–1,–1,–1,–1,–1,–1,–1,–1,–1,–1,–1,–1, –1;

1,–1,–1,–1,–1,–1,–1,–1,–1,–1,176,–1,–1,28,–1,–1,–1,–
1,–1,–1,–1,–1,–1,–1,220,–1,–1,–1,–1,–1,–1, –1,–1,–1,–
1,–1,–1,–1,–1,–1,–1,–1,–1,–1,–1,–1,–1,–1,–1,–1,–1,–1,
0,–1,–1,–1,–1,–1,–1,–1,–1,–1,–1,–1,–1,–1,–1,–1, –1;

–1,186,–1,–1,–1,–1,–1,40,–1,–1,–1,–1,–1,–1,–1,–1,–
1,–1,–1,–1,–1,–1,118,–1,–1,297,–1,–1,–1,–1, –1,–1,–1,–
1,–1,–1,–1,–1,–1,–1,–1,–1,–1,–1,–1,–1,–1,–1,–1,–1,–1,–
1,–1,0,–1,–1,–1,–1,–1,–1,–1,–1,–1,–1,–1,–1, –1,–1;

322,–1,–1,–1,–1,–1,–1,–1,–1,–1,–1,–1, 139,–1,233,–1,–
1,–1,–1,–1,–1,–1,–1,–1,102,–1,–1,–1,–1,–1,–1,–1,–1,–1,–
1,–1,–1,–1,–1,–1,–1,–1,–1,–1,–1,–1,–1,–1,–1,–1,–1,–1,–
1,–1,0,–1,–1,–1,–1,–1,–1,–1,–1,–1,–1,–1,–1,–1;

–1,2,236,–1,–1,–1,–1,–1,–1,–1,–1,22,–1,–1,–1,–1,–1,–
1,–1,–1,–1,158,–1,–1,–1,–1,–1,–1,–1,–1,–1, –1,–1,–1,–
1,–1,–1,–1,–1,–1,–1,–1,–1,–1,–1,–1,–1,–1,–1,–1,–1,–1,–
1,–1,–1,0,–1,–1,–1,–1,–1,–1,–1,–1,–1,–1,–1, –1;

6,–1,–1,–1,–1,–1,–1,120,–1,–1,–1,–1,–1,–1,–1,293,–1,
96,–1,–1,–1,–1,–1,–1,–1,–1,–1,–1,–1,–1,–1, –1,–1,–1,–
1,–1,–1,–1,–1,–1,–1,–1,–1,–1,–1,–1,–1,–1,–1,–1,–1,–1,–
1,–1,–1,–1,0,–1,–1,–1,–1,–1,–1,–1,–1,–1,–1, –1;

–1,339,–1,–1,–1,–1,266,–1,–1,–1,–1,–1,20,–1,–1,–1,–
1,–1,–1,–1,–1,–1,99,–1,–1,–1,–1,–1,–1,–1,–1,–1,–1,–1,–
1,–1,–1,–1,–1,–1,–1,–1,–1,–1,–1,–1,–1,–1,–1,–1,–1,–1,–
1,–1,–1,–1,–1,0,–1,–1,–1,–1,–1,–1,–1,–1,–1,–1;

268,–1,–1,–1,–1,–1,–1,–1,–1,–1,–1,–1,–1,–1,22,57,–1,–1,46,–1,–1,–1,–1,–1,–1,–1,–1,–1,–1,–1,–1, –1,–1,–1,–1,–1,–1,–1,–1,–1,–1,–1,–1,–1,–1,–1,–1,–1,–1,–1,–1,–1,–1,–1,–1,–1,–1,–1,–1,0,–1,–1,–1,–1,–1,–1,–1,–1, –1;

–1,150,–1,–1,–1,–1,–1,–1,–1,–1,–1,–1,–1,244,–1,–1,–1,–1,–1,–1,–1,–1,–1,162,–1,–1,–1,–1,–1,–1, –1,–1,–1,–1,–1,–1,–1,–1,–1,–1,–1,–1,–1,–1,–1,–1,–1,–1,–1,–1,–1,–1,–1,–1,–1,–1,–1,–1,0,–1,–1,–1,–1,–1,–1,–1,–1;

346,–1,–1,–1,–1,–1,–1,–1,–1,265,327,–1,254,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,0,–1,–1,–1,–1,–1,–1,–1;

–1,6,–1,104,–1,–1,–1,59,–1,–1,–1,–1,–1,–1,–1,–1,–1,–1,–1,64,–1,–1,–1,–1,–1,–1,–1,–1,–1,–1,–1, –1,–1,–1,–1,–1,–1,–1,–1,–1,–1,–1,–1,–1,–1,–1,–1,–1,–1,–1,–1,–1,–1,–1,–1,–1,–1,–1,–1,0,–1,–1,–1,–1,–1,–1;

88,–1,–1,–1,–1,–1,–1,–1,125,–1,–1,–1,–1,–1,–1,–1,–1,164,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,0,–1,–1,–1,–1,–1;

–1,220,–1,2,–1,–1,–1,–1,–1,243,–1,–1,–1,–1,–1,–1,–1,–1,72,–1,–1,–1,–1,–1,–1,–1,–1,–1,–1,–1,–1, –1,–1,–1,–1,–1,–1,–1,–1,–1,–1,–1,–1,–1,–1,–1,–1,–1,–1,–1,–1,–1,–1,–1,–1,–1,–1,–1,–1,0,–1,–1,–1, –1;

123,–1,–1,–1,304,–1,–1,–1,–1,–1,–1,–1,–1,–1,–1,–1,–1,–1,–1,–1,–1,–1,–1,–1,265,–1,–1,–1,–1,–1, –1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,0,–1,–1,–1;

–1,4,–1,–1,–1,–1,–1,–1,–1,–1,–1,–1,–1,–1,–1,–1,30,–1,42,–1,–1,–1,–1,–1,–1,11,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,0,–1,–1;

12,–1,–1,–1,–1,–1,–1,31,–1,289,–1,–1,–1,–1,–1,–1,–1,–1,–1,–1,–1,–1,2,–1,–1,–1,–1,–1,–1,–1,–1, –1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,0,–1;

–1,33,–1,–1,–1,–1,125,–1,–1,–1,112,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,0.

The coefficient matrix 7 is written as:

0,0,0,0,–1,0,0,–1,–1,0,0,0,0,0,–1,0,0,–1,0,0,0,0,0,0,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1;

22,–1,11,124,0,10,–1,0,0,2,–1,16,60,–1,0,6,30,0,–1,168,–1,31,105,0,0,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1;

132,37,21,–1,180,4,149,48,38,122,195,–1,–1,155,28,85,–1,47,179,42,66,–1,–1,–1,0,0,–1, –1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1, –1,–1,–1,–1,–1;

4,6,–1,33,113,–1,49,21,6,–1,151,83,154,87,5,–1,92,173,120,–1,2,142,0,–1,–1,0,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1;

24,204,–1,–1,–1,–1,–1,–1,–1,–1,–1,–1,–1,–1,–1,–1,–1,–1,–1,–1,–1,–1,–1,–1,–1,0,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1;

185,100,–1,24,–1,–1,–1,–1,–1,–1,–1,–1,65,–1,–1,–1,207,–1,–1,–1,–1,161,72,–1,–1,–1,–1,0,–1, –1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1, –1,–1,–1;

6,–1,–1,–1,–1,–1,27,–1,–1,–1,163,50,–1,48,–1,–1,–1,24,38,–1,91,–1,–1,–1,–1,–1,–1,–1,0,–1,–1, –1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1, –1;

145,88,–1,–1,112,–1,–1,153,159,–1,–1,–1,–1,–1,76,–1,–1,–1,–1,–1,–1,–1,–1,–1,–1,–1,–1,–1,–1, 0,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1;

172,2,–1,131,–1,–1,–1,–1,–1,–1,–1,–1,141,–1,–1,–1,96,–1,–1,99,–1, 101,35,–1,116,–1,–1,–1,–1,–1,0,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1;

6,10,–1,–1,–1,–1,–1,–1,–1,–1,145,53,–1,201,–1,–1,–1,4,164,–1,173,–1,–1,–1,–1,–1,–1,–1,–1,–1,–1,0,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1;

–1,126,77,–1,156,–1,–1,16,12,–1,–1,–1,–1,–1,70,–1,–1,–1,–1,–1,–1,–1,–1,–1,–1,–1,–1,–1,–1,–1, –1,–1,0,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1;

184,194,–1,–1,–1,–1,–1,–1,–1,–1,–1,–1,123,–1,–1,–1,16,–1,–1,–1,–1,104,109,124,–1,–1,–1,–1, –1,–1,–1,–1,–1,0,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1;

6,20,–1,–1,–1,–1,–1,–1,–1,–1,203,153,–1,104,–1,–1,–1,–1,207,–1,–1,–1,–1,–1,–1,–1,–1,–1,–1,–1,–1,–1,–1,–1,0,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1;

52,–1,–1,147,–1,–1,–1,1,–1,–1,–1,–1,–1,–1,–1,–1,–1,–1,–1,16,–1,–1,46,–1,–1,–1,–1,–1,–1,–1, –1,–1,–1,–1,0,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1;

1,–1,–1,–1,–1,–1,–1,–1,–1,–1,–1,–1,202,–1,–1,118,130,1,–1,–1,–1,2,–1,–1,–1,–1,–1,–1,–1,–1,–1, –1,–1,–1,–1,–1,0,–1,–1,–1,–1,–1,–1,–1,–1,–1,–1,–1,–1,–1,–1,–1,–1,–1,–1,–1,–1,–1,–1,–1,–1,–1,–1,–1,–1, –1;

173,6,–1,–1,–1,–1,–1,–1,–1,–1,81,–1,–1,182,–1,–1,–1,–1,53,–1,–1,–1,–1,–1,–1,46,–1,–1,–1,–1,–1,–1,–1,–1,–1,–1,–1,0,–1,–1,–1,–1,–1,–1,–1,–1,–1,–1,–1,–1,–1,–1,–1,–1,–1,–1,–1,–1,–1,–1,–1,–1,–1,–1,–1,–1,–1;

–1,88,–1,198,–1,–1,–1,–1,–1,–1,–1,160,–1,–1,–1,–1,–1,–1,–1,–1,122,–1,182,–1,–1,–1,–1,–1,–1, –1,–1,–1,–1,–1,–1,–1,–1,–1,0,–1,–1,–1,–1,–1,–1,–1,–1,–1,–1,–1,–1,–1,–1,–1,–1,–1,–1,–1,–1,–1,–1,–1,–1,–1,–1,–1,–1;

91,–1,–1,–1,–1,–1,–1,–1,–1,–1,–1,–1,–1,–1,184,–1,30,3,–1,–1,–1,155,–1,–1,–1,–1,–1,–1,–1,–1,–1,–1,–1,–1,–1,–1,–1,–1,–1,–1,0,–1,–1,–1,–1,–1,–1,–1,–1,–1,–1,–1,–1,–1,–1,–1,–1,–1,–1,–1,–1,–1,–1,–1,–1,–1,–1;

–1,1,–1,–1,–1,–1,–1,–1,–1,–1,–1,–1,41,167,–1,–1,–1,–1,68,148,–1,–1,–1,–1,–1,–1,–1,–1,–1,–1,–1,–1,–1,–1,–1,–1,–1,–1,–1,–1,–1,0,–1,–1,–1,–1,–1,–1,–1,–1,–1,–1,–1,–1,–1,–1,–1,–1,–1,–1,–1,–1,–1,–1,–1,–1,–1;

12,6,–1,–1,–1,–1,–1,166,184,–1,191,–1,–1,–1,–1,–1,–1,–1,–1,–1,–1,–1,–1,–1,–1,–1,–1,–1,–1,–1, –1,–1,–1,–1,–1,–1,–1,–1,–1,–1,–1,0,–1,–1,–1,–1,–1,–1,–1,–1,–1,–1,–1,–1,–1,–1,–1,–1,–1,–1,–1,–1,–1,–1,–1,–1,–1;

6,–1,–1,12,–1,–1,–1,–1,–1,15,–1,5,–1,–1,–1,–1,–1,–1,–1,–1,–1,–1,30,–1,–1,–1,–1,–1,–1,–1,–1, –1,–1,–1,–1,–1,–1,–1,–1,–1,–1,0,–1,–1,–1,–1,–1,–1,–1,–1,–1,–1,–1,–1,–1,–1,–1,–1,–1,–1,–1,–1,–1,–1,–1;

–1,6,–1,–1,–1,86,–1,–1,–1,–1,–1,–1,–1,–1,–1,–1,96,–1,–1,–1,42,199,–1,–1,–1,–1,–1,–1,–1,–1, –1,–1,–1,–1,–1,–1,–1,–1,–1,–1,–1,–1,0,–1,–1,–1,–1,–1,–1,–1,–1,–1,–1,–1,–1,–1,–1,–1,–1,–1,–1,–1,–1,–1,–1,–1;

44,–1,–1,–1,–1,–1,–1,–1,–1,–1,–1,–1,58,130,–1,–1,–1,131,–1,–1,–1,–1,–1,–1,–1,–1,–1,–1,–1,–1,–1,–1,–1,–1,–1,–1,–1,–1,–1,–1,–1,–1,0,–1,–1,–1,–1,–1,–1,–1,–1,–1,–1,–1,–1,–1,–1,–1,–1,–1,–1,–1,–1,–1,–1,–1;

−1,45,18,−1,−1,−1,−1,−1,−1,−1,132,−1,−1,−1,−1,−1,−1,−1,100,−1,−1,−1,−1,−1,−1,−1,−1,−1,−1,−1,−1,−1,−1,−1,−1,−1,−1,−1,−1,−1,−1,−1,−1,−1,−1,0,−1,−1,−1,−1,−1,−1,−1,−1,−1,−1,−1,−1,−1,−1,−1,−1,−1,−1,−1,−1;

9,−1,−1,125,191,−1,−1,−1,−1,−1,−1,28,−1,−1,−1,−1,−1,−1,−1,−1,−1,−1,6,−1,−1,−1,−1,−1,−1,−1,−1, −1,−1,−1,−1,−1,−1,−1,−1,−1,−1,−1,−1,−1,−1,−1,0,−1,−1,−1,−1,−1,−1,−1,−1,−1,−1,−1,−1,−1,−1,−1,−1,−1,−1,−1,−1;

−1,4,−1,−1,−1,−1,74,16,−1,−1,−1,−1,−1,−1,28,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1,0,−1,−1,−1,−1,−1,−1,−1,−1,−1,−1,−1,−1,−1,−1,−1,−1,−1,−1,−1;

21,−1,142,−1,192,−1,−1,−1,−1,−1,−1,−1,−1,−1,−1,197,−1,−1,−1,−1,−1,−1,−1,−1,−1,−1,−1,−1,−1,−1,−1, −1,−1,−1,−1,−1,−1,−1,−1,−1,−1,−1,−1,−1,−1,−1,−1,−1,−1,0,−1,−1,−1,−1,−1,−1,−1,−1,−1,−1,−1,−1,−1,−1,−1,−1,−1, −1,−1;

−1,98,−1,−1,−1,−1,140,−1,22,−1,−1,−1,−1,−1,−1,−1,−1,−1,−1,−1,−1,−1,−1,−1,−1,−1,−1,−1,−1,−1,−1,−1, −1,−1,−1,−1,−1,−1,−1,−1,−1,−1,−1,−1,−1,−1,−1,−1,−1,−1,0,−1,−1,−1,−1,−1,−1,−1,−1,−1,−1,−1,−1,−1,−1,−1,−1,−1,−1, −1;

4,−1,−1,−1,1,−1,−1,−1,−1,−1,−1,−1,−1,−1,−1,−1,−1,−1,−1,−1,40,−1,93,−1,−1,−1,−1,−1,−1,−1,−1,−1,−1,−1, −1,−1,−1,−1,−1,−1,−1,−1,−1,−1,−1,−1,−1,−1,−1,−1,−1,−1,0,−1,−1,−1,−1,−1,−1,−1,−1,−1,−1,−1,−1,−1,−1,−1,−1,−1;

−1,92,−1,−1,−1,−1,−1,−1,−1,−1,−1,−1,−1,−1,136,−1,−1,−1,106,−1,−1,−1,−1,−1,−1,6,−1,−1,−1,−1,−1,−1, −1,−1,−1,−1,−1,−1,−1,−1,−1,−1,−1,−1,−1,−1,−1,−1,−1,−1,−1,−1,−1,0,−1,−1,−1,−1,−1,−1,−1,−1,−1,−1,−1,−1,−1,−1,−1,−1, −1;

2,−1,−1,−1,−1,−1,−1,−1,−1,−1,88,−1,−1,112,−1,−1,−1,−1,−1,−1,−1,−1,−1,−1,20,−1,−1,−1,−1,−1,−1,−1, −1,−1,−1,−1,−1,−1,−1,−1,−1,−1,−1,−1,−1,−1,−1,−1,−1,−1,−1,−1,−1,−1,0,−1,−1,−1,−1,−1,−1,−1,−1,−1,−1,−1,−1,−1,−1,−1,−1,−1;

−1,4,−1,−1,−1,−1,−1,49,−1,−1,−1,−1,−1,−1,−1,−1,−1,−1,−1,−1,−1,−1,125,−1,−1,194,−1,−1,−1,−1,−1, −1,−1,−1,−1,−1,−1,−1,−1,−1,−1,−1,−1,−1,−1,−1,−1,−1,−1,−1,−1,−1,−1,−1,0,−1,−1,−1,−1,−1,−1,−1,−1,−1,−1,−1,−1,−1,−1, −1;

6,−1,−1,−1,−1,−1,−1,−1,−1,−1,−1,−1,126,−1,63,−1,−1,−1,−1,−1,−1,−1,−1,−1,20,−1,−1,−1,−1,−1,−1,−1, −1,−1,−1,−1,−1,−1,−1,−1,−1,−1,−1,−1,−1,−1,−1,−1,−1,−1,−1,−1,−1,−1,−1,0,−1,−1,−1,−1,−1,−1,−1,−1,−1,−1,−1,−1,−1,−1;

−1,10,30,−1,−1,−1,−1,−1,−1,−1,−1,6,−1,−1,−1,−1,−1,−1,−1,−1,−1,92,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1,0,−1,−1,−1,−1,−1,−1,−1,−1,−1,−1,−1,−1;

4,−1,−1,−1,−1,−1,−1,153,−1,−1,−1,−1,−1,−1,−1,197,−1,155,−1,−1,−1,−1,−1,−1,−1,−1,−1,−1,−1,−1,−1,−1;

−1,4,−1,−1,−1,−1,45,−1,−1,−1,−1,−1,168,−1,−1,−1,−1,−1,−1,−1,−1,−1,185,−1,−1,−1,−1,−1,−1,−1,−1, −1,−1,−1,−1,−1,−1,−1,−1,−1,−1,−1,−1,−1,−1,−1,−1,−1,−1,−1,−1,−1,−1,−1,−1,−1,−1,−1,−1,0,−1,−1,−1,−1,−1,−1,−1,−1,−1, −1;

6,−1,−1,−1,−1,−1,−1,−1,−1,−1,−1,−1,−1,−1,200,177,−1,−1,43,−1,−1,−1,−1,−1,−1,−1,−1,−1,−1,−1,−1,−1, −1,−1,−1,−1,−1,−1,−1,−1,−1,−1,−1,−1,−1,−1,−1,−1,−1,−1,−1,−1,−1,−1,−1,−1,−1,−1,−1,0,−1,−1,−1,−1,−1,−1,−1,−1, −1;

−1,82,−1,−1,−1,−1,−1,−1,−1,−1,−1,−1,−1,2,−1,−1,−1,−1,−1,−1,−1,−1,−1,135,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1,0,−1,−1,−1,−1,−1,−1,−1,−1;

91,−1,−1,−1,−1,−1,−1,−1,−1,64,198,−1,100,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1,0,−1,−1,−1,−1,−1,−1,−1;

−1,4,−1,28,−1,−1,−1,109,−1,−1,−1,−1,−1,−1,−1,−1,−1,−1,−1,188,−1,−1,−1,−1,−1,−1,−1,−1,−1,−1,−1,−1, −1,−1,−1,−1,−1,−1,−1,−1,−1,−1,−1,−1,−1,−1,−1,−1,−1,−1,−1,−1,−1,−1,−1,−1,−1,−1,−1,−1,−1,−1,0,−1,−1,−1,−1,−1, −1;

10,−1,−1,−1,−1,−1,−1,−1,84,−1,−1,−1,−1,−1,−1,−1,−1,−1,12,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1,0,−1,−1,−1,−1,−1;

−1,2,−1,75,−1,−1,−1,−1,−1,142,−1,−1,−1,−1,−1,−1,−1,−1,128,−1,−1,−1,−1,−1,−1,−1,−1,−1,−1,−1,−1, −1,−1,−1,−1,−1,−1,−1,−1,−1,−1,−1,−1,−1,−1,−1,−1,−1,−1,−1,−1,−1,−1,−1,−1,−1,−1,−1,−1,−1,−1,0,−1,−1,−1, −1;

163,−1,−1,−1,10,−1,−1,−1,−1,−1,−1,−1,−1,−1,−1,−1,−1,−1,−1,−1,−1,−1,−1,−1,−1,162,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1,0,−1,−1,−1;

−1,1,−1,−1,−1,−1,−1,−1,−1,−1,−1,−1,−1,−1,−1,−1,−1,163,−1,99,−1,−1,−1,−1,−1,−1,98,−1,−1,−1,−1,−1,−1, −1,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1,0,−1,−1;

4,−1,−1,−1,−1,−1,−1,6,−1,142,−1,−1,−1,−1,−1,−1,−1,−1,−1,−1,−1,−1,3,−1,−1,−1,−1,−1,−1,−1,−1,−1, −1,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1,0,−1;

−1,181,−1,−1,−1,−1,45,−1,−1,−1,153,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1,0.

The coefficient matrix 8 is written as:

106,22,2,232,−1,109,166,−1,−1,29,162,123,102,144,−1,18,73,−1,233,93,54,147,0,0,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1;

66,−1,201,214,137,103,−1,94,190,128,−1,175,74,−1,216,86,29,154,−1,68,−1,97,1,0,0,−1, −1,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1, −1,−1,−1,−1,−1,−1;

138,67,90,−1,68,37,221,80,75,196,169,−1,−1,208,170,165,−1,177,4,124,134,−1,−1,−1,0, 0,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1;

82,44,−1,125,208,−1,157,179,175,−1,91,13,110,140,123,−1,166,152,238,−1,167,39,0,−1, −1,0,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1;

68,37,−1,−1,−1,−1,−1,−1,−1,−1,−1,−1,−1,−1,−1,−1,−1,−1,−1,−1,−1,−1,−1,−1,−1,−1,0,−1,−1,−1,−1,−1, −1,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1;

156,31,−1,50,−1,−1,−1,−1,−1,−1,−1,−1,79,−1,−1,−1,88,−1,−1,−1,−1,29,176,−1,−1,−1,−1,0,−1,−1, −1,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1, −1,−1;

68,−1,−1,−1,−1,−1,17,−1,−1,−1,75,194,−1,195,−1,−1,−1,214,43,−1,112,−1,−1,−1,−1,−1,−1,−1,0, −1,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1, −1,−1,−1;

234,11,−1,−1,136,−1,−1,76,184,−1,−1,−1,−1,−1,195,−1,−1,−1,−1,−1,−1,−1,−1,−1,−1,−1,−1,−1,−1,−1, 0,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1;

0,97,−1,196,−1,−1,−1,−1,−1,−1,−1,−1,187,−1,−1,−1,169,−1,−1,199,−1,118,129,−1,10,−1,−1,−1, −1,−1,0,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1;

74,59,−1,−1,−1,−1,−1,−1,−1,−1,92,169,−1,225,−1,−1,−1,138,46,−1,221,−1,−1,−1,−1,−1,−1,−1,−1,−1, −1,−1,0,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1, −1,−1,−1;

–1,23,158,–1,170,–1,–1,183,125,–1,–1,–1,–1,–1,47,–1,–1,–1,–1,–1,–1,–1,–1,–1,–1,–1,–1,–1,–1, –1,–1,–1,0,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1;

191,83,–1,–1,–1,–1,–1,–1,–1,–1,–1,–1,225,–1,–1,–1, 19,–1,–1,–1,–1,195,29,15,–1,–1,–1,–1,–1,–1,–1,–1,0,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1;

231,204,–1,–1,–1,–1,–1,–1,–1,–1,163,99,–1,231,–1,–1,–1,–1,2,–1,–1,–1,–1,–1,–1,–1,–1,–1,–1,–1,–1,–1,–1, 0,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1;

15,–1,–1,11,–1,–1,–1,4,–1,–1,–1,–1,–1,–1,–1,–1,–1,–1,–1,–1,17,–1,–1,163,–1,–1,–1,–1,–1,–1,–1, –1,–1,–1,–1, 0,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1;

131,–1,–1,–1,–1,–1,–1,–1,–1,–1,–1,–1,20,–1,–1,104, 104,133,–1,–1,–1,199,–1,–1,–1,–1,–1,–1,–1,–1,–1,–1,–1,–1,–1,0,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1;

223,194,–1,–1,–1,–1,–1,–1,–1,–1,136,–1,–1,192,–1,–1,–1,–1,16,–1,–1,–1,–1,–1,–1,49,–1,–1,–1, –1,–1,–1,–1,–1,–1,–1,–1,0,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1;

–1,98,–1,79,–1,–1,–1,–1,–1,–1,–1,235,–1,–1,–1,–1,–1,–1,–1,–1,7,–1,97,–1,–1,–1,–1,–1,–1,–1,–1, –1,–1,–1,–1,–1,–1,–1,0,–1,–1,–1,–1,–1,–1,–1,–1,–1,–1,–1,–1,–1,–1,–1,–1,–1,–1,–1,–1,–1,–1,–1,–1,–1,–1,–1,–1,–1;

224,–1,–1,–1,–1,–1,–1,–1,–1,–1,–1,–1,–1, 177,–1, 229,14,–1,–1,–1,36,–1,–1,–1,–1,–1,–1,–1,–1,–1,–1,–1,–1,–1,–1,–1,–1,0,–1,–1,–1,–1,–1,–1,–1,–1,–1,–1,–1,–1,–1,–1,–1,–1,–1,–1,–1,–1,–1,–1,–1,–1,–1,–1,–1,–1,–1;

–1,230,–1,–1,–1,–1,–1,–1,–1,–1,–1,–1,147,171,–1,–1,–1,–1,48,79,–1,–1,–1,–1,–1,–1,–1,–1,–1,–1,–1,–1,–1,–1,–1,–1,–1,–1,–1,–1,0,–1,–1,–1,–1,–1,–1,–1,–1,–1,–1,–1,–1,–1,–1,–1,–1,–1,–1,–1,–1,–1,–1,–1,–1,–1,–1;

7,178,–1,–1,–1,–1,–1,105,75,–1,230,–1,–1,–1,–1,–1,–1,–1,–1,–1,–1,–1,–1,–1,–1,–1,–1,–1,–1,–1, –1,–1,–1,–1,–1,–1,–1,–1,–1,–1,–1,0,–1,–1,–1,–1,–1,–1,–1,–1,–1,–1,–1,–1,–1,–1,–1,–1,–1,–1,–1,–1,–1,–1,–1,–1,–1;

229,–1,–1,100,–1,–1,–1,–1,–1,229,–1,30,–1,–1,–1,–1,–1,–1,–1,–1,–1,–1,202,–1,–1,–1,–1,–1,–1, –1,–1,–1,–1,–1,–1,–1,–1,–1,–1,–1,–1,–1,0,–1,–1,–1,–1,–1,–1,–1,–1,–1,–1,–1,–1,–1,–1,–1,–1,–1,–1,–1,–1,–1,–1,–1,–1,–1;

–1,145,–1,–1,–1,199,–1,–1,–1,–1,–1,–1,–1,–1,–1,–1, 167,–1,–1,–1,74,164,–1,–1,–1,–1,–1,–1,–1, –1,–1,–1,–1,–1,–1,–1,–1,–1,–1,–1,–1,–1,–1,0,–1,–1,–1,–1,–1,–1,–1,–1,–1,–1,–1,–1,–1,–1,–1,–1,–1,–1,–1,–1,–1,–1,–1,–1;

89,–1,–1,–1,–1,–1,–1,–1,–1,–1,–1,–1,130,203,–1,–1,–1, 199,–1,–1,–1,–1,–1,–1,–1,–1,–1,–1,–1,–1, –1,–1,–1,–1,–1,–1,–1,–1,–1,–1,–1,–1,–1,–1,0,–1,–1,–1,–1,–1,–1,–1,–1,–1,–1,–1,–1,–1,–1,–1,–1,–1,–1,–1,–1, –1,–1;

–1,204,144,–1,–1,–1,–1,–1,–1,–1,78,–1,–1,–1,–1,–1,–1,–1,210,–1,–1,–1,–1,–1,–1,–1,–1,–1,–1,–1, –1,–1,–1,–1,–1,–1,–1,–1,–1,–1,–1,–1,–1,–1,0,–1,–1,–1,–1,–1,–1,–1,–1,–1,–1,–1,–1,–1,–1,–1,–1,–1,–1,–1,–1, –1,–1;

213,–1,–1,202,216,–1,–1,–1,–1,–1,–1,34,–1,–1,–1,–1,–1,–1,–1,–1,–1,–1,129,–1,–1,–1,–1,–1,–1, –1,–1,–1,–1,–1,–1,–1,–1,–1,–1,–1,–1,–1,–1,–1,–1,0,–1,–1,–1,–1,–1,–1,–1,–1,–1,–1,–1,–1,–1,–1,–1,–1,–1,–1,–1,–1,–1;

–1,51,–1,–1,–1,–1,186,152,–1,–1,–1,–1,–1,–1,101,–1,–1,–1,–1,–1,–1,–1,–1,–1,–1,–1,–1,–1,–1,–1, –1,–1,–1,–1,–1,–1,–1,–1,–1,–1,–1,–1,–1,–1,–1,–1,0,–1,–1,–1,–1,–1,–1,–1,–1,–1,–1,–1,–1,–1,–1,–1,–1,–1,–1,–1, –1,–1;

150,–1,7,–1,173,–1,–1,–1,–1,–1,–1,–1,–1,–1,–1,224,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,0,–1,–1,–1,–1,–1,–1,–1,–1,–1,–1,–1,–1,–1,–1,–1,–1,–1,–1,–1,–1,–1,–1,–1,–1,–1,–1,–1;

–1,58,–1,–1,–1,–1,11,–1,194,–1,–1,–1,–1,–1,–1,–1,–1,–1,–1,–1,–1,–1,–1,–1,–1,–1,–1,–1,–1,–1,–1, –1,–1,–1,–1,–1,–1,–1,–1,–1,–1,–1,–1,–1,–1,–1,–1,–1,–1,0,–1,–1,–1,–1,–1,–1,–1,–1,–1,–1,–1,–1,–1,–1,–1,–1,–1, –1;

103,–1,–1,–1,161,–1,–1,–1,–1,–1,–1,–1,–1,–1,–1,–1,–1,–1,–1,188,–1,189,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,0,–1,–1,–1,–1,–1,–1,–1,–1,–1,–1,–1,–1,–1,–1,–1,–1,–1;

–1,180,–1,–1,–1,–1,–1,–1,–1,–1,–1,–1,–1,–1,222,–1,–1,–1,175,–1,–1,–1,–1,–1,–1,144,–1,–1,–1,–1,–1,–1,–1,–1,–1,–1,–1,–1,–1,–1,–1,–1,–1,–1,–1,–1,–1,–1,–1,–1,–1, 0,–1,–1,–1,–1,–1,–1,–1,–1,–1,–1,–1,–1,–1,–1,–1;

171,–1,–1,–1,–1,–1,–1,–1,–1,–1,55,–1,–1,69,–1,–1,–1,–1,–1,–1,–1,–1,–1,–1,23,–1,–1,–1,–1,–1,–1, –1,–1,–1,–1,–1,–1,–1,–1,–1,–1,–1,–1,–1,–1,–1,–1,–1,–1,–1,–1,0,–1,–1,–1,–1,–1,–1,–1,–1,–1,–1,–1,–1,–1,–1, –1;

–1,0,–1,–1,–1,–1,–1,91,–1,–1,–1,–1,–1,–1,–1,–1,–1,–1,–1,–1,–1,–1,142,–1,–1,164,–1,–1,–1,–1,–1, –1,–1,–1,–1,–1,–1,–1,–1,–1,–1,–1,–1,–1,–1,–1,–1,–1,–1,–1,–1,–1,0,–1,–1,–1,–1,–1,–1,–1,–1,–1,–1,–1,–1,–1, –1;

2,–1,–1,–1,–1,–1,–1,–1,–1,–1,–1,–1,63,–1,234,–1,–1,–1,–1,–1,–1,–1,–1,–1,185,–1,–1,–1,–1,–1,–1, –1,–1,–1,–1,–1,–1,–1,–1,–1,–1,–1,–1,–1,–1,–1,–1,–1,–1,–1,–1,–1,–1,0,–1,–1,–1,–1,–1,–1,–1,–1,–1,–1,–1,–1, –1;

–1,202,178,–1,–1,–1,–1,–1,–1,–1,–1,234,–1,–1,–1,–1,–1,–1,–1,–1,–1,2,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,0,–1,–1,–1,–1,–1,–1,–1,–1,–1,–1,–1,–1;

98,–1,–1,–1,–1,–1,–1,94,–1,–1,–1,–1,–1,–1,–1,73,–1, 15,–1,–1,–1,–1,–1,–1,–1,–1,–1,–1,–1,–1,–1, –1,–1,–1,–1,–1,–1,–1,–1,–1,–1,–1,–1,–1,–1,–1,–1,–1,–1,–1,–1,–1,–1,–1,0,–1,–1,–1,–1,–1,–1,–1,–1,–1,–1,–1;

–1,33,–1,–1,–1,–1,14,–1,–1,–1,–1,–1,104,–1,–1,–1,–1,–1,–1,–1,–1,–1,126,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,0,–1,–1,–1,–1,–1,–1,–1,–1,–1,–1;

223,–1,–1,–1,–1,–1,–1,–1,–1,–1,–1,–1,–1,47,170,–1,–1,117,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,0,–1,–1,–1,–1,–1,–1,–1, –1,–1;

–1,164,–1,–1,–1,–1,–1,–1,–1,–1,–1,–1,–1,81,–1,–1,–1,–1,–1,–1,–1,–1,–1,30,–1,–1,–1,–1,–1,–1,–1, –1,–1,–1,–1,–1,–1,–1,–1,–1,–1,–1,–1,–1,–1,–1,–1,–1,–1,–1,–1,–1,–1,–1,–1,0,–1,–1,–1,–1,–1,–1,–1, –1;

206,–1,–1,–1,–1,–1,–1,–1,–1,120,121,–1,29,–1,–1,–1,–1,–1,–1,–1,–1,–1,–1,–1,–1,–1,–1,–1,–1,–1, –1,–1,–1,–1,–1,–1,–1,–1,–1,–1,–1,–1,–1,–1,–1,–1,–1,–1,–1,–1,–1,–1,–1,–1,–1,–1,0,–1,–1,–1,–1,–1, –1,–1;

–1,81,–1,134,–1,–1,–1,13,–1,–1,–1,–1,–1,–1,–1,–1,–1,–1,236,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,0,–1,–1,–1,–1,–1,–1;

180,–1,–1,–1,–1,–1,–1,–1,116,–1,–1,–1,–1,–1,–1,–1,–1, 231,–1,–1,–1,–1,–1,–1,–1,–1,–1,–1,–1,–1, –1,–1,–1,–1,–1,–1,–1,–1,–1,–1,–1,–1,–1,–1,–1,–1,–1,–1,–1,–1,–1,–1,–1,–1,–1,–1,–1,–1,0,–1,–1,–1,–1,–1;

–1,130,–1,161,–1,–1,–1,–1,–1,24,–1,–1,–1,–1,–1,–1,–1,–1,202,–1,–1,–1,–1,–1,–1,–1,–1,–1,–1,–1, –1,–1,–1,–1,–1,–1,–1,–1,–1,–1,–1,–1,–1,–1,–1,–1,–1,–1,–1,–1,–1,–1,–1,–1,–1,–1,–1,–1,–1,0,–1,–1, –1,–1;

33,–1,–1,–1,50,–1,–1,–1,–1,–1,–1,–1,–1,–1,–1,–1,–1,–1,–1,–1,–1,–1,–1,–1,106,–1,–1,–1,–1,–1,–1, –1,–1,–1,–1,–1,–1,–1,–1,–1,–1,–1,–1,–1,–1,–1,–1,–1,–1,–1,–1,–1,–1,–1,–1,–1,–1,–1,0,–1,–1, –1;

−1,150,−1,−1,−1,−1,−1,−1,−1,−1,−1,−1,−1,−1,−1,−1,
238,−1,108,−1,−1,−1,−1,−1,−1,219,−1,−1,−1,−1,−1,−1,−1,−
1,−1,−1,−1,−1,−1,−1,−1,−1,−1,−1,−1,−1,−1,−1,−1,−1,−
1,−1,−1,−1,−1,−1,−1,−1,−1,−1,−1,−1,−1,−1, 0,−1,−1;

171,−1,−1,−1,−1,−1,−1,51,−1,236,−1,−1,−1,−1,−1,−1,−
1,−1,−1,−1,−1,−1,135,−1,−1,−1,−1,−1,−1,−1, −1,−1,−1,−
1,−1,−1,−1,−1,−1,−1,−1,−1,−1,−1,−1,−1,−1,−1,−1,−1,−
1,−1,−1,−1,−1,−1,−1,−1,−1,−1,−1,−1,−1,−1, 0,−1;

−1,164,−1,−1,−1,−1,167,−1,−1,−1,28,−1,−1,−1,−1,−1,−
1,−1,−1,−1,−1,−1,−1,−1,−1,−1,−1,−1,−1,−1,−1,−1,−1,−
1,−1,−1,−1,−1,−1,−1,−1,−1,−1,−1,−1,−1,−1,−1,−1,−1,−
1,−1,−1,−1,−1,−1,−1,−1,−1,−1,−1,−1,−1,−1,−1,0.

All the lifting sizes supported by the coefficient matrix i correspond to the lifting size subset Zseti, where i=1, 2, 3, . . . , 8, and the i-th set Z0seti corresponds to the coefficient matrix i, where i=1, 2, 3, . . . , 8.

In another optional implementation mode, the first coefficient matrix set at least includes one of coefficient matrices of 46 rows and 68 columns described below.

The coefficient matrix 1 is written as:

132,186,219,253,−1,42,235,−1,−1,10,128,51,135,40,−1,
112,246,−1,8,75,43,222,1,0,−1,−1,−1,−1,−1,−1,−1,−1,−1,−
1,−1,−1,−1,−1,−1,−1,−1,−1,−1,−1,−1,−1,−1,−1,−1,−1,−
1,−1,−1,−1,−1,−1,−1,−1,−1,−1,−1,−1,−1,−1,−1,−1,−1;

37,−1,245,63,19,179,−1,188,179,209,−1,184,123,−1,6,3,
101,99,−1,70,−1,168,0,0,0,−1,−1, −1,−1,−1,−1,−1,−1,−1,−
1,−1,−1,−1,−1,−1,−1,−1,−1,−1,−1,−1,−1,−1,−1,−1,−1,−
1,−1,−1,−1,−1,−1,−1,−1,−1,−1,−1, −1,−1,−1,−1,−1;

235,243,80,−1,124,23,81,107,12,88,24,−1,−1,63,203,
225,−1,160,84,103,61,−1,−1,−1,0,0, −1,−1,−1,−1,−1,−1,−
1,−1,−1,−1,−1,−1,−1,−1,−1,−1,−1,−1,−1,−1,−1,−1,−1,−
1,−1,−1,−1,−1,−1,−1,−1,−1,−1,−1,−1, −1,−1,−1,−1,−1,−1;

1,238,−1,181,250,−1,174,148,27,−1,27,109,165,9,189,−
1,248,5,16,−1,87,167,1,−1,−1,0,−1,−1,−1,−1,−1,−1,−1,−1,−
1,−1,−1,−1,−1,−1,−1,−1,−1,−1,−1,−1,−1,−1,−1,−1,−1,−
1,−1,−1,−1,−1,−1,−1,−1,−1,−1,−1,−1,−1,−1,−1,−1;

69,222,−1,−1,−1,−1,−1,−1,−1,−1,−1,−1,−1,−1,−1,−1,−
1,−1,−1,−1,−1,−1,−1,−1,−1,−1,0,−1,−1,−1,−1,−1,−1,−1,−
1,−1,−1,−1,−1,−1,−1,−1,−1,−1,−1,−1,−1,−1,−1,−1,−1,−
1,−1,−1,−1,−1,−1,−1,−1,−1,−1,−1,−1,−1,−1,−1,−1;

201,167,−1,59,−1,−1,−1,−1,−1,−1,−1,−1,118,−1,−1,−1,
88,−1,−1,−1,−1,101,182,−1,−1,−1,−1,0,−1, −1,−1,−1,−1,−
1,−1,−1,−1,−1,−1,−1,−1,−1,−1,−1,−1,−1,−1,−1,−1,−1,−
1,−1,−1,−1,−1,−1,−1,−1,−1,−1,−1,−1,−1,−1, −1,−1,−1;

232,−1,−1,−1,−1,−1,145,−1,−1,−1,148,37,−1,199,−1,−
1,−1,17,31,−1,252,−1,−1,−1,−1,−1,−1,−1, 0,−1,−1,−1,−1,−
1,−1,−1,−1,−1,−1,−1,−1,−1,−1,−1,−1,−1,−1,−1,−1,−1,−
1,−1,−1,−1,−1,−1,−1,−1,−1,−1,−1,−1,−1,−1,−1,−1,−1;

217,148,−1,−1,4,−1,−1,0,98,−1,−1,−1,−1,−1,254,−1,−1,−
1,−1,−1,−1,−1,−1,−1,−1,−1,−1,−1,−1,0,−1, −1,−1,−1,−1,−
1,−1,−1,−1,−1,−1,−1,−1,−1,−1,−1,−1,−1,−1,−1,−1,−1,−
1,−1,−1,−1,−1,−1,−1,−1,−1,−1,−1,−1,−1,−1,−1;

209,97,−1,55,−1,−1,−1,−1,−1,−1,−1,−1, 129,−1,−1,−1,
223,−1,−1, 182,−1,239,77,−1,225,−1,−1,−1,−1,−1,0,−1,−
1,−1,−1,−1,−1,−1,−1,−1,−1,−1,−1,−1,−1,−1,−1,−1,−1,−
1,−1,−1,−1,−1,−1,−1,−1,−1,−1,−1,−1,−1,−1,−1,−1,−1,−1;

67,40,−1,−1,−1,−1,−1,−1,−1,−1,66,79,−1,156,−1,−1,−1,
73,112,−1,136,−1,−1,−1,−1,−1,−1,−1,−1, −1,−1,0,−1,−1,−
1,−1,−1,−1,−1,−1,−1,−1,−1,−1,−1,−1,−1,−1,−1,−1,−1,−
1,−1,−1,−1,−1,−1,−1,−1,−1,−1,−1,−1,−1,−1,−1,−1;

−1,109,3,−1,184,−1,−1,177,254,−1,−1,−1,−1,−1,118,−
1,−1,−1,−1,−1,−1,−1,−1,−1,−1,−1,−1,−1,−1, −1,−1,−1,0,−
1,−1,−1,−1,−1,−1,−1,−1,−1,−1,−1,−1,−1,−1,−1,−1,−1,−
1,−1,−1,−1,−1,−1,−1,−1,−1,−1,−1,−1,−1,−1,−1,−1,−1,−1;

175,92,−1,−1,−1,−1,−1,−1,−1,−1,−1,−1,113,−1,−1,−1,
229,−1,−1,−1,−1,217,68,165,−1,−1,−1,−1,−1,−1,−1,−1,−1,
0,−1,−1,−1,−1,−1,−1,−1,−1,−1,−1,−1,−1,−1,−1,−1,−1,−
1,−1,−1,−1,−1,−1,−1,−1,−1,−1,−1,−1,−1,−1,−1,−1,−1;

36,254,−1,−1,−1,−1,−1,−1,−1,−1,220,150,−1,105,−1,−
1,−1,−1,214,−1,−1,−1,−1,−1,−1,−1,−1,−1,−1,−1,−1,−1,−1,−
1,0,−1,−1,−1,−1,−1,−1,−1,−1,−1,−1,−1,−1,−1,−1,−1,−
1,−1,−1,−1,−1,−1,−1,−1,−1,−1,−1,−1,−1,−1,−1,−1,−1;

108,−1,−1,178,−1,−1,−1,208,−1,−1,−1,−1,−1,−1,−1,−1,−
1,−1,−1,−1,24,−1,−1,17,−1,−1,−1,−1,−1,−1,−1,−1,−1,−1,−
1,0,−1,−1,−1,−1,−1,−1,−1,−1,−1,−1,−1,−1,−1,−1,−1,−
1,−1,−1,−1,−1,−1,−1,−1,−1,−1,−1,−1,−1,−1,−1,−1;

69,−1,−1,−1,−1,−1,−1,−1,−1,−1,−1,−1,228,−1,−1,238,39,
25,−1,−1,−1,78,−1,−1,−1,−1,−1,−1,−1,−1, −1,−1,−1,−1,−
1,−1,0,−1,−1,−1,−1,−1,−1,−1,−1,−1,−1,−1,−1,−1,−1,−
1,−1,−1,−1,−1,−1,−1,−1,−1,−1,−1,−1,−1,−1,−1,−1;

229,133,−1,−1,−1,−1,−1,−1,−1,−1,67,−1,−1,176,−1,−1,−
1,−1,68,−1,−1,−1,−1,−1,−1,70,−1,−1,−1,−1,−1,−1,−1,−
1,−1,−1,0,−1,−1,−1,−1,−1,−1,−1,−1,−1,−1,−1,−1,−1,−
1,−1,−1,−1,−1,−1,−1,−1,−1,−1,−1,−1,−1,−1,−1,−1;

−1,229,−1,156,−1,−1,−1,−1,−1,−1,−1,83,−1,−1,−1,−1,−
1,−1,−1,−1,7,−1,126,−1,−1,−1,−1,−1,−1,−1, −1,−1,−1,−1,−
1,−1,−1,−1,0,−1,−1,−1,−1,−1,−1,−1,−1,−1,−1,−1,−1,−
1,−1,−1,−1,−1,−1,−1,−1,−1,−1,−1,−1,−1,−1,−1,−1;

133,−1,−1,−1,−1,−1,−1,−1,−1,−1,−1,−1,−1,−1,41,−1,169,
29,−1,−1,−1,132,−1,−1,−1,−1,−1,−1,−1,−1,−1,−1,−1,−1,−
1,−1,−1,−1,−1,0,−1,−1,−1,−1,−1,−1,−1,−1,−1,−1,−1,−
1,−1,−1,−1,−1,−1,−1,−1,−1,−1,−1, 1,−1,−1;

−1,148,−1,−1,−1,−1,−1,−1,−1,−1,−1,−1,113,112,−1,−1,−
1,−1,162,79,−1,−1,−1,−1,−1,−1,−1,−1,−1, −1,−1,−1,−1,−1,−
1,−1,−1,−1,−1,−1,0,−1,−1,−1,−1,−1,−1,−1,−1,−1,−1,−
1,−1,−1,−1,−1,−1,−1,−1,−1,−1,−1,−1,−1,−1,−1,−1;

123,97,−1,−1,−1,−1,−1,224,160,−1,249,−1,−1,−1,−1,−
1,−1,−1,−1,−1,−1,−1,−1,−1,−1,−1,−1,−1,−1, −1,−1,−1,−1,−
1,−1,−1,−1,−1,−1,−1,−1,0,−1,−1,−1,−1,−1,−1,−1,−1,−
1,−1,−1,−1,−1,−1,−1,−1,−1,−1,−1,−1,−1,−1,−1,−1,−1;

184,−1,−1,128,−1,−1,−1,−1,−1,87,−1,177,−1,−1,−1,−1,−
1,−1,−1,−1,−1,−1,52,−1,−1,−1,−1,−1,−1,−1,−1,−1,−1,−1,−
1,−1,−1,−1,−1,−1,−1,−1,0,−1,−1,−1,−1,−1,−1,−1,−1,−
1,−1,−1,−1,−1,−1,−1,−1,−1,−1,−1,−1,−1,−1,−1,−1;

−1,157,−1,−1,−1,76,−1,−1,−1,−1,−1,−1,−1,−1,−1,−1,
178,−1,−1,−1,179,244,−1,−1,−1,−1,−1,−1,−1, −1,−1,−1,−
1,−1,−1,−1,−1,−1,−1,−1,−1,−1,−1,0,−1,−1,−1,−1,−1,−1,−
1,−1,−1,−1,−1,−1,−1,−1,−1,−1,−1,−1,−1,−1,−1,−1,−1,−1;

169,−1,−1,−1,−1,−1,−1,−1,−1,−1,−1,−1,10,32,−1,−1,−1,
240,−1,−1,−1,−1,−1,−1,−1,−1,−1,−1,−1,−1,−1,−1,−1,−1,−
1,−1,−1,−1,−1,−1,−1,−1,−1,−1,0,−1,−1,−1,−1,−1,−1,−1,−
1,−1,−1,−1,−1,−1,−1,−1,−1,−1,−1,−1,−1,−1,−1,−1;

−1,190,177,−1,−1,−1,−1,−1,−1,−1,237,−1,−1,−1,−1,−1,−
1,−1,162,−1,−1,−1,−1,−1,−1,−1,−1,−1,−1,−1,−1,−1,−1,−1,−
1,−1,−1,−1,−1,−1,−1,−1,−1,−1,−1,0,−1,−1,−1,−1,−1,−1,−
1,−1,−1,−1,−1,−1,−1,−1,−1,−1,−1,−1,−1,−1,−1,−1;

63,−1,−1,3,65,−1,−1,−1,−1,−1,−1,245,−1,−1,−1,−1,−1,−
1,−1,−1,−1,−1,214,−1,−1,−1,−1,−1,−1,−1,−1,−1,−1,−1,−1,−
1,−1,−1,−1,−1,−1,−1,−1,−1,−1,−1,0,−1,−1,−1,−1,−1,−1,−
1,−1,−1,−1,−1,−1,−1,−1,−1,−1,−1,−1,−1,−1,−1;

−1,29,−1,−1,−1,−1,0,0,−1,−1,−1,−1,−1,−1,16,−1,−1,−1,−
1,−1,−1,−1,−1,−1,−1,−1,−1,−1,−1,−1,−1,−1, −1,−1,−1,−1,−
1,−1,−1,−1,−1,−1,−1,−1,−1,−1,−1,0,−1,−1,−1,−1,−1,−1,−
1,−1,−1,−1,−1,−1,−1,−1,−1,−1,−1,−1,−1,−1;

3,−1,0,−1,25,−1,−1,−1,−1,−1,−1,−1,−1,−1,−1,0,−1,−1,−
1,−1,−1,−1,−1,−1,−1,−1,−1,−1,−1,−1,−1,−1,−1,−1,−1,−1,−
1,−1,−1,−1,−1,−1,−1,−1,−1,−1,−1,−1,0,−1,−1,−1,−1,−1,−
1,−1,−1,−1,−1,−1,−1,−1,−1,−1,−1,−1,−1,−1;

−1,0,−1,−1,−1,−1,12,−1,0,−1,−1,−1,−1,−1,−1,−1,−1,−1,−
1,−1,−1,−1,−1,−1,−1,−1,−1,−1,−1,−1,−1,−1,−1,−1,−1,−1,−
1,−1,−1,−1,−1,−1,−1,−1,−1,−1,−1,−1,−1,0,−1,−1,−1,−1,−
1,−1,−1,−1,−1,−1,−1,−1,−1,−1,−1,−1,−1,−1;

11,-1,-1,-1,0,-1,-1,-1,-1,-1,-1,-1,-1,-1,-1,-1,-1,-1,-1,-1,0,-1,0,-1,-1,-1,-1,-1,-1,-1,-1,-1,-1,-1,-1,-1,-1,-1,-1,-1,-1,-1,-1,-1,-1,-1,-1,-1,-1,-1,-1-1,-1,-1,0,-1,-1,-1,-1,-1,-1,-1,-1,-1,-1,-1,-1,-1,-1,-1;

-1,4,-1,-1,-1,-1,-1,-1,-1,-1,-1,-1,-1,-1,15,-1,-1,-1,0,-1,-1,-1,-1,-1,-1,0,-1,-1,-1,-1,-1,-1,-1,-1,-1,-1,-1,-1,-1,-1,-1,-1,-1,-1,-1,-1,-1,-1,-1,-1,-1,0,-1,-1,-1,-1,-1,-1,-1,-1,-1,-1,-1,-1,-1,-1,-1,-1;

0,-1,-1,-1,-1,-1,-1,-1,-1,-1,0,-1,-1,0,-1,-1,-1,-1,-1,-1,-1,-1,-1,-1,6,-1,-1,-1,-1,-1,-1,-1,-1,-1, -1,-1,-1,-1,-1,-1,-1,-1,-1,-1,-1,-1,-1,-1,-1,-1,-1,-1,-1,-1,0,-1,-1,-1,-1,-1,-1,-1,-1,-1,-1,-1,-1,-1,-1,-1,-1;

-1,0,-1,-1,-1,-1,-1,10,-1,-1,-1,-1,-1,-1,-1,-1,-1,-1,-1,-1,-1,-1,-1,0,-1,-1,0,-1,-1,-1,-1,-1,-1,-1,-1,-1,-1,-1,-1,-1,-1,-1,-1,-1,-1,-1,-1,-1,-1,-1,-1,-1,-1,-1,-1,0,-1,-1,-1,-1,-1,-1,-1,-1,-1,-1,-1,-1,-1,-1,-1;

0,-1,-1,-1,-1,-1,-1,-1,-1,-1,-1,-1,0,-1,19,-1,-1,-1,-1,-1,-1,-1,-1,-1,23,-1,-1,-1,-1,-1,-1,-1,-1, -1,-1,-1,-1,-1,-1,-1,-1,-1,-1,-1,-1,-1,-1,-1,-1,-1,-1,-1,-1,-1,-1,-1,-1,0,-1,-1,-1,-1,-1,-1,-1,-1,-1,-1,-1,-1,-1,-1;

-1,0,0,-1,-1,-1,-1,-1,-1,-1,-1,0,-1,-1,-1,-1,-1,-1,-1,-1,-1,0,-1,-1,-1,-1,-1,-1,-1,-1,-1,-1,-1,-1, -1,-1,-1,-1,-1,-1,-1,-1,-1,-1,-1,-1,-1,-1,-1,-1,-1,-1,-1,-1,-1,-1,-1,-1,0,-1,-1,-1,-1,-1,-1,-1,-1,-1,-1,-1,-1,-1;

24,-1,-1,-1,-1,-1,-1,21,-1,-1,-1,-1,-1,-1,-1,0,-1,2,-1,-1,-1,-1,-1,-1,-1,-1,-1,-1,-1,-1,-1,-1,-1,-1, -1,-1,-1,-1,-1,-1,-1,-1,-1,-1,-1,-1,-1,-1,-1,-1,-1,-1,-1,-1,-1,-1,-1,-1,-1,-1,0,-1,-1,-1,-1,-1,-1,-1,-1,-1,-1,-1,-1,-1;

-1,14,-1,-1,-1,-1,28,-1,-1,-1,-1,-1,0,-1,-1,-1,-1,-1,-1,-1,-1,-1,27,-1,-1,-1,-1,-1,-1,-1,-1,-1,-1,-1,-1,-1,-1,-1,-1,-1,-1,-1,-1,-1,-1,-1,-1,-1,-1,-1,-1,-1,-1,-1,-1,-1,-1,-1,0,-1,-1,-1,-1,-1,-1,-1,-1,-1,-1;

0,-1,-1,-1,-1,-1,-1,-1,-1,-1,-1,-1,-1,-1,17,0,-1,-1,0,-1,-1,-1,-1,-1,-1,-1,-1,-1,-1,-1,-1,-1,-1,-1,-1,-1,-1,-1,-1,-1,-1,-1,-1,-1,-1,-1,-1,-1,-1,-1,-1,-1,-1,-1,-1,-1,-1,-1,0,-1,-1,-1,-1,-1,-1,-1,-1,-1;

-1,0,-1,-1,-1,-1,-1,-1,-1,-1,-1,-1,-1,0,-1,-1,-1,-1,-1,-1,-1,-1,-1,0,-1,-1,-1,-1,-1,-1,-1,-1,-1,-1, -1,-1,-1,-1,-1,-1,-1,-1,-1,-1,-1,-1,-1,-1,-1,-1,-1,-1,-1,-1,-1,-1,-1,-1,-1,0,-1,-1,-1,-1,-1,-1,-1,-1;

18,-1,-1,-1,-1,-1,-1,-1,-1,1,0,-1,26,-1,-1,-1,-1,-1,-1,-1,-1,-1,-1,-1,-1,-1,-1,-1,-1,-1,-1,-1,-1,-1, -1,-1,-1,-1,-1,-1,-1,-1,-1,-1,-1,-1,-1,-1,-1,-1,-1,-1,-1,-1,-1,-1,-1,-1,-1,-1,-1,-1,0,-1,-1,-1,-1,-1,-1,-1;

-1,31,-1,0,-1,-1,-1,0,-1,-1,-1,-1,-1,-1,-1,-1,-1,-1,-1,0,-1,-1,-1,-1,-1,-1,-1,-1,-1,-1,-1,-1,-1,-1,-1,-1,-1,-1,-1,-1,-1,-1,-1,-1,-1,-1,-1,-1,-1,-1,-1,-1,-1,-1,-1,-1,-1,-1,-1,-1,-1,0,-1,-1,-1,-1,-1,-1;

0,-1,-1,-1,-1,-1,-1,-1,0,-1,-1,-1,-1,-1,-1,-1,-1,0,-1,-1,-1,-1,-1,-1,-1,-1,-1,-1,-1,-1,-1,-1,-1,-1, -1,-1,-1,-1,-1,-1,-1,-1,-1,-1,-1,-1,-1,-1,-1,-1,-1,-1,-1,-1,-1,-1,-1,-1,-1,-1,-1,-1,-1,0,-1,-1,-1,-1,-1;

-1,0,-1,0,-1,-1,-1,-1,-1,0,-1,-1,-1,-1,-1,-1,-1,-1,-1,9,-1,-1,-1,-1,-1,-1,-1,-1,-1,-1,-1,-1,-1,-1,-1, -1,-1,-1,-1,-1,-1,-1,-1,-1,-1,-1,-1,-1,-1,-1,-1,-1,-1,-1,-1,-1,-1,-1,-1,-1,-1,-1,-1,-1,0,-1,-1,-1,-1;

0,-1,-1,-1,0,-1,-1,-1,-1,-1,-1,-1,-1,-1,-1,-1,-1,-1,-1,-1,-1,-1,-1,-1,0,-1,-1,-1,-1,-1,-1,-1,-1, -1,-1,-1,-1,-1,-1,-1,-1,-1,-1,-1,-1,-1,-1,-1,-1,-1,-1,-1,-1,-1,-1,-1,-1,-1,-1,-1,-1,-1,-1,-1,0,-1,-1,-1;

-1,0,-1,-1,-1,-1,-1,-1,-1,-1,-1,-1,-1,-1,-1,-1,0,-1,0,-1,-1,-1,-1,-1,-1,30,-1,-1,-1,-1,-1,-1,-1,-1,-1,-1,-1,-1,-1,-1,-1,-1,-1,-1,-1,-1,-1,-1,-1,-1,-1,-1,-1,-1,-1,-1,-1,-1,-1,-1,-1,-1,-1,-1,-1,0,-1,-1;

0,-1,-1,-1,-1,-1,-1,8,-1,0,-1,-1,-1,-1,-1,-1,-1,-1,-1,-1,-1,-1,7,-1,-1,-1,-1,-1,-1,-1,-1,-1,-1,-1, -1,-1,-1,-1,-1,-1,-1,-1,-1,-1,-1,-1,-1,-1,-1,-1,-1,-1,-1,-1,-1,-1,-1,-1,-1,-1,-1,-1,-1,-1,-1,-1,0,-1;

-1,13,-1,-1,-1,-1,0,-1,-1,-1,0,-1,-1,-1,-1,-1,-1,-1,-1,-1,-1,-1,-1,-1,-1,-1,-1,-1,-1,-1,-1,-1,-1,-1,-1,-1,-1,-1,-1,-1,-1,-1,-1,-1,-1,-1,-1,-1,-1,-1,-1,-1,-1,-1,-1,-1,-1,-1,-1,-1,-1,-1,-1,-1,0.

The coefficient matrix 2 is written as:

169,118,114,114,-1,190,127,-1,-1,53,89,180,169,132,-1,165,36,-1,28,30,105,103,1,0,-1,-1,-1,-1,-1,-1,-1,-1,-1,-1,-1,-1,-1,-1,-1,-1,-1,-1,-1,-1,-1,-1,-1,-1,-1,-1,-1,-1,-1,-1,-1,-1,-1,-1,-1,-1,-1,-1,-1,-1,-1,-1;

125,-1,159,191,60,143,-1,82,121,69,-1,106,33,-1,94,127,49,176,-1,48,-1,106,0,0,0,-1, -1,-1,-1,-1,-1,-1,-1,-1,-1,-1,-1,-1,-1,-1,-1,-1,-1,-1,-1,-1,-1,-1,-1,-1,-1,-1,-1,-1,-1,-1,-1,-1,-1, -1,-1,-1,-1,-1,-1;

124,87,71,-1,31,2,64,88,5,95,48,-1,-1,109,160,137,-1,159,116,44,185,-1,-1,-1,0,0,-1,-1,-1,-1,-1,-1,-1,-1,-1,-1,-1,-1,-1,-1,-1,-1,-1,-1,-1,-1,-1,-1,-1,-1,-1,-1,-1,-1,-1,-1,-1,-1,-1,-1,-1,-1,-1,-1,-1,-1;

87,145,-1,107,80,-1,30,20,38,-1,163,169,116,90,15,-1,142,6,57,-1,33,131,1,-1,-1,0,-1, -1,-1,-1,-1,-1,-1,-1,-1,-1,-1,-1,-1,-1,-1,-1,-1,-1,-1,-1,-1,-1,-1,-1,-1,-1,-1,-1,-1,-1,-1,-1,-1,-1, -1,-1,-1,-1,-1;

48,49,-1,-1,-1,-1,-1,-1,-1,-1,-1,-1,-1,-1,-1,-1,-1,-1,-1,-1,-1,-1,-1,-1,-1,0,-1,-1,-1,-1,-1, -1,-1,-1,-1,-1,-1,-1,-1,-1,-1,-1,-1,-1,-1,-1,-1,-1,-1,-1,-1,-1,-1,-1,-1,-1,-1,-1,-1,-1,-1,-1,-1,-1;

58,99,-1,87,-1,-1,-1,-1,-1,-1,-1,-1,21,-1,-1,-1,190,-1,-1,-1,-1,152,71,-1,-1,-1,-1,0,-1,-1, -1,-1,-1,-1,-1,-1,-1,-1,-1,-1,-1,-1,-1,-1,-1,-1,-1,-1,-1,-1,-1,-1,-1,-1,-1,-1,-1,-1,-1,-1,-1,-1, -1,-1;

6,-1,-1,-1,-1,-1,57,-1,-1,-1,90,9,-1,166,-1,-1,-1,131,22,-1,191,-1,-1,-1,-1,-1,-1,-1,0,-1,-1,-1,-1,-1,-1,-1,-1,-1,-1,-1,-1,-1,-1,-1,-1,-1,-1,-1,-1,-1,-1,-1,-1,-1,-1,-1,-1,-1,-1,-1,-1,-1,-1,-1,-1,-1;

126,145,-1,-1,159,-1,-1,46, 1,0,-1,-1,-1,-1,-1,-1,-1,-1,-1,-1,-1,-1,-1,-1,-1,-1,-1,-1,-1,-1,-1,-1,-1,-1,-1,-1,-1,-1,-1,-1,-1,-1,-1,-1,-1,-1,-1;

85,117,-1,32,-1,-1,-1,-1,-1,-1,-1,-1,75,-1,-1,-1,24,-1,-1,139,-1,64,80,-1,144,-1,-1,-1,-1, -1,0,-1,-1,-1,-1,-1,-1,-1,-1,-1,-1,-1,-1,-1,-1,-1,-1,-1,-1,-1,-1,-1,-1,-1,-1,-1,-1,-1,-1,-1,-1,-1,-1,-1,-1;

57,149,-1,-1,-1,-1,-1,-1,-1,-1,28,44,-1,63,-1,-1,-1,54,46,-1,106,-1,-1,-1,-1,-1,-1,-1,-1,-1,-1,0,-1,-1,-1,-1,-1,-1,-1,-1,-1,-1,-1,-1,-1,-1,-1,-1,-1,-1,-1,-1,-1,-1,-1,-1,-1,-1,-1,-1,-1,-1,-1,-1,-1;

-1,168,153,-1,132,-1,-1,191,148,-1,-1,-1,-1,-1,100,-1,-1,-1,-1,-1,-1,-1,-1,-1,-1,-1,-1, -1,-1,-1,-1,0,-1,-1,-1,-1,-1,-1,-1,-1,-1,-1,-1,-1,-1,-1,-1,-1,-1,-1,-1,-1,-1,-1,-1,-1,-1,-1,-1,-1,-1,-1,-1;

125,153,-1,-1,-1,-1,-1,-1,-1,-1,-1,-1,37,-1,-1,-1,164,-1,-1,-1,-1,22,25,177,-1,-1,-1,-1,-1, -1,-1,-1,-1,0,-1,-1,-1,-1,-1,-1,-1,-1,-1,-1,-1,-1,-1,-1,-1,-1,-1,-1,-1,-1,-1,-1,-1,-1,-1,-1,-1,-1,-1, -1,-1,-1;

30,86,-1,-1,-1,-1,-1,-1,-1,-1,28,138,-1,5,-1,-1,-1,-1,160,-1,-1,-1,-1,-1,-1,-1,-1,-1,-1,-1,-1,-1,-1,0,-1,-1,-1,-1,-1,-1,-1,-1,-1,-1,-1,-1,-1,-1,-1,-1,-1,-1,-1,-1,-1,-1,-1,-1,-1,-1,-1,-1,-1,-1,-1,-1;

177,-1,-1,129,-1,-1,-1,21,-1,-1,-1,-1,-1,-1,-1,-1,-1,-1,-1,-1,23,-1,-1,19,-1,-1,-1,-1,-1,-1, -1,-1,-1,-1,-1,0,-1,-1,-1,-1,-1,-1,-1,-1,-1,-1,-1,-1,-1,-1,-1,-1,-1,-1,-1,-1,-1,-1,-1,-1,-1,-1,-1,-1,-1,-1;

62,-1,-1,-1,-1,-1,-1,-1,-1,-1,-1,-1,12,-1,-1,149,123,40,-1,-1,-1,84,-1,-1,-1,-1,-1,-1,-1,-1, -1,-1,-1,-1,-1,-1,0,-1,-1,-1,-1,-1,-1,-1,-1,-1,-1,-1,-1,-1,-1,-1,-1,-1,-1,-1,-1,-1,-1,-1,-1,-1,-1,-1,-1,-1;

136,32,−1,−1,−1,−1,−1,−1,−1,−1,36,−1,−1,91,−1,−1,−1,−1,57,−1,−1,−1,−1,−1,−1,122,−1,−1,−1,−1, −1,−1,−1,−1,−1,−1,−1,0,−1,−1,−1,−1,−1,−1,−1,−1,−1,−1,−1,−1,−1,−1,−1,−1,−1,−1,−1,−1,−1,−1,−1,−1,−1,−1,−1,−1,−1;

−1,15,−1,68,−1,−1,−1,−1,−1,−1,−1,76,−1,−1,−1,−1,−1,−1,−1,−1,147,−1,62,−1,−1,−1,−1,−1,−1,−1,−1,−1,−1,−1,−1,−1,−1,−1,0,−1,−1,−1,−1,−1,−1,−1,−1,−1,−1,−1,−1,−1,−1,−1,−1,−1,−1,−1,−1,−1,−1,−1,−1, 1,−1;

169,−1,−1,−1,−1,−1,−1,−1,−1,−1,−1,−1,−1,−1,−1,71,−1,120, 132,−1,−1,−1,116,−1,−1,−1,−1,−1,−1,−1,−1, −1,−1,−1,−1,−1,−1,−1,−1,−1,−1,0,−1,−1,−1,−1,−1,−1,−1,−1,−1,−1,−1,−1,−1,−1,−1,−1,−1,−1,−1,−1,−1,−1,−1,−1,−1,−1,−1;

−1,12,−1,−1,−1,−1,−1,−1,−1,−1,−1,−1,178,91,−1,−1,−1,−1,72,33,−1,−1,−1,−1,−1,−1,−1,−1,−1,−1,−1,−1,−1,−1,−1,−1,−1,−1,−1,−1,0,−1,−1,−1,−1,−1,−1,−1,−1,−1,−1,−1,−1,−1,−1,−1,−1,−1,−1,−1,−1,−1,−1,−1,−1,−1;

160,73,−1,−1,−1,−1,−1,78,106,−1,70,−1,−1,−1,−1,−1,−1,−1,−1,−1,−1,−1,−1,−1,−1,−1,−1,−1,−1,−1,−1, −1,−1,−1,−1,−1,−1,−1,−1,−1,−1,−1,0,−1,−1,−1,−1,−1,−1,−1,−1,−1,−1,−1,−1,−1,−1,−1,−1,−1,−1,−1,−1,−1,−1,−1,−1,−1;

155,−1,−1,13,−1,−1,−1,−1,−1,25,−1,4,−1,−1,−1,−1,−1,−1,−1,−1,−1,−1,179,−1,−1,−1,−1,−1,−1,−1,−1,−1,−1,−1,−1,−1,−1,−1,−1,−1,−1,−1,0,−1,−1,−1,−1,−1,−1,−1,−1,−1,−1,−1,−1,−1,−1,−1,−1,−1,−1,−1,−1,−1,−1,−1,−1;

−1,79,−1,−1,−1,37,−1,−1,−1,−1,−1,−1,−1,−1,−1,−1,118,−1,−1,−1,51,153,−1,−1,−1,−1,−1,−1,−1,−1, −1,−1,−1,−1,−1,−1,−1,−1,−1,−1,−1,−1,0,−1,−1,−1,−1,−1,−1,−1,−1,−1,−1,−1,−1,−1,−1,−1,−1,−1,−1,−1,−1,−1,−1,−1,−1;

137,−1,−1,−1,−1,−1,−1,−1,−1,−1,−1,−1,81,43,−1,−1,−1, 35,−1,−1,−1,−1,−1,−1,−1,−1,−1,−1,−1,−1,−1, −1,−1,−1,−1,−1,−1,−1,−1,−1,−1,−1,−1,0,−1,−1,−1,−1,−1,−1,−1,−1,−1,−1,−1,−1,−1,−1,−1,−1,−1,−1,−1,−1,−1,−1, −1;

−1,38,149,−1,−1,−1,−1,−1,−1,−1,135,−1,−1,−1,−1,−1,−1,−1,20,−1,−1,−1,−1,−1,−1,−1,−1,−1,−1,−1,−1,−1,−1,−1,−1,−1,−1,−1,−1,−1,−1,−1,−1,−1,−1,0,−1,−1,−1,−1,−1,−1,−1,−1,−1,−1,−1,−1,−1,−1,−1,−1,−1,−1,−1,−1,−1;

83,−1,−1,39,51,−1,−1,−1,−1,−1,−1,178,−1,−1,−1,−1,−1,−1,−1,−1,−1,−1,134,−1,−1,−1,−1,−1,−1,−1, −1,−1,−1,−1,−1,−1,−1,−1,−1,−1,−1,−1,−1,−1,0,−1,−1,−1,−1,−1,−1,−1,−1,−1,−1,−1,−1,−1,−1,−1,−1,−1,−1,−1,−1,−1;

−1,22,−1,−1,−1,−1,17,0,−1,−1,−1,−1,−1,−1,11,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1,0,−1,−1,−1,−1,−1,−1,−1,−1,−1,−1,−1,−1,−1,−1,−1,−1,−1,−1,−1;

0,−1,0,−1,0,−1,−1,−1,−1,−1,−1,−1,−1,−1,−1,6,−1,−1,−1,−1,−1,−1,−1,−1,−1,−1,−1,−1,−1,−1,−1,−1,−1, −1,−1,−1,−1,−1,−1,−1,−1,−1,−1,−1,−1,−1,−1,0,−1,−1,−1,−1,−1,−1,−1,−1,−1,−1,−1,−1,−1,−1,−1,−1,−1,−1;

−1,9,−1,−1,−1,−1,0,−1,0,−1,−1,−1,−1,−1,−1,−1,−1,−1,−1,−1,−1,−1,−1,−1,−1,−1,−1,−1,−1,−1,−1,−1,−1,−1, −1,−1,−1,−1,−1,−1,−1,−1,−1,−1,−1,−1,−1,−1,−1,0,−1,−1,−1,−1,−1,−1,−1,−1,−1,−1,−1,−1,−1,−1,−1,−1,−1,−1;

12,−1,−1,−1,0,−1,−1,−1,−1,−1,−1,−1,−1,−1,−1,−1,−1,−1,−1,0,−1,0,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1,0,−1,−1,−1,−1,−1,−1,−1,−1,−1,−1,−1,−1,−1,−1,−1,−1,−1;

−1,0,−1,−1,−1,−1,−1,−1,−1,−1,−1,−1,−1,−1,16,−1,−1,−1, 0,−1,−1,−1,−1,−1,−1,2,−1,−1,−1,−1,−1,−1,−1,−1,−1,−1,−1,−1,−1,−1,−1,−1,−1,−1,−1,−1,−1,−1,−1,−1,−1,−1,0,−1,−1,−1,−1,−1,−1,−1,−1,−1,−1,−1,−1,−1,−1,−1,−1,−1;

0,−1,−1,−1,−1,−1,−1,−1,−1,−1,199,−1,−1,0,−1,−1,−1,−1,−1,−1,−1,−1,−1,−1,0,−1,−1,−1,−1,−1,−1,−1, −1,−1,−1,−1,−1,−1,−1,−1,−1,−1,−1,−1,−1,−1,−1,−1,−1,−1,−1,−1,0,−1,−1,−1,−1,−1,−1,−1,−1,−1,−1,−1,−1,−1,−1,−1,−1,−1;

−1,0,−1,−1,−1,−1,−1,0,−1,−1,−1,−1,−1,−1,−1,−1,−1,−1,−1,−1,−1,−1,22,−1,−1,0,−1,−1,−1,−1,−1,−1,−1,−1,−1,−1,−1,−1,−1,−1,−1,−1,−1,−1,−1,−1,−1,−1,−1,−1,−1,−1,−1,0,−1,−1,−1,−1,−1,−1,−1,−1,−1,−1,−1,−1,−1,−1,−1,−1,−1;

202,−1,−1,−1,−1,−1,−1,−1,−1,−1,−1,−1,23,−1,0,−1,−1,−1,−1,−1,−1,−1,−1,−1,192,−1,−1,−1,−1,−1,−1, −1,−1,−1,−1,−1,−1,−1,−1,−1,−1,−1,−1,−1,−1,−1,−1,−1,−1,−1,−1,−1,−1,0,−1,−1,−1,−1,−1,−1,−1,−1,−1,−1,−1,−1, −1;

−1,0,0,−1,−1,−1,−1,−1,−1,−1,−1,12,−1,−1,−1,−1,−1,−1,−1,−1,−1,1,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1,0,−1,−1,−1,−1,−1,−1,−1,−1,−1,−1,−1,−1;

20,−1,−1,−1,−1,−1,−1,0,−1,−1,−1,−1,−1,−1,−1,4,−1,0,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1,0,−1,−1,−1,−1,−1,−1,−1,−1,−1,−1,−1;

−1,3,−1,−1,−1,−1,192,−1,−1,−1,−1,−1,13,−1,−1,−1,−1,−1,−1,−1,−1,−1,192,−1,−1,−1,−1,−1,−1,−1,−1, −1,−1,−1,−1,−1,−1,−1,−1,−1,−1,−1,−1,−1,−1,−1,−1,−1,−1,−1,−1,−1,−1,−1,−1,−1,0,−1,−1,−1,−1,−1,−1,−1,−1,−1, −1;

0,−1,−1,−1,−1,−1,−1,−1,−1,−1,−1,−1,−1,−1,13,0,−1,−1, 0,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1,0,−1,−1,−1,−1,−1,−1,−1,−1,−1;

−1,8,−1,−1,−1,−1,−1,−1,−1,−1,−1,−1,−1,0,−1,−1,−1,−1,−1,−1,−1,−1,−1,0,−1,−1,−1,−1,−1,−1,−1,−1,−1, −1,−1,−1,−1,−1,−1,−1,−1,−1,−1,−1,−1,−1,−1,−1,−1,−1,−1,−1,−1,−1,−1,−1,−1,0,−1,−1,−1,−1,−1,−1,−1,−1;

206,−1,−1,−1,−1,−1,−1,−1,−1,5,0,−1,0,−1,−1,−1,−1,−1,−1,−1,−1,−1,−1,−1,−1,−1,−1,−1,−1,−1,−1,−1, −1,−1,−1,−1,−1,−1,−1,−1,−1,−1,−1,−1,−1,−1,−1,−1,−1,−1,−1,−1,−1,−1,−1,−1,−1,−1,0,−1,−1,−1,−1,−1,−1,−1;

−1,212,−1,0,−1,−1,−1,0,−1,−1,−1,−1,−1,−1,−1,−1,−1,−1,−1,0,−1,−1,−1,−1,−1,−1,−1,−1,−1,−1,−1,−1,

192,−1,−1,−1,−1,−1,−1,−1,0,−1,−1,−1,−1,−1,−1,−1,−1, 0,−1,−1,−1,−1,−1,−1,−1,−1,−1,−1,−1,−1,−1,−1, −1,−1,−1,−1,−1,−1,−1,−1,−1,−1,−1,−1,−1,−1,−1,−1,−1,−1,−1,−1,−1,−1,−1,−1,−1,−1,0,−1,−1,−1,−1,−1;

−1,0,−1,0,−1,−1,−1,−1,−1,207,−1,−1,−1,−1,−1,−1,−1,−1, 21,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1,0,−1,−1,−1,−1;

0,−1,−1,−1,15,−1,−1,−1,−1,−1,−1,−1,−1,−1,−1,−1,−1,−1,−1,−1,−1,−1,−1,−1,18,−1,−1,−1,−1,−1,−1,−1, −1,−1,−1,−1,−1,−1,−1,−1,−1,−1,−1,−1,−1,−1,−1,−1,−1,−1,−1,−1,−1,−1,−1,−1,−1,−1,−1,−1,0,−1,−1,−1;

−1,213,−1,−1,−1,−1,−1,−1,−1,−1,−1,−1,−1,−1,−1,−1, 19,−1,0,−1,−1,−1,−1,−1,−1,0,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1,0,−1,−1;

0,−1,−1,−1,−1,−1,−1,0,−1,0,−1,−1,−1,−1,−1,−1,−1,−1,−1,−1,−1,−1,16,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1,0,−1;

−1,11,−1,−1,−1,−1,0,−1,−1,−1,0,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1,0.

The coefficient matrix 3 is written as:

98,24,28,92,−1,124,148,−1,−1,72,41,88,142,118,−1,67, 45,−1,43,129,39,6,1,0,−1,−1,−1,−1, −1,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1, −1,−1,−1,−1;

39,−1,51,94,147,73,−1,133,69,83,−1,67,135,−1,133,121, 10,40,−1,65,−1,123,0,0,0,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1;

75,130,144,−1,122,90,55,139,40,10,143,−1,−1,109,5, 97,−1,2,82,50,34,−1,−1,−1,0,0,−1,−1, −1,−1,−1,−1,−1,−1,−

1,−1,−1,−1,−1,−1,−1,−1,−1,−1,−1,−1,−1,−1,−1,−1,−1,−1,−1,−1,−1,−1,−1,−1,−1,−1,−1,−1,−1, −1,−1,−1,−1;

131,22,−1,4,133,−1,4,80,114,−1,138,77,157,102,84,−1,93,4,26,−1,92,120,1,−1,−1,0,−1,−1, −1,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1, −1,−1,−1,−1;

142,69,−1,−1,−1,−1,−1,−1,−1,−1,−1,−1,−1,−1,−1,−1,−1,−1,−1,−1,−1,−1,−1,−1,−1,−1,0,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1;

136,137,−1,92,−1,−1,−1,−1,−1,−1,−1,−1,110,−1,−1,−1,37,−1,−1,−1,−1,137,70,−1,−1,−1,−1,0,−1, −1,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1, −1,−1,−1;

121,−1,−1,−1,−1,−1,121,−1,−1,−1,16,16,−1,30,−1,−1,−1,38,97,−1,64,−1,−1,−1,−1,−1,−1,−1,0,−1, −1,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1, −1,−1;

33,56,−1,−1,9,−1,−1,159,144,−1,−1,−1,−1,−1,21,−1,−1,−1,−1,−1,−1,−1,−1,−1,−1,−1,−1,−1,−1,0,−1, −1,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1, −1;

3,157,−1,89,−1,−1,−1,−1,−1,−1,−1,−1,127,−1,−1,−1,85,−1,−1,110,−1,125,129,−1,126,−1,−1,−1, −1,−1,0,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1;

38,50,−1,−1,−1,−1,−1,−1,−1,−1,150,142,−1,23,−1,−1,−1,153,79,−1,56,−1,−1,−1,−1,−1,−1,−1,−1, −1,−1,0,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1;

−1,87,127,−1,144,−1,−1,68,50,−1,−1,−1,−1,−1,31,−1,−1,−1,−1,−1,−1,−1,−1,−1,−1,−1,−1,−1,−1,−1, −1,−1,0,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1;

40,130,−1,−1,−1,−1,−1,−1,−1,−1,−1,−1,147,−1,−1,−1,40,−1,−1,−1,−1,39,105,158,−1,−1,−1,−1,−1, −1,−1,−1,−1,0,−1,−1,−1,−1,−1,−1,−1,−1,−1,−1,−1,−1,−1,−1,−1,−1,−1,−1,−1,−1,−1,−1,−1,−1,−1,−1,−1,−1,−1, −1,−1,−1;

134,33,−1,−1,−1,−1,−1,−1,−1,−1,100,81,−1,141,−1,−1,−1,−1,91,−1,−1,−1,−1,−1,−1,−1,−1,−1,−1,−1,−1,−1,−1,−1,0,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1;

144,−1,−1,71,−1,−1,−1,135,−1,−1,−1,−1,−1,−1,−1,−1,−1,−1,−1,−1,139,−1,−1,78,−1,−1,−1,−1,−1,−1,−1,−1,−1,−1,−1,0,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1;

34,−1,−1,−1,−1,−1,−1,−1,−1,−1,−1,−1,136,−1,−1,110,1,156,−1,−1,−1,151,−1,−1,−1,−1,−1,−1,−1,−−1,−1,−1,−1,−1,−1,−1,0,−1,−1,−1,−1,−1,−1,−1,−1,−1,−1,−1,−1,−1,−1,−1,−1,−1,−1,−1,−1,−1,−1,−1,−1,−1,−1,−1,−1;

131,6,−1,−1,−1,−1,−1,−1,−1,−1,52,−1,−1,141,−1,−1,−1,−1,119,−1,−1,−1,−1,−1,−1,31,−1,−1,−1,−1, −1,−1,−1,−1,−1,−1,−1,0,−1,−1,−1,−1,−1,−1,−1,−1,−1,−1,−1,−1,−1,−1,−1,−1,−1,−1,−1,−1,−1,−1,−1,−1,−1,−1,−1,−1;

−1,69,−1,56,−1,−1,−1,−1,−1,−1,−1,90,−1,−1,−1,−1,−1,−1,−1,−1,10,−1,18,−1,−1,−1,−1,−1,−1,−1,−1, −1,−1,−1,−1,−1,−1,−1,0,−1,−1,−1,−1,−1,−1,−1,−1,−1,−1,−1,−1,−1,−1,−1,−1,−1,−1,−1,−1,−1,−1,−1,−1,−1,−1,−1,−1;

78,−1,−1,−1,−1,−1,−1,−1,−1,−1,−1,−1,−1,−1,20,−1, 116,101,−1,−1,−1,1,−1,−1,−1,−1,−1,−1,−1,−1,−1,−1,−1,−1,−1,−1,−1,−1,−1,−1,0,−1,−1,−1,−1,−1,−1,−1,−1,−1,−1,−1,−1,−1,−1,−1,−1,−1,−1,−1,−1,−1,−1,−1,−1,−1,−1,−1;

−1,7,−1,−1,−1,−1,−1,−1,−1,−1,−1,−1,12,21,−1,−1,−1,−1,53,23,−1,−1,−1,−1,−1,−1,−1,−1,−1,−1,−1,−1,−1,−1,−1,−1,−1,−1,−1,−1,0,−1,−1,−1,−1,−1,−1,−1,−1,−1,−1,−1,−1,−1,−1,−1,−1,−1,−1,−1,−1,−1,−1,−1,−1,−1,−1;

19,100,−1,−1,−1,−1,−1,96,154,−1,116,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1,0,−1,−1,−1,−1,−1,−1,−1,−1,−1,−1,−1,−1,−1,−1,−1,−1,−1,−1,−1,−1,−1,−1,−1,−1,−1,−1;

157,−1,−1,17,−1,−1,−1,−1,−1,55,−1,138,−1,−1,−1,−1,−1,−1,−1,−1,−1,−1,31,−1,−1,−1,−1,−1,−1,−1, −1,−1,−1,−1,−1,−1,−1,−1,−1,−1,−1,−1,0,−1,−1,−1,−1,−1,−1,−1,−1,−1,−1,−1,−1,−1,−1,−1,−1,−1,−1,−1,−1,−1,−1,−1,−1,−1;

−1,139,−1,−1,−1,113,−1,−1,−1,−1,−1,−1,−1,−1,−1,−1,75,−1,−1,−1,56,116,−1,−1,−1,−1,−1,−1,−1,−1,−1,−1,−1,−1,−1,−1,−1,−1,−1,−1,−1,−1,−1,−1,−1,0,−1,−1,−1,−1,−1,−1,−1,−1,−1,−1,−1,−1,−1,−1,−1,−1,−1,−1,−1,−1,−1,−1,−1,−1,−1;

48,−1,−1,−1,−1,−1,−1,−1,−1,−1,−1,−1,44,71,−1,−1,−1,12,−1,−1,−1,−1,−1,−1,−1,−1,−1,−1,−1,−1,−1, −1,−1,−1,−1,−1,−1,−1,−1,−1,−1,−1,−1,−1,0,−1,−1,−1,−1,−1,−1,−1,−1,−1,−1,−1,−1,−1,−1,−1,−1,−1,−1,−1,−1,−1,−1,−1;

−1,120,15,−1,−1,−1,−1,−1,−1,−1,13,−1,−1,−1,−1,−1,−1,−1,38,−1,−1,−1,−1,−1,−1,−1,−1,−1,−1,−1,−1, −1,−1,−1,−1,−1,−1,−1,−1,−1,−1,−1,−1,−1,0,−1,−1,−1,−1,−1,−1,−1,−1,−1,−1,−1,−1,−1,−1,−1,−1,−1,−1,−1,−1,−1;

104,−1,−1,49,65,−1,−1,−1,−1,−1,−1,74,−1,−1,−1,−1,−1,−1,−1,−1,−1,−1,114,−1,−1,−1,−1,−1,−1,−1, −1,−1,−1,−1,−1,−1,−1,−1,−1,−1,−1,−1,−1,−1,−1,−1,0,−1,−1,−1,−1,−1,−1,−1,−1,−1,−1,−1,−1,−1,−1,−1,−1,−1,−1,−1,−1,−1;

−1,39,−1,−1,−1,−1,0,0,−1,−1,−1,−1,−1,−1,107,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1,0,−1,−1,−1,−1,−1,−1,−1,−1,−1,−1,−1,−1,−1,−1,−1,−1,−1,−1,−1,−1;

10,−1,0,−1,0,−1,−1,−1,−1,−1,−1,−1,−1,−1,−1,36,−1,−1,−1,−1,−1,−1,−1,−1,−1,−1,−1,−1,−1,−1,−1,−1, −1,−1,−1,−1,−1,−1,−1,−1,−1,−1,−1,−1,−1,−1,−1,−1,0,−1,−1,−1,−1,−1,−1,−1,−1,−1,−1,−1,−1,−1,−1,−1,−1,−1,−1;

−1,31,−1,−1,−1,−1,160,−1,0,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1,0,−1,−1,−1,−1,−1,−1,−1,−1,−1,−1,−1,−1,−1,−1,−1,−1,−1,−1;

80,−1,−1,−1,0,−1,−1,−1,−1,−1,−1,−1,−1,−1,−1,−1,−1,−1,−1,0,−1,0,−1,−1,−1,−1,−1,−1,−1,−1,−1,−1,−1,−1,−1,−1,−1,−1,−1,−1,−1,−1,−1,−1,−1,−1,−1,−1,−1,−1,0,−1,−1,−1,−1,−1,−1,−1,−1,−1,−1,−1,−1,−1,−1,−1,−1;

−1,113,−1,−1,−1,−1,−1,−1,−1,−1,−1,−1,−1,−1,0,−1,−1,−1,0,−1,−1,−1,−1,−1,−1,0,−1,−1,−1,−1,−1,−1, −1,−1,−1,−1,−1,−1,−1,−1,−1,−1,−1,−1,−1,−1,−1,−1,−1,−1,−1,0,−1,−1,−1,−1,−1,−1,−1,−1,−1,−1,−1,−1,−1,−1,−1;

0,−1,−1,−1,−1,−1,−1,−1,−1,−1,0,−1,−1,0,−1,−1,−1,−1,−1,−1,−1,−1,−1,−1,0,−1,−1,−1,−1,−1,−1,−1,−1, −1,−1,−1,−1,−1,−1,−1,−1,−1,−1,−1,−1,−1,−1,−1,−1,−1,−1,0,−1,−1,−1,−1,−1,−1,−1,−1,−1,−1,−1,−1,−1,−1;

−1,0,−1,−1,−1,−1,−1,97,−1,−1,−1,−1,−1,−1,−1,−1,−1,−1,−1,−1,−1,−1,20,−1,−1,0,−1,−1,−1,−1,−1,−1, −1,−1,−1,−1,−1,−1,−1,−1,−1,−1,−1,−1,−1,−1,−1,−1,−1,−1,−1,−1,−1,0,−1,−1,−1,−1,−1,−1,−1,−1,−1,−1,−1,−1,−1,−1;

0,−1,−1,−1,−1,−1,−1,−1,−1,−1,−1,0,−1,0,−1,−1,−1,−1,−1,−1,−1,−1,−1,15,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1,0,−1,−1,−1,−1,−1,−1,−1,−1,−1,−1,−1,−1,−1;

−1,178,0,−1,−1,−1,−1,−1,−1,−1,−1,160,−1,−1,−1,−1,−1,−1,−1,−1,−1,188,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1,0,−1,−1,−1,−1,−1,−1,−1,−1,−1,−1,−1,−1;

16,−1,−1,−1,−1,−1,−1,266,−1,−1,−1,−1,−1,−1,−1,240,−1,0,−1,−1,−1,−1,−1,−1,−1,−1,−1,−1,−1,−1,−1, −1,−1,−1,−1,−1,−1,−1,−1,−1,−1,−1,−1,−1,−1,−1,−1,−1,−1,−1,−1,−1,−1,−1,−1,0,−1,−1,−1,−1,−1,−1,−1,−1,−1,−1, −1;

−1,0,−1,−1,−1,−1,160,−1,−1,−1,−1,−1,183,−1,−1,−1,−1,−1,−1,−1,−1,−1,0,−1,−1,−1,−1,−1,−1,−1,−1,−1,−1,−1,−1,−

1,–1,–1,–1,–1,–1,–1,–1,–1,–1,–1,–1,–1,–1,–1,–1,–1,–1,–1,–1,–1,0,–1,–1,–1,–1,–1,–1,–1, 1;

0,–1,–1,–1,–1,–1,–1,–1,–1,–1,–1,–1,–1,–1,19,0,–1,–1,0,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,0,–1,–1,–1,–1,–1,–1,–1,–1,–1;

–1,38,–1,–1,–1,–1,–1,–1,–1,–1,–1,–1,–1,80,–1,–1,–1,–1,–1,–1,–1,–1,–1,0,–1,–1,–1,–1,–1,–1,–1,–1, –1,–1,–1,–1,–1,–1,–1,–1,–1,–1,–1,–1,–1,–1,–1,–1,–1,–1,–1,–1,–1,–1,–1,–1,–1,–1,0,–1,–1,–1,–1,–1,–1,–1,–1;

197,–1,–1,–1,–1,–1,–1,–1,–1,0,0,–1,0,–1,–1,–1,–1,–1,–1,–1,–1,–1,–1,–1,–1,–1,–1,–1,–1,–1,–1,–1, –1,–1,–1,–1,–1,–1,–1,–1,–1,–1,–1,–1,–1,–1,–1,–1,–1,–1,–1,–1,–1,–1,–1,–1,–1,0,–1,–1,–1,–1,–1,–1,–1;

–1,25,–1,0,–1,–1,–1,0,–1,–1,–1,–1,–1,–1,–1,–1,–1,–1,–1,24,–1,–1,–1,–1,–1,–1,–1,–1,–1,–1,–1,–1, –1,–1,–1,–1,–1,–1,–1,–1,–1,–1,–1,–1,–1,–1,–1,–1,–1,–1,–1,–1,–1,–1,–1,–1,–1,–1,0,–1,–1,–1,–1,–1,–1;

21,–1,–1,–1,–1,–1,–1,–1,0,–1,–1,–1,–1,–1,–1,–1,–1,0,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,0,–1,–1,–1,–1,–1;

–1,29,–1,0,–1,–1,–1,–1,–1,0,–1,–1,–1,–1,–1,–1,–1,–1,0,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,0,–1,–1,–1,–1;

0,–1,–1,–1,35,–1,–1,–1,–1,–1,–1,–1,–1,–1,–1,–1,–1,–1,–1,–1,–1,–1,–1,–1,–1,32,–1,–1,–1,–1,–1,–1,–1, –1,–1,–1,–1,–1,–1,–1,–1,–1,–1,–1,–1,–1,–1,–1,–1,–1,–1,–1,–1,–1,–1,–1,–1,–1,–1,–1,–1,0,–1,–1,–1;

–1,30,–1,–1,–1,–1,–1,–1,–1,–1,–1,–1,–1,–1,–1,–1,0,–1,0,–1,–1,–1,–1,–1,–1,13,–1,–1,–1,–1,–1,–1, –1,–1,–1,–1,–1,–1,–1,–1,–1,–1,–1,–1,–1,–1,–1,–1,–1,–1,–1,–1,–1,–1,–1,–1,–1,–1,–1,–1,–1,–1,0,–1,–1;

0,–1,–1,–1,–1,–1,–1,80,–1,0,–1,–1,–1,–1,–1,–1,–1,–1,–1,–1,–1,–1,0,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,0,–1;

–1,182,–1,–1,–1,–1,0,–1,–1,–1,0,–1,–1,–1,–1,–1,–1,–1,–1,–1,–1,–1,–1,–1,–1,–1,–1,–1,–1,–1,–1,–1,–1, –1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,0.

The coefficient matrix 4 is written as:

67,49,179,180,–1,44,209,–1,–1,5,10,143,123,130,–1,84,29,–1,49,168,217,104,1,0,–1,–1, –1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1, –1,–1,–1,–1,–1,–1;

101,–1,105,195,79,124,–1,76,108,165,–1,5,88,–1,215,190,8,98,–1,54,–1,37,0,0,0,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1;

174,66,163,–1,194,111,107,152,153,163,210,–1,–1,27,121,131,–1,41,190,199,146,–1,–1, –1,0,0,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1;

36,63,–1,31,38,–1,15,51,148,–1,181,107,112,180,203,–1,42,191,103,–1,168,215,1,–1,–1, 0,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1, –1,–1,–1,–1,–1,–1,–1;

86,209,–1,–1,–1,–1,–1,–1,–1,–1,–1,–1,–1,–1,–1,–1,–1,–1,–1,–1,–1,–1,–1,–1,–1,–1,0,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1;

126,210,–1,112,–1,–1,–1,–1,–1,–1,–1,–1,136,–1,–1,–1,64,–1,–1,–1,–1,84,184,–1,–1,–1,–1,0,–1, –1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1, –1,–1,–1;

140,–1,–1,–1,–1,–1,214,–1,–1,–1,113,80,–1,16,–1,–1,–1,191,0,–1,67,–1,–1,–1,–1,–1,–1,–1,0,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1;

214,171,–1,–1,162,–1,–1,25,0,–1,–1,–1,–1,–1,222,–1,–1,–1,–1,–1,–1,–1,–1,–1,–1,–1,–1,–1,–1,0, –1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1, –1,–1;

145,52,–1,31,–1,–1,–1,–1,–1,–1,–1,–1,135,–1,–1,–1,61,–1,–1,1,–1,23,30,–1,183,–1,–1,–1,–1,–1,0,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1;

105,52,–1,–1,–1,–1,–1,–1,–1,–1,25,27,–1,27,–1,–1,–1,99,15,–1,47,–1,–1,–1,–1,–1,–1,–1,–1,–1, –1,0,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1;

–1,211,60,–1,92,–1,–1,136,10,–1,–1,–1,–1,–1,108,–1,–1,–1,–1,–1,–1,–1,–1,–1,–1,–1,–1,–1,–1,–1,–1,0,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1;

33,157,–1,–1,–1,–1,–1,–1,–1,–1,–1,–1,85,–1,–1,–1,93,–1,–1,–1,–1,204,125,146,–1,–1,–1,–1,–1, –1,–1,–1,–1,0,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1;

23,173,–1,–1,–1,–1,–1,–1,–1,–1,185,153,–1,154,–1,–1,–1,–1,88,–1,–1,–1,–1,–1,–1,–1,–1,–1,–1, –1,–1,–1,–1,–1,0,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1;

34,–1,–1,215,–1,–1,–1,91,–1,–1,–1,–1,–1,–1,–1,–1,–1,–1,–1,–1,78,–1,–1,112,–1,–1,–1,–1,–1,–1, –1,–1,–1,–1,–1,0,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1;

194,–1,–1,–1,–1,–1,–1,–1,–1,–1,–1,–1,97,–1,–1,90,221,101,–1,–1,–1,113,–1,–1,–1,–1,–1,–1,–1, –1,–1,–1,–1,–1,–1,–1,0,–1,–1,–1,–1,–1,–1,–1,–1,–1,–1,–1,–1,–1,–1,–1,–1,–1,–1,–1,–1,–1,–1,–1,–1,–1,–1,–1,–1,–1;

177,119,–1,–1,–1,–1,–1,–1,–1,–1,38,–1,–1,80,–1,–1,–1,–1,42,–1,–1,–1,–1,–1,–1,125,–1,–1,–1,–1,–1,–1,–1,–1,–1,–1,–1,0,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1;

–1,95,–1,115,–1,–1,–1,–1,–1,–1,–1,202,–1,–1,–1,–1,–1,–1,–1,–1,114,–1,167,–1,–1,–1,–1,–1,–1, –1,–1,–1,–1,–1,–1,–1,–1,–1,0,–1,–1,–1,–1,–1,–1,–1,–1,–1,–1,–1,–1,–1,–1,–1,–1,–1,–1,–1,–1,–1,–1,–1,–1,–1,–1,–1;

164,–1,–1,–1,–1,–1,–1,–1,–1,–1,–1,–1,–1,–1,145,–1,199,100,–1,–1,–1,16,–1,–1,–1,–1,–1,–1,–1, –1,–1,–1,–1,–1,–1,–1,–1,–1,–1,0,–1,–1,–1,–1,–1,–1,–1,–1,–1,–1,–1,–1,–1,–1,–1,–1,–1,–1,–1,–1,–1,–1,–1,–1,–1,–1,–1;

–1,88,–1,–1,–1,–1,–1,–1,–1,–1,–1,–1,102,153,–1,–1,–1,–1,122,169,–1,–1,–1,–1,–1,–1,–1,–1,–1, –1,–1,–1,–1,–1,–1,–1,–1,–1,–1,–1,0,–1,–1,–1,–1,–1,–1,–1,–1,–1,–1,–1,–1,–1,–1,–1,–1,–1,–1,–1,–1,–1,–1,–1,–1,–1,–1;

0,210,–1,–1,–1,–1,–1,125,181,–1,44,–1,–1,–1,–1,–1,–1,–1,–1,–1,–1,–1,–1,–1,–1,–1,–1,–1,–1,–1, –1,–1,–1,–1,–1,–1,–1,–1,–1,–1,–1,0,–1,–1,–1,–1,–1,–1,–1,–1,–1,–1,–1,–1,–1,–1,–1,–1,–1,–1,–1,–1,–1,–1,–1,–1,–1,–1;

180,–1,–1,75,–1,–1,–1,–1,–1,144,–1,25,–1,–1,–1,–1,–1,–1,–1,–1,–1,–1,187,–1,–1,–1,–1,–1,–1,–1,–1,–1,–1,–1,–1,–1,–1,–1,–1,–1,–1,0,–1,–1,–1,–1,–1,–1,–1,–1,–1,–1,–1,–1,–1,–1,–1,–1,–1,–1,–1,–1,–1,–1,–1,–1,–1,–1;

–1,101,–1,–1,–1,31,–1,–1,–1,–1,–1,–1,–1,–1,–1,–1,26,–1,–1,–1,135,76,–1,–1,–1,–1,–1,–1,–1,–1,–1,–1,–1,–1,–1,–1,–1,–1,–1,–1,–1,–1,–1,–1,–1,–1,–1,–1,–1, 1,–1;

151,–1,–1,–1,–1,–1,–1,–1,–1,–1,–1,–1,22,72,–1,–1,–1,39,–1,–1,–1,–1,–1,–1,–1,–1,–1,–1,–1,–1,–1, –1,–1,–1,–

1,–1,–1,–1,–1,–1,–1,–1,–1,–1,0,–1,–1,–1,–1,–1,–1,–1,–1,–1,–1,–1,–1,–1,–1,–1,–1,–1,–1,–1,–1,–1,–1,–1, –1;

–1,208,185,–1,–1,–1,–1,–1,–1,–1,46,–1,–1,–1,–1,–1,–1,–1,70,–1,–1,–1,–1,–1,–1,–1,–1,–1,–1,–1,–1,–1,–1,–1,–1,–1,–1,–1,–1,–1,–1,–1,–1,–1,–1,0,–1,–1,–1,–1,–1,–1,–1,–1,–1,–1,–1,–1,–1,–1,–1,–1,–1,–1,–1,–1,–1,–1;

177,–1,–1,38,56,–1,–1,–1,–1,–1,–1,82,–1,–1,–1,–1,–1,–1,–1,–1,–1,–1,59,–1,–1,–1,–1,–1,–1,–1,–1,–1,–1,–1,–1,–1,–1,–1,–1,–1,–1,–1,–1,–1,–1,–1,–1,0,–1,–1,–1,–1,–1,–1,–1,–1,–1,–1,–1,–1,–1,–1,–1,–1,–1,–1,–1,–1,–1,–1;

–1,25,–1,–1,–1,–1,0,23,–1,–1,–1,–1,–1,–1,0,–1,–1,–1,–1,–1,–1,–1,–1,–1,–1,–1,–1,–1,–1,–1,–1,–1,–1, –1,–1,–1,–1,–1,–1,–1,–1,–1,–1,–1,–1,–1,–1,–1,0,–1,–1,–1,–1,–1,–1,–1,–1,–1,–1,–1,–1,–1,–1,–1,–1,–1,–1,–1,–1;

13,–1,0,–1,0,–1,–1,–1,–1,–1,–1,–1,–1,–1,–1,16,–1,–1,–1,–1,–1,–1,–1,–1,–1,–1,–1,–1,–1,–1,–1,–1, –1,–1,–1,–1,–1,–1,–1,–1,–1,–1,–1,–1,–1,–1,–1,–1,0,–1,–1,–1,–1,–1,–1,–1,–1,–1,–1,–1,–1,–1,–1,–1,–1,–1,–1,–1;

–1,12,–1,–1,–1,–1,0,–1,0,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,0,–1,–1,–1,–1,–1,–1,–1,–1,–1,–1,–1,–1,–1,–1,–1,–1,–1;

0,–1,–1,–1,22,–1,–1,–1,–1,–1,–1,–1,–1,–1,–1,–1,–1,–1,–1,0,–1,0,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,0,–1,–1,–1,–1,–1,–1,–1,–1,–1,–1,–1,–1,–1,–1,–1,–1,–1;

–1,0,–1,–1,–1,–1,–1,–1,–1,–1,–1,–1,–1,–1,24,–1,–1,–1,1,–1,–1,–1,–1,–1,–1,3,–1,–1,–1,–1,–1,–1,–1,–1,–1,–1,–1,–1,–1,–1,–1,–1,–1,–1,–1,–1,–1,–1,–1,–1,–1,0,–1,–1,–1,–1,–1,–1,–1,–1,–1,–1,–1,–1,–1,–1,–1;

0,–1,–1,–1,–1,–1,–1,–1,–1,–1,25,–1,–1,0,–1,–1,–1,–1,–1,–1,–1,–1,–1,0,–1,–1,–1,–1,–1,–1,–1,–1,–1,–1,–1,–1,–1,–1,–1,–1,–1,–1,–1,–1,–1,–1,–1,–1,–1,–1,–1,0,–1,–1,–1,–1,–1,–1,–1,–1,–1,–1,–1,–1,–1,–1;

–1,0,–1,–1,–1,–1,–1,0,–1,–1,–1,–1,–1,–1,–1,–1,–1,–1,–1,–1,–1,–1,15,–1,–1,0,–1,–1,–1,–1,–1,–1,–1,–1,–1,–1,–1,–1,–1,–1,–1,–1,–1,–1,–1,–1,–1,–1,–1,–1,–1,–1,–1,0,–1,–1,–1,–1,–1,–1,–1,–1,–1,–1,–1,–1,–1,–1;

0,–1,–1,–1,–1,–1,–1,–1,–1,–1,–1,–1,27,–1,0,–1,–1,–1,–1,–1,–1,–1,–1,–1,17,–1,–1,–1,–1,–1,–1,–1, –1,–1,–1,–1,–1,–1,–1,–1,–1,–1,–1,–1,–1,–1,–1,–1,–1,–1,–1,–1,0,–1,–1,–1,–1,–1,–1,–1,–1,–1,–1,–1,–1,–1;

–1,0,0,–1,–1,–1,–1,–1,–1,–1,–1,0,–1,–1,–1,–1,–1,–1,–1,–1,–1,0,–1,–1,–1,–1,–1,–1,–1,–1,–1,–1,–1, –1,–1,–1,–1,–1,–1,–1,–1,–1,–1,–1,–1,–1,–1,–1,–1,–1,–1,–1,–1,–1,–1,0,–1,–1,–1,–1,–1,–1,–1,–1,–1,–1,–1,–1;

18,–1,–1,–1,–1,–1,–1,11,–1,–1,–1,–1,–1,–1,–1,–1,–1,–1,–1,–1,–1,–1, –1,–1,–1,–1,–1,–1,–1,–1,–1,–1,–1,–1,–1,–1,–1,–1,–1,–1,–1,–1,–1,–1,–1,–1,0,–1,–1,–1,–1,–1,–1,–1,–1,–1,–1;

–1,9,–1,–1,–1,–1,0,–1,–1,–1,–1,–1,0,–1,–1,–1,–1,–1,–1,–1,–1,–1,21,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,0,–1,–1,–1,–1,–1,–1,–1,–1,–1,–1;

0,–1,–1,–1,–1,–1,–1,–1,–1,–1,–1,–1,–1,–1,–1,19,0,–1,–1,6,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,0,–1,–1,–1,–1,–1,–1,–1,–1,–1,–1;

–1,0,–1,–1,–1,–1,–1,–1,–1,–1,–1,–1,–1,0,–1,–1,–1,–1,–1,–1,–1,–1,–1,0,–1,–1,–1,–1,–1,–1,–1,–1,–1, –1,–1,–1,–1,–1,–1,–1,–1,–1,–1,–1,–1,–1,–1,–1,–1,–1,–1,–1,–1,–1,–1,–1,0,–1,–1,–1,–1,–1,–1,–1,–1;

0,–1,–1,–1,–1,–1,–1,–1,–1,4,0,–1,14,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,0,–1,–1,–1,–1,–1,–1,–1;

–1,5,–1,0,–1,–1,–1,0,–1,–1,–1,–1,–1,–1,–1,–1,–1,–1,–1,0,–1,–1,–1,–1,–1,–1,–1,–1,–1,–1,–1,–1,–1, –1,–1,–1,–1,–1,–1,–1,–1,–1,–1,–1,–1,–1,–1,–1,–1,–1,–1,–1,–1,–1,–1,–1,0,–1,–1,–1,–1,–1,–1;

7,–1,–1,–1,–1,–1,–1,–1,2,–1,–1,–1,–1,–1,–1,–1,–1,0,–1,–1,–1,–1,–1,–1,–1,–1,–1,–1,–1,–1,–1,–1, –1,–1,–1,–1,–1,–1,–1,–1,–1,–1,–1,–1,–1,–1,–1,–1,–1,–1,–1,–1,–1,–1,–1,–1,0,–1,–1,–1,–1,–1;

–1,10,–1,0,–1,–1,–1,–1,–1,0,–1,–1,–1,–1,–1,–1,–1,0,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,0,–1,–1,–1,–1;

27,–1,–1,–1,0,–1,–1,–1,–1,–1,–1,–1,–1,–1,–1,–1,–1,–1,–1,–1,–1,–1,–1,0,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,0,–1,–1,–1;

–1,0,–1,–1,–1,–1,–1,–1,–1,–1,–1,–1,–1,–1,–1,0,–1,26,–1,–1,–1,–1,–1,–1,8,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,0,–1,–1;

0,–1,–1,–1,–1,–1,0,–1,0,–1,–1,–1,–1,–1,–1,–1,–1,–1,–1,–1,0,–1,–1,–1,–1,–1,–1,–1,–1,–1, –1,–1,–1,–1,–1,–1,–1,–1,–1,–1,–1,–1,–1,–1,–1,–1,–1,–1,–1,–1,–1,–1,–1,–1,–1,–1,–1,–1,–1,–1,0,–1;

–1,0,–1,–1,–1,–1,0,–1,–1,–1,0,–1,–1,–1,–1,–1,–1,–1,–1,–1,–1,–1,–1,–1,–1,–1,–1,–1,–1,–1,–1,–1,–1, –1,–1,–1,–1,–1,–1,–1,–1,–1,–1,–1,–1,–1,–1,–1,–1,–1,–1,–1,–1,–1,–1,–1,–1,–1,–1,–1,–1,0.

The coefficient matrix 5 is written as:

63,62,118,133,–1,28,133,–1,–1,50,67,68,27,15,–1,85,70,–1,13,91,137,118,1,0,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1;

129,–1,107,26,124,130,–1,138,50,25,–1,16,133,–1,72,135,8,68,–1,83,–1,52,0,0,0,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1;

102,50,19,–1,44,102,84,87,24,31,82,–1,–1,5,38,56,–1,82,40,30,128,–1,–1,–1,0,0,–1,–1,–1, –1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1, –1,–1,–1;

28,137,–1,50,14,–1,55,45,79,–1,85,115,47,91,143,–1,139,21,140,–1,100,6,1,–1,–1,0,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1;

5,89,–1,–1,–1,–1,–1,–1,–1,–1,–1,–1,–1,–1,–1,–1,–1,–1,–1,–1,–1,–1,–1,–1,–1,0,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1;

84,139,–1,92,–1,–1,–1,–1,–1,–1,–1,–1,24,–1,–1,–1,132,–1,–1,–1,–1,135,44,–1,–1,–1,–1,0,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1;

70,–1,–1,–1,–1,–1,20,–1,–1,–1,88,93,–1, 103,–1,–1,–1,102,27,–1,141,–1,–1,–1,–1,–1,–1,–1,0,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1;

83,135,–1,–1,9,–1,–1,89,18,–1,–1,–1,–1,–1,99,–1,–1,–1,–1,–1,–1,–1,–1,–1,–1,–1,–1,–1,–1,0,–1, –1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1, –1;

113,68,–1,141,–1,–1,–1,–1,–1,–1,–1,–1,84,–1,–1,–1,135,–1,–1, 143,–1,106,118,–1,116,–1,–1,–1,–1,–1,0,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1;

119,22,–1,–1,–1,–1,–1,–1,–1,–1,94,44,–1,122,–1,–1,–1,93,31,–1,94,–1,–1,–1,–1,–1,–1,–1,–1,–1,–1,0,–1,–1,–1,–

1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1;

–1,45,20,–1,85,–1,–1,112,18,–1,–1,–1,–1,–1,134,–1,–1,–1,–1,–1,–1,–1,–1,–1,–1,–1,–1,–1,–1,–1,–1, –1,–1,0,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1;

127,90,–1,–1,–1,–1,–1,–1,–1,–1,–1,6,–1,–1,–1,9,–1,–1,–1,–1,36,126,5,–1,–1,–1,–1,–1,–1,–1,–1,–1,0,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1, 1;

135,81,–1,–1,–1,–1,–1,–1,–1,–1,91,61,–1,45,–1,–1,–1,–1,9,–1,–1,–1,–1,–1,–1,–1,–1,–1,–1,–1,–1, –1,–1,–1,0,–1,–1,–1,–1,–1,–1,–1,–1,–1,–1,–1,–1,–1,–1,–1,–1,–1,–1,–1,–1,–1,–1,–1,–1,–1,–1,–1,–1,–1, –1;

94,–1,–1,110,–1,–1,–1,121,–1,–1,–1,–1,–1,–1,–1,–1,–1,–1,–1,–1,80,–1,–1,86,–1,–1,–1,–1,–1,–1, –1,–1,–1,–1,–1,0,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1;

90,–1,–1,–1,–1,–1,–1,–1,–1,–1,–1,–1,58,–1,–1,127,113,17,–1,–1,–1,53,–1,–1,–1,–1,–1,–1,–1,–1, –1,–1,–1,–1,–1,–1,0,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1;

40,114,–1,–1,–1,–1,–1,–1,–1,–1,19,–1,–1,128,–1,–1,–1,–1,51,–1,–1,–1,–1,–1,–1,59,–1,–1,–1,–1, –1,–1,–1,–1,–1,–1,–1,0,–1,–1,–1,–1,–1,–1,–1,–1,–1,–1,–1,–1,–1,–1,–1,–1,–1,–1,–1,–1,–1,–1,–1,–1,–1,–1,–1,–1,–1;

–1,95,–1,41,–1,–1,–1,–1,–1,–1,–1,96,–1,–1,–1,–1,–1,–1,–1,–1,102,–1,133,–1,–1,–1,–1,–1,–1,–1, –1,–1,–1,–1,–1,–1,–1,–1,0,–1,–1,–1,–1,–1,–1,–1,–1,–1,–1,–1,–1,–1,–1,–1,–1,–1,–1,–1,–1,–1,–1,–1,–1,–1,–1,–1,–1;

109,–1,–1,–1,–1,–1,–1,–1,–1,–1,–1,–1,–1,–1,67,–1,28,1,–1,–1,–1,7,–1,–1,–1,–1,–1,–1,–1,–1,–1,–1,–1,–1,–1,–1,–1,–1,–1,–1,0,–1,–1,–1,–1,–1,–1,–1,–1,–1,–1,–1,–1,–1,–1,–1,–1,–1,–1,–1,–1,–1,–1,–1,–1,–1,–1,–1;

–1,109,–1,–1,–1,–1,–1,–1,–1,–1,–1,–1,137,43,–1,–1,–1,–1,98,99,–1,–1,–1,–1,–1,–1,–1,–1,–1,–1, –1,–1,–1,–1,–1,–1,–1,–1,–1,–1,0,–1,–1,–1,–1,–1,–1,–1,–1,–1,–1,–1,–1,–1,–1,–1,–1,–1,–1,–1,–1,–1,–1,–1,–1,–1,–1;

12,91,–1,–1,–1,–1,–1,136,70,–1,75,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,0,–1,–1,–1,–1,–1,–1,–1,–1,–1,–1,–1,–1,–1,–1,–1,–1,–1,–1,–1,–1,–1,–1,–1,–1;

105,–1,–1,142,–1,–1,–1,–1,–1,120,–1,100,–1,–1,–1,–1,–1,–1,–1,–1,–1,–1,15,–1,–1,–1,–1,–1,–1, –1,–1,–1,–1,–1,–1,–1,–1,–1,–1,–1,–1,0,–1,–1,–1,–1,–1,–1,–1,–1,–1,–1,–1,–1,–1,–1,–1,–1,–1,–1,–1,–1,–1,–1,–1,–1,–1;

–1,70,–1,–1,–1,3,–1,–1,–1,–1,–1,–1,–1,–1,–1,–1,140,–1,–1,–1,48,104,–1,–1,–1,–1,–1,–1,–1,–1,–1,–1,–1,–1,–1,–1,–1,–1,–1,–1,–1,–1,–1,–1,0,–1,–1,–1,–1,–1,–1,–1,–1,–1,–1,–1,–1,–1,–1,–1,–1,–1,–1,–1,–1,–1,–1;

98,–1,–1,–1,–1,–1,–1,–1,–1,–1,–1,–1,6,127,–1,–1,–1,56,–1,–1,–1,–1,–1,–1,–1,–1,–1,–1,–1,–1,–1, –1,–1,–1,–1,–1,–1,–1,–1,–1,–1,–1,–1,0,–1,–1,–1,–1,–1,–1,–1,–1,–1,–1,–1,–1,–1,–1,–1,–1,–1,–1,–1,–1,–1,–1,–1;

–1,100,112,–1,–1,–1,–1,–1,–1,–1,6,–1,–1,–1,–1,–1,–1,–1,22,–1,–1,–1,–1,–1,–1,–1,–1,–1,–1,–1,–1, –1,–1,–1,–1,–1,–1,–1,–1,–1,–1,–1,–1,–1,0,–1,–1,–1,–1,–1,–1,–1,–1,–1,–1,–1,–1,–1,–1,–1,–1,–1,–1,–1,–1, –1;

61,–1,–1,19,97,–1,–1,–1,–1,–1,–1,8,–1,–1,–1,–1,–1,–1,–1,–1,–1,–1,50,–1,–1,–1,–1,–1,–1,–1,–1,–1,–1,–1,–1,–1,–1,–1,–1,–1,–1,–1,–1,–1,–1,0,–1,–1,–1,–1,–1,–1,–1,–1,–1,–1,–1,–1,–1,–1,–1,–1,–1,–1,–1,–1,–1;

–1,34,–1,–1,–1,–1,0,0,–1,–1,–1,–1,–1,–1,0,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,0,–1,–1,–1,–1,–1,–1,–1,–1,–1,–1,–1,–1,–1,–1,–1,–1,–1,–1,–1,–1;

1,–1,0,–1,0,–1,–1,–1,–1,–1,–1,–1,–1,–1,–1,0,–1,–1,–1,–1,–1,–1,–1,–1,–1,–1,–1,–1,–1,–1,–1,–1,–1,–1, –1,–1,–1,–1,–1,–1,–1,–1,–1,–1,–1,–1,–1,–1,–1,0,–1,–1,–1,–1,–1,–1,–1,–1,–1,–1,–1,–1,–1,–1,–1,–1,–1,–1,–1,–1;

–1,13,–1,–1,–1,–1,0,–1,0,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,0,–1,–1,–1,–1,–1,–1,–1,–1,–1,–1,–1,–1,–1,–1,–1,–1,–1,–1,–1;

0,–1,–1,–1,32,–1,–1,–1,–1,–1,–1,–1,–1,–1,–1,–1,–1,–1,–1,22,–1,0,–1,–1,–1,–1,–1,–1,–1,–1,–1,–1, –1,–1,–1,–1,–1,–1,–1,–1,–1,–1,–1,–1,–1,–1,–1,–1,–1,0,–1,–1,–1,–1,–1,–1,–1,–1,–1,–1,–1,–1,–1,–1,–1,–1,–1,–1,–1;

–1,29,–1,–1,–1,–1,–1,–1,–1,–1,–1,–1,–1,–1,144,–1,–1,–1,0,–1,–1,–1,–1,–1,–1,17,–1,–1,–1,–1,–1, –1,–1,–1,–1,–1,–1,–1,–1,–1,–1,–1,–1,–1,–1,–1,–1,–1,–1,–1,0,–1,–1,–1,–1,–1,–1,–1,–1,–1,–1,–1,–1,–1,–1,–1,–1,–1,–1;

168,–1,–1,–1,–1,–1,–1,–1,–1,0,–1,–1,0,–1,–1,–1,–1,–1,–1,–1,–1,–1,–1,28,–1,–1,–1,–1,–1,–1,–1,–1,–1,–1,–1,–1,–1,–1,–1,–1,–1,–1,–1,–1,–1,–1,–1,–1,–1,–1,–1,0,–1,–1,–1,–1,–1,–1,–1,–1,–1,–1,–1,–1,–1,–1,–1;

–1,0,–1,–1,–1,–1,–1,0,–1,–1,–1,–1,–1,–1,–1,–1,–1,–1,–1,–1,–1,–1,12,–1,–1,0,–1,–1,–1,–1,–1,–1,–1,–1,–1,–1,–1,–1,–1,–1,–1,–1,–1,–1,–1,–1,–1,–1,–1,–1,–1,–1,–1,0,–1,–1,–1,–1,–1,–1,–1,–1,–1,–1,–1,–1,–1,–1;

0,–1,–1,–1,–1,–1,–1,–1,–1,–1,–1,–1,11,–1,144,–1,–1,–1,–1,–1,–1,–1,–1,–1,18,–1,–1,–1,–1,–1,–1,–1,–1,–1,–1,–1,–1,–1,–1, 1;

–1,0,0,–1,–1,–1,–1,–1,–1,–1,–1,19,–1,–1,–1,–1,–1,–1,–1,–1,–1,5,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,0,–1,–1,–1,–1,–1,–1,–1,–1,–1,–1,–1,–1;

25,–1,–1,–1,–1,–1,–1,0,–1,–1,–1,–1,–1,–1,–1,0,–1,27,–1,–1,–1,–1,–1,–1,–1,–1,–1,–1,–1,–1,–1,–1, –1,–1,–1,–1,–1,–1,–1,–1,–1,–1,–1,–1,–1,–1,–1,–1,–1,–1,–1,–1,–1,–1,–1,–1,0,–1,–1,–1,–1,–1,–1,–1,–1,–1,–1,–1;

–1,0,–1,–1,–1,–1,0,–1,–1,–1,–1,–1,0,–1,–1,–1,–1,–1,–1,–1,–1,–1,33,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,0,–1,–1,–1,–1,–1,–1,–1,–1,–1,–1;

34,–1,–1,–1,–1,–1,–1,–1,–1,–1,–1,–1,–1,0,0,–1,–1,10,–1,–1,–1,–1,–1,–1,–1,–1,–1,–1,–1,–1,–1, –1,–1,–1,–1,–1,–1,–1,–1,–1,–1,–1,–1,–1,–1,–1,–1,–1,–1,–1,–1,–1,–1,–1,0,–1,–1,–1,–1,–1,–1,–1,–1,–1;

–1,14,–1,–1,–1,–1,–1,–1,–1,–1,–1,–1,–1,0,–1,–1,–1,–1,–1,–1,–1,–1,–1,0,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,0,–1,–1,–1,–1,–1,–1,–1,–1,–1;

2,–1,–1,–1,–1,–1,–1,–1,–1,26,0,–1,0,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,0,–1,–1,–1,–1,–1,–1,–1;

–1,144,–1,144,–1,–1,–1, 159,–1,–1,–1,–1,–1,–1,–1,–1,–1,–1,–1,0,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,0,–1,–1,–1,–1,–1,–1;

0,–1,–1,–1,–1,–1,–1,–1,0,–1,–1,–1,–1,–1,–1,–1,–1,9,–1,–1,–1,–1,–1,–1,–1,–1,–1,–1,–1,–1,–1,–1,–1, –1,–1,–1,–1,–1,–1,–1,–1,–1,–1,–1,–1,–1,–1,–1,–1,–1,–1,–1,–1,–1,–1,–1,–1,–1,–1,–1,0,–1,–1,–1,–1,–1;

–1,34,–1,0,–1,–1,–1,–1,–1,0,–1,–1,–1,–1,–1,–1,–1,–1,6,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,0,–1,–1,–1,–1;

3,–1,–1,–1,0,–1,–1,–1,–1,–1,–1,–1,–1,–1,–1,–1,–1,–1,–1,–1,–1,–1,–1,–1,–1,31,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,0,–1,–1,–1;

–1,4,–1,–1,–1,–1,–1,–1,–1,–1,–1,–1,–1,–1,–1,–1,0,–1,0,–1,–1,–1,–1,–1,–1,20,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,0,–1,–1;

0,–1,–1,–1,–1,–1,–1,0,–1,0,–1,–1,–1,–1,–1,–1,–1,–1,–1,–1,–1,–1,21,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,0,–1;

–1,16,–1,–1,–1,–1,0,–1,–1,–1,8,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,0.

The coefficient matrix 6 is written as:

168,99,146,33,–1,89,137,–1,–1,165,113,51,28,80,–1,33,0,–1,11,52,80,74,1,0,–1,–1,–1,–1, –1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1, –1,–1,–1,–1;

122,–1,120,43,52,57,–1,32,114,168,–1,0,11,–1,3,79,129,9,–1,135,–1,131,0,0,0,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,––1,–1,–1;

64,80,163,–1,79,97,70,122,80,172,57,–1,–1,74,158,170,–1,125,114,0,47,–1,–1,–1,0,0,–1, –1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1, –1,–1,–1,–1,–1;

128,54,–1,168,22,–1,11,57,174,–1,59,174,82,69,148,–1,141,173,77,–1,11,142,1,–1,–1,0, –1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1, –1,–1,–1,–1,–1,–1;

23,51,–1,–1,–1,–1,–1,–1,–1,–1,–1,–1,–1,–1,–1,–1,–1,–1,–1,–1,–1,–1,–1,–1,–1,0,–1,–1,–1,–1,–1, –1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1;

26,27,–1,24,–1,–1,–1,–1,–1,–1,–1,–1,157,–1,–1,–1,92,–1,–1,–1,–1,7,19,–1,–1,–1,–1,0,–1,–1,–1, –1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1, –1;

162,–1,–1,–1,–1,–1,55,–1,–1,–1,170,35,–1,78,–1,–1,–1,146,82,–1,18,–1,–1,–1,–1,–1,–1,–1,0,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1;

39,134,–1,–1,83,–1,–1,6,22,–1,–1,–1,–1,–1,112,–1,–1,–1,–1,–1,–1,–1,–1,–1,–1,–1,–1,–1,–1,0,–1, –1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1, –1;

29,146,–1,158,–1,–1,–1,–1,–1,–1,–1,–1,69,–1,–1,–1,152,–1,–1,124,–1,108,61,–1,46,–1,–1,–1, –1,–1,0,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,––1,–1,–1;

17,60,–1,–1,–1,–1,–1,–1,–1,–1,24,61,–1,140,–1,–1,–1,97,51,–1,86,–1,–1,–1,–1,–1,–1,–1,–1,–1,–1,0,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1;

–1,79,68,–1,130,–1,–1,32,96,–1,–1,–1,–1,–1,78,–1,–1,–1,–1,–1,–1,–1,–1,–1,–1,–1,–1,–1,–1,–1,–1,–1,–1,0,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1;

98,144,–1,–1,–1,–1,–1,–1,–1,–1,–1,–1,4,–1,–1,–1,138,–1,–1,–1,–1,159,12,167,–1,–1,–1,–1,–1,–1,–1,–1,–1,0,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1;

171,145,–1,–1,–1,–1,–1,–1,–1,–1,154,2,–1,63,–1,–1,–1,–1,97,–1,–1,–1,–1,–1,–1,–1,–1,–1,–1,–1, –1,–1,–1,–1,0,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1;

106,–1,–1,174,–1,–1,–1,161,–1,–1,–1,–1,–1,–1,–1,–1,–1,–1,–1,–1,7,–1,–1,71,–1,–1,–1,–1,–1,–1, –1,–1,–1,–1,–1,

0,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1;

4,–1,–1,–1,–1,–1,–1,–1,–1,–1,–1,–1,154,–1,–1,118,78,46,–1,–1,–1,151,–1,–1,–1,–1,–1,–1,–1,–1, –1,–1,–1,–1,–1,–1,0,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1;

103,97,–1,–1,–1,–1,–1,–1,–1,–1,82,–1,–1,37,–1,–1,–1,–1,0,–1,–1,–1,–1,–1,–1,152,–1,–1,–1,–1,–1,–1,–1,–1,–1,–1,0,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1;

–1,146,–1,141,–1,–1,–1,–1,–1,–1,–1,172,–1,–1,–1,–1,–1,–1,–1,–1,156,–1,63,–1,–1,–1,–1,–1,–1, –1,–1,–1,–1,–1,–1,–1,–1,–1,0,–1,–1,–1,–1,–1,–1,–1,–1,–1,–1,–1,–1,–1,–1,–1,–1,–1,–1,–1,–1,–1,–1,–1,–1,–1,–1,–1,–1;

8,–1,–1,–1,–1,–1,–1,–1,–1,–1,–1,–1,–1,–1,68,–1, 100,128,–1,–1,–1,94,–1,–1,–1,–1,–1,–1,–1,–1,–1,–1,–1,–1,–1,–1,–1,–1,–1,0,–1,–1,–1,–1,–1,–1,–1,–1,–1,–1,–1,–1,–1,–1,–1,–1,–1,–1,–1,–1,–1,–1,–1,–1,–1,–1,–1,–1;

–1,132,–1,–1,–1,–1,–1,–1,–1,–1,–1,–1,19,87,–1,–1,–1,–1,125,75,–1,–1,–1,–1,–1,–1,–1,–1,–1,–1, –1,–1,–1,–1,–1,–1,–1,–1,–1,0,–1,–1,–1,–1,–1,–1,–1,–1,–1,–1,–1,–1,–1,–1,–1,–1,–1,–1,–1,–1,–1,–1,–1,–1,–1,–1,–1,–1;

98,57,–1,–1,–1,–1,–1,133,20,–1,166,–1,–1,–1,–1,–1,–1,–1,–1,–1,–1,–1,–1,–1,–1,–1,–1,–1,–1,–1, –1,–1,–1,–1,–1,–1,–1,–1,–1,–1,–1,0,–1,–1,–1,–1,–1,–1,–1,–1,–1,–1,–1,–1,–1,–1,–1,–1,–1,–1,–1,–1,–1,–1,–1,–1,–1;

120,–1,–1,154,–1,–1,–1,–1,–1,83,–1,33,–1,–1,–1,–1,–1,–1,–1,–1,–1,–1,64,–1,–1,–1,–1,–1,–1,–1, –1,–1,–1,–1,–1,–1,–1,–1,–1,–1,–1,–1,0,–1,–1,–1,–1,–1,–1,–1,–1,–1,–1,–1,–1,–1,–1,–1,–1,–1,–1,–1,–1,–1,–1,–1,–1;

–1,36,–1,–1,–1,126,–1,–1,–1,–1,–1,–1,–1,–1,–1,–1,35,–1,–1,–1,78,136,–1,–1,–1,–1,–1,–1,–1,–1, –1,–1,–1,–1,–1,–1,–1,–1,–1,–1,–1,–1,0,–1,–1,–1,–1,–1,–1,–1,–1,–1,–1,–1,–1,–1,–1,–1,–1,–1,–1,–1,–1,–1,–1,–1,–1;

63,–1,–1,–1,–1,–1,–1,–1,–1,–1,–1,–1,32,38,–1,–1,–1,92,–1,–1,–1,–1,–1,–1,–1,–1,–1,–1,–1,–1,–1, –1,–1,–1,–1,–1,–1,–1,–1,–1,–1,–1,–1,–1,0,–1,–1,–1,–1,–1,–1,–1,–1,–1,–1,–1,–1,–1,–1,–1,–1,–1,–1,–1,–1,–1,–1,–1;

–1,76,78,–1,–1,–1,–1,–1,–1,–1,132,–1,–1,–1,–1,–1,–1,–1,133,–1,–1,–1,–1,–1,–1,–1,–1,–1,–1,–1,–1,–1,–1,–1,–1,–1,–1,–1,–1,–1,–1,–1,–1,–1,–1,0,–1,–1,–1,–1,–1,–1,–1,–1,–1,–1,–1,–1,–1,–1,–1,–1,–1,–1,–1,–1,–1,–1;

66,–1,–1,35,124,–1,–1,–1,–1,–1,–1,156,–1,–1,–1,–1,–1,–1,–1,–1,–1,–1,40,–1,–1,–1,–1,–1,–1,–1, –1,–1,–1,–1,–1,–1,–1,–1,–1,–1,–1,–1,–1,–1,–1,0,–1,–1,–1,–1,–1,–1,–1,–1,–1,–1,–1,–1,–1,–1,–1,–1,–1,–1,–1,–1,–1,–1;

–1,39,–1,–1,–1,–1,0,0,–1,–1,–1,–1,–1,–1,10,–1,–1,–1,–1,–1,–1,–1,–1,–1,–1,–1,–1,–1,–1,–1,–1,–1, –1,–1,–1,–1,–1,–1,–1,–1,–1,–1,–1,–1,–1,–1,0,–1,–1,–1,–1,–1,–1,–1,–1,–1,–1,–1,–1,–1,–1,–1,–1,–1,–1,–1;

31,–1,0,–1,0,–1,–1,–1,–1,–1,–1,–1,–1,–1,–1,88,–1,–1,–1,–1,–1,–1,–1,–1,–1,–1,–1,–1,–1,–1,–1,–1,–1, –1,–1,–1,–1,–1,–1,–1,–1,–1,–1,–1,–1,–1,–1,–1,0,–1,–1,–1,–1,–1,–1,–1,–1,–1,–1,–1,–1,–1,–1,–1,–1,–1,–1,–1;

–1,29,–1,–1,–1,–1,0,–1,0,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,0,–1,–1,–1,–1,–1,–1,–1,–1,–1,–1,–1,–1,–1,–1,–1,–1,–1,–1,–1;

17,–1,–1,–1,0,–1,–1,–1,–1,–1,–1,–1,–1,–1,–1,–1,–1,–1,–1,0,–1,0,–1,–1,–1,–1,–1,–1,–1,–1,–1,–1,–1,–1,–1,–1,–1,–1,–1,–1,–1,–1,–1,–1,–1,–1,–1,–1,–1,–1,0,–1,–1,–1,–1,–1,–1,–1,–1,–1,–1,–1,–1,–1,–1,–1,–1,–1;

–1,23,–1,–1,–1,–1,–1,–1,–1,–1,–1,–1,–1,–1,36,–1,–1,–1,0,–1,–1,–1,–1,–1,–1,302,–1,–1,–1,–1,–1, –1,–1,–1,–1,–1,–1,–1,–1,–1,–1,–1,–1,–1,–1,–1,–1,–1,–1,–1,–1,0,–1,–1,–1,–1,–1,–1,–1,–1,–1,–1,–1,–1,–1,–1,–1,–1,–1;

0,–1,–1,–1,–1,–1,–1,–1,–1,–1,22,–1,–1,102,–1,–1,–1,–1,–1,–1,–1,–1,–1,–1,118,–1,–1,–1,–1,–1,–1, –1,–1,–1,–1,–1,–1,–1,–1,–1,–1,–1,–1,–1,–1,–1,–1,–1,–1,–1,–1,0,–1,–1,–1,–1,–1,–1,–1,–1,–1,–1,–1,–1,–1,–1, –1;

–1,176,–1,–1,–1,–1,–1,0,–1,–1,–1,–1,–1,–1,–1,–1,–1,–1,–1,–1,–1,–1,27,–1,–1,0,–1,–1,–1,–1,–1,–1,–1,–1,–1,–1,–1,–1,–1,–1,–1,–1,–1,–1,–1,–1,–1,–1,–1,–1,–1,–1,0,–1,–1,–1,–1,–1,–1,–1,–1,–1,–1,–1,–1,–1;

0,–1,–1,–1,–1,–1,–1,–1,–1,–1,–1,20,–1,0,–1,–1,–1,–1,–1,–1,–1,–1,–1,0,–1,–1,–1,–1,–1,–1,–1,–1,–1,–1,–1,–1,–1,–1,–1,–1,–1,–1,–1,–1,–1,–1,–1,–1,–1,–1,–1,–1,0,–1,–1,–1,–1,–1,–1,–1,–1,–1,–1,–1,–1;

–1,0,0,–1,–1,–1,–1,–1,–1,–1,–1,0,–1,–1,–1,–1,–1,–1,–1,–1,–1,213,–1,–1,–1,–1,–1,–1,–1,–1,–1,–1, –1,–1,–1,–1,–1,–1,–1,–1,–1,–1,–1,–1,–1,–1,–1,–1,–1,–1,–1,–1,–1,–1,0,–1,–1,–1,–1,–1,–1,–1,–1,–1,–1,–1,–1;

264,–1,–1,–1,–1,–1,–1,176,–1,–1,–1,–1,–1,–1,–1,176,–1,0,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,0,–1,–1,–1,–1,–1,–1,–1,–1,–1,–1,–1;

–1,176,–1,–1,–1,–1,120,–1,–1,–1,–1,–1,0,–1,–1,–1,–1,–1,–1,–1,–1,–1,21,–1,–1,–1,–1,–1,–1,–1,–1, –1,–1,–1,–1,–1,–1,–1,–1,–1,–1,–1,–1,–1,–1,–1,–1,–1,–1,–1,–1,–1,–1,–1,0,–1,–1,–1,–1,–1,–1,–1,–1,–1, –1;

104,–1,–1,–1,–1,–1,–1,–1,–1,–1,–1,–1,–1,42,0,–1,–1,0,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,0,–1,–1,–1,–1,–1,–1,–1,–1;

–1,176,–1,–1,–1,–1,–1,–1,–1,–1,–1,–1,–1,0,–1,–1,–1,–1,–1,–1,–1,–1,–1,88,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,0,–1,–1,–1,–1,–1,–1,–1;

0,–1,–1,–1,–1,–1,–1,–1,0,0,–1,0,–1,–1,–1,–1,–1,–1,–1,–1,–1,–1,–1,–1,–1,–1,–1,–1,–1,–1,–1,–1,–1, –1,–1,–1,–1,–1,–1,–1,–1,–1,–1,–1,–1,–1,–1,–1,–1,–1,–1,–1,–1,–1,–1,–1,–1,–1,–1,0,–1,–1,–1,–1,–1,–1,–1;

–1,11,–1,0,–1,–1,–1,0,–1,–1,–1,–1,–1,–1,–1,–1,–1,–1,–1,0,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,0,–1,–1,–1,–1,–1,–1;

24,–1,–1,–1,–1,–1,–1,264,–1,–1,–1,–1,–1,–1,–1,–1,0,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,0,–1,–1,–1,–1,–1;

–1,25,–1,292,–1,–1,–1,–1,–1,0,–1,–1,–1,–1,–1,–1,–1,–1,0,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,0,–1, 1;

15,–1,–1,–1,0,–1,–1,–1,–1,–1,–1,–1,–1,–1,–1,–1,–1,–1,–1,–1,–1,–1,–1,–1,33,–1,–1,–1,–1,–1,–1,–1, –1,–1,–1,–1,–1,–1,–1,–1,–1,–1,–1,–1,–1,–1,–1,–1,–1,–1,–1,–1,–1,–1,–1,–1,–1,–1,–1,–1,–1,0,–1,–1,–1;

–1,194,–1,–1,–1,–1,–1,–1,–1,–1,–1,–1,–1,–1,–1,–1,0,–1,0,–1,–1,–1,–1,–1,–1,40,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,0,–1,–1;

0,–1,–1,–1,–1,–1,–1,100,–1,283,–1,–1,–1,–1,–1,–1,–1,–1,–1,–1,–1,–1,35,–1,–1,–1,–1,–1,–1,–1,–1, –1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,0, –1;

–1,0,–1,–1,–1,–1,0,–1,–1,–1,0,–1,–1,–1,–1,–1,–1,–1,–1,–1,–1,–1,–1,–1,–1,–1,–1,–1,–1,–1,–1,–1,–1,–1,–1, –1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,0.

The coefficient matrix 7 is written as:

44,155,200,15,–1,92,106,–1,–1,100,66,111,83,52,–1,23,112,–1,176,8,115,109,1,0,–1,–1, –1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1, –1,–1,–1,–1,–1,–1;

67,–1,154,11,124,23,–1,31,38,39,–1,130,173,–1,172,28,201,196,–1,87,–1,197,0,0,0,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1;

111,107,188,–1,198,89,197,206,11,81,26,–1,–1,188,182,48,–1,25,51,104,49,–1,–1,–1,0,0, –1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1, –1,–1,–1,–1,–1,–1;

29,183,–1,170,60,–1,81,203,65,–1,34,129,73,59,207,–1,207,182,169,–1,26,52,1,–1,–1,0, –1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1, –1,–1,–1,–1,–1,–1;

111,63,–1,–1,–1,–1,–1,–1,–1,–1,–1,–1,–1,–1,–1,–1,–1,–1,–1,–1,–1,–1,–1,–1,–1,–1,0,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1;

172,138,–1,110,–1,–1,–1,–1,–1,–1,–1,–1,176,–1,–1,–1,197,–1,–1,–1,–1,21,102,–1,–1,–1,–1,0,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1;

24,–1,–1,–1,–1,–1,64,–1,–1,–1, 117,201,–1,13,–1,–1,–1,70,169,–1,51,–1,–1,–1,–1,–1,–1,–1,0,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1;

171,44,–1,–1,22,–1,–1,148,37,–1,–1,–1,–1,–1,69,–1,–1,–1,–1,–1,–1,–1,–1,–1,–1,–1,–1,–1,0,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1;

50,203,–1,28,–1,–1,–1,–1,–1,–1,–1,–1,126,–1,–1,–1,164,–1,–1,22,–1,207,114,–1,24,–1,–1,–1, –1,–1,0,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1;

163,139,–1,–1,–1,–1,–1,–1,–1,–1,7,130,–1,52,–1,–1,–1,195,94,–1,179,–1,–1,–1,–1,–1,–1,–1,–1, –1,–1,0,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1, –1,–1,–1;

–1,85,21,–1,2,–1,–1,142,164,–1,–1,–1,–1,–1,200,–1,–1,–1,–1,–1,–1,–1,–1,–1,–1,–1,–1,–1,–1, –1,–1,0,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1;

59,137,–1,–1,–1,–1,–1,–1,–1,–1,–1,–1,180,–1,–1,–1,4,–1,–1,–1,–1,45,112,133,–1,–1,–1,–1,–1,–1,–1,–1,0,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1;

5,184,–1,–1,–1,–1,–1,–1,–1,–1,45,186,–1,114,–1,–1,–1,–1,60,–1,–1,–1,–1,–1,–1,–1,–1,–1,–1, –1,–1,–1,–1,0,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1;

88,–1,–1,34,–1,–1,–1,34,–1,–1,–1,–1,–1,–1,–1,–1,–1,–1,–1,–1,53,–1,–1,5,–1,–1,–1,–1,–1,–1,–1,–1,–1,–1,–1,0,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1;

145,–1,–1,–1,–1,–1,–1,–1,–1,–1,–1,–1,15,–1,–1,31,7,136,–1,–1,–1,98,–1,–1,–1,–1,–1,–1,–1,–1,–1,–1,–1,–1,–1,–1,0,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1;

8,41,–1,–1,–1,–1,–1,–1,–1,–1,157,–1,–1,106,–1,–1,–1,–1,204,–1,–1,–1,–1,–1,–1,46,–1,–1,–1,–1, –1,–1,–1,–1,–1,–1,–1,0,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1;

–1,26,–1,118,–1,–1,–1,–1,–1,–1,–1,75,–1,–1,–1,–1,–1,–1,–1,–1,200,–1,72,–1,–1,–1,–1,–1,–1,–1, –1,–1,–1,–1,–1,–1,–1,–1,0,–1,–1,–1,–1,–1,–1,–1,–1,–1,–1,–1,–1,–1,–1,–1,–1,–1,–1,–1,–1,–1,–1,–1,–1,–1,–1,–1,–1,–1;

20,–1,–1,–1,–1,–1,–1,–1,–1,–1,–1,–1,–1,–1,179,–1,133, 10,–1,–1,–1,31,–1,–1,–1,–1,–1,–1,–1,–1, –1,–1,–1,–1,–1,–1,–1,–1,–1,0,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1;

–1,190,–1,–1,–1,–1,–1,–1,–1,–1,–1,–1,100,53,–1,–1,–1,–1,52,179,–1,–1,–1,–1,–1,–1,–1,–1,–1,–1,–1,–1,–1,–1,–1,–1,–1,–1,–1,–1,–1,0,–1,–1,–1,–1,–1,–1,–1,–1,–1,–1,–1,–1,–1,–1,–1,–1,–1,–1,–1,–1,–1,–1,–1,–1,–1,–1,–1;

72,10,–1,–1,–1,–1,–1,154,67,–1,118,–1,–1,–1,–1,–1,–1,–1,–1,–1,–1,–1,–1,–1,–1,–1,–1,–1,–1,–1,–1, –1,–1,–1,–1,–1,–1,–1,–1,–1,–1,–1,0,–1,–1,–1,–1,–1,–1,–1,–1,–1,–1,–1,–1,–1,–1,–1,–1,–1,–1,–1,–1,–1,–1,–1,–1,–1,–1;

69,–1,–1,19,–1,–1,–1,–1,–1,152,–1,29,–1,–1,–1,–1,–1,–1,–1,–1,–1,–1,185,–1,–1,–1,–1,–1,–1,–1,–1, –1,–1,–1,–1,–1,–1,–1,–1,–1,–1,–1,–1,0,–1,–1,–1,–1,–1,–1,–1,–1,–1,–1,–1,–1,–1,–1,–1,–1,–1,–1,–1,–1,–1,–1,–1,–1,–1,–1;

–1,120,–1,–1,–1,181,–1,–1,–1,–1,–1,–1,–1,–1,–1,–1, 202,–1,–1,–1,143,38,–1,–1,–1,–1,–1,–1,–1, –1,–1,–1,–1,–1,–1,–1,–1,–1,–1,–1,–1,–1,–1,0,–1,–1,–1,–1,–1,–1,–1,–1,–1,–1,–1,–1,–1,–1,–1,–1,–1,–1,–1,–1,–1,–1,–1,–1,–1;

116,–1,–1,–1,–1,–1,–1,–1,–1,–1,–1,–1,40,88,–1,–1,–1, 147,–1,–1,–1,–1,–1,–1,–1,–1,–1,–1,–1,–1,–1,–1,–1,–1,–1,–1,–1,–1,–1,–1,–1,–1,–1,–1,–1,0,–1,–1,–1,–1,–1,–1,–1,–1,–1,–1,–1,–1,–1,–1,–1,–1,–1,–1,–1,–1,–1,–1,–1,–1;

–1,158,170,–1,–1,–1,–1,–1,–1,–1,143,–1,–1,–1,–1,–1,–1,–1,188,–1,–1,–1,–1,–1,–1,–1,–1,–1,–1,–1,–1,–1,–1,–1,–1,–1,–1,–1,–1,–1,–1,–1,–1,–1,–1,–1,0,–1,–1,–1,–1,–1,–1,–1,–1,–1,–1,–1,–1,–1,–1,–1,–1,–1,–1,–1,–1,–1,–1,–1;

17,–1,–1,201,202,–1,–1,–1,–1,–1,–1,21,–1,–1,–1,–1,–1,–1,–1,–1,–1,–1,145,–1,–1,–1,–1,–1,–1,–1,–1,–1,–1,–1,–1,–1,–1,–1,–1,–1,–1,–1,–1,–1,–1,–1,0,–1,–1,–1,–1,–1,–1,–1,–1,–1,–1,–1,–1,–1,–1,–1,–1,–1,–1,–1,–1;

–1,25,–1,–1,–1,–1,0,0,–1,–1,–1,–1,–1,–1,0,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,0,–1,–1,–1,–1,–1,–1,–1,–1,–1,–1,–1,–1,–1,–1,–1,–1,–1,–1,–1;

0,–1,24,–1,23,–1,–1,–1,–1,–1,–1,–1,–1,–1,–1,12,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,0,–1,–1,–1,–1,–1,–1,–1,–1,–1,–1,–1,–1,–1,–1,–1,–1,–1,–1,–1,–1;

–1,0,–1,–1,–1,–1,11,–1,0,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,0,–1,–1,–1,–1,–1,–1,–1,–1,–1,–1,–1,–1,–1,–1,–1,–1,–1,–1,–1;

20,–1,–1,–1,0,–1,–1,–1,–1,–1,–1,–1,–1,–1,–1,–1,–1,–1,–1,0,–1,0,–1,–1,–1,–1,–1,–1,–1,–1,–1,–1,–1,–1,–1,–1,–1,–1,–1,–1,–1,–1,–1,–1,–1,–1,–1,–1,–1,–1,0,–1,–1,–1,–1,–1,–1,–1,–1,–1,–1,–1,–1,–1,–1,–1,–1,–1;

–1,18,–1,–1,–1,–1,–1,–1,–1,–1,–1,–1,–1,–1,8,–1,–1,–1, 0,–1,–1,–1,–1,–1,–1,0,–1,–1,–1,–1,–1,–1,–1,–1,–1,–1,–1,–1,–1,–1,–1,–1,–1,–1,–1,–1,–1,–1,–1,–1,0,–1,–1,–1,–1,–1,–1,–1,–1,–1,–1,–1,–1,–1,–1,–1,–1,–1;

0,–1,–1,–1,–1,–1,–1,–1,–1,–1,7,–1,–1,16,–1,–1,–1,–1,–1,–1,–1,–1,–1,–1,3,–1,–1,–1,–1,–1,–1,–1,–1,–1,–1,–1,–1,–1,–1,–1,–1,–1,–1,–1,–1,–1,–1,–1,–1,–1,–1,–1,0,–1,–1,–1,–1,–1,–1,–1,–1,–1,–1,–1,–1,–1,–1;

–1,0,–1,–1,–1,–1,–1,17,–1,–1,–1,–1,–1,–1,–1,–1,–1,–1,–1,–1,–1,–1,21,–1,–1,0,–1,–1,–1,–1,–1,–1, –1,–1,–1,–1,–1,–1,–1,–1,–1,–1,–1,–1,–1,–1,–1,–1,–1,–1,–1,–1, 0,–1,–1,–1,–1,–1,–1,–1,–1,–1,–1,–1,–1,–1,–1;

22,–1,–1,–1,–1,–1,–1,–1,–1,–1,–1,–1,19,–1,0,–1,–1,–1,–1,–1,–1,–1,–1,–1,23,–1,–1,–1,–1,–1,–1,–1,–1,–1,–1,–1,–1,–1,–1,–1,–1,–1,–1,–1,–1,–1,–1,–1,–1,–1,–1,–1,–1,–1,0,–1,–1,–1,–1,–1,–1,–1,–1,–1,–1,–1,–1,–1;

–1,0,0,–1,–1,–1,–1,–1,–1,–1,–1,0,–1,–1,–1,–1,–1,–1,–1,–1,–1,0,–1,–1,–1,–1,–1,–1,–1,–1,–1,–1,–1, –1,–1,–1,–1,–1,–1,–1,–1,–1,–1,–1,–1,–1,–1,–1,–1,–1,–1,–1,–1,–1,0,–1,–1,–1,–1,–1,–1,–1,–1,–1,–1,–1,–1;

0,–1,–1,–1,–1,–1,–1,0,–1,–1,–1,–1,–1,–1,–1,4,–1,0,–1,–1,–1,–1,–1,–1,–1,–1,–1,–1,–1,–1,–1,–1,–1, –1,–1,–1,–1,–1,–1,–1,–1,–1,–1,–1,–1,–1,–1,–1,–1,–1,–1,–1,–1,–1,–1,0,–1,–1,–1,–1,–1,–1,–1,–1,–1,–1,–1;

–1,13,–1,–1,–1,–1,0,–1,–1,–1,–1,–1,0,–1,–1,–1,–1,–1,–1,–1,–1,–1,0,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,0,–1,–1,–1,–1,–1,–1,–1,–1,–1,–1;

0,–1,–1,–1,–1,–1,–1,–1,–1,–1,–1,–1,–1,–1,0,0,–1,–1, 0,–1,–1,–1,–1,–1,–1,–1,–1,–1,–1,–1,–1,–1, –1,–1,–1,–1,–1,–1,–1,–1,–1,–1,–1,–1,–1,–1,–1,–1,–1,–1,–1,–1,–1,–1,0,–1,–1,–1,–1,–1,–1,–1,–1;

–1,0,–1,–1,–1,–1,–1,–1,–1,–1,–1,–1,–1,25,–1,–1,–1,–1,–1,–1,–1,–1,–1,0,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,0,–1,–1,–1,–1,–1,–1,–1,–1;

18,–1,–1,–1,–1,–1,–1,–1,–1,6,0,–1,0,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,0,–1,–1,–1,–1,–1,–1,–1;

–1,19,–1,10,–1,–1,–1,0,–1,–1,–1,–1,–1,–1,–1,–1,–1,–1,–1,0,–1,–1,–1,–1,–1,–1,–1,–1,–1,–1,–1,–1,–1, –1,–1,–1,–1,–1,–1,–1,–1,–1,–1,–1,–1,–1,–1,–1,–1,–1,–1,–1,–1,–1,–1,–1,–1,0,–1,–1,–1,–1,–1,–1;

0,–1,–1,–1,–1,–1,–1,–1,0,–1,–1,–1,–1,–1,–1,–1,–1,22,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,0,–1,–1,–1,–1,–1;

–1,0,–1,0,–1,–1,–1,–1,–1,9,–1,–1,–1,–1,–1,–1,–1,–1, 1,–1,–1,–1,–1,–1,–1,–1,–1,–1,–1,–1,–1,–1,–1, –1,–1,–1,–1,–1,–1,–1,–1,–1,–1,–1,–1,–1,–1,–1,–1,–1,–1,–1,–1,–1,–1,–1,–1,–1,–1,0,–1,–1,–1,–1;

15,–1,–1,–1,0,–1,–1,–1,–1,–1,–1,–1,–1,–1,–1,–1,–1,–1,–1,–1,–1,–1,–1,24,–1,–1,–1,–1,–1,–1,–1, –1,–1,–1,–1,–1,–1,–1,–1,–1,–1,–1,–1,–1,–1,–1,–1,–1,–1,–1,–1,–1,–1,–1,–1,–1,–1,–1,–1,–1,0,–1,–1,–1;

–1,0,–1,–1,–1,–1,–1,–1,–1,–1,–1,–1,–1,–1,–1,–1,0,–1, 0,–1,–1,–1,–1,–1,–1,2,–1,–1,–1,–1,–1,–1,–1, –1,–1,–1,–1,–1,–1,–1,–1,–1,–1,–1,–1,–1,–1,–1,–1,–1,–1,–1,–1,–1,–1,–1,–1,–1,–1,–1,–1,0,–1,–1;

0,–1,–1,–1,–1,–1,–1,14,–1,0,–1,–1,–1,–1,–1,–1,–1,–1,–1,–1,–1,–1,0,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,0,–1;

–1,0,–1,–1,–1,–1,0,–1,–1,–1,0,–1,–1,–1,–1,–1,–1,–1,–1,–1,–1,–1,–1,–1,–1,–1,–1,–1,–1,–1,–1,–1,–1,–1, –1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,0.

The coefficient matrix 8 is written as:

25,52,4,152,–1,3,9,–1,–1,60,0,0,60,44,–1,79,156,–1,100, 129,120,14,1,0,–1,–1,–1,–1,–1,–1, –1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1, –1,–1;

41,–1,17,141,2,148,–1,2,45,32,–1,203,72,–1,234,176, 180,57,–1,15,–1,70,0,0,0,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1;

64,9,132,–1,146,120,70,9,125,198,10,–1,–1,36,67,0,–1, 0,1,74,14,–1,–1,–1,0,0,–1,–1,–1,–1, –1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1, –1,–1;

30,168,–1,91,0,–1,122,194,150,–1,223,139,63,38,158,–1,8,14,187,–1,37,0,1,–1,–1,0,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1;

42,43,–1,–1,–1,–1,–1,–1,–1,–1,–1,–1,–1,–1,–1,–1,–1,–1,–1,–1,–1,–1,–1,–1,0,–1,–1,–1,–1,–1, –1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1;

141,29,–1,67,–1,–1,–1,–1,–1,–1,–1,–1,20,–1,–1,–1, 165,–1,–1,–1,–1,188,0,–1,–1,–1,–1,0,–1,–1, –1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1, –1,–1;

19,–1,–1,–1,–1,–1,154,–1,–1,–1,170,30,–1,204,–1,–1,–1,167,237,–1,41,–1,–1,–1,–1,–1,–1,–1, 0,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1;

92,126,–1,–1,68,–1,–1,87,50,–1,–1,–1,–1,–1,217,–1,–1,–1,–1,–1,–1,–1,–1,–1,–1,–1,–1,–1,–1,0,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1;

234,0,–1,0,–1,–1,–1,–1,–1,–1,–1,–1,106,–1,–1,–1,40,–1,–1,82,–1,58,178,–1,146,–1,–1,–1,–1,–1,0,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1;

6,210,–1,–1,–1,–1,–1,–1,–1,–1,149,143,–1,95,–1,–1,–1, 137,145,–1,127,–1,–1,–1,–1,–1,–1,–1,–1,–1,–1,0,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1;

–1,166,189,–1,86,–1,–1,201,52,–1,–1,–1,–1,–1,68,–1,–1,–1,–1,–1,–1,–1,–1,–1,–1,–1,–1,–1,–1,–1,–1,0,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1;

123,85,–1,–1,–1,–1,–1,–1,–1,–1,–1,–1,27,–1,–1,–1, 146,–1,–1,–1,–1,237,120,28,–1,–1,–1,–1,–1, –1,–1,–1,–1, 0,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1, –1,–1,–1;

38,145,–1,–1,–1,–1,–1,–1,–1,–1,178,127,–1,3,–1,–1,–1,–1,56,–1,–1,–1,–1,–1,–1,–1,–1,–1,–1,–1, –1,–1,–1,–1, 0,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1;

228,–1,–1,194,–1,–1,–1,0,–1,–1,–1,–1,–1,–1,–1,–1,–1,–1,–1,–1,24,–1,–1,25,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1, 1,–1;

1,–1,–1,–1,–1,–1,–1,–1,–1,–1,–1,–1,134,–1,–1,126,56, 120,–1,–1,–1,123,–1,–1,–1,–1,–1,–1,–1,–1,–1,–1,–1,–1,–1,–1,0,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1;

58,0,–1,–1,–1,–1,–1,–1,–1,–1,127,–1,–1,138,–1,–1,–1,–1,160,–1,–1,–1,–1,–1,–1,215,–1,–1,–1,–1,–1,–1,–1,–1,–1,–1,–1,0,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1;

–1,97,–1,55,–1,–1,–1,–1,–1,–1,–1,22,–1,–1,–1,–1,–1,–1,–1,–1,163,–1,77,–1,–1,–1,–1,–1,–1,–1,–1,–1,–1,–1,–1,–1,–1,–1,0,–1,–1,–1,–1,–1,–1,–1,–1,–1,–1,–1,–1,–1,–1,–1,–1,–1,–1,–1,–1,–1,–1,–1,–1,–1,–1,–1,–1;

117,–1,–1,–1,–1,–1,–1,–1,–1,–1,–1,–1,–1,–1,179,–1, 150,90,–1,–1,–1,4,–1,–1,–1,–1,–1,–1,–1,–1, –1,–1,–1,–1,–1,–1,–1,–1,–1,0,–1,–1,–1,–1,–1,–1,–1,–1,–1,–1,–1,–1,–1,–1,–1,–1,–1,–1,–1,–1,–1,–1,–1,–1,–1,–1,–1,–1;

–1,75,–1,–1,–1,–1,–1,–1,–1,–1,–1,–1,89,0,–1,–1,–1,–1, 191,34,–1,–1,–1,–1,–1,–1,–1,–1,–1,–1,–1, –1,–1,–1,–1,–1,–1,–1,–1,–1,0,–1,–1,–1,–1,–1,–1,–1,–1,–1,–1,–1,–1,–1,–1,–1,–1,–1,–1,–1,–1,–1,–1,–1,–1,–1,–1;

151,116,–1,–1,–1,–1,–1,226,16,–1,83,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,0,–1,–1,–1,–1,–1,–1,–1,–1,–1,–1,–1,–1,–1,–1,–1,–1,–1,–1,–1,–1,–1,–1,–1,–1,–1,–1;

52,–1,–1,66,–1,–1,–1,–1,–1,200,–1,30,–1,–1,–1,–1,–1,–1,–1,–1,–1,–1,73,–1,–1,–1,–1,–1,–1,–1,–1,–1,–1,–1,–1,–1,–1,–1,–1,–1,–1,–1,–1,–1,–1,0,–1,–1,–1,–1,–1,–1,–1,–1,–1,–1,–1,–1,–1,–1,–1,–1,–1,–1,–1,–1,–1,–1,–1,–1,–1,–1,–1;

–1,67,–1,–1,–1,0,–1,–1,–1,–1,–1,–1,–1,–1,–1,–1,131,–1,–1,–1,30,38,–1,–1,–1,–1,–1,–1,–1,–1,–1, –1,–1,–1,–1,–1,–1,–1,–1,–1,–1,–1,0,–1,–1,–1,–1,–1,–1,–1,–1,–1,–1,–1,–1,–1,–1,–1,–1,–1,–1,–1,–1,–1,–1,–1;

162,–1,–1,–1,–1,–1,–1,–1,–1,–1,–1,–1,88,180,–1,–1,–1, 109,–1,–1,–1,–1,–1,–1,–1,–1,–1,–1,–1, –1,–1,–1,–1,–1,–1,–1,–1,–1,–1,–1,–1,–1,0,–1,–1,–1,–1,–1,–1,–1,–1,–1,–1,–1,–1,–1,–1,–1,–1,–1,–1,–1,–1,–1,

–1,128,9,–1,–1,–1,–1,–1,–1,–1,32,–1,–1,–1,–1,–1,–1,–1,70,–1,–1,–1,–1,–1,–1,–1,–1,–1,–1,–1,–1, –1,–1,–1,–1,–1,–1,–1,–1,–1,–1,–1,–1,–1,0,–1,–1,–1,–1,–1,–1,–1,–1,–1,–1,–1,–1,–1,–1,–1,–1,–1,–1,–1,–1,–1;

212,–1,–1,120,0,–1,–1,–1,–1,–1,–1,96,–1,–1,–1,–1,–1,–1,–1,–1,–1,–1,110,–1,–1,–1,–1,–1,–1,–1, –1,–1,–1,–1,–1,–1,–1,–1,–1,–1,–1,–1,–1,–1,–1,0,–1,–1,–1,–1,–1,–1,–1,–1,–1,–1,–1,–1,–1,–1,–1,–1,–1,–1,–1,–1,–1;

–1,121,–1,–1,–1,–1,177,0,–1,–1,–1,–1,–1,–1,229,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,0,–1,–1,–1,–1,–1,–1,–1,–1,–1,–1,–1,–1,–1,–1,–1,–1,–1,–1,–1,–1;

97,–1,86,–1,64,–1,–1,–1,–1,–1,–1,–1,–1,–1,–1,23,–1,–1,–1,–1,–1,–1,–1,–1,–1,–1,–1,–1,–1,–1,–1, –1,–1,–1,–1,–1,–1,–1,–1,–1,–1,–1,–1,–1,–1,–1,0,–1,–1,–1,–1,–1,–1,–1,–1,–1,–1,–1,–1,–1,–1,–1,–1,–1,–1;

–1,112,–1,–1,–1,–1,15,–1,145,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,0,–1,–1,–1,–1,–1,–1,–1,–1,–1,–1,–1,–1,–1,–1,–1,–1,–1,–1,–1,–1;

106,–1,–1,–1,125,–1,–1,–1,–1,–1,–1,–1,–1,–1,–1,–1,–1,–1,–1,62,–1,180,–1,–1,–1,–1,–1,–1,–1,–1, –1,–1,–1,–1,–1,–1,–1,–1,–1,–1,–1,–1,–1,–1,–1,–1,–1,–1,–1,0,–1,–1,–1,–1,–1,–1,–1,–1,–1,–1,–1,–1,–1,–1, –1,–1;

–1,120,–1,–1,–1,–1,–1,–1,–1,–1,–1,–1,–1,–1,231,–1,–1,–1,189,–1,–1,–1,–1,–1,–1,233,–1,–1,–1,–1,–1,–1,–1,–1,–1,–1,–1,–1,–1,–1,–1,–1,–1,–1,–1,–1,–1,–1,–1,–1,–1, 0,–1,–1,–1,–1,–1,–1,–1,–1,–1,–1,–1,–1,–1,–1,–1,–1;

0,–1,–1,–1,–1,–1,–1,–1,–1,–1,78,–1,–1,4,–1,–1,–1,–1,–1,–1,–1,–1,–1,–1,35,–1,–1,–1,–1,–1,–1,–1, –1,–1,–1,–1,–1,–1,–1,–1,–1,–1,–1,–1,–1,–1,–1,–1,–1,–1,0,–1,–1,–1,–1,–1,–1,–1,–1,–1,–1,–1,–1,–1,–1,–1;

–1,30,–1,–1,–1,–1,–1,25,–1,–1,–1,–1,–1,–1,–1,–1,–1,–1,–1,–1,–1,–1,96,–1,–1,60,–1,–1,–1,–1,–1, –1,–1,–1,–1,–1,–1,–1,–1,–1,–1,–1,–1,–1,–1,–1,–1,–1,–1,–1,–1, 0,–1,–1,–1,–1,–1,–1,–1,–1,–1,–1,–1,–1,–1;

0,–1,–1,–1,–1,–1,–1,–1,–1,–1,–1,–1,28,–1,82,–1,–1,–1,–1,–1,–1,–1,–1,–1,127,–1,–1,–1,–1,–1,–1, –1,–1,–1,–1,–1,–1,–1,–1,–1,–1,–1,–1,–1,–1,–1,–1,–1,–1,–1,–1,–1,–1,0,–1,–1,–1,–1,–1,–1,–1,–1,–1,–1,–1,–1,–1;

–1,90,0,–1,–1,–1,–1,–1,–1,–1,–1,159,–1,–1,–1,–1,–1,–1,–1,–1,–1,168,–1,–1,–1,–1,–1,–1,–1,–1,–1, –1,–1,–1,–1,–1,–1,–1,–1,–1,–1,–1,–1,–1,–1,–1,–1,–1,–1,–1,–1,–1,–1,–1,0,–1,–1,–1,–1,–1,–1,–1,–1,–1,–1,–1, –1;

45,–1,–1,–1,–1,–1,–1,139,–1,–1,–1,–1,–1,–1,–1,155,–1, 21,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,0,–1,–1,–1,–1,–1,–1,–1,–1,–1,–1,–1;

–1,167,–1,–1,–1,–1,7,–1,–1,–1,–1,–1,120,–1,–1,–1,–1,–1,–1,–1,–1,–1,46,–1,–1,–1,–1,–1,–1,–1,–1, –1,–1,–1,–1,–1,–1,–1,–1,–1,–1,–1,–1,–1,–1,–1,–1,–1,–1,–1,–1,–1,–1,–1,–1,–1,0,–1,–1,–1,–1,–1,–1,–1,–1,–1, –1;

42,–1,–1,–1,–1,–1,–1,–1,–1,–1,–1,–1,–1,–1,54,120,–1,–1, 137,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,0,–1,–1,–1,–1,–1,–1,–1,–1,–1;

−1,193,−1,−1,−1,−1,−1,−1,−1,−1,−1,−1,−1,38,−1,−1,−1,−1,−1,−1,−1,−1,−1,180,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1,0,−1,−1,−1,−1,−1,−1,−1,−1;

19,−1,−1,−1,−1,−1,−1,−1,−1,201,89,−1,150,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1,0,−1,−1,−1,−1,−1,−1,−1;

−1,44,−1,12,−1,−1,−1,59,−1,−1,−1,−1,−1,−1,−1,−1,−1,−1,−1,221,−1,−1,−1,−1,−1,−1,−1,−1,−1,−1,−1, −1,−1,−1,−1,−1,−1,−1,−1,−1,−1,−1,−1,−1,−1,−1,−1,−1,−1,−1,−1,−1,−1,−1,−1,−1,−1,−1,−1,−1,−1,0,−1,−1,−1,−1,−1, −1;

60,−1,−1,−1,−1,−1,−1,−1,203,−1,−1,−1,−1,−1,−1,−1,−1, 0,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1,0,−1,−1,−1,−1,−1;

−1,74,−1,0,−1,−1,−1,−1,−1,155,−1,−1,−1,−1,−1,−1,−1,−1,43,−1,−1,−1,−1,−1,−1,−1,−1,−1,−1,−1,−1, −1,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1,0,−1,−1,−1,−1;

70,−1,−1,−1,0,−1,−1,−1,−1,−1,−1,−1,−1,−1,−1,−1,−1,−1,−1,−1,−1,−1,−1,−1,235,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1,0,−1,−1,−1;

11,−1,−1,−1,−1,−1,−1,91,−1,0,−1,−1,−1,−1,−1,−1,−1,−1,−1,−1,−1,−1,123,−1,−1,−1,−1,−1,−1,−1,−1, −1,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1,0,−1;

−1,24,−1,−1,−1,−1,40,−1,−1,−1,119,−1,−1,−1,−1,−1,−1,−1,−1,−1,−1,−1,−1,−1,−1,−1,−1,−1,−1,−1,−1, −1,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1, 0.

All the lifting sizes supported by the coefficient matrix i correspond to the lifting size subset Zseti, where i=1, 2, 3, . . . , 8; and the i-th set Z0seti corresponds to the coefficient matrix i, where i=1, 2, 3, . . . , 8. The 8 lifting size subsets are respectively Zset1={2, 4, 8, 16, 32, 64, 128, 256}, Zset2={3, 6, 12, 24, 48, 96, 192, 384}, Zset3={5, 10, 20, 40, 80, 160, 320}, Zset4={7, 14, 28, 56, 112, 224}, Zset5={9, 18, 36, 72, 144, 288}, Zset6={11, 22, 44, 88, 176, 352}, Zset7={13, 26, 52, 104, 208}, and Zset8={15, 30, 60, 120, 240}.

From the description of the embodiment described above, it will be apparent to those skilled in the art that the method in the embodiment described above may be implemented by software plus a necessary general-purpose hardware platform, or may of course be implemented by hardware. However, in many cases, the former is a preferred implementation mode. Based on this understanding, the solutions provided by the present invention substantially, or the part contributing to the related art, may be embodied in the form of a software product. The computer software product is stored in a storage medium (such as a read-only memory (ROM)/random access memory (RAM), a magnetic disk or an optical disk) and includes several instructions for enabling a terminal device (which may be a mobile phone, a computer, a server, a network device or the like) to execute the method according to each embodiment of the present invention.

Embodiment 2

This embodiment further provides a design apparatus for quasi-cyclic low-density parity-check encoding. The apparatus is configured to implement the above-mentioned embodiment and preferred implementation modes. What has been described will not be repeated. As used below, a term "module" may be software, hardware or a combination thereof capable of implementing predetermined functions. The apparatus in the embodiment described below is preferably implemented by software, but implementation by hardware or by a combination of software and hardware is also possible and conceived.

Figure 2:
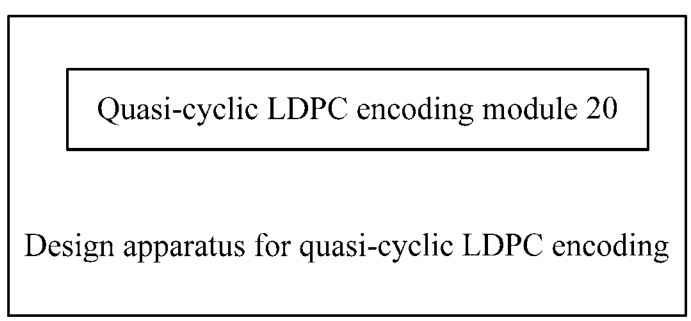
FIG. 2 is a block diagram of a design apparatus for quasi-cyclic low-density parity-check encoding according to an embodiment of the present invention.

FIG. 2 is a block diagram of a design apparatus for quasi-cyclic low-density parity-check encoding according to an embodiment of the present invention. As shown in FIG. 2, the apparatus includes a quasi-cyclic LDPC encoding module 20.

The quasi-cyclic LDPC encoding module 20 is configured to perform LDPC encoding on a K-bit information sequence to be encoded according to a parity check matrix of a quasi-cyclic LDPC code to obtain an N-bit LDPC encoded sequence.

The parity check matrix is determined according to a basic matrix coefficient and a lifting size Z, where K is a positive integer, N is an integer greater than K, and Z is a positive integer.

Optionally, the apparatus further includes a first storage module and a second storage module. The first storage module is configured to store a lifting size set Zset. The lifting size Z is an element in the lifting size set Zset, A lifting size subsets are respectively Zseti (i=1, 2, 3, . . . , A), all elements in the A lifting size subsets constitute the lifting size set Zset, and the A lifting size subsets have no common elements. The second storage module is configured to store a coefficient matrix set. The coefficient matrix is a coefficient matrix in the coefficient matrix set, and all lifting sizes supported by an i-th coefficient matrix in the coefficient matrix set constitute an i-th lifting size subset Zseti.

The coefficient matrix set includes A coefficient matrices, where A is an integer greater than 1. The A coefficient matrices have a same number of rows, a same number of columns, and same positions at which elements of non-"−1" are disposed. All elements in the lifting size set Zset are positive integers.

Optionally, all lifting sizes corresponding to parity check matrices with a girth greater than or equal to 6 of all basic matrices determined by each lifting size in the lifting size set Zset and the i-th coefficient matrix in the coefficient matrix set constitute a set Z0seti. The set Z0seti includes a number L0i of elements which belong to the i-th lifting size subset Zseti and a number L1i of elements which do not belong to the i-th lifting size subset Zseti, where L0i is a positive integer less than or equal to Li, Li is a number of elements in the i-th lifting size subset Zseti, and L1i≥2, L1i≥3, L1i≥4, L1i≥5, L1i≥6, L1i≥7, L1i≥8, L1i≥9, L1i≥10, or L1i≥11.

Optionally, the apparatus further includes a third storage module. The third storage module is configured to store a first coefficient matrix set. All coefficient matrices in the first coefficient matrix set have a same number of rows and a same number of columns, and any coefficient matrix in the first coefficient matrix set has a same number of rows and a same number of columns as the A coefficient matrices in the coefficient matrix set stored in the second storage module.

Optionally, the coefficient matrix set stored in the second storage module includes at least one coefficient matrix in the first coefficient matrix set.

Optionally, the coefficient matrix set stored in the second storage module includes at least one adjusted coefficient matrix obtained by adjusting one coefficient matrix in the first coefficient matrix set.

Optionally, all elements of non-"−1" among a first element to an (kb+M)-th element in an s-th row of the adjusted coefficient matrix are equal to all integers obtained from a modulo calculation of all respective elements of non-"−1" among a first element to an (kb+M)-th element in an s-th row of an original coefficient matrix plus Rs by Zmax, where s=1, 2, 3, . . . , row, Rs is an integer to be added corresponding to the s-th row, at least one of R0, R1, . . . , R(row) is a non-zero integer. Alternatively, all elements of non-"−1" among a first element to a row-th element in a t-th column of the adjusted coefficient matrix are equal to all integers obtained from a modulo calculation of all respective elements of non-"−1" among a first element to a row-th element in a t-th column of the original coefficient matrix plus Ct by Zmax, where t=1, 2, 3, . . . , col, Ct is an integer to be added corresponding to the t-th column, and at least one of C0, C1, . . . , C(col) is a non-zero integer, row is a number of rows of the coefficient matrix, col is a number of columns of the coefficient matrix, kb is equal to a difference between col and row, M is a non-negative integer less than 10, Zmax a maximum lifting size supported by the adjusted coefficient matrix, and Zmax is a positive integer.

Optionally, an element in an s-th row and a t-th column of the adjusted coefficient matrix is equal to an integer obtained from a modulo calculation result of an element in an s-th row and a t-th column of the original coefficient matrix plus (Xs+Yt) by Zmax. The element in the s-th row and the t-th column of the original coefficient matrix is an element of non-"−1", s=1, 2, 3, . . . , row, t=1, 2, 3, . . . , kb+M, kb is the difference between col and row, row is the number of rows of the coefficient matrix, col is the number of columns of the coefficient matrix, M is a non-negative integer less than 10, both Xs and Yt are integers, and at least one of X0, X1, . . . , X(row) and Y0, Y1, . . . , Y(kb+M) is a non-zero integer.

Optionally, A is equal to 8, and the 8 lifting size subsets are respectively as follows:

Zset1={2, 4, 8, 16, 32, 64, 128, 256}, Zset2={3, 6, 12, 24, 48, 96, 192}, Zset3={5, 10, 20, 40, 80, 160}, Zset4={7, 14, 28, 56, 112, 224}, Zset5={9, 18, 36, 72, 144}, Zset6={11, 22, 44, 88, 176}, Zset7={13, 26, 52, 104, 208}, and Zset8={15, 30, 60, 120, 240}.

Optionally, the set Z0seti are respectively Z0set1={56, 80, 104, 112, 120, 128, 160, 176, 192, 208, 224, 240, 256}, Z0set2={44, 48, 72, 88, 96, 144, 160, 176, 192, 208, 224, 240, 256}, Z0set3={60, 80, 120, 128, 160, 208, 224, 240, 256}, Z0set4={56, 60, 104, 112, 120, 128, 192, 208, 224, 240, 256}, Z0set5={72, 128, 144, 160, 176, 192, 224, 240, 256}, Z0set6={88, 96, 104, 128, 176, 192, 208, 224, 240, 256}, Z0set7={26, 52, 80, 104, 144, 160, 176, 192, 208, 224, 240}, and Z0set8={30, 60, 112, 120, 144, 160, 208, 224, 240, 256}.

Optionally, A is equal to 8, and the 8 lifting size subsets are respectively as follows:

Zset1={2, 4, 8, 16, 32, 64, 128, 256}, Zset2={3, 6, 12, 24, 48, 96, 192, 384}, Zset3={5, 10, 20, 40, 80, 160, 320}, Zset4={7, 14, 28, 56, 112, 224}, Zset5={9, 18, 36, 72, 144, 288}, Zset6={11, 22, 44, 88, 176, 352}, Zset7={13, 26, 52, 104, 208}, and Zset8={15, 30, 60, 120, 240}.

Optionally, the set Z0seti are respectively Z0set1={16, 32, 48, 64, 80, 96, 112, 128, 144, 160, 176, 192, 208, 224, 240, 256, 288, 320, 352, 384}, Z0set2={12, 24, 36, 48, 60, 72, 96, 120, 144, 192, 240, 256, 288, 352, 384}, Z0set3={20, 40, 60, 80, 120, 160, 240, 320, 352}, Z0set4={56, 112, 224, 288, 352, 384}, Z0set5={18, 36, 72, 144, 176, 192, 288, 352, 384}, Z0set6={22, 44, 88, 176, 256, 320, 352, 384}, Z0set7={13, 26, 52, 104, 176, 208, 224, 240, 256, 288, 320, 352, 384}, and Z0set8={30, 60, 120, 240, 320, 352}.

Optionally, all lifting sizes corresponding to all basic matrices with the girth greater than or equal to 6 and corresponding to an encoding rate of Rate0 determined by the each lifting size in the lifting size set Zset and the i-th coefficient matrix in the coefficient matrix set constitute the set Z0seti, and all lifting sizes corresponding to all basic matrices with the girth greater than or equal to 6 and corresponding to an encoding rate of Rate1 determined by the each lifting size in the lifting size set Zset and the i-th coefficient matrix in the coefficient matrix set constitute a set Z0set1i; where Rate0 is less than Rate1, a number of elements in the set Z0set0i is less than or equal to a number of elements in the set Z0set1i, Rate0 and Rate1 are both real numbers greater than 0 and less than 1, and both the set Z0set0i and the set Z0set1i are non-empty sets.

It is to be noted that the various modules described above may be implemented by software or hardware. Implementation by hardware may, but may not necessarily, be performed in the following manners: the various modules described above are located in a same processor, or the various modules described above are located in their respective processors in any combination form.

Embodiment 3

This embodiment is an optional embodiment of the present invention, used for supplementing and describing the present application in detail. This embodiment includes examples described below.

Example 1

Figure 3:
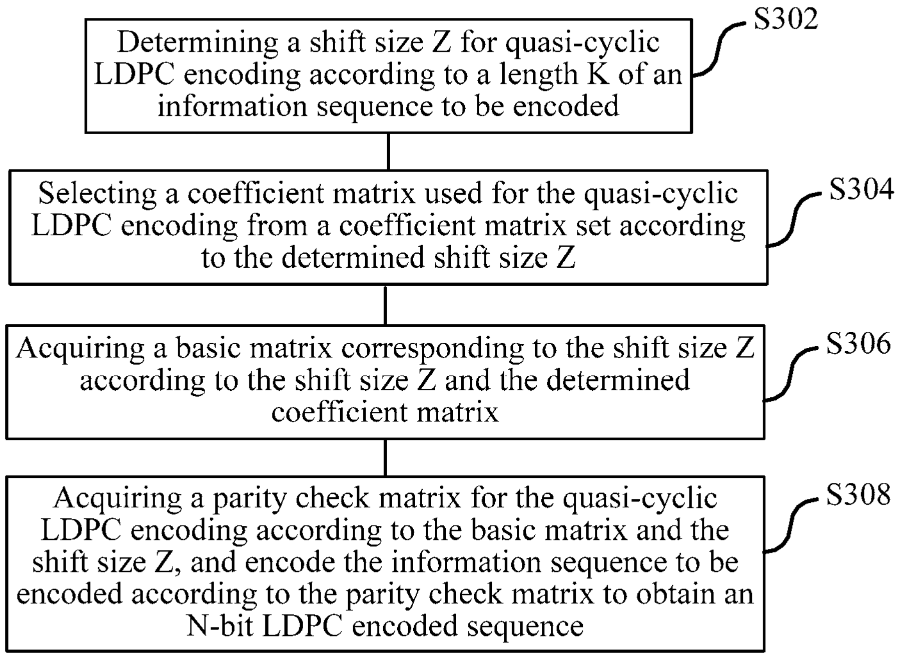
FIG. 3 is a flowchart of a design method for quasi-cyclic low-density parity-check encoding according to an example 1 of the present invention.

An embodiment of the present invention provides an example of a design method for quasi-cyclic low-density parity-check encoding. FIG. 3 is a flowchart of a design method for quasi-cyclic low-density parity-check encoding according to an example 1 of the present invention. As shown in FIG. 3, the method includes steps described below.

In step 302, a lifting size Z for the quasi-cyclic LDPC encoding is determined according to a length K of an information sequence to be encoded.

In step 304, a coefficient matrix used for the quasi-cyclic LDPC encoding is selected from a coefficient matrix set according to the determined lifting size Z.

In step 306, a basic matrix corresponding to the lifting size Z is obtained according to the lifting size Z and the determined coefficient matrix. The basic matrix has mb rows and nb columns, and a maximum number of system columns of the basic matrix is kbmax=nb−mb.

In step 308, a parity check matrix for the quasi-cyclic LDPC encoding is acquired according to the basic matrix and the lifting size Z, and the information sequence to be encoded is encoded according to the parity check matrix to obtain an N-bit LDPC encoded sequence, where K is a positive integer, N is an integer greater than K, and Z is a positive integer.

Specifically, the step 302 in which the lifting size Z for the quasi-cyclic LDPC encoding is determined according to the length K of the information sequence to be encoded includes: selecting a minimum lifting size greater than or equal to K/kb from a lifting size set Zset as the lifting size used for the current quasi-cyclic LDPC encoding, where kb is the determined maximum number of system columns corresponding to the length K of the information sequence to be encoded, kb is less than or equal to the maximum number kbmax of system columns of the basic matrix. The beneficial effect of this operation is that a minimum number of padding bits are required for the quasi-cyclic LDPC encoding and performance losses are prevented.

In step 304, the coefficient matrix set includes A=8 coefficient matrices, and lifting sizes supported by the 8 coefficient matrices have no common elements, so an index of a required coefficient matrix in the coefficient matrix set may be determined according to the determined lifting size Z, and the coefficient matrix used for the current LDPC encoding may be determined from the coefficient matrix set according to the index.

In step 306, the basic matrix corresponding to the lifting size Z may be calculated according to the determined lifting size Z and coefficient matrix. Preferably, a calculation method may be obtained by using the following calculation formula: kb, where $V_{i,j}$ is an element in an i-th row and a j-th column of the coefficient matrix corresponding to the lifting size Z and is an element of non-"−1", $P_{i,j}$ is an element in an i-th row and a j-th column of the basic matrix corresponding to the lifting size Z, a function ƒ(a, b) is a remainder (modulo) operation, that is, an integer a is divided by an integer b for a remainder. For example, if a=5 and b=10, ƒ(a, b)=5; if a=39 and b=32, ƒ(a, b)=7.

In addition, the calculation formula may also be a floor operation. For example: $P_{i,j}=f(V_{i,j},Z,Z_{max})=\text{floor}(V_{i,j}\times Z/Z_{max})$, where $P_{i,j}$ is related to three variables $V_{i,j}$, Z, and $Z_{max}$. Therefore, it may be found that the acquired coefficient matrix is practically a basic matrix corresponding to Zmax, where Zmax is a maximum lifting size supported by the coefficient matrix.

In step 308, the parity check matrix for the quasi-cyclic LDPC encoding may be obtained according to the acquired basic matrix and the lifting size Z, and the information sequence of length K to be encoded may be encoded according to the parity check matrix to obtain the LDPC encoded sequence. Before the quasi-cyclic LDPC encoding, the information sequence to be encoded needs to be filled with kb×Z−K padding bits to obtain the information sequence to be encoded of kb×Z bits. The quasi-cyclic LDPC encoding is performed on the information sequence of kb×Z bits filled with the dummy bits to obtain an original LDPC encoded sequence of nb×Z bits. Bit selection is performed on the original LDPC encoded sequence to acquire the N-bit LDPC encoded sequence corresponding to a code rate. A bit selection method is to select from a (Z×2+1)-th bit and skip the padding bits to cyclically select the N-bit LDPC encoded sequence. The filled kb×Z−K dummy bits are adopted to assist in encoding and are known for both a transmitting end and a receiving end. Therefore, these bits do not need to be transmitted. The parity check matrix is not necessarily required for the quasi-cyclic LDPC encoding in the encoding process. Since the quasi-cyclic LDPC encoding has very regular construction and strong structurality, the sequence to be encoded may directly be encoded according to the basic matrix and the lifting size.

In a more specific example, the coefficient matrix set includes 8 coefficient matrices of 46 rows and 68 columns in the embodiment 1, and lifting size subsets supported by the 8 coefficient matrices are respectively Zset1={2, 4, 8, 16, 32, 64, 128, 256}, Zset2={3, 6, 12, 24, 48, 96, 192, 384}, Zset3={5, 10, 20, 40, 80, 160, 320}, Zset4={7, 14, 28, 56, 112, 224}, Zset5={9, 18, 36, 72, 144, 288}, Zset6={11, 22, 44, 88, 176, 352}, Zset7={13, 26, 52, 104, 208}, and Zset8={15, 30, 60, 120, 240}. All elements in all the lifting size subsets constitute a set of lifting sizes Zset={Zset1, Zset2, Zset3, Zset4, Zset5, Zset6, Zset7, Zset8}. The lifting size subset corresponding to a coefficient matrix 1 is Zset1, the lifting size subset corresponding to a coefficient matrix 2 is Zset2, the lifting size subset corresponding to a coefficient matrix 3 is Zset3, the lifting size subset corresponding to a coefficient matrix 4 is Zset4, the lifting size subset corresponding to a coefficient matrix 5 is Zset5, the lifting size subset corresponding to a coefficient matrix 6 is Zset6, the lifting size subset corresponding to a coefficient matrix 7 is Zset7, and the lifting size subset corresponding to a coefficient matrix 8 is Zset8. According to a number mb=46 of rows and a number nb=68 of columns of the coefficient matrix, it may be known that kbmax=68−46=22, and kb=kbmax=22 in this example.

The LDPC encoding is performed on the information sequence of length K=6000 bits to be encoded to output the LDPC encoded sequence of length N=12000 bits. The method specifically includes steps described below.

1. The minimum lifting size greater than or equal to K/kb=6000/22 is selected from the lifting size set Zset. It may be found that Z=288 satisfies the preceding condition.

2. From the determined lifting size Z=288, it may be known that the lifting size Z=288 belongs to Zset5 and corresponds to a coefficient matrix index 5. Therefore, a fifth coefficient matrix is selected from the coefficient matrix set as the coefficient matrix corresponding to the lifting size Z.

3. The basic matrix corresponding to the lifting size Z is obtained according to the lifting size Z and the determined coefficient matrix. The basic matrix corresponding to the lifting size Z=288 is obtained by using the remainder calculation formula described above. Since the lifting size Z=288 is the maximum value in a fifth lifting size subset, the basic matrix is equal to the coefficient matrix and has mb=46 rows and nb=68 columns.

4. Since the number of system columns of the basic matrix acquired above is 22, that is, 22×288−6000=336 dummy bits need to be filled to perform the quasi-cyclic LDPC encoding, and the length of the information sequence to be encoded becomes 22×288=6336 bits. The parity check matrix for the quasi-cyclic LDPC encoding is acquired according to the basic matrix and the lifting size Z=288, the information sequence to be encoded is encoded according to the parity check matrix to obtain the original LDPC encoded sequence of nb×Z=19584 bits, and the LDPC encoded sequence of N=12000 bits is selected from the original LDPC encoded sequence.

Example 2

Figure 4:
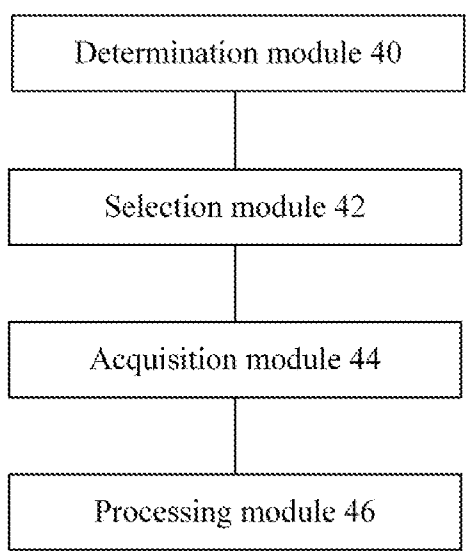
FIG. 4 is a block diagram of a design apparatus for quasi-cyclic low-density parity-check encoding according to an example 2 of the present invention.

An embodiment of the present invention provides an example of a design apparatus for quasi-cyclic low-density parity-check encoding. FIG. 4 is a block diagram of a design apparatus for quasi-cyclic low-density parity-check encoding according to an example 2 of the present invention. As shown in FIG. 4, the apparatus includes a determination module 40, a selection module 42, an acquisition module 44, and a processing module 46.

The determination module 40 is configured to determine a lifting size Z for the quasi-cyclic LDPC encoding according to a length K of an information sequence to be encoded.

The selection module 42 is configured to select a coefficient matrix used for the quasi-cyclic LDPC encoding from a coefficient matrix set according to the determined lifting size Z.

The acquisition module 44 is configured to acquire a basic matrix corresponding to the lifting size Z according to the lifting size Z and the determined coefficient matrix. The basic matrix has mb rows and nb columns, and a maximum number of system columns of the basic matrix is kbmax=nb−mb.

The processing module 46 is configured to acquire a parity check matrix for the quasi-cyclic LDPC encoding according to the basic matrix and the lifting size Z, and perform encoding on the information sequence to be encoded according to the parity check matrix to obtain an N-bit LDPC encoded sequence, where K is a positive integer, N is an integer greater than K, and Z is a positive integer.

Specifically, the determination module 40 determines the lifting size Z for the quasi-cyclic LDPC encoding according to the length K of the information sequence to be encoded by selecting a minimum lifting size greater than or equal to K/kb from a lifting size set Zset as the lifting size used for the current quasi-cyclic LDPC encoding, where kb is the determined maximum number of system columns corresponding to the length K of the information sequence to be encoded, kb is less than or equal to the maximum number kbmax of system columns of the basic matrix. The beneficial effect of this operation is that a minimum number of padding bits are required for the quasi-cyclic LDPC encoding and performance losses are prevented.

For the selection module 42, the coefficient matrix set includes A=8 coefficient matrices, and lifting sizes supported by the 8 coefficient matrices have no common elements, so an index of a required coefficient matrix in the coefficient matrix set may be determined according to the determined lifting size Z, and the coefficient matrix used for the current LDPC encoding may be determined from the coefficient matrix set according to the index.

For the acquisition module 44, the basic matrix corresponding to the lifting size Z may be calculated according to the determined lifting size Z and coefficient matrix. Preferably, a calculation method may be obtained by using the following calculation formula: kb, where $V_{i,j}$ is an element in an i-th row and a j-th column of the coefficient matrix corresponding to the lifting size Z and is an element of non-"−1", $P_{i,j}$ is an element in an i-th row and a j-th column of the basic matrix corresponding to the lifting size Z, a function $f(a, b)$ is a remainder (modulo) operation, that is, an integer a is divided by an integer b for a remainder. For example, if a=5 and b=10, $f(a, b)=5$; if a=39 and b=32, $f(a, b)=7$.

In addition, the calculation formula may also be a floor operation. For example: $P_{i,j}=f(V_{i,j},Z,Z_{max})=\text{floor}\ (V_{i,j}\times Z/Z_{max})$, where $P_{i,j}$ is related to three variables $V_{i,j}$, Z, and $Z_{max}$. Therefore, it may be found that the acquired coefficient matrix is practically a basic matrix corresponding to Zmax, where Zmax is a maximum lifting size supported by the coefficient matrix.

For the processing module 46, the parity check matrix for the quasi-cyclic LDPC encoding may be obtained according to the acquired basic matrix and the lifting size Z, and the information sequence of length K to be encoded may be encoded according to the parity check matrix to obtain the LDPC encoded sequence. Before the quasi-cyclic LDPC encoding, the information sequence to be encoded needs to be filled with kb×Z−K dummy bits to obtain the information sequence to be encoded of kb×Z bits. The quasi-cyclic LDPC encoding is performed on the information sequence of kb×Z bits filled with the dummy bits to obtain an original LDPC encoded sequence of nb×Z bits. Bit selection is performed on the original LDPC encoded sequence to acquire the N-bit LDPC encoded sequence corresponding to a code rate. A bit selection method is to select from a (Z×2+1)-th bit and skip the padding bits to cyclically select the N-bit LDPC encoded sequence. The filled kb×Z−K dummy bits are adopted to assist in encoding and are known for both a transmitting end and a receiving end. Therefore, these bits do not need to be transmitted. The parity check matrix is not necessarily required for the quasi-cyclic LDPC encoding in the encoding process. Since the quasi-cyclic LDPC encoding has very regular construction and strong structurality, the sequence to be encoded may directly be encoded according to the basic matrix and the lifting size.

In a more specific example, the coefficient matrix set includes 8 coefficient matrices of 46 rows and 68 columns in the embodiment 1, and lifting size subsets supported by the 8 coefficient matrices are respectively Zset1={2, 4, 8, 16, 32, 64, 128, 256}, Zset2={3, 6, 12, 24, 48, 96, 192, 384}, Zset3={5, 10, 20, 40, 80, 160, 320}, Zset4={7, 14, 28, 56, 112, 224}, Zset5={9, 18, 36, 72, 144, 288}, Zset6={11, 22, 44, 88, 176, 352}, Zset7={13, 26, 52, 104, 208}, and Zset8={15, 30, 60, 120, 240}. All elements in all the lifting size subsets constitute a set of lifting sizes Zset={Zset1, Zset2, Zset3, Zset4, Zset5, Zset6, Zset7, Zset8}. The lifting size subset corresponding to a coefficient matrix 1 is Zset1, the lifting size subset corresponding to a coefficient matrix 2 is Zset2, the lifting size subset corresponding to a coefficient matrix 3 is Zset3, . . . , and the lifting size subset corresponding to a coefficient matrix 8 is Zset8 According to a number mb=46 of rows and a number nb=68 of columns of the coefficient matrix, it may be known that kbmax=68−46=22, and kb=kbmax=22 in this example.

The LDPC encoding is performed on the information sequence of length K=6000 bits to be encoded to output the LDPC encoded sequence of length N=12000 bits. The method specifically includes steps described below.

1. The minimum lifting size greater than or equal to K/kb=6000/22 is selected from the lifting size set Zset. It may be found that Z=288 satisfies the preceding condition.

2. From the determined lifting size Z=288, it may be known that the lifting size Z=288 belongs to Zset5 and corresponds to a coefficient matrix index 5. Therefore, a fifth coefficient matrix is selected from the coefficient matrix set as the coefficient matrix corresponding to the lifting size Z.

3. The basic matrix corresponding to the lifting size Z is obtained according to the lifting size Z and the determined coefficient matrix. The basic matrix corresponding to the lifting size Z=288 is obtained by using the remainder calculation formula described above. Since the lifting size Z=288 is the maximum value in a fifth lifting size subset, the basic matrix is equal to the coefficient matrix and has mb=46 rows and nb=68 columns.

4. Since the number of system columns of the basic matrix acquired above is 22, that is, 22×288−6000=336 dummy bits need to be filled to perform the quasi-cyclic LDPC encoding, and the length of the information sequence to be encoded becomes 22×288=6336 bits. The parity check matrix for the quasi-cyclic LDPC encoding is acquired according to the basic matrix and the lifting size Z=288, the information sequence to be encoded is encoded according to the parity check matrix to obtain the original LDPC encoded sequence of nb×Z=19584 bits, and the LDPC encoded sequence of N=12000 bits is selected from the original LDPC encoded sequence.

In the technical solutions in this embodiment, the design method for quasi-cyclic LDPC encoding and the corresponding apparatus may effectively solve the problem of poor performance of a quasi-cyclic LDPC code and improve quasi-cyclic LDPC encoding performance.

Embodiment 4

An embodiment of the present invention further provides a storage medium. Optionally, in this embodiment, the storage medium may be configured to store program codes for executing a step described below.

In S1, according to a parity check matrix of a quasi-cyclic low-density parity-check (LDPC) code, LDPC encoding is performed on a K-bit information sequence to be encoded to obtain an N-bit LDPC encoded sequence.

Optionally, in this embodiment, the storage medium may include, but is not limited to, a USB flash disk, a read-only memory (ROM), a random access memory (RAM), a mobile hard disk, a magnetic disk, an optical disk or another medium capable of storing program codes.

Optionally, in this embodiment, a processor performs, according to the program codes stored in the storage medium, the following step: according to a parity check matrix of a quasi-cyclic low-density parity-check (LDPC) code, LDPC encoding is performed on a K-bit information sequence to be encoded to obtain an N-bit LDPC encoded sequence.

Optionally, for specific examples in this embodiment, reference may be made to the examples described in the above-mentioned embodiments and optional implementation modes, and repetition will not be made in this embodiment.

Apparently, it should be understood by those skilled in the art that each of the above-mentioned modules or steps of the present invention may be implemented by a general-purpose computing apparatus, the modules or steps may be concentrated on a single computing apparatus or distributed on a network composed of multiple computing apparatuses, and alternatively, the modules or steps may be implemented by program codes executable by the computing apparatus, so that the modules or steps may be stored in a storage apparatus and executed by the computing apparatus. In some circumstances, the illustrated or described steps may be executed in sequences different from those described herein, or the modules or steps may be made into various integrated circuit modules separately, or multiple modules or steps therein may be made into a single integrated circuit module for implementation. In this way, the present invention is not limited to any specific combination of hardware and software.

The above are only preferred embodiments of the present invention and are not intended to limit the present invention. For those skilled in the art, the present invention may have various modifications and variations. Any modifications, equivalent substitutions, improvements and the like made within the spirit and principle of the present invention should fall within the scope of the present invention.

It should be understood by those skilled in the art that the embodiments of the present invention may be provided as methods, systems, or computer program products. Therefore, the present invention may adopt a form of a hardware embodiment, a software embodiment, or a combination of hardware and software embodiments. In addition, the present invention may adopt a form of a computer program product implemented on one or more computer-usable storage media (including, but not limited to, a disk memory, an optical memory, and the like) which include computer-usable program codes.

The present invention is described with reference to flowcharts and/or block diagrams of methods, devices (systems) and computer program products according to the embodiments of the present invention. It should be understood that computer program instructions may implement each flow and/or block in the flowcharts and/or block diagrams and a combination of flows and/or blocks in the flowcharts and/or block diagrams. These computer program instructions may be provided to a general-purpose computer, a special-purpose computer, an embedded processor or a processor of another programmable data processing device to produce a machine so that instructions executed by a computer or the processor of another programmable data processing device produce a means for implementing functions specified in one or more flows in the flowcharts and/or one or more blocks in the block diagrams.

These computer program instructions may also be stored in a computer-readable memory which may direct the computer or another programmable data processing device to operate in a particular manner so that the instructions stored in the computer-readable memory produce a manufactured product including an instructing means. The instructing means implements the functions specified in one or more flows in the flowcharts and/or one or more blocks in the block diagrams.

These computer program instructions may also be loaded onto the computer or another programmable data processing device so that a series of operation steps are performed on the computer or another programmable device to produce processing implemented by the computer. Therefore, instructions executed on the computer or another programmable device provide steps for implementing the functions specified in one or more flows in the flowcharts and/or one or more blocks in the block diagrams.

The above are only preferred embodiments of the present invention and are not intended to limit the scope of the present invention.

INDUSTRIAL APPLICABILITY

In the embodiments of the present invention, the LDPC encoding is performed on the K-bit information sequence to be encoded according to the parity check matrix of the quasi-cyclic LDPC code, where the parity check matrix is determined according to the basic matrix and the lifting size Z, and the basic matrix is determined according to the lifting size Z and the coefficient matrix. The present invention solves the problem in the related art of poor performance of the quasi-cyclic LDPC code and effectively improves quasi-cyclic LDPC encoding performance.

The invention claimed is:

1. A method for wireless communication, comprising:

performing, by a transmitting end, LDPC encoding on an input sequence having K bits according to a parity check matrix of a low-density parity-check (LDPC) code;

obtaining an encoded sequence having N bits by the transmitting end from the LDPC encoding of the input sequence having K bits; and performing, by the transmitting end, a transmission to a receiving end based on the encoded sequence, wherein the parity check matrix is determined based on at least a basic matrix that is determined according to a lifting size Z and a coefficient matrix in a set of coefficient matrices, wherein K is a positive integer, N is an integer greater than K, and Z is a positive integer, and wherein elements of the coefficient matrix comprises:

3,26,53,35,−1,−1,115,−1,−1,127,0,0,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1,−1;

19,–1,–1,94,104,66,84,98,69,50,–1,0,0,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1;

95,106,–1,92,110,–1,–1,–1,111,–1,1,–1,0,0,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1;

–1,120,121,–1,22,4,73,49,128,79,0,–1,–1,0,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1;

42,24,–1,–1,–1,–1,–1,–1,–1,–1,–1,51,–1,–1,0,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1;

40,140,–1,–1,–1,84,–1,137,–1,–1,–1,71,–1,–1,–1,0,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1;

109,–1,–1,–1,–1,87,–1,107,–1,133,–1,139,–1,–1,–1,–1,0,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1;

–1,97,–1,–1,–1,135,–1,35,–1,–1,–1,108,–1,65,–1,–1,–1,0,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1;

70,69,–1,–1,–1,–1,–1,–1,–1,–1,–1,–1,88,–1,–1,–1,–1,–1,0,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1;

–1,97,–1,–1,–1,–1,–1,–1,40,–1,24,49,–1,–1,–1,–1,–1,–1,–1,0,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1;

46,41,–1,–1,–1,–1,101,96,–1,–1,–1,–1,–1,–1,–1,–1,–1,–1,–1,–1,0,–1,–1,–1,–1,–1,–1,–1,–1,–1,–1,–1,–1,–1,–1,–1,–1,–1,–1,–1,–1,–1,–1,–1,–1,–1,–1,–1,–1,–1;

28,–1,–1,–1,–1,–1,–1,30,–1,116,–1,–1,–1,64,–1,–1,–1,–1,–1,–1,–1,0,–1,–1,–1,–1,–1,–1,–1,–1,–1,–1,–1,–1,–1,–1,–1,–1,–1,–1,–1,–1,–1,–1,–1,–1,–1,–1,–1,–1;

–1,33,–1,122,–1,–1,–1,–1,–1,–1,–1,131,–1,–1,–1,–1,–1,–1,–1,–1,–1,–1,0,–1,–1,–1,–1,–1,–1,–1,–1,–1,–1,–1,–1,–1,–1,–1,–1,–1,–1,–1,–1,–1,–1,–1,–1,–1,–1,–1;

76,37,–1,–1,–1,–1,–1,–1,62,–1,–1,–1,–1,47,–1,–1,–1,–1,–1,–1,–1,–1,–1,0,–1,–1,–1,–1,–1,–1,–1,–1,–1,–1,–1,–1,–1,–1,–1,–1,–1,–1,–1,–1,–1,–1,–1,–1,–1,–1;

–1,143,–1,–1,–1,–1,51,–1,–1,–1,–1,130,–1,97,–1,–1,–1,–1,–1,–1,–1,–1,–1,0,–1,–1,–1,–1,–1,–1,–1,–1,–1,–1,–1,–1,–1,–1,–1,–1,–1,–1,–1,–1,–1,–1,–1,–1,–1,–1;

139,–1,–1,–1,–1,–1,–1,–1,–1,–1,96,128,–1,–1,–1,–1,–1,–1,–1,–1,–1,–1,–1,–1,0,–1,–1,–1,–1,–1,–1,–1,–1,–1,–1,–1,–1,–1,–1,–1,–1,–1,–1,–1,–1,–1,–1,–1,–1,–1;

–1,48,–1,–1,–1,–1,–1,–1,–1,9,–1,28,8,–1,–1,–1,–1,–1,–1,–1,–1,–1,–1,–1,–1,–1,0,–1,–1,–1,–1,–1,–1,–1,–1,–1,–1,–1,–1,–1,–1,–1,–1,–1,–1,–1,–1,–1,–1,–1;

–1,120,–1,–1,–1,43,–1,–1,–1,–1,–1,65,42,–1,–1,–1,–1,–1,–1,–1,–1,–1,–1,–1,–1,–1,0,–1,–1,–1,–1,–1,–1,–1,–1,–1,–1,–1,–1,–1,–1,–1,–1,–1,–1,–1,–1,–1,–1,–1;

17,–1,–1,–1,–1,–1,106,142,–1,–1,–1,–1,–1,–1,–1,–1,–1,–1,–1,–1,–1,–1,–1,–1,–1,–1,–1,0,–1,–1,–1,–1,–1,–1,–1,–1,–1,–1,–1,–1,–1,–1,–1,–1,–1,–1,–1,–1,–1,–1;

79,28,–1,–1,–1,–1,–1,–1,–1,–1,41,–1,–1,–1,–1,–1,–1,–1,–1,–1,–1,–1,–1,–1,–1,–1,–1,–1,0,–1,–1,–1,–1,–1,–1,–1,–1,–1,–1,–1,–1,–1,–1,–1,–1,–1,–1,–1,–1,–1;

–1,2,–1,–1,103,–1,–1,–1,–1,–1,–1,78,–1,–1,–1,–1,–1,–1,–1,–1,–1,–1,–1,–1,–1,–1,–1,–1,–1,0,–1,–1,–1,–1,–1,–1,–1,–1,–1,–1,–1,–1,–1,–1,–1,–1,–1,–1,–1,–1;

91,–1,–1,–1,–1,–1,–1,–1,75,–1,–1,–1,–1,81,–1,–1,–1,–1,–1,–1,–1,–1,–1,–1,–1,–1,–1,–1,–1,–1,0,–1,–1,–1,–1,–1,–1,–1,–1,–1,–1,–1,–1,–1,–1,–1,–1,–1,–1,–1;

–1,54,132,–1,–1,–1,–1,–1,–1,–1,–1,–1,–1,–1,–1,–1,–1,–1,–1,–1,–1,–1,–1,–1,–1,–1,–1,–1,–1,–1,–1,0,–1,–1,–1,–1,–1,–1,–1,–1,–1,–1,–1,–1,–1,–1,–1,–1,–1,–1;

68,–1,–1,115,–1,56,–1,–1,–1,–1,–1,–1,–1,–1,–1,–1,–1,–1,–1,–1,–1,–1,–1,–1,–1,–1,–1,–1,–1,–1,–1,–1,0,–1,–1,–1,–1,–1,–1,–1,–1,–1,–1,–1,–1,–1,–1,–1,–1,–1;

–1,30,42,–1,–1,–1,–1,–1,–1,101,–1,–1,–1,–1,–1,–1,–1,–1,–1,–1,–1,–1,–1,–1,–1,–1,–1,–1,–1,–1,–1,–1,–1,0,–1,–1,–1,–1,–1,–1,–1,–1,–1,–1,–1,–1,–1,–1,–1,–1;

128,–1,–1,–1,–1,63,–1,–1,–1,–1,–1,–1,–1,–1,–1,–1,–1,–1,–1,–1,–1,–1,–1,–1,–1,–1,–1,–1,–1,–1,–1,–1,–1,–1,0,–1,–1,–1,–1,–1,–1,–1,–1,–1,–1,–1,–1,–1,–1,–1;

–1,–1,142,–1,–1,–1,–1,28,–1,–1,–1,–1,100,133,–1,–1,–1,–1,–1,–1,–1,–1,–1,–1,–1,–1,–1,–1,–1,–1,–1,–1,–1,–1,–1,0,–1,–1,–1,–1,–1,–1,–1,–1,–1,–1,–1,–1,–1,–1;

13,–1,–1,–1,–1,–1,10,–1,–1,–1,–1,–1,–1,–1,–1,–1,–1,–1,–1,–1,–1,–1,–1,–1,–1,–1,–1,–1,–1,–1,–1,–1,–1,–1,–1,–1,0,–1,–1,–1,–1,–1,–1,–1,–1,–1,–1,–1,–1,–1;

–1,106,77,–1,–1,43,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,0,–1,–1,–1,–1,–1,–1,–1,–1,–1,–1,–1,–1;

133,–1,–1,–1,25,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,0,–1,–1,–1,–1,–1,–1,–1,–1,–1,–1,–1;

–1,–1,87,–1,–1,56,–1,104,–1,70,–1,–1,–1,–1,–1,–1,–1,–1,–1,–1,–1,–1,–1,–1,–1,–1,–1,–1,–1,–1,–1,–1,–1,–1,–1,–1,–1,–1,–1,0,–1,–1,–1,–1,–1,–1,–1,–1,–1,–1;

–1,80,–1,–1,–1,–1,–1,–1,–1,–1,–1,–1,–1,139,–1,–1,–1,–1,–1,–1,–1,–1,–1,–1,–1,–1,–1,–1,–1,–1,–1,–1,–1,–1,–1,–1,–1,–1,–1,0,–1,–1,–1,–1,–1,–1,–1,–1,–1,–1;

32,–1,–1,–1,–1,89,–1,–1,–1,–1,–1,–1,71,–1,–1,–1,–1,–1,–1,–1,–1,–1,–1,–1,–1,–1,–1,–1,–1,–1,–1,–1,–1,–1,–1,–1,–1,–1,–1,–1,0,–1,–1,–1,–1,–1,–1,–1,–1,–1;

–1,–1,135,–1,–1,–1,–1,6,–1,–1,2,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,0,–1,–1,–1,–1,–1,–1,–1,–1;

37,–1,–1,–1,–1,–1,–1,–1,–1,–1,–1,–1,25,114,–1,–1,–1,–
1,–1,–1,–1,–1,–1,–1,–1,–1,–1,–1,–1,–1,–1,–1,–
1,–1,–1,–1,–1,–1,–1,–1,–1,–1,–1,0,–1,–1,–1,–1,–1,–
1,–1;
–1,60,–1,–1,–1,137,–1,–1,–1,–1,–1,93,–1,–1,–1,–1,–1,–
1,–1,–1,–1,–1,–1,–1,–1,–1,–1,–1,–1,–1,–1,–1,–
1,–1,–1,–1,–1,–1,–1,–1,–1,–1,–1,0,–1,–1,–1,–1,–
1,–1;
121,–1,129,–1,–1,–1,–1,26,–1,–1,–1,–1,–1,–1,–1,–1,–
1,–1,–1,–1,–1,–1,–1,–1,–1,–1,–1,–1,–1,–1,–1,–
1,–1,–1,–1,–1,–1,–1,–1,–1,–1,–1,–1,–1,0,–1,–1,–
1,–1,–1;
–1,–1,–1,–1,–1,–1,–1,–1,–1,–1,97,–1,–1,56,–1,–1,–1,–
1,–1,–1,–1,–1,–1,–1,–1,–1,–1,–1,–1,–1,–1,–1,–
1,–1,–1,–1,–1,–1,–1,–1,–1,–1,–1,–1,–1,–1,0,–1,–1,–
1,–1;
–1,1,–1,–1,–1,70,–1,–1,–1,–1,–1,1,–1,–1,–1,–1,–1,–1,–
1,–1,–1,–1,–1,–1,–1,–1,–1,–1,–1,–1,–1,–1,–1,–
1,–1,–1,–1,–1,–1,–1,–1,–1,–1,–1,–1,–1,0,–1,–1,–
1;
119,–1,–1,–1,–1,–1,–1,32,–1,–1,–1,–1,142,–1,–1,–1,–
1,–1,–1,–1,–1,–1,–1,–1,–1,–1,–1,–1,–1,–1,–1,–
1,–1,–1,–1,–1,–1,–1,–1,–1,–1,–1,–1,–1,–1,–1,–1,
0,–1,–1;
–1,–1,6,–1,–1,–1,–1,–1,–1,–1,73,–1,–1,102,–1,–1,–1,–
1,–1,–1,–1,–1,–1,–1,–1,–1,–1,–1,–1,–1,–1,–1,–
1,–1,–1,–1,–1,–1,–1,–1,–1,–1,–1,–1,–1,–1,–1,–1,
0,–1;
–1,48,–1,–1,–1,47,–1,–1,–1,–1,–1,19,–1,–1,–1,–1,–1,–
1,–1,–1,–1,–1,–1,–1,–1,–1,–1,–1,–1,–1,–1,–1,–
1,–1,–1,–1,–1,–1,–1,–1,–1,–1,–1,–1,–1,–1,–1,–
1,–1,0;

wherein –1 represents a null value.

2. The method of claim 1, wherein all coefficient matrices in the set of coefficient matrices have 42 rows and 52 columns.

3. The method of claim 1, wherein the shift size Z is an element in a shift size set Zset, elements in the shift size set Zset are grouped in A shift size subsets and an i-th shift size subset among the A shift size subsets denoted as Zseti (i=1, 2, 3, . . . , A), and wherein the A shift size subsets have no common element, A being an integer greater than 1;

wherein the set of coefficient matrices comprises A coefficient matrices; and wherein an i-th coefficient matrix in the set of coefficient matrices corresponds to the i-th shift size subset Zseti.

4. The method of claim 1, wherein the basic matrix has a same number of rows and a same number of columns as the coefficient matrix.

5. The method of claim 1, wherein the parity check matrix is further determined based on the lifting size Z.

6. A method for wireless communication, comprising:

performing, a transmitting end, LDPC encoding on an input sequence having K bits according to a parity check matrix of a low-density parity-check (LDPC) code;

obtaining an encoded sequence having N bits by the transmitting end from the LDPC encoding of the input sequence having K bits; and performing, by the transmitting end, a transmission to a receiving end based on the encoded sequence, wherein the parity check matrix is determined based on at least a matrix that is determined according to a lifting size Z and a set of coefficient matrices, wherein K is a positive integer, N is an integer greater than K, and Z is a positive integer, and wherein elements of the coefficient matrix comprise:

0,0,0,0,–1,0,0,–1,–1,0,0,0,0,0,–1,0,0,–1,0,0,0,0,0,0,–1,–
1,–1,–1,–1,–1,–1,–1,–1,–1,–1,–1,–1,–1,–1,–1,–
1,–1,–1,–1,–1,–1,–1,–1,–1,–1,–1,–1,–1,–1,–1,–
1,–1,–1,–1,–1,–1,–1,–1,–1,–1;
22,–1,11,124,0,10,–1,0,0,2,–1,16,60,–1,0,6,30,0,–1,
168,–1,31,105,0,0,–1,–1,–1,–1,–1,–1,–1,–1,–1,–
1,–1,–1,–1,–1,–1,–1,–1,–1,–1,–1,–1,–1,–1,–1,–
1,–1,–1,–1,–1,–1,–1,–1,–1,–1,–1,–1,–1,–1,–1,–1;
132,37,21,–1,180,4,149,48,38,122,195,–1,–1,155,28,
85,–1,47,179,42,66,–1,–1,–1,0,0,–1,–1,–1,–1,–1,–1,–
1,–1,–1,–1,–1,–1,–1,–1,–1,–1,–1,–1,–1,–1,–1,–
1,–1,–1,–1,–1,–1,–1,–1,–1,–1,–1,–1,–1,–1,–1,–
1,–1,–1,–1;
4,6,–1,33,113,–1,49,21,6,–1,151,83,154,87,5,–1,92,173,
120,–1,2,142,0,–1,–1,0,–1,–1,–1,–1,–1,–1,–1,–1,–1,–
1,–1,–1,–1,–1,–1,–1,–1,–1,–1,–1,–1,–1,–1,–1,–
1,–1,–1,–1,–1,–1,–1,–1,–1,–1,–1,–1,–1,–1,–1,–1;
24,204,–1,–1,–1,–1,–1,–1,–1,–1,–1,–1,–1,–1,–1,–
1,–1,–1,–1,–1,–1,–1,–1,–1,0,–1,–1,–1,–1,–1,–1,–
1,–1,–1,–1,–1,–1,–1,–1,–1,–1,–1,–1,–1,–1,–1,–
1,–1,–1,–1,–1,–1,–1,–1,–1,–1,–1,–1,–1,–1,–1,–
1,–1,–1;
185,100,–1,24,–1,–1,–1,–1,–1,–1,–1,–1,65,–1,–1,–1,
207,–1,–1,–1,–1,161,72,–1,–1,–1,–1,0,–1,–1,–1,–1,–
1,–1,–1,–1,–1,–1,–1,–1,–1,–1,–1,–1,–1,–1,–1,–
1,–1,–1,–1,–1,–1,–1,–1,–1,–1,–1,–1,–1,–1,–1,–
1,–1,–1,–1;
6,–1,–1,–1,–1,–1,27,–1,–1,–1,163,50,–1,48,–1,–1,–1,
24,38,–1,91,–1,–1,–1,–1,–1,–1,–1,0,–1,–1,–1,–1,–1,–
1,–1,–1,–1,–1,–1,–1,–1,–1,–1,–1,–1,–1,–1,–1,–
1,–1,–1,–1,–1,–1,–1,–1,–1,–1,–1,–1,–1,–1,–1,–
1,–1;
145,88,–1,–1,112,–1,–1,153,159,–1,–1,–1,–1,–1,76,–
1,–1,–1,–1,–1,–1,–1,–1,–1,–1,–1,–1,–1,–1,0,–1,–1,–
1,–1,–1,–1,–1,–1,–1,–1,–1,–1,–1,–1,–1,–1,–1,–
1,–1,–1,–1,–1,–1,–1,–1,–1,–1,–1,–1,–1,–1,–1,–
1,–1,–1,–1;
172,2,–1,131,–1,–1,–1,–1,–1,–1,–1,–1,141,–1,–1,–1,
96,–1,–1,99,–1,101,35,–1,116,–1,–1,–1,–1,–1,0,–1,–
1,–1,–1,–1,–1,–1,–1,–1,–1,–1,–1,–1,–1,–1,–1,–
1,–1,–1,–1,–1,–1,–1,–1,–1,–1,–1,–1,–1,–1,–1,–
1,–1,–1,–1;
6,10,–1,–1,–1,–1,–1,–1,–1,–1,145,53,–1,201,–1,–1,–1,
4,164,–1,173,–1,–1,–1,–1,–1,–1,–1,–1,–1,–1,0,–1,–
1,–1,–1,–1,–1,–1,–1,–1,–1,–1,–1,–1,–1,–1,–1,–
1,–1,–1,–1,–1,–1,–1,–1,–1,–1,–1,–1,–1,–1,–1,–
1,–1,–1;
–1,126,77,–1,156,–1,–1,16,12,–1,–1,–1,–1,–1,70,–1,–
1,–1,–1,–1,–1,–1,–1,–1,–1,–1,–1,–1,–1,–1,–1,–1,0,–
1,–1,–1,–1,–1,–1,–1,–1,–1,–1,–1,–1,–1,–1,–1,–
1,–1,–1,–1,–1,–1,–1,–1,–1,–1,–1,–1,–1,–1,–1,–
1,–1,–1;
184,194,–1,–1,–1,–1,–1,–1,–1,–1,–1,–1,123,–1,–1,–1,
16,–1,–1,–1,–1,104,109,124,–1,–1,–1,–1,–1,–1,–1,–
1,–1,0,–1,–1,–1,–1,–1,–1,–1,–1,–1,–1,–1,–1,–1,–
1,–1,–1,–1,–1,–1,–1,–1,–1,–1,–1,–1,–1,–1,–1,–
1,–1,–1,–1;
6,20,–1,–1,–1,–1,–1,–1,–1,–1,203,153,–1,104,–1,–1,–
1,–1,207,–1,–1,–1,–1,–1,–1,–1,–1,–1,–1,–1,–1,–1,–
1,–1,0,–1,–1,–1,–1,–1,–1,–1,–1,–1,–1,–1,–1,–1,–
1,–1,–1,–1,–1,–1,–1,–1,–1,–1,–1,–1,–1,–1,–1,–
1,–1,–1;
52,–1,–1,147,–1,–1,–1,1,–1,–1,–1,–1,–1,–1,–1,–1,–1,–
1,–1,–1,16,–1,–1,46,–1,–1,–1,–1,–1,–1,–1,–1,–1,–1,–
1,0,–1,–1,–1,–1,–1,–1,–1,–1,–1,–1,–1,–1,–1,–1,–1,–
1,–1,–1,–1,–1,–1,–1,–1,–1,–1,–1,–1,–1,–1,–1,–1;

1,–1,–1,–1,–1,–1,–1,–1,–1,–1,–1,–1,202,–1,–1,118,130,1,–1,–1,–1,2,–1,–1,–1,–1,–1,–1,–1,–1,–1,–1,–1,–1,–1,0,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1;

173,6,–1,–1,–1,–1,–1,–1,–1,–1,81,–1,–1,182,–1,–1,–1,–1,53,–1,–1,–1,–1,–1,–1,46,–1,–1,–1,–1,–1,–1,–1,–1,–1,–1,0,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1;

–1,88,–1,198,–1,–1,–1,–1,–1,–1,–1,160,–1,–1,–1,–1,–1,–1,–1,–1,122,–1,182,–1,–1,–1,–1,–1,–1,–1,–1,–1,–1,–1,–1,–1,–1,–1,0,–1,–1,–1,–1,–1,–1,–1,–1,–1,–1,–1,–1,–1,–1,–1,–1,–1,–1,–1,–1,–1,–1,–1,–1,–1,–1,–1,–1,–1;

91,–1,–1,–1,–1,–1,–1,–1,–1,–1,–1,–1,–1,–1,184,–1,30,3,–1,–1,–1,155,–1,–1,–1,–1,–1,–1,–1,–1,–1,–1,–1,–1,–1,–1,–1,–1,0,–1,–1,–1,–1,–1,–1,–1,–1,–1,–1,–1,–1,–1,–1,–1,–1,–1,–1,–1,–1,–1,–1,–1,–1,–1,–1,–1;

–1,1,–1,–1,–1,–1,–1,–1,–1,–1,–1,–1,41,167,–1,–1,–1,–1,68,148,–1,–1,–1,–1,–1,–1,–1,–1,–1,–1,–1,–1,–1,–1,–1,–1,–1,–1,–1,0,–1,–1,–1,–1,–1,–1,–1,–1,–1,–1,–1,–1,–1,–1,–1,–1,–1,–1,–1,–1,–1,–1,–1,–1,–1,–1;

12,6,–1,–1,–1,–1,–1,166,184,–1,191,–1,–1,–1,–1,–1,–1,–1,–1,–1,–1,–1,–1,–1,–1,–1,–1,–1,–1,–1,–1,–1,–1,–1,–1,–1,–1,–1,–1,–1,0,–1,–1,–1,–1,–1,–1,–1,–1,–1,–1,–1,–1,–1,–1,–1,–1,–1,–1,–1,–1,–1,–1,–1,–1,–1,–1;

6,–1,–1,12,–1,–1,–1,–1,–1,15,–1,5,–1,–1,–1,–1,–1,–1,–1,–1,–1,–1,30,–1,–1,–1,–1,–1,–1,–1,–1,–1,–1,–1,–1,–1,–1,–1,–1,–1,–1,0,–1,–1,–1,–1,–1,–1,–1,–1,–1,–1,–1,–1,–1,–1,–1,–1,–1,–1,–1,–1,–1,–1,–1,–1;

–1,6,–1,–1,–1,86,–1,–1,–1,–1,–1,–1,–1,–1,–1,–1,96,–1,–1,–1,42,199,–1,–1,–1,–1,–1,–1,–1,–1,–1,–1,–1,–1,–1,–1,–1,–1,–1,–1,–1,–1,0,–1,–1,–1,–1,–1,–1,–1,–1,–1,–1,–1,–1,–1,–1,–1,–1,–1,–1,–1,–1,–1,–1,–1;

44,–1,–1,–1,–1,–1,–1,–1,–1,–1,–1,–1,58,130,–1,–1,–1,131,–1,–1,–1,–1,–1,–1,–1,–1,–1,–1,–1,–1,–1,–1,–1,–1,–1,–1,–1,–1,–1,–1,–1,–1,–1,0,–1,–1,–1,–1,–1,–1,–1,–1,–1,–1,–1,–1,–1,–1,–1,–1,–1,–1,–1,–1,–1,–1;

–1,45,18,–1,–1,–1,–1,–1,–1,–1,132,–1,–1,–1,–1,–1,–1,–1,100,–1,–1,–1,–1,–1,–1,–1,–1,–1,–1,–1,–1,–1,–1,–1,–1,–1,–1,–1,–1,–1,–1,–1,–1,–1,–1,0,–1,–1,–1,–1,–1,–1,–1,–1,–1,–1,–1,–1,–1,–1,–1,–1,–1,–1,–1,–1;

9,–1,–1,125,191,–1,–1,–1,–1,–1,–1,28,–1,–1,–1,–1,–1,–1,–1,–1,–1,–1,6,–1,–1,–1,–1,–1,–1,–1,–1,–1,–1,–1,–1,–1,–1,–1,–1,–1,–1,–1,–1,–1,–1,–1,0,–1,–1,–1,–1,–1,–1,–1,–1,–1,–1,–1,–1,–1,–1,–1,–1,–1,–1,–1,–1,–1;

–1,4,–1,–1,–1,–1,74,16,–1,–1,–1,–1,–1,–1,28,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,0,–1,–1,–1,–1,–1,–1,–1,–1,–1,–1,–1,–1,–1,–1,–1,–1,–1,–1,–1;

21,–1,142,–1,192,–1,–1,–1,–1,–1,–1,–1,–1,–1,–1,197,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,0,–1,–1,–1,–1,–1,–1,–1,–1,–1,–1,–1,–1,–1,–1,–1,–1,–1,–1;

–1,98,–1,–1,–1,–1,140,–1,22,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,0,–1,–1,–1,–1,–1,–1,–1,–1,–1,–1,–1,–1,–1,–1,–1,–1,–1;

4,–1,–1,–1,1,–1,–1,–1,–1,–1,–1,–1,–1,–1,–1,–1,–1,–1,–1,40,–1,93,–1,–1,–1,–1,–1,–1,–1,–1,–1,–1,–1,–1,–1,–1,–1,–1,–1,–1,–1,–1,–1,–1,–1,–1,–1,–1,–1,–1,0,–1,–1,–1,–1,–1,–1,–1,–1,–1,–1,–1,–1,–1,–1,–1,–1,–1;

–1,92,–1,–1,–1,–1,–1,–1,–1,–1,–1,–1,–1,–1,136,–1,–1,–1,106,–1,–1,–1,–1,–1,–1,6,–1,–1,–1,–1,–1,–1,–1,–1,–1,–1,–1,–1,–1,–1,–1,–1,–1,–1,–1,–1,–1,–1,–1,–1,–1,0,–1,–1,–1,–1,–1,–1,–1,–1,–1,–1,–1,–1,–1,–1,–1;

2,–1,–1,–1,–1,–1,–1,–1,–1,–1,88,–1,–1,112,–1,–1,–1,–1,–1,–1,–1,–1,–1,–1,20,–1,–1,–1,–1,–1,–1,–1,–1,–1,–1,–1,–1,–1,–1,–1,–1,–1,–1,–1,–1,–1,–1,–1,–1,–1,–1,–1,0,–1,–1,–1,–1,–1,–1,–1,–1,–1,–1,–1,–1,–1,–1,–1;

–1,4,–1,–1,–1,–1,–1,49,–1,–1,–1,–1,–1,–1,–1,–1,–1,–1,–1,–1,–1,–1,125,–1,–1,194,–1,–1,–1,–1,–1,–1,–1,–1,–1,–1,–1,–1,–1,–1,–1,–1,–1,–1,–1,–1,–1,–1,–1,–1,–1,–1,0,–1,–1,–1,–1,–1,–1,–1,–1,–1,–1,–1,–1,–1;

6,–1,–1,–1,–1,–1,–1,–1,–1,–1,–1,–1,126,–1,63,–1,–1,–1,–1,–1,–1,–1,–1,–1,20,–1,–1,–1,–1,–1,–1,–1,–1,–1,–1,–1,–1,–1,–1,–1,–1,–1,–1,–1,–1,–1,–1,–1,–1,–1,–1,–1,–1,0,–1,–1,–1,–1,–1,–1,–1,–1,–1,–1,–1,–1;

–1,10,30,–1,–1,–1,–1,–1,–1,–1,–1,6,–1,–1,–1,–1,–1,–1,–1,–1,–1,92,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,0,–1,–1,–1,–1,–1,–1,–1,–1,–1,–1,–1;

4,–1,–1,–1,–1,–1,–1,153,–1,–1,–1,–1,–1,–1,–1,197,–1,155,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,0,–1,–1,–1,–1,–1,–1,–1,–1,–1,–1;

–1,4,–1,–1,–1,–1,45,–1,–1,–1,–1,–1,168,–1,–1,–1,–1,–1,–1,–1,–1,–1,185,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,0,–1,–1,–1,–1,–1,–1,–1,–1,–1;

6,–1,–1,–1,–1,–1,–1,–1,–1,–1,–1,–1,–1,–1,200,177,–1,–1,43,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,0,–1,–1,–1,–1,–1,–1,–1,–1;

–1,82,–1,–1,–1,–1,–1,–1,–1,–1,–1,–1,–1,2,–1,–1,–1,–1,–1,–1,–1,–1,–1,135,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,0,–1,–1,–1,–1,–1,–1,–1,–1;

91,–1,–1,–1,–1,–1,–1,–1,–1,64,198,–1,100,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,0,–1,–1,–1,–1,–1,–1,–1;

–1,4,–1,28,–1,–1,–1,109,–1,–1,–1,–1,–1,–1,–1,–1,–1,–1,–1,–1,188,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,0,–1,–1,–1,–1,–1,–1;

10,–1,–1,–1,–1,–1,–1,–1,84,–1,–1,–1,–1,–1,–1,–1,–1,12,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,0,–1,–1,–1,–1,–1;

–1,2,–1,75,–1,–1,–1,–1,–1,142,–1,–1,–1,–1,–1,–1,–1,–1,128,–1,–1,–1,–1,–1,–1,–1,–1,–1,–1,–1,–1,–1,–1,–

1,–1,–1,–1,–1,–1,–1,–1,–1,–1,–1,–1,–1,–1,–1,–1,–
1,–1,–1,–1,–1,–1,–1,–1,–1,–1,–1,–1,–1,0,–1,–1,–
1,–1;
163,–1,–1,–1,10,–1,–1,–1,–1,–1,–1,–1,–1,–1,–1,–1,–
1,–1,–1,–1,–1,–1,–1,–1,162,–1,–1,–1,–1,–1,–1,–1,–
1,–1,–1,–1,–1,–1,–1,–1,–1,–1,–1,–1,–1,–1,–1,–1,–
1,–1,–1,–1,–1,–1,–1,–1,–1,–1,–1,–1,–1,–1,–1,0,–
1,–1,–1;
–1,1,–1,–1,–1,–1,–1,–1,–1,–1,–1,–1,–1,–1,–1,–1,163,–
1,99,–1,–1,–1,–1,–1,–1,98,–1,–1,–1,–1,–1,–1,–1,–1,–
1,–1,–1,–1,–1,–1,–1,–1,–1,–1,–1,–1,–1,–1,–1,–1,–
1,–1,–1,–1,–1,–1,–1,–1,–1,–1,–1,–1,–1,–1,–1,0,–1,–
1;
4,–1,–1,–1,–1,–1,–1,6,–1,142,–1,–1,–1,–1,–1,–1,–1,–
1,–1,–1,–1,–1,3,–1,–1,–1,–1,–1,–1,–1,–1,–1,–1,–1,–
1,–1,–1,–1,–1,–1,–1,–1,–1,–1,–1,–1,–1,–1,–1,–1,–
1,–1,–1,–1,–1,–1,–1,–1,–1,–1,–1,–1,–1,–1,–1,–1,0,–
1;
–1,181,–1,–1,–1,–1,45,–1,–1,–1,153,–1,–1,–1,–1,–1,–
1,–1,–1,–1,–1,–1,–1,–1,–1,–1,–1,–1,–1,–1,–1,–1,–
1,–1,–1,–1,–1,–1,–1,–1,–1,–1,–1,–1,–1,–1,–1,–1,–
1,–1,–1,–1,–1,–1,–1,–1,–1,–1,–1,–1,–1,–1,–1,–1,–
1,–1,–1,0;

wherein –1 represents a null value.

7. The method of claim 6, wherein all coefficient matrices in the set of coefficient matrices have 46 rows and 68 columns.

8. The method of claim 6, wherein the shift size Z is an element in a shift size set Zset, elements in the shift size set Zset are grouped in A shift size subsets and an i-th shift size subset among the A shift size subsets denoted as Zseti (i=1, 2, 3, . . . , A), and wherein the A shift size subsets have no common element, A being an integer greater than 1;

wherein the set of coefficient matrices comprises A coefficient matrices; and wherein an i-th coefficient matrix in the set of coefficient matrices corresponds to the i-th shift size subset Zseti.

9. The method of claim 6, wherein the basic matrix has a same number of rows and a same number of columns as the coefficient matrix.

10. The method of claim 6, wherein the parity check matrix is further determined based on the lifting size Z.

11. An apparatus for wireless communications, comprising:

a processor; and a memory including processor-executable instructions stored thereon, the processor-executable instructions upon execution by the processor configures the processor to:

perform LDPC encoding on an input sequence having K bits according to a parity check matrix of a low-density parity-check (LDPC) code;

obtain an encoded sequence having N bits from the LDPC encoding of the input sequence having K bits; and perform a transmission to a receiving apparatus based on the encoded sequence, wherein the parity check matrix is determined based on at least a basic matrix that is determined according to a lifting size Z and a coefficient matrix in a set of coefficient matrices, wherein K is a positive integer, N is an integer greater than K, and Z is a positive integer, and wherein elements of the coefficient matrix comprises:

3,26,53,35,–1,–1,115,–1,–1,127,0,0,–1,–1,–1,–1,–1,–
1,–1,–1,–1,–1,–1,–1,–1,–1,–1,–1,–1,–1,–1,–1,–1,–
1,–1,–1,–1,–1,–1,–1,–1,–1,–1,–1,–1,–1,–1,–1,–1,–
1,–1,–1;
19,–1,–1,94,104,66,84,98,69,50,–1,0,0,–1,–1,–1,–1,–1,–
1,–1,–1,–1,–1,–1,–1,–1,–1,–1,–1,–1,–1,–1,–1,–1,–
1,–1,–1,–1,–1,–1,–1,–1,–1,–1,–1,–1,–1,–1,–1,–1,–
1,–1;
95,106,–1,92,110,–1,–1,–1,111,–1,1,–1,0,0,–1,–1,–1,–
1,–1,–1,–1,–1,–1,–1,–1,–1,–1,–1,–1,–1,–1,–1,–1,–
1,–1,–1,–1,–1,–1,–1,–1,–1,–1,–1,–1,–1,–1,–1,–1,–
1,–1,–1;
–1,120,121,–1,22,4,73,49,128,79,0,–1,–1,0,–1,–1,–1,–
1,–1,–1,–1,–1,–1,–1,–1,–1,–1,–1,–1,–1,–1,–1,–1,–
1,–1,–1,–1,–1,–1,–1,–1,–1,–1,–1,–1,–1,–1,–1,–1,–
1,–1,–1;
42,24,–1,–1,–1,–1,–1,–1,–1,–1,–1,51,–1,–1,0,–1,–1,–
1,–1,–1,–1,–1,–1,–1,–1,–1,–1,–1,–1,–1,–1,–1,–1,–
1,–1,–1,–1,–1,–1,–1,–1,–1,–1,–1,–1,–1,–1,–1,–1,–
1,–1,–1;
40,140,–1,–1,–1,84,–1,137,–1,–1,–1,71,–1,–1,–1,0,–1,–
1,–1,–1,–1,–1,–1,–1,–1,–1,–1,–1,–1,–1,–1,–1,–1,–
1,–1,–1,–1,–1,–1,–1,–1,–1,–1,–1,–1,–1,–1,–1,–1,–
1,–1,–1;
109,–1,–1,–1,–1,87,–1,107,–1,133,–1,139,–1,–1,–1,–1,
0,–1,–1,–1,–1,–1,–1,–1,–1,–1,–1,–1,–1,–1,–1,–1,–
1,–1,–1,–1,–1,–1,–1,–1,–1,–1,–1,–1,–1,–1,–1,–1,–
1,–1,–1,–1;
–1,97,–1,–1,–1,135,–1,35,–1,–1,–1,108,–1,65,–1,–1,–1,
0,–1,–1,–1,–1,–1,–1,–1,–1,–1,–1,–1,–1,–1,–1,–1,–
1,–1,–1,–1,–1,–1,–1,–1,–1,–1,–1,–1,–1,–1,–1,–1,–
1,–1,–1;
70,69,–1,–1,–1,–1,–1,–1,–1,–1,–1,–1,88,–1,–1,–1,–1,–
1,0,–1,–1,–1,–1,–1,–1,–1,–1,–1,–1,–1,–1,–1,–1,–1,–
1,–1,–1,–1,–1,–1,–1,–1,–1,–1,–1,–1,–1,–1,–1,–1,–
1,–1;
–1,97,–1,–1,–1,–1,–1,–1,40,–1,24,49,–1,–1,–1,–1,–1,–
1,–1,0,–1,–1,–1,–1,–1,–1,–1,–1,–1,–1,–1,–1,–1,–1,–
1,–1,–1,–1,–1,–1,–1,–1,–1,–1,–1,–1,–1,–1,–1,–1,–
1,–1;
46,41,–1,–1,–1,–1,101,96,–1,–1,–1,–1,–1,–1,–1,–1,–1,–
1,–1,–1,0,–1,–1,–1,–1,–1,–1,–1,–1,–1,–1,–1,–1,–1,–
1,–1,–1,–1,–1,–1,–1,–1,–1,–1,–1,–1,–1,–1,–1,–1,–
1,–1;
28,–1,–1,–1,–1,–1,–1,30,–1,116,–1,–1,–1,64,–1,–1,–1,–
1,–1,–1,–1,0,–1,–1,–1,–1,–1,–1,–1,–1,–1,–1,–1,–1,–
1,–1,–1,–1,–1,–1,–1,–1,–1,–1,–1,–1,–1,–1,–1,–1,–
1,–1;
–1,33,–1,122,–1,–1,–1,–1,–1,–1,–1,131,–1,–1,–1,–1,–
1,–1,–1,–1,–1,–1,0,–1,–1,–1,–1,–1,–1,–1,–1,–1,–
1,–1,–1,–1,–1,–1,–1,–1,–1,–1,–1,–1,–1,–1,–1,–1,–
1,–1,–1;
76,37,–1,–1,–1,–1,–1,–1,62,–1,–1,–1,–1,47,–1,–1,–1,–
1,–1,–1,–1,–1,–1,0,–1,–1,–1,–1,–1,–1,–1,–1,–1,–
1,–1,–1,–1,–1,–1,–1,–1,–1,–1,–1,–1,–1,–1,–1,–1,–
1,–1;
–1,143,–1,–1,–1,–1,51,–1,–1,–1,–1,130,–1,97,–1,–1,–
1,–1,–1,–1,–1,–1,–1,–1,0,–1,–1,–1,–1,–1,–1,–1,–1,–
1,–1,–1,–1,–1,–1,–1,–1,–1,–1,–1,–1,–1,–1,–1,–1,–
1,–1,–1;
139,–1,–1,–1,–1,–1,–1,–1,–1,–1,96,128,–1,–1,–1,–1,–
1,–1,–1,–1,–1,–1,–1,–1,–1,0,–1,–1,–1,–1,–1,–1,–1,–
1,–1,–1,–1,–1,–1,–1,–1,–1,–1,–1,–1,–1,–1,–1,–1,–
1,–1,–1;
–1,48,–1,–1,–1,–1,–1,–1,–1,9,–1,28,8,–1,–1,–1,–1,–1,–
1,–1,–1,–1,–1,–1,–1,–1,0,–1,–1,–1,–1,–1,–1,–1,–1,–
1,–1,–1,–1,–1,–1,–1,–1,–1,–1,–1,–1,–1,–1,–1,–1,–1;
–1,120,–1,–1,–1,43,–1,–1,–1,–1,–1,65,42,–1,–1,–1,–1,–
1,–1,–1,–1,–1,–1,–1,–1,–1,–1,0,–1,–1,–1,–1,–1,–1,–
1,–1,–1,–1,–1,–1,–1,–1,–1,–1,–1,–1,–1,–1,–1,–1,–
1,–1;

17,−1,−1,−1,−1,−1,106,142,−1,−1,−1,−1,−1,−1,−1,−
1,−1,−1,−1,−1,−1,−1,−1,−1,−1,−1,0,−1,−1,−1,−1,−
1,−1,−1,−1,−1,−1,−1,−1,−1,−1,−1,−1,−1,−1,−1,−
1,−1,−1;
79,28,−1,−1,−1,−1,−1,−1,−1,−1,41,−1,−1,−1,−1,−1,−1,−
1,−1,−1,−1,−1,−1,−1,−1,−1,−1,−1,0,−1,−1,−1,−1,−
1,−1,−1,−1,−1,−1,−1,−1,−1,−1,−1,−1,−1,−1,−1,−
1,−1;
−1,2,−1,−1,103,−1,−1,−1,−1,−1,−1,78,−1,−1,−1,−1,−1,−
1,−1,−1,−1,−1,−1,−1,−1,−1,−1,−1,−1,0,−1,−1,−1,−
1,−1,−1,−1,−1,−1,−1,−1,−1,−1,−1,−1,−1,−1,−1,−
1,−1;
91,−1,−1,−1,−1,−1,−1,−1,75,−1,−1,−1,−1,81,−1,−1,−1,−
1,−1,−1,−1,−1,−1,−1,−1,−1,−1,−1,−1,−1,−1,0,−1,−1,−
1,−1,−1,−1,−1,−1,−1,−1,−1,−1,−1,−1,−1,−1,−1,−
1,−1;
−1,54,132,−1,−1,−1,−1,−1,−1,−1,−1,−1,−1,−1,−1,−1,−
1,−1,−1,−1,−1,−1,−1,−1,−1,−1,−1,−1,−1,−1,−1,0,−
1,−1,−1,−1,−1,−1,−1,−1,−1,−1,−1,−1,−1,−1,−1,−
1,−1,−1;
68,−1,−1,115,−1,56,−1,−1,−1,−1,−1,−1,−1,−1,−1,−1,−1,−
1,−1,−1,−1,−1,−1,−1,−1,−1,−1,−1,−1,−1,−1,−1,0,−
1,−1,−1,−1,−1,−1,−1,−1,−1,−1,−1,−1,−1,−1,−1,−
1,−1;
−1,30,42,−1,−1,−1,−1,−1,−1,101,−1,−1,−1,−1,−1,−1,−1,−
1,−1,−1,−1,−1,−1,−1,−1,−1,−1,−1,−1,−1,−1,−1,−1,
0,−1,−1,−1,−1,−1,−1,−1,−1,−1,−1,−1,−1,−1,−1,−
1,−1;
128,−1,−1,−1,−1,63,−1,−1,−1,−1,−1,−1,−1,−1,−1,−1,−
1,−1,−1,−1,−1,−1,−1,−1,−1,−1,−1,−1,−1,−1,−1,−
1,−1,−1,0,−1,−1,−1,−1,−1,−1,−1,−1,−1,−1,−1,−1,−1,−
1,−1,−1;
−1,−1,142,−1,−1,−1,−1,28,−1,−1,−1,−1,100,133,−1,−1,−
1,−1,−1,−1,−1,−1,−1,−1,−1,−1,−1,−1,−1,−1,−1,−
1,−1,−1,−1,0,−1,−1,−1,−1,−1,−1,−1,−1,−1,−1,−1,−1,−
1,−1,−1;
13,−1,−1,−1,−1,−1,10,−1,−1,−1,−1,−1,−1,−1,−1,−1,−1,−
1,−1,−1,−1,−1,−1,−1,−1,−1,−1,−1,−1,−1,−1,−1,−
1,−1,−1,−1,0,−1,−1,−1,−1,−1,−1,−1,−1,−1,−1,−1,−1,−
1,−1;
−1,106,77,−1,−1,43,−1,−1,−1,−1,−1,−1,−1,−1,−1,−1,−1,−
1,−1,−1,−1,−1,−1,−1,−1,−1,−1,−1,−1,−1,−1,−1,−
1,−1,−1,−1,−1,0,−1,−1,−1,−1,−1,−1,−1,−1,−1,−1,−1,−
1,−1;
133,−1,−1,−1,25,−1,−1,−1,−1,−1,−1,−1,−1,−1,−1,−1,−
1,−1,−1,−1,−1,−1,−1,−1,−1,−1,−1,−1,−1,−1,−1,−
1,−1,−1,−1,−1,−1,−1,0,−1,−1,−1,−1,−1,−1,−1,−1,−1,−
1,−1,−1;
−1,−1,87,−1,−1,56,−1,104,−1,70,−1,−1,−1,−1,−1,−1,−1,−
1,−1,−1,−1,−1,−1,−1,−1,−1,−1,−1,−1,−1,−1,−1,−
1,−1,−1,−1,−1,−1,−1,0,−1,−1,−1,−1,−1,−1,−1,−1,−1,−
1,−1;
−1,80,−1,−1,−1,−1,−1,−1,−1,−1,−1,−1,−1,139,−1,−1,−
1,−1,−1,−1,−1,−1,−1,−1,−1,−1,−1,−1,−1,−1,−1,−
1,−1,−1,−1,−1,−1,−1,−1,−1,0,−1,−1,−1,−1,−1,−1,−1,−
1,−1,−1;
32,−1,−1,−1,−1,89,−1,−1,−1,−1,−1,−1,71,−1,−1,−1,−1,−
1,−1,−1,−1,−1,−1,−1,−1,−1,−1,−1,−1,−1,−1,−1,−
1,−1,−1,−1,−1,−1,−1,−1,−1,0,−1,−1,−1,−1,−1,−1,−1,−
1,−1;
−1,−1,135,−1,−1,−1,−1,6,−1,−1,2,−1,−1,−1,−1,−1,−1,−
1,−1,−1,−1,−1,−1,−1,−1,−1,−1,−1,−1,−1,−1,−1,−
1,−1,−1,−1,−1,−1,−1,−1,−1,−1,0,−1,−1,−1,−1,−1,−1,−
1,−1;

37,−1,−1,−1,−1,−1,−1,−1,−1,−1,−1,−1,25,114,−1,−1,−1,−
1,−1,−1,−1,−1,−1,−1,−1,−1,−1,−1,−1,−1,−1,−1,−
1,−1,−1,−1,−1,−1,−1,−1,−1,−1,−1,0,−1,−1,−1,−1,−1,−
1,−1;
−1,60,−1,−1,−1,137,−1,−1,−1,−1,−1,93,−1,−1,−1,−1,−1,−
1,−1,−1,−1,−1,−1,−1,−1,−1,−1,−1,−1,−1,−1,−1,−
1,−1,−1,−1,−1,−1,−1,−1,−1,−1,−1,−1,0,−1,−1,−1,−1,−
1,−1;
121,−1,129,−1,−1,−1,−1,26,−1,−1,−1,−1,−1,−1,−1,−1,−
1,−1,−1,−1,−1,−1,−1,−1,−1,−1,−1,−1,−1,−1,−1,−
1,−1,−1,−1,−1,−1,−1,−1,−1,−1,−1,−1,−1,−1,0,−1,−1,−
1,−1,−1;
−1,−1,−1,−1,−1,−1,−1,−1,−1,−1,97,−1,−1,56,−1,−1,−1,−
1,−1,−1,−1,−1,−1,−1,−1,−1,−1,−1,−1,−1,−1,−1,−
1,−1,−1,−1,−1,−1,−1,−1,−1,−1,−1,−1,−1,−1,0,−1,−1,−
1,−1;
−1,1,−1,−1,−1,70,−1,−1,−1,−1,−1,1,−1,−1,−1,−1,−1,−1,−
1,−1,−1,−1,−1,−1,−1,−1,−1,−1,−1,−1,−1,−1,−1,−
1,−1,−1,−1,−1,−1,−1,−1,−1,−1,−1,−1,−1,−1,0,−1,−1,−
1;
119,−1,−1,−1,−1,−1,−1,32,−1,−1,−1,−1,−1,142,−1,−1,−1,−
1,−1,−1,−1,−1,−1,−1,−1,−1,−1,−1,−1,−1,−1,−1,−
1,−1,−1,−1,−1,−1,−1,−1,−1,−1,−1,−1,−1,−1,−1,−1,−1,
0,−1,−1;
−1,−1,6,−1,−1,−1,−1,−1,−1,−1,73,−1,−1,102,−1,−1,−1,−
1,−1,−1,−1,−1,−1,−1,−1,−1,−1,−1,−1,−1,−1,−1,−
1,−1,−1,−1,−1,−1,−1,−1,−1,−1,−1,−1,−1,−1,−1,−1,−1,
0,−1;
−1,48,−1,−1,−1,47,−1,−1,−1,−1,−1,19,−1,−1,−1,−1,−1,−
1,−1,−1,−1,−1,−1,−1,−1,−1,−1,−1,−1,−1,−1,−1,−
1,−1,−1,−1,−1,−1,−1,−1,−1,−1,−1,−1,−1,−1,−1,−
1,−1,0;

wherein −1 represents a null value.

12. The apparatus of claim 11, wherein all coefficient matrices in the set of coefficient matrices have 42 rows and 52 columns.

13. The apparatus of claim 11, wherein the shift size Z is an element in a shift size set Zset, elements in the shift size set Zset are grouped in A shift size subsets and an i-th shift size subset among the A shift size subsets denoted as Zseti (i=1, 2, 3, . . . , A), and wherein the A shift size subsets have no common element, A being an integer greater than 1;

wherein the set of coefficient matrices comprises A coefficient matrices; and wherein an i-th coefficient matrix in the set of coefficient matrices corresponds to the i-th shift size subset Zseti.

14. The apparatus of claim 11, wherein the basic matrix has a same number of rows and a same number of columns as the coefficient matrix.

15. The apparatus of claim 11, wherein the parity check matrix is further determined based on the lifting size Z.

16. An apparatus for wireless communications, comprising:

a processor; and a memory including processor-executable instructions stored thereon, the processor-executable instructions upon execution by the processor configures the processor to:

perform LDPC encoding on an input sequence having K bits according to a parity check matrix of a low-density parity-check (LDPC) code;

obtain an encoded sequence having N bits from the LDPC encoding of the input sequence having K bits; and perform a transmission to a receiving apparatus based on the encoded sequence, wherein the parity check matrix is determined based on at least a basic matrix that is determined according to a lifting size Z and a set of coefficient matrices, wherein K is a positive integer, N is an integer greater than K, and Z is a positive integer, and wherein elements of the coefficient matrix comprise:

0,0,0,0,–1,0,0,–1,–1,0,0,0,0,0,–1,0,0,–1,0,0,0,0,0,0,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1;

22,–1,11,124,0,10,–1,0,0,2,–1,16,60,–1,0,6,30,0,–1,168,–1,31,105,0,0,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1;

132,37,21,–1,180,4,149,48,38,122,195,–1,–1,155,28,85,–1,47,179,42,66,–1,–1,–1,0,0,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1;

4,6,–1,33,113,–1,49,21,6,–1,151,83,154,87,5,–1,92,173,120,–1,2,142,0,–1,–1,0,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1;

24,204,–1,–1,–1,–1,–1,–1,–1,–1,–1,–1,–1,–1,–1,–1,–1,–1,–1,–1,–1,–1,–1,–1,0,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1;

185,100,–1,24,–1,–1,–1,–1,–1,–1,–1,–1,65,–1,–1,–1,207,–1,–1,–1,–1,161,72,–1,–1,–1,–1,0,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1;

6,–1,–1,–1,–1,–1,27,–1,–1,–1,163,50,–1,48,–1,–1,–1,24,38,–1,91,–1,–1,–1,–1,–1,–1,–1,0,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1;

145,88,–1,–1,112,–1,–1,153,159,–1,–1,–1,–1,–1,76,–1,–1,–1,–1,–1,–1,–1,–1,–1,–1,–1,–1,–1,0,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1;

172,2,–1,131,–1,–1,–1,–1,–1,–1,–1,–1,141,–1,–1,–1,96,–1,–1,99,–1,101,35,–1,116,–1,–1,–1,–1,–1,0,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1;

6,10,–1,–1,–1,–1,–1,–1,–1,–1,145,53,–1,201,–1,–1,–1,4,164,–1,173,–1,–1,–1,–1,–1,–1,–1,–1,–1,–1,0,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1;

–1,126,77,–1,156,–1,–1,16,12,–1,–1,–1,–1,–1,70,–1,–1,–1,–1,–1,–1,–1,–1,–1,–1,–1,–1,–1,–1,–1,–1,0,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1;

184,194,–1,–1,–1,–1,–1,–1,–1,–1,–1,–1,123,–1,–1,–1,16,–1,–1,–1,–1,104,109,124,–1,–1,–1,–1,–1,–1,–1,–1,–1,0,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1;

6,20,–1,–1,–1,–1,–1,–1,–1,–1,203,153,–1,104,–1,–1,–1,–1,207,–1,–1,–1,–1,–1,–1,–1,–1,–1,–1,–1,–1,–1,–1,–1,–1,0,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1;

52,–1,–1,147,–1,–1,–1,1,–1,–1,–1,–1,–1,–1,–1,–1,–1,–1,–1,–1,16,–1,–1,46,–1,–1,–1,–1,–1,–1,–1,–1,–1,–1,0,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1;

1,–1,–1,–1,–1,–1,–1,–1,–1,–1,–1,–1,202,–1,–1,118,130,1,–1,–1,–1,2,–1,–1,–1,–1,–1,–1,–1,–1,–1,–1,–1,–1,–1,0,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1;

173,6,–1,–1,–1,–1,–1,–1,–1,–1,81,–1,–1,182,–1,–1,–1,–1,53,–1,–1,–1,–1,–1,–1,46,–1,–1,–1,–1,–1,–1,–1,–1,–1,–1,–1,0,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1;

–1,88,–1,198,–1,–1,–1,–1,–1,–1,–1,160,–1,–1,–1,–1,–1,–1,–1,–1,122,–1,182,–1,–1,–1,–1,–1,–1,–1,–1,–1,–1,–1,–1,–1,–1,0,–1,–1,–1,–1,–1,–1,–1,–1,–1,–1,–1,–1,–1,–1,–1,–1,–1,–1,–1,–1,–1,–1,–1,–1,–1,–1,–1,–1;

91,–1,–1,–1,–1,–1,–1,–1,–1,–1,–1,–1,–1,184,–1,30,3,–1,–1,–1,155,–1,–1,–1,–1,–1,–1,–1,–1,–1,–1,–1,–1,–1,–1,–1,–1,0,–1,–1,–1,–1,–1,–1,–1,–1,–1,–1,–1,–1,–1,–1,–1,–1,–1,–1,–1,–1,–1,–1,–1,–1,–1,–1,–1,–1;

–1,1,–1,–1,–1,–1,–1,–1,–1,–1,–1,–1,41,167,–1,–1,–1,–1,68,148,–1,–1,–1,–1,–1,–1,–1,–1,–1,–1,–1,–1,–1,–1,–1,–1,–1,–1,–1,0,–1,–1,–1,–1,–1,–1,–1,–1,–1,–1,–1,–1,–1,–1,–1,–1,–1,–1,–1,–1,–1,–1,–1,–1,–1,–1;

12,6,–1,–1,–1,–1,–1,166,184,–1,191,–1,–1,–1,–1,–1,–1,–1,–1,–1,–1,–1,–1,–1,–1,–1,–1,–1,–1,–1,–1,–1,–1,–1,–1,–1,–1,–1,–1,–1,0,–1,–1,–1,–1,–1,–1,–1,–1,–1,–1,–1,–1,–1,–1,–1,–1,–1,–1,–1,–1,–1,–1,–1,–1,–1,–1,–1;

6,–1,–1,12,–1,–1,–1,–1,–1,15,–1,5,–1,–1,–1,–1,–1,–1,–1,–1,–1,–1,30,–1,–1,–1,–1,–1,–1,–1,–1,–1,–1,–1,–1,–1,–1,–1,–1,–1,–1,0,–1,–1,–1,–1,–1,–1,–1,–1,–1,–1,–1,–1,–1,–1,–1,–1,–1,–1,–1,–1,–1,–1,–1,–1,–1,–1;

–1,6,–1,–1,–1,86,–1,–1,–1,–1,–1,–1,–1,–1,–1,96,–1,–1,–1,42,199,–1,–1,–1,–1,–1,–1,–1,–1,–1,–1,–1,–1,–1,–1,–1,–1,–1,–1,–1,–1,–1,0,–1,–1,–1,–1,–1,–1,–1,–1,–1,–1,–1,–1,–1,–1,–1,–1,–1,–1,–1,–1,–1,–1,–1,–1;

44,–1,–1,–1,–1,–1,–1,–1,–1,–1,–1,58,130,–1,–1,–1,131,–1,–1,–1,–1,–1,–1,–1,–1,–1,–1,–1,–1,–1,–1,–1,–1,–1,–1,–1,–1,–1,–1,–1,–1,–1,0,–1,–1,–1,–1,–1,–1,–1,–1,–1,–1,–1,–1,–1,–1,–1,–1,–1,–1,–1,–1,–1,–1,–1,–1;

–1,45,18,–1,–1,–1,–1,–1,–1,–1,132,–1,–1,–1,–1,–1,–1,–1,100,–1,–1,–1,–1,–1,–1,–1,–1,–1,–1,–1,–1,–1,–1,–1,–1,–1,–1,–1,–1,–1,–1,–1,–1,–1,0,–1,–1,–1,–1,–1,–1,–1,–1,–1,–1,–1,–1,–1,–1,–1,–1,–1,–1,–1,–1,–1,–1;

9,–1,–1,125,191,–1,–1,–1,–1,–1,–1,28,–1,–1,–1,–1,–1,–1,–1,–1,–1,–1,6,–1,–1,–1,–1,–1,–1,–1,–1,–1,–1,–1,–1,–1,–1,–1,–1,–1,–1,–1,–1,–1,0,–1,–1,–1,–1,–1,–1,–1,–1,–1,–1,–1,–1,–1,–1,–1,–1,–1,–1,–1,–1,–1,–1,–1;

–1,4,–1,–1,–1,–1,74,16,–1,–1,–1,–1,–1,–1,28,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,0,–1,–1,–1,–1,–1,–1,–1,–1,–1,–1,–1,–1,–1,–1,–1,–1,–1,–1,–1,–1;

21,–1,142,–1,192,–1,–1,–1,–1,–1,–1,–1,–1,–1,–1,197,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,–1,0,–1,–1,–1,–1,–1,–1,–1,–1,–1,–1,–1,–1,–1,–1,–1,–1,–1,–1,–1,–1,–1;

–1,98,–1,–1,–1,–1,140,–1,22,–1,–1,–1,–1,–1,–1,–1,–1,–1,–1,–1,–1,–1,–1,–1,–1,–1,–1,–1,–1,–1,–1,–1,–

1,–1,–1,–1,–1,–1,–1,–1,–1,–1,–1,–1,–1,–1,–1,–1,0,–
1,–1,–1,–1,–1,–1,–1,–1,–1,–1,–1,–1,–1,–1,–1,–
1,–1;
4,–1,–1,–1,1,–1,–1,–1,–1,–1,–1,–1,–1,–1,–1,–1,–1,–1,–
1,40,–1,93,–1,–1,–1,–1,–1,–1,–1,–1,–1,–1,–1,–1,–1,–
1,–1,–1,–1,–1,–1,–1,–1,–1,–1,–1,–1,–1,–1,0,–1,–
1,–1,–1,–1,–1,–1,–1,–1,–1,–1,–1,–1,–1,–1,–1,–1;
–1,92,–1,–1,–1,–1,–1,–1,–1,–1,–1,–1,–1,–1,136,–1,–
1,–1,106,–1,–1,–1,–1,–1,–1,6,–1,–1,–1,–1,–1,–1,–
1,–1,–1,–1,–1,–1,–1,–1,–1,–1,–1,–1,–1,–1,–1,–
1,–1,0,–1,–1,–1,–1,–1,–1,–1,–1,–1,–1,–1,–1,–1,–
1,–1;
2,–1,–1,–1,–1,–1,–1,–1,–1,88,–1,–1,112,–1,–1,–1,–
1,–1,–1,–1,–1,–1,–1,20,–1,–1,–1,–1,–1,–1,–1,–
1,–1,–1,–1,–1,–1,–1,–1,–1,–1,–1,–1,–1,–1,–1,–
1,–1,–1,0,–1,–1,–1,–1,–1,–1,–1,–1,–1,–1,–1,–1,–
1,–1;
–1,4,–1,–1,–1,–1,–1,49,–1,–1,–1,–1,–1,–1,–1,–1,–
1,–1,–1,–1,–1,125,–1,–1,194,–1,–1,–1,–1,–1,–1,–
1,–1,–1,–1,–1,–1,–1,–1,–1,–1,–1,–1,–1,–1,–1,–
1,–1,–1,–1,0,–1,–1,–1,–1,–1,–1,–1,–1,–1,–1,–1,–
1,–1;
6,–1,–1,–1,–1,–1,–1,–1,–1,–1,–1,–1,126,–1,63,–1,–1,–
1,–1,–1,–1,–1,–1,–1,20,–1,–1,–1,–1,–1,–1,–1,–
1,–1,–1,–1,–1,–1,–1,–1,–1,–1,–1,–1,–1,–1,–1,–
1,–1,–1,–1,–1,0,–1,–1,–1,–1,–1,–1,–1,–1,–1,–1,–
1,–1;
–1,10,30,–1,–1,–1,–1,–1,–1,–1,–1,6,–1,–1,–1,–1,–
1,–1,–1,–1,92,–1,–1,–1,–1,–1,–1,–1,–1,–1,–1,–
1,–1,–1,–1,–1,–1,–1,–1,–1,–1,–1,–1,–1,–1,–1,–
1,–1,–1,–1,–1,–1,0,–1,–1,–1,–1,–1,–1,–1,–1,–1,–
1,–1;
4,–1,–1,–1,–1,–1,–1,153,–1,–1,–1,–1,–1,–1,–1,197,–1,
155,–1,–1,–1,–1,–1,–1,–1,–1,–1,–1,–1,–1,–1,–1,–
1,–1,–1,–1,–1,–1,–1,–1,–1,–1,–1,–1,–1,–1,–1,–
1,–1,–1,–1,–1,–1,–1,0,–1,–1,–1,–1,–1,–1,–1,–1,–
1,–1;
–1,4,–1,–1,–1,–1,45,–1,–1,–1,–1,–1,168,–1,–1,–1,–
1,–1,–1,–1,–1,185,–1,–1,–1,–1,–1,–1,–1,–1,–1,–
1,–1,–1,–1,–1,–1,–1,–1,–1,–1,–1,–1,–1,–1,–1,–
1,–1,–1,–1,–1,–1,–1,–1,0,–1,–1,–1,–1,–1,–1,–1,–
1,–1;
6,–1,–1,–1,–1,–1,–1,–1,–1,–1,–1,–1,–1,–1,200,177,–1,–
1,43,–1,–1,–1,–1,–1,–1,–1,–1,–1,–1,–1,–1,–1,–1,–
1,–1,–1,–1,–1,–1,–1,–1,–1,–1,–1,–1,–1,–1,–1,–
1,–1,–1,–1,–1,–1,–1,–1,–1,0,–1,–1,–1,–1,–1,–1,–1,–
1,–1;
–1,82,–1,–1,–1,–1,–1,–1,–1,–1,–1,–1,–1,2,–1,–1,–1,–
1,–1,–1,–1,–1,–1,135,–1,–1,–1,–1,–1,–1,–1,–1,–1,–
1,–1,–1,–1,–1,–1,–1,–1,–1,–1,–1,–1,–1,–1,–1,–
1,–1,–1,–1,–1,–1,–1,–1,–1,–1,0,–1,–1,–1,–1,–1,–1,–
1,–1;
91,–1,–1,–1,–1,–1,–1,–1,–1,64,198,–1,100,–1,–1,–1,–
1,–1,–1,–1,–1,–1,–1,–1,–1,–1,–1,–1,–1,–1,–1,–
1,–1,–1,–1,–1,–1,–1,–1,–1,–1,–1,–1,–1,–1,–1,–
1,–1,–1,–1,–1,–1,–1,–1,–1,–1,–1,–1,0,–1,–1,–1,–1,–
1,–1,–1;

–1,4,–1,28,–1,–1,–1,109,–1,–1,–1,–1,–1,–1,–1,–1,–1,–
1,–1,188,–1,–1,–1,–1,–1,–1,–1,–1,–1,–1,–1,–1,–1,–
1,–1,–1,–1,–1,–1,–1,–1,–1,–1,–1,–1,–1,–1,–1,–
1,–1,–1,–1,–1,–1,–1,–1,–1,–1,–1,–1,0,–1,–1,–1,–1,–
1,–1;
10,–1,–1,–1,–1,–1,–1,–1,84,–1,–1,–1,–1,–1,–1,–1,–1,
12,–1,–1,–1,–1,–1,–1,–1,–1,–1,–1,–1,–1,–1,–1,–1,–
1,–1,–1,–1,–1,–1,–1,–1,–1,–1,–1,–1,–1,–1,–1,–
1,–1,–1,–1,–1,–1,–1,–1,–1,–1,–1,–1,–1,0,–1,–1,–1,–
1,–1;
–1,2,–1,75,–1,–1,–1,–1,–1,142,–1,–1,–1,–1,–1,–1,–1,–
1,128,–1,–1,–1,–1,–1,–1,–1,–1,–1,–1,–1,–1,–1,–1,–
1,–1,–1,–1,–1,–1,–1,–1,–1,–1,–1,–1,–1,–1,–1,–
1,–1,–1,–1,–1,–1,–1,–1,–1,–1,–1,–1,–1,–1,0,–1,–1,–
1,–1;
163,–1,–1,–1,10,–1,–1,–1,–1,–1,–1,–1,–1,–1,–1,–1,–
1,–1,–1,–1,–1,–1,–1,–1,162,–1,–1,–1,–1,–1,–1,–1,–
1,–1,–1,–1,–1,–1,–1,–1,–1,–1,–1,–1,–1,–1,–1,–
1,–1,–1,–1,–1,–1,–1,–1,–1,–1,–1,–1,–1,–1,–1,–1,0,–
1,–1,–1;
–1,1,–1,–1,–1,–1,–1,–1,–1,–1,–1,–1,–1,–1,–1,–1,163,–
1,99,–1,–1,–1,–1,–1,–1,98,–1,–1,–1,–1,–1,–1,–1,–1,–
1,–1,–1,–1,–1,–1,–1,–1,–1,–1,–1,–1,–1,–1,–1,–
1,–1,–1,–1,–1,–1,–1,–1,–1,–1,–1,–1,–1,–1,–1,0,–1,–
1;
4,–1,–1,–1,–1,–1,–1,6,–1,142,–1,–1,–1,–1,–1,–1,–1,–
1,–1,–1,–1,–1,3,–1,–1,–1,–1,–1,–1,–1,–1,–1,–1,–
1,–1,–1,–1,–1,–1,–1,–1,–1,–1,–1,–1,–1,–1,–1,–
1,–1,–1,–1,–1,–1,–1,–1,–1,–1,–1,–1,–1,–1,–1,–1,0,–
1;
–1,181,–1,–1,–1,–1,45,–1,–1,–1,153,–1,–1,–1,–1,–1,–
1,–1,–1,–1,–1,–1,–1,–1,–1,–1,–1,–1,–1,–1,–1,–
1,–1,–1,–1,–1,–1,–1,–1,–1,–1,–1,–1,–1,–1,–1,–
1,–1,–1,–1,–1,–1,–1,–1,–1,–1,–1,–1,–1,–1,–1,–
1,–1,–1,0;

wherein –1 represents a null value.

17. The apparatus of claim 16, wherein all coefficient matrices in the set of coefficient matrices have 46 rows and 68 columns.

18. The apparatus of claim 16, wherein the shift size Z is an element in a shift size set Zset, elements in the shift size set Zset are grouped in A shift size subsets and an i-th shift size subset among the A shift size subsets denoted as Zseti (i=1, 2, 3, . . . , A), and wherein the A shift size subsets have no common element, A being an integer greater than 1;

wherein the set of coefficient matrices comprises A coefficient matrices; and wherein an i-th coefficient matrix in the set of coefficient matrices corresponds to the i-th shift size subset Zseti.

19. The apparatus of claim 16, wherein the basic matrix has a same number of rows and a same number of columns as the coefficient matrix.

20. The apparatus of claim 16, wherein the parity check matrix is further determined based on the lifting size Z.

* * * * *

UNITED STATES PATENT AND TRADEMARK OFFICE

CERTIFICATE OF CORRECTION

PATENT NO. : 11,159,178 B2
APPLICATION NO. : 16/727714
DATED : October 26, 2021
INVENTOR(S) : Liguang Li et al.

It is certified that error appears in the above-identified patent and that said Letters Patent is hereby corrected as shown below:

In the Claims

In Column 97, Claim 3, Lines 37-46, delete:
"The method of claim 1, wherein the shift size Z is an element in a shift size set Zset, elements in the shift size set Zset are grouped in A shift size subsets and an i-th shift size subset among the A shift size subsets denoted as Zseti (i= 1, 2, 3, … , A), and wherein the A shift size subsets have no common element, A being an integer greater than 1;
wherein the set of coefficient matrices comprises A coefficient matrices; and
wherein an i-th coefficient matrix in the set of coefficient matrices corresponds to the i-th shift size subset Zseti."

And insert:
--The method of claim 1, wherein the lifting size Z is an element in a lifting size set Zset, elements in the lifting size set Zset are grouped in A lifting size subsets and an i-th lifting size subset among the A lifting size subsets denoted as Zseti (i=1, 2, 3, . . . , A), and wherein the A lifting size subsets have no common element, A being an integer greater than 1;
wherein the set of coefficient matrices comprises A coefficient matrices; and
wherein an i-th coefficient matrix in the set of coefficient matrices corresponds to the i-th lifting size subset Zseti.--

In Column 101, Claim 8, Lines 28-37, delete:
"The method of claim 6, wherein the shift size Z is an element in a shift size set Zset, elements in the shift size set Zset are grouped in A shift size subsets and an i-th shift size subset among the A shift size subsets denoted as Zseti (i=1, 2, 3, . . . , A), and wherein the A shift size subsets have no common element, A being an integer greater than 1;
wherein the set of coefficient matrices comprises A coefficient matrices; and
wherein an i-th coefficient matrix in the set of coefficient matrices corresponds to the i-th shift size subset Zseti."

Signed and Sealed this
Eighth Day of October, 2024

Katherine Kelly Vidal

Katherine Kelly Vidal
*Director of the United States Patent and Trademark Office*

And insert:
--The method of claim 6, wherein the lifting size Z is an element in a lifting size set Zset, elements in the lifting size set Zset are grouped in A lifting size subsets and an i-th lifting size subset among the A lifting size subsets denoted as Zseti (i=1, 2, 3, . . . , A), and wherein the A lifting size subsets have no common element, A being an integer greater than 1;
wherein the set of coefficient matrices comprises A coefficient matrices; and
wherein an i-th coefficient matrix in the set of coefficient matrices corresponds to the i-th lifting size subset Zseti.--

In Column 104, Claim 13, Lines 37-46, delete:
"The apparatus of claim 11, wherein the shift size Z is an element in a shift size set Zset, elements in the shift size set Zset are grouped in A shift size subsets and an i-th shift size subset among the A shift size subsets denoted as Zseti (i=1, 2, 3, . . . , A), and wherein the A shift size subsets have no common element, A being an integer greater than 1;
wherein the set of coefficient matrices comprises A coefficient matrices; and
wherein an i-th coefficient matrix in the set of coefficient matrices corresponds to the i-th shift size subset Zseti."

And insert:
--The apparatus of claim 11, wherein the lifting size Z is an element in a lifting size set Zset, elements in the lifting size set Zset are grouped in A lifting size subsets and an i-th lifting size subset among the A lifting size subsets denoted as Zseti (i=1, 2, 3, . . . , A), and wherein the A lifting size subsets have no common element, A being an integer greater than 1;
wherein the set of coefficient matrices comprises A coefficient matrices; and
wherein an i-th coefficient matrix in the set of coefficient matrices corresponds to the i-th lifting size subset Zseti.--

In Column 108, Claim 18, Lines 42-51, delete:
"The apparatus of claim 16, wherein the shift size Z is an element in a shift size set Zset, elements in the shift size set Zset are grouped in A shift size subsets and an i-th shift size subset among the A shift size subsets denoted as Zseti (i=1, 2, 3, . . . , A), and wherein the A shift size subsets have no common element, A being an integer greater than 1;
wherein the set of coefficient matrices comprises A coefficient matrices; and
wherein an i-th coefficient matrix in the set of coefficient matrices corresponds to the i-th shift size subset Zseti."

And insert:
--The apparatus of claim 16, wherein the lifting size Z is an element in a lifting size set Zset, elements in the lifting size set Zset are grouped in A lifting size subsets and an i-th lifting size subset among the A lifting size subsets denoted as Zseti (i=1, 2, 3, . . . , A), and wherein the A lifting size subsets have no common element, A being an integer greater than 1;
wherein the set of coefficient matrices comprises A coefficient matrices; and
wherein an i-th coefficient matrix in the set of coefficient matrices corresponds to the i-th lifting size subset Zseti.--